US006114890A

United States Patent [19]

Okajima et al.

[11] Patent Number: 6,114,890

[45] Date of Patent: Sep. 5, 2000

[54] SKEW-REDUCTION CIRCUIT

[75] Inventors: Yoshinori Okajima; Tsuyoshi Higuchi, both of Kawasaki, Japan

[73] Assignee: Fujitsu Limited, Kawasaki, Japan

[21] Appl. No.: 08/967,658

[22] Filed: Nov. 10, 1997

[30] Foreign Application Priority Data

| | | | |
|---|---|---|---|
| May 20, 1997 | [JP] | Japan | 9-129761 |
| May 16, 1997 | [JP] | Japan | 9-127582 |
| May 16, 1997 | [JP] | Japan | 9-127583 |
| May 16, 1997 | [JP] | Japan | 9-127584 |

[51] Int. Cl.[7] ........ H03K 5/12

[52] U.S. Cl. ........ 327/170

[58] Field of Search ........ 327/131, 134, 327/135, 136, 141, 144, 161, 165, 166, 170, 172, 176, 178, 291–293, 295, 296

[56] References Cited

U.S. PATENT DOCUMENTS

| | | | |
|---|---|---|---|
| 5,087,829 | 2/1992 | Ishibashi et al. | 327/152 |
| 5,184,027 | 2/1993 | Masuda et al. | 327/149 |
| 5,369,640 | 11/1994 | Watson et al. | 371/1 |
| 5,467,040 | 11/1995 | Nelson et al. | 327/276 |
| 5,751,711 | 5/1998 | Sakaue | 370/431 |
| 5,889,423 | 3/1999 | Trumpp | 327/298 |

FOREIGN PATENT DOCUMENTS

| | | |
|---|---|---|
| 61-216524 | 9/1986 | Japan . |
| 2-142215 | 5/1990 | Japan . |

*Primary Examiner*—My-Trang Nu Ton
*Attorney, Agent, or Firm*—Arent Fox Kintner Plotkin & Kahn, PLLC

[57] ABSTRACT

A circuit includes a first phase-adjustment circuit adjusting phases of rising edges and falling edges of an original signal, and a phase-delay circuit receiving a phase-adjusted signal from said first phase-adjustment circuit and generating a delay signal by delaying said phase-adjusted signal by a predetermined phase amount. The circuit further includes a phase-comparison circuit comparing phases of edges between said phase-adjusted signal and said delay signal so as to control said first phase-adjustment circuit such that said phases of edges satisfy a predetermined phase relation.

18 Claims, 77 Drawing Sheets

FIG. 6A
FIG. 6B
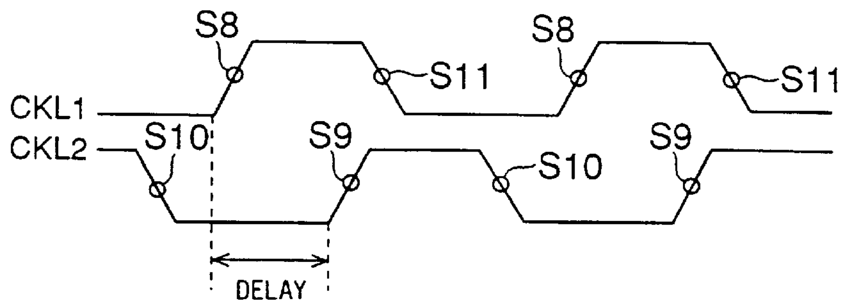
FIG. 7A
FIG. 7B
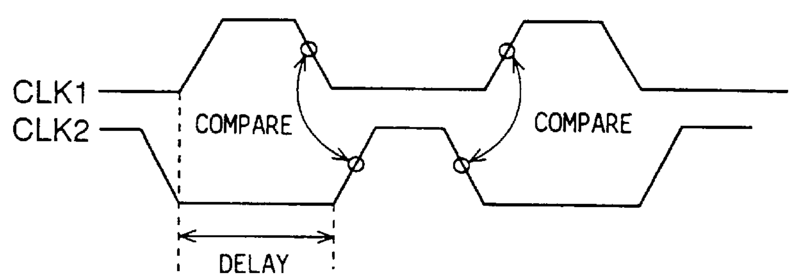

28 (29)

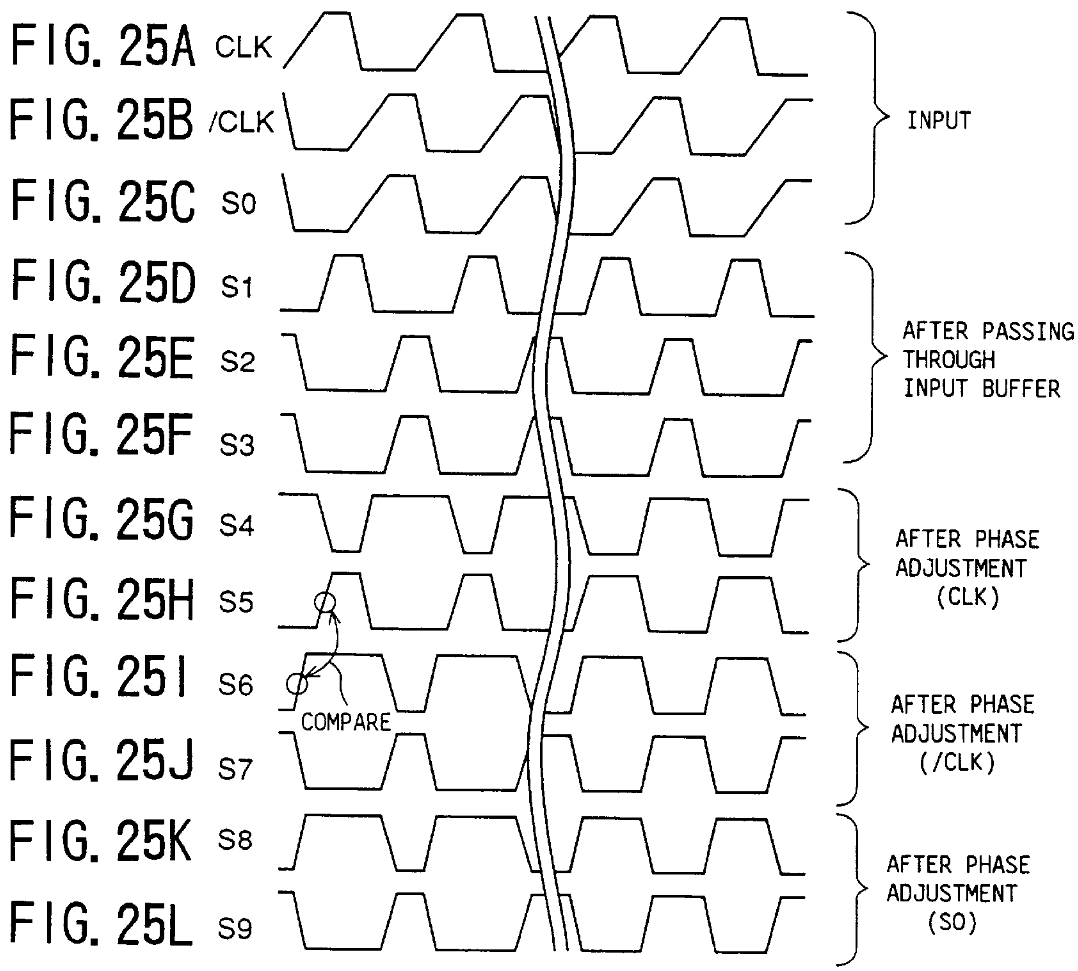
FIG. 25A CLK
FIG. 25B /CLK
FIG. 25C S0
FIG. 25D S1
FIG. 25E S2
FIG. 25F S3
FIG. 25G S4
FIG. 25H S5
FIG. 25I S6
FIG. 25J S7
FIG. 25K S8
FIG. 25L S9
COMPARE
INPUT
AFTER PASSING THROUGH INPUT BUFFER
AFTER PHASE ADJUSTMENT (CLK)
AFTER PHASE ADJUSTMENT (/CLK)
AFTER PHASE ADJUSTMENT (S0)

F I G. 5 6
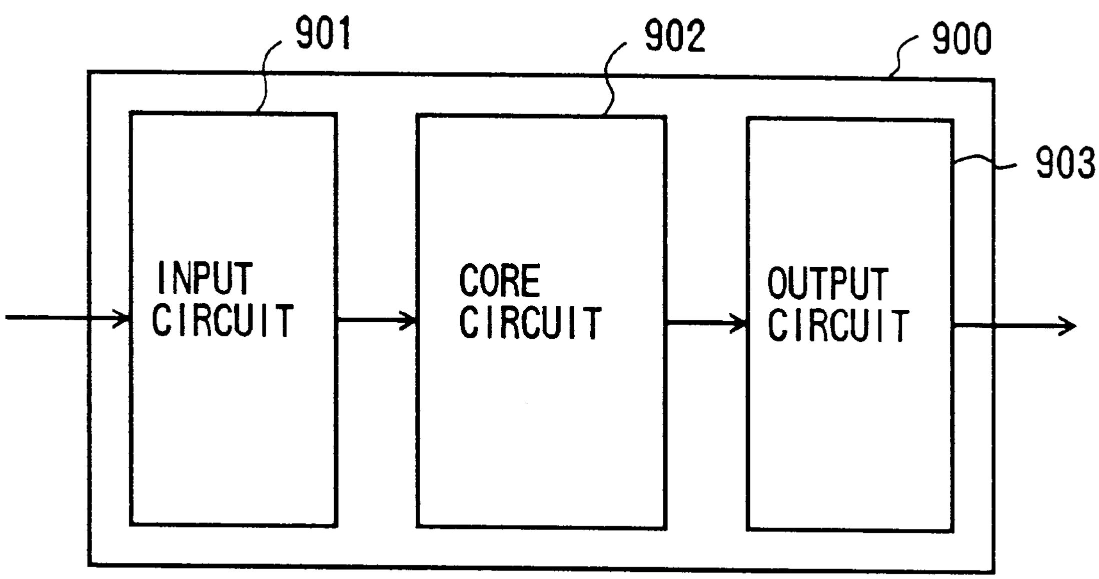

1024

1010B

1021A

1010C

1023B

SKEW-REDUCTION CIRCUIT

BACKGROUND OF THE INVENTION

1. Field of the Invention

The present invention generally relates to interface circuits, and particularly relates to an input/output interface circuit used in semiconductor devices.

2. Description of the Related Art

There is an increasing demand for semiconductor devices which achieve high-speed operations by using high-frequency signals for data input/output. When frequencies of data-input/output signals are raised with an aim of obtaining high-speed operations, however, various factors that could hamper an effort to increase signal frequencies become increasingly prominent. Such factors need to be removed to achieve high-speed operations.

One of the factors placing a cap on the signal frequencies is a signal skew, i.e., a displacement of signal timings. When an input clock signal used for signal synchronization has a skew, for example, a timing displacement may cause erroneous signal detection when other signals are detected by using this clock signal. The possibility of erroneous detection becomes greater as signal frequencies increase, so that the signal skew makes it difficult to raise signal frequencies to step up an operation speed.

There are several types of skews. A skew with regard to a rise and a fall in a signal (hereinafter referred to as a rise-and-fall skew) has not been particularly addressed in the related art. Here, a rise-and-fall skew refers to a timing displacement which diverts a signal-rise timing and a signal-fall timing from respective desired timings.

FIGS. 1A and 1B are timing charts for explaining a rise-and-fall skew of a clock signal.

FIG. 1A shows a case in which no rise-and-fall skew is present, and FIG. 1B exhibits a case in which a clock signal has a rise-and-fall skew. In FIGS. 1A and 1B, a clock signal is demonstrated along with a reference voltage Vref, which is used for voltage comparison in input buffers. A period Thigh marks an interval during which the clock signal is HIGH when the clock signal is compared with the reference voltage Vref, and a period Tlow indicates a period in which the clock signal is LOW.

In FIG. 1B, the clock signal has a skew because a transition period of signal rise is short (steep rise) and a transition period of signal fall is long (slow fall). In this case, the period Thigh and the period Tlow have different time lengths from those of FIG. 1A. This means that not only is each period elongated or shortened from a normal length thereof, but also a signal-rise timing and a signal-fall timing deviate from their expected timings.

When signal-rise and signal-fall timings are displaced in a clock signal for signal synchronization, other signals may be detected to give erroneous results. Further, if a rise-and-fall skew is in existence in signals such as data signals, a valid period in which the data is regarded as valid has a limited time span defined by the shortest one of the period Thigh and the period Tlow. Because of these, a rise-and-fall skew makes it difficult to raise input/output-signal frequencies to boost an operation speed.

Various factors contribute to generating a rise-and-fall skew. In a signal-output circuit for outputting signals, transition periods are different between a signal rise and a signal fall because of variations in circuit characteristics. That is, a rise-and-fall skew is present even at a point where signals are output from circuits. Further, if a reference voltage Vref used for comparison with input signals fluctuates in input buffers for receiving signals, the period Thigh and the period Tlow end up varying. Moreover, a transition period of signal rise and a transition period of signal fall may be different from each other in input buffers because of a variation in circuit characteristics, serving as another factor to create a rise-and-fall skew.

These factors contributing to generating a rise-and-fall skew are believed to impose the same influence on each signal. This is because output buffers and input buffers generally have the same designs, respectively, when they are used in the same semiconductor devices. Also, the reference voltage Vref is shared by each of the buffers. In consideration of this, it is fair to say that a rise-and-fall skew is a common skew shared by many signals.

Since signal frequencies used in the related art are not high in comparison to effects of skews, measures taken against the rise-and-fall skews in the related art are limited to only crude measures like designing circuits that have a small rise-and-fall skew. Such a measure is not sufficient, and a rise-and-fall skew needs to be actively reduced in order to raise signal frequencies and boost operation speeds.

Accordingly, there is a need for a circuit which can reduce a rise-and-fall skew.

Further, when there are skews between input data signals, timing displacements may cause erroneous data detection.

There are several types of skews. One of the most commonly observed skews is a timing displacement between signals which is caused by different path layouts of signal wiring lines. If each signal line has a different path length, each signal arrives at a destination at a different timing when signals are transmitted from one chip to another chip. Even if path lengths are the same, path-route differences result in capacitance, inductance, etc., varying between signal lines, thereby bringing about a variation in signal propagation speed. When this happens, signals received at the destination end up including inter-signal skews.

The inter-signal skew has been well addressed in the related art, and there are circuits which are designed to reduce inter-signal skews.

The rise-and-fall skew constitutes a problem of its own, as previously described, but also causes a problem when the rise-and-fall skew affects the extent to which inter-signal skews are reduced. When signals including a clock signal for synchronization suffer rise-and-fall skews, a circuit for reducing inter-signal skews may be used. Since each signal timing contains uncertainty owing to a rise-and-fall skew, however, alignment of signals can only be as accurate as this uncertainty. Namely, inter-signal skews can be reduced, but some inter-signal skews commensurate with this uncertainty are bound to remain.

Accordingly, there is a need for a circuit which can reduce an inter-signal skew without being affected by a common skew which is equally present in signals.

SUMMARY OF THE INVENTION

Accordingly, it is a general object of the present invention to provide a circuit which can satisfy the needs described above.

It is another and more specific object of the present invention to provide a circuit which can reduce a rise-and-fall skew.

In order to achieve the above objects, a circuit according to the present invention include a first phase-adjustment circuit adjusting phases of rising edges and falling edges of an original signal, a phase-delay circuit receiving a phase-adjusted signal from the first phase-adjustment circuit and generating a delay signal by delaying the phase-adjusted signal by a predetermined phase amount, and a phase-comparison circuit comparing phases of edges between the phase-adjusted signal and the delay signal so as to control the first phase-adjustment circuit such that the phases of edges satisfy a predetermined phase relation.

According to one aspect of the present invention, the circuit is such that the original signal is a clock signal, the phase-delay circuit introducing substantially a 180° delay as the predetermined phase amount, the phase-comparison circuit controlling the first phase-adjustment circuit such that the phase-adjusted signal has a HIGH-level period and a LOW-level period substantially equal to each other.

According to another aspect of the present invention, the circuit is such that the first phase-adjustment circuit adjusts phases by adjusting transition periods of the rising edges and the falling edges.

According to another aspect of the present invention, the circuit further includes a second phase-adjustment circuit for adjusting phases of rising edges and falling edges of another signal, wherein the phase-comparison circuit applies the same control to the second phase-adjustment circuit and to the first phase-adjustment circuit.

According to another aspect of the present invention, the circuit is such that the original signal supplied to the first phase-adjustment circuit is a clock signal, the phase-delay circuit introducing substantially a 180° delay as the predetermined phase amount, the phase-comparison circuit controlling the first phase-adjustment circuit such that the phase-adjusted signal has a HIGH-level period and a LOW-level period substantially equal to each other.

According to another aspect of the present invention, the circuit is such that the phase-comparison circuit includes a first comparison circuit making a check as to which one of a rising-edge timing of the phase-adjusted signal and a falling-edge timing of the delay signal is ahead of the other, a second comparison circuit making a check as to which one of a falling-edge timing of the phase-adjusted signal and a rising-edge timing of the delay signal is ahead of the other, a first control circuit controlling the phase-delay circuit to adjust a delay of the delay signal when the first comparison circuit and the second comparison circuit give concurring check results as to whether the delay is too large or too small, and a second control circuit controlling the first phase-adjustment circuit to adjust the phases of the rising edges and the falling edges of the original signal when the first comparison circuit and the second comparison circuit give contradicting check results as to whether the delay is too large or too small.

According to another aspect of the present invention, the circuit includes at least one frequency divider, wherein the first comparison circuit and the second comparison circuit make the check by using frequency-divided signals from the at least one frequency divider.

According to another aspect of the present invention, the circuit is such that the first phase-adjustment circuit includes an edge-adjustment circuit changing the phases of the rising edges and the falling edges of the original signal, and a phase-shift hold circuit holding parameters for defining an amount of phase changes of the edge-adjustment circuit, the parameters successively updated by the second comparison circuit.

According to another aspect of the present invention, the circuit is such that the phase-shift hold circuit includes a shift register.

According to another aspect of the present invention, the circuit is such that the edge-adjustment circuit changes an output-signal level thereof over a first transition period in response to a rising edge of the original signal, and changes the output signal level over a second transition period in response to a falling edge of the original signal, the edge-adjustment circuit adjusting the first transition period and the second transition period to change the phases.

According to another aspect of the present invention, the circuit is such that the edge-adjustment circuit changes the first transition period and the second transition period by changing a driving force for driving an output signal.

According to another aspect of the present invention, the circuit is such that the edge-adjustment circuit includes an inverter including at least one PMOS transistor and at least one NMOS transistor, a plurality of first transistors inserted between the at least one PMOS transistor and a power voltage, and a plurality of second transistors inserted between the at least one NMOS transistor and a ground voltage, wherein the phases of the rising edges and the falling edges are changed by changing a number of driven transistors among the first transistors and a number of driven transistors among the second transistors.

In the circuit described above, the clock signal is compared with the delayed clock signal obtained by delaying the clock signal by a predetermined delay amount, and phases of rising edges and falling edges of the clock signal are adjusted based on the above comparison such that the clock signal has a HIGH-level period and a LOW-level period equal to each other, thereby reducing a rise-and-fall skew of the clock signal. Further, the same phase adjustment that is applied to the clock signal is also applied to other signals, thereby reducing rise-and-fall skews in the other signals. The phase adjustment of the rising edges and falling edges is readily achieved by controlling a transition period of each edge. Since the transition period can be changed by adjusting a power to drive signals, a circuit having a relatively simple configuration can implement the phase-adjustment function.

Further, a semiconductor device according to the present invention includes a first input buffer receiving a clock signal from an external source, a first phase-adjustment circuit adjusting phases of rising edges and falling edges of the clock signal supplied from the first input buffer, a phase-delay circuit receiving a phase-adjusted signal from the first phase-adjustment circuit and generating a delay signal by delaying the phase-adjusted signal by a predetermined phase amount, and a phase-comparison circuit comparing phases of edges between the phase-adjusted signal and the delay signal so as to control the first phase-adjustment circuit such that the phases of edges satisfy a predetermined phase relation.

According to one aspect of the present invention, the semiconductor device is such that the phase-delay circuit introduces substantially a 180° delay as the predetermined phase amount, and the phase-comparison circuit controls the first phase-adjustment circuit such that the phase-adjusted signal has a HIGH-level period and a LOW-level period substantially equal to each other.

According to another aspect of the present invention, the semiconductor device further includes a second input buffer receiving another signal, and a second phase-adjustment circuit for adjusting phases of rising edges and falling edges of the another signal, wherein the phase-comparison circuit applies the same control to the second phase-adjustment circuit and to the first phase-adjustment circuit.

In the semiconductor device described above, an input circuit of the semiconductor device adjusts phases of rising edges and falling edges of the clock signal based on a comparison between the clock signal and the delayed clock signal internally generated by delaying the clock signal by a predetermined delay amount such that the clock signal has a HIGH-level period and a LOW-level period equal to each other, thereby reducing a rise-and-fall skew of the clock signal. Further, the same phase adjustment that is applied to the clock signal is also applied to other input signals, thereby reducing rise-and-fall skews in the other input signals.

Further, a semiconductor device according to the present invention includes a first phase-adjustment circuit adjusting phases of rising edges and falling edges of a clock signal supplied from an internal source, a phase-delay circuit receiving a phase-adjusted signal from the first phase-adjustment circuit and generating a delay signal by delaying the phase-adjusted signal by a predetermined phase amount, a phase-comparison circuit comparing phases of edges between the phase-adjusted signal and the delay signal so as to control the first phase-adjustment circuit such that the phases of edges satisfy a predetermined phase relation, a second phase-adjustment circuit adjusting phases of rising edges and falling edges of another signal supplied from an internal source, and an output buffer outputting the another signal having a phase thereof adjusted by the second phase-adjustment circuit, wherein the phase-comparison circuit applies the same control to the second phase-adjustment circuit and to the first phase-adjustment circuit.

According to one aspect of the present invention, the semiconductor device is such that the phase-delay circuit introduces substantially a 180° delay as the predetermined phase amount, and the phase-comparison circuit controls the first phase-adjustment circuit such that the phase-adjusted signal has a HIGH-level period and a LOW-level period substantially equal to each other.

According to another aspect of the present invention, the semiconductor device further includes an output buffer and an input buffer provided between the first phase-adjustment circuit and the phase-comparison circuit.

In the semiconductor device described above, an output circuit of the semiconductor device adjusts phases of rising edges and falling edges of the clock signal supplied from an internal circuit based on a comparison between the clock signal and the delayed clock signal internally generated by delaying the clock signal by a predetermined delay amount such that the clock signal has a HIGH-level period and a LOW-level period equal to each other, thereby reducing a rise-and-fall skew of the clock signal. Further, the same phase adjustment that is applied to the clock signal is also applied to output signals, thereby reducing rise-and-fall skews in the output signals.

Further, a circuit according to the present invention includes a first phase-adjustment circuit adjusting phases of rising edges and falling edges of a first signal, and a timing-detection circuit receiving the first signal having an adjusted phase from the first phase-adjustment circuit and controlling the first phase-adjustment circuit such that relative phases between the rising edges and the falling edges satisfy a predetermined phase relation.

According to one aspect of the present invention, the circuit is such that the first signal is a clock signal, the timing-detection circuit controlling the first phase-adjustment circuit such that the first signal has a HIGH-level period and a LOW-level period substantially equal to each other.

According to another aspect of the present invention, the circuit is such that the first phase-adjustment circuit adjusts phases by adjusting transition periods of the rising edges and the falling edges.

According to another aspect of the present invention, the circuit further includes a second phase-adjustment circuit for adjusting phases of rising edges and falling edges of a second signal, wherein the timing-detection circuit applies the same control to the second phase-adjustment circuit and to the first phase-adjustment circuit.

According to another aspect of the present invention, the circuit is such that the first signal includes at least one clock signal, the timing-detection circuit controlling the first phase-adjustment circuit such that the first signal has a HIGH-level period and a LOW-level period substantially equal to each other.

According to another aspect of the present invention, the circuit is such that the first phase-adjustment circuit receives the clock signal and a complementary clock signal having a 180°-phase difference with each other, and wherein the timing-detection circuit treats one of the clock signal and the complementary clock signal as a third signal and an inverse of the other one of the clock signal and the complementary clock signal as a fourth signal, and controls the first phase-adjustment circuit such that the third signal and the fourth signal have the same phase.

According to another aspect of the present invention, the circuit is such that the timing-detection circuit includes a frequency divider dividing frequencies of the third signal and the forth signal to generate frequency divided signals, and a circuit for checking relations of edge timings between the frequency divided signals.

According to another aspect of the present invention, the circuit is such that the first phase-adjustment circuit includes an edge-adjustment circuit changing the phases of the rising edges and the falling edges, and a phase-shift hold circuit holding parameters for defining an amount of phase changes of the edge-adjustment circuit, the parameters successively updated based on the relations of edge timings.

According to another aspect of the present invention, the circuit is such that the phase-shift hold circuit includes a shift register.

According to another aspect of the present invention, the circuit is such that the edge-adjustment circuit changes an output-signal level thereof over a first transition period in response to a rising edge of the first signal, and changes the output signal level over a second transition period in response to a falling edge of the first signal, the edge-adjustment circuit adjusting the first transition period and the second transition period to change the phases.

According to another aspect of the present invention, the circuit is such that the edge-adjustment circuit changes the first transition period and the second transition period by changing a driving force for driving an output signal.

According to another aspect of the present invention, the circuit is such that the edge-adjustment circuit includes an inverter including at least one PMOS transistor and at least one NMOS transistor, a plurality of first transistors inserted between the at least one PMOS transistor and a power voltage, and a plurality of second transistors inserted between the at least one NMOS transistor and a ground voltage, wherein the phases of the rising edges and the falling edges are changed by changing a number of driven transistors among the first transistors and a number of driven transistors among the second transistors.

In the circuit described above, phases of rising edges and falling edges of the clock signal are adjusted such that the clock signal has a HIGH-level period and a LOW-level period equal to each other, thereby reducing a rise-and-fall skew of the clock signal. Further, the same phase adjustment that is applied to the clock signal is also applied to other signals, thereby reducing rise-and-fall skews in the other signals. The phase adjustment of the rising edges and falling edges is readily achieved by controlling a transition period of each edge. Since the transition period can be changed by adjusting a power to drive signals, a circuit having a relatively simple configuration can implement the phase-adjustment function.

Further, a semiconductor device according to the present invention includes a first input buffer receiving a clock signal from an external source, a first phase-adjustment circuit adjusting phases of rising edges and falling edges of the clock signal supplied from the input buffer, and a timing-detection circuit receiving the clock signal having an adjusted phase from the first phase-adjustment circuit and controlling the first phase-adjustment circuit such that relative phases between the rising edges and the falling edges satisfy a predetermined phase relation.

According to another aspect of the present invention, the semiconductor device is such that the timing-detection circuit controls the first phase-adjustment circuit such that the clock signal has a HIGH-level period and a LOW-level period substantially equal to each other.

According to another aspect of the present invention, the semiconductor device further includes a second input buffer receiving another signal from an external source, and a second phase-adjustment circuit for adjusting phases of rising edges and falling edges of the another signal, wherein the timing-detection circuit applies the same control to the second phase-adjustment circuit and to the first phase-adjustment circuit.

In the semiconductor device described above, an input circuit of the semiconductor device adjusts phases of rising edges and falling edges of the clock signal externally provided such that the clock signal has a HIGH-level period and a LOW-level period equal to each other, thereby reducing a rise-and-fall skew of the clock signal. Further, the same phase adjustment that is applied to the clock signal is also applied to other input signals, thereby reducing rise-and-fall skews in the other input signals.

Further, a semiconductor device according to the present invention includes a first phase-adjustment circuit adjusting phases of rising edges and falling edges of a clock signal supplied from an internal source, a timing-detection circuit receiving the clock signal having an adjusted phase from the first phase-adjustment circuit and controlling the first phase-adjustment circuit such that relative phases between the rising edges and the falling edges satisfy a predetermined phase relation, a second phase-adjustment circuit for adjusting phases of rising edges and falling edges of another signal supplied from an internal source, and an output buffer outputting the another signal having a phase thereof adjusted by the second phase-adjustment circuit, wherein the timing-detection circuit applies the same control to the second phase-adjustment circuit and to the first phase-adjustment circuit.

According to one aspect of the present invention, the semiconductor device is such that the timing-detection circuit controls the first phase-adjustment circuit such that the clock signal has a HIGH-level period and a LOW-level period substantially equal to each other.

According to another aspect of the present invention, the semiconductor device further includes an output buffer and an input buffer provided between the first phase-adjustment circuit and the timing-detection circuit.

In the semiconductor device described above, an output circuit of the semiconductor device adjusts phases of rising edges and falling edges of the clock signal supplied from an internal circuit such that the clock signal has a HIGH-level period and a LOW-level period equal to each other, thereby reducing a rise-and-fall skew of the clock signal. Further, the same phase adjustment that is applied to the clock signal is also applied to output signals, thereby reducing rise-and-fall skews in the output signals.

Further, a circuit according to the present invention includes a first phase-adjustment circuit adjusting phases of rising edges and falling edges of a signal, and a period-comparison circuit receiving a phase-adjusted signal from the first phase-adjustment circuit, and comparing a first period extending from one of the rising edges to a following one of the falling edges with a second period extending from one of the falling edges to a following one of the rising edges so as to control the first phase-adjustment circuit such that the first period and the second period are substantially equal to each other.

According to one aspect of the present invention, the circuit is such that the first phase-adjustment circuit adjusts phases by adjusting transition periods of the rising edges and the falling edges.

According to another aspect of the present invention, the circuit further includes a second phase-adjustment circuit for adjusting phases of rising edges and falling edges of another signal, wherein the period-comparison circuit applies the same control to the second phase-adjustment circuit and to the first phase-adjustment circuit.

According to another aspect of the present invention, the circuit is such that the period-comparison circuit includes a first measurement circuit measuring the first period, a second measurement circuit measuring the second period, and a measurement-result-comparison circuit comparing a measurement result of the first measurement circuit with a measurement result of the second measurement circuit.

According to another aspect of the present invention, the circuit is such that the first measurement circuit includes a first series of delay elements and measures the first period by a number of the delay elements through which a first signal propagating through the first series of delay elements passes through in the first period, and wherein the second measurement circuit includes a second series of delay elements and measures the second period by a number of the delay elements through which a second signal propagating through the second series of delay elements passes through in the second period.

According to another aspect of the present invention, the circuit is such that the first measurement circuit further includes a series of first latches each corresponding to respective one of the delay elements in the first series of delay elements, some of the first latches latching a first level when the some of the first latches correspond to the delay elements through which the first signal pass in the first period, remaining ones of the first latches latching a second level, and the second measurement circuit further includes a series of second latches each corresponding to respective one of the delay elements in the second series of delay elements, some of the second latches latching the first level when the some of the second latches correspond to the delay elements through which the second signal pass in the second period, remaining ones of the second latches latching the second level, wherein the measurement-result-comparison circuit includes a circuit for comparing the first period with the second period based on information regarding a difference between a level latched by one of the first latches and a level latched by a corresponding one of the second latches.

According to another aspect of the present invention, the circuit is such that the period-comparison circuit includes a first circuit measuring the first period, a second circuit indicating a point of time following the one of the falling edges such that a period extending from the one of the falling edges to the point of time is equal to the first period measured by the first circuit, and a third circuit comparing timings between the following one of the rising edges and the point of time.

According to another aspect of the present invention, the circuit is such that the period-comparison circuit includes a first circuit measuring the second period, a second circuit indicating a point of time following the one of the rising edges such that a period extending from the one of the rising edges to the point of time is equal to the second period measured by the first circuit, and a third circuit comparing timings between the following one of the following edges and the point of time.

According to another aspect of the present invention, the circuit is such that the first phase-adjustment circuit includes an edge-adjustment circuit changing the phases of the rising edges and the falling edges of the signal, and a phase-shift hold circuit holding parameters for defining an amount of phase changes of the edge-adjustment circuit, the parameters successively updated based on which one of the first period and the second period is the longest.

According to another aspect of the present invention, the circuit is such that the phase-shift hold circuit includes a shift register.

According to another aspect of the present invention, the circuit is such that the edge-adjustment circuit changes an output-signal level thereof over a first transition period in response to a rising edge of the signal, and changes the output signal level over a second transition period in response to a falling edge of the signal, the edge-adjustment circuit adjusting the first transition period and the second transition period to change the phases.

According to another aspect of the present invention, the circuit is such that the edge-adjustment circuit changes the first transition period and the second transition period by changing a driving force for driving an output signal.

According to another aspect of the present invention, the circuit is such that the edge-adjustment circuit includes an inverter including at least one PMOS transistor and at least one NMOS transistor, a plurality of first transistors inserted between the at least one PMOS transistor and a power voltage, and a plurality of second transistors inserted between the at least one NMOS transistor and a ground voltage, wherein the phases of the rising edges and the falling edges are changed by changing a number of driven transistors among the first transistors and a number of driven transistors among the second transistors.

In the circuit described above, the HIGH-level period and the LOW-level period of the clock signal are compared with each other, and phases of rising edges and falling edges of the clock signal are adjusted such that the HIGH-level period and the LOW-level period become equal, thereby reducing a rise-and-fall skew of the clock signal. Further, the same phase adjustment that is applied to the clock signal is also applied to other signals, thereby reducing rise-and-fall skews in the other signals. The phase adjustment of the rising edges and falling edges is readily achieved by controlling a transition period of each edge. Since the transition period can be changed by adjusting a power to drive signals, a circuit having a relatively simple configuration can implement the phase-adjustment function. Further, the HIGH-level period and the LOW-level period of the clock signal are measured by counting how many delay elements a given signal can pass through in a period to be measured when the given signal is input to a series of delay elements. Namely, a circuit having a relatively simple configuration can implement the period measurement and comparison functions.

Further, a semiconductor device according to the present invention includes a first input buffer receiving a clock signal from an external source, a first phase-adjustment circuit adjusting phases of rising edges and falling edges of the clock signal supplied from the first input buffer, and a period-comparison circuit receiving a phase-adjusted signal from the first phase-adjustment circuit, and comparing a first period extending from one of the rising edges to a following one of the falling edges with a second period extending from one of the falling edges to a following one of the rising edges so as to control the first phase-adjustment circuit such that the first period and the second period are substantially equal to each other.

According to one aspect of the present invention, the semiconductor device further includes a second input buffer receiving another signal, and a second phase-adjustment circuit for adjusting phases of rising edges and falling edges of the another signal supplied from the second input buffer, wherein the period-comparison circuit applies the same control to the second phase-adjustment circuit and to the first phase-adjustment circuit.

In the semiconductor device described above, an input circuit of the semiconductor device compares a HIGH-level period with a LOW-level period of the clock signal externally provided, and adjusts phases of rising edges and falling edges of the clock signal such that the HIGH-level period and the LOW-level period become equal, thereby reducing a rise-and-fall skew of the clock signal. Further, the same phase adjustment that is applied to the clock signal is also applied to other input signals, thereby reducing rise-and-fall skews in the other input signals.

Further, a semiconductor device according to the present invention includes a first phase-adjustment circuit adjusting phases of rising edges and falling edges of a clock signal supplied from an internal source, a period-comparison circuit receiving a phase-adjusted signal from the first phase-adjustment circuit, and comparing a first period extending from one of the rising edges to a following one of the falling edges with a second period extending from one of the falling edges to a following one of the rising edges so as to control the first phase-adjustment circuit such that the first period and the second period are substantially equal to each other, a second phase-adjustment circuit adjusting phases of rising edges and falling edges of another signal supplied from an internal source, and an output buffer outputting the another signal having a phase thereof adjusted by the second phase-adjustment circuit, wherein the period-comparison circuit applies the same control to the second phase-adjustment circuit and to the first phase-adjustment circuit.

According to one aspect of the present invention, the semiconductor device further includes an output buffer and an input buffer provided between the first phase-adjustment circuit and the period-comparison circuit.

In the semiconductor device described above, an output circuit of the semiconductor device compares a HIGH-level period with a LOW-level period of the clock signal supplied from an internal circuit, and adjusts phases of rising edges and falling edges of the clock signal such that the HIGH-level period and the LOW-level period become equal, thereby reducing a rise-and-fall skew of the clock signal. Further, the same phase adjustment that is applied to the clock signal is also applied to output signals, thereby reducing rise-and-fall skews in the output signals.

It is yet another object of the present invention to provide a circuit which can reduce an inter-signal skew without being affected by a common skew which is equally present in signals.

In order to achieve the above object, a circuit according to the present invention includes a first skew-reduction circuit receiving signals inclusive of a clock signal and reducing a relative timing displacement between a rising edge and a falling edge in each of the signals, and a second skew-reduction circuit reducing edge-timing differences between the signals output from the first skew-reduction circuit.

According to one aspect of the present invention, the circuit is such that the first skew-reduction circuit includes edge-adjustment circuits, each provided for a corresponding one of the signals, adjusting a relative timing between a rising edge and a falling edge of the corresponding one of the signals, the edge-adjustment circuits outputting adjusted signals, and a skew-measurement circuit controlling one of the edge-adjustment circuits corresponding to the clock signal such that an adjusted clock signal output from the one of the edge-adjustment circuits has a HIGH-level period and a LOW-level period equal to each other, and controlling remaining ones of the edge-adjustment circuits in the same manner as the one of the edge-adjustment circuits.

According to another aspect of the present invention, the circuit is such that the skew-measurement circuit receives the adjusted clock signal to compare the HIGH-level period and the LOW-level period of the adjusted clock signal, and controls the one of the edge-adjustment circuits corresponding to the clock signal such that the HIGH-level period and the LOW-level period become equal to each other, the skew-measurement circuit controlling the remaining ones of the edge-adjustment circuits in the same manner as the one of the edge-adjustment circuits.

According to another aspect of the present invention, the circuit is such that the skew-measurement circuit receives the clock signal to measure the relative timing displacement between a rising edge and a falling edge of the clock signal, and controls the one of the edge-adjustment circuits corresponding to the clock signal based on a measurement of the relative timing displacement such that the HIGH-level period and the LOW-level period of the adjusted clock signal become equal to each other, the skew-measurement circuit controlling the remaining ones of the edge-adjustment circuits in the same manner as the one of the edge-adjustment circuits.

According to another aspect of the present invention, the circuit is such that the second skew-reduction circuit includes first delay circuits, each provided for a corresponding one of the signals excluding the clock signal, delaying the adjusted signals to output delayed signals, and inter-signal-skew-measurement circuits, each provided for a corresponding one of the first delay circuits, measuring a phase difference between a corresponding one of the delayed signals and the adjusted clock signal and adjusting a delay of a corresponding one of the first delay circuits such that the phase difference becomes substantially zero.

According to another aspect of the present invention, the circuit is such that the second skew-reduction circuit further includes a clock-buffer circuit delaying the adjusted clock signal by a predetermined length of delay to output a delayed clock signal, and latch circuits, each provided for a corresponding one of the first delay circuits, latching a corresponding one of the delayed signals by using the delayed clock signal as a synchronization signal.

In the circuits described above, the first skew-reduction circuit reduces a rise-and-fall skew in each of the signals, and the second skew-reduction circuit reduces inter-signal skews between the signals. Therefore, the second-skew reduction circuit can achieve a highly accurate inter-signal skew reduction without being affected by a rise-and-fall skew which is equally present in each of the signals.

According to another aspect of the present invention, the circuit further includes a third skew-reduction circuit, provided between the first skew-reduction circuit and the second skew-reduction circuit, narrowing a gap between a timing of the adjusted clock signal and a timing distribution of the adjusted signals excluding the adjusted clock signal.

According to another aspect of the present invention, the circuit is such that the third skew-reduction circuit includes second delay circuits, each provided for a corresponding one of the signals excluding the clock signal, delaying the adjusted signals to output delayed signals, a third delay circuit delaying the adjusted clock signal to output a delayed clock signal, and a clock-skew-measurement circuit adjusting a delay of one of the second delay circuits and a delay of the third delay circuit such that one of the delayed signals corresponding to the one of the second delay circuits has a phase substantially equal to a phase of the delayed clock signal, and setting the same delay in remaining ones of the second delay circuits as a delay set in the one of the second delay circuits.

In the circuit described above, the third skew-reduction circuit is provided between the first skew-reduction circuit and the second skew-reduction circuit in order to bring a timing of the clock signal closer to a timing of other signals, taking into account the fact that the clock signal is likely to have an isolated timing. Since the timing of the clock signal is brought closer to the timing of other signals in advance, it is sufficient for the second skew-reduction circuit to adjust timings within only a limited range of phase adjustment when reducing inter-signal skews between the signals. Namely, a circuit having a relatively small circuit size can achieve a highly accurate inter-signal-skew reduction.

According to another aspect of the present invention, the circuit is such that the skew-measurement circuit includes a first circuit measuring a first duration of a first period ranging from a rising edge to a falling edge of the adjusted clock signal, a second circuit measuring a second duration of a second period ranging from a falling edge to a rising edge of the adjusted clock signal, and a comparison circuit comparing the first duration measured by the first circuit with the second duration measured by the second circuit.

According to another aspect of the present invention, the circuit is such that the first circuit includes a series of first delay elements, and measures the first duration of the first period based on a number of the first delay elements through which a signal passes in the first period, and wherein the second circuit includes a series of second delay elements, and measures the second duration of the second period based on a number of the second delay elements through which a signal passes in the second period.

According to another aspect of the present invention, the circuit is such that each of the edge-adjustment circuits includes a series of third delay elements delaying the corresponding one of the signals by a first delay to generate a first delayed signal, a series of fourth delay elements delaying the corresponding one of the signals by a second delay to generate a second delayed signal, and a circuit combining the first delayed signal and the second delayed signal to generate a corresponding one of the adjusted signals.

According to another aspect of the present invention, the circuit is such that the first skew-reduction circuit receives calibration-purpose signal patterns as the signals when there is a need to reduce edge-timing differences between the signals, the calibration-purpose signal patterns having edge timings coinciding with at least some edges of the clock signal.

According to another aspect of the present invention, the circuit is such that the calibration-purpose signal patterns include a plurality of signal patterns.

In the circuits described above, the first skew-reduction circuit reduces a rise-and-fall skew in each of the signals, and the second skew-reduction circuit reduces inter-signal skews between the signals. Therefore, the second-skew reduction circuit can achieve a highly accurate inter-signal skew reduction without being affected by a rise-and-fall skew which is equally present in each of the signals.

Further, according to the present invention, a semiconductor device receiving signals inclusive of a clock signal includes an input interface unit, wherein the input interface unit includes a first skew-reduction circuit reducing a relative timing displacement between a rising edge and a falling edge in each of the signals, and a second skew-reduction circuit reducing edge-timing differences between the signals output from the first skew-reduction circuit, wherein rise-and-fall skews of the signals and inter-signal skews between the signals are reduced by the input interface unit.

According to one aspect of the present invention, the circuit is such that the first skew-reduction circuit includes edge-adjustment circuits, each provided for a corresponding one of the signals, adjusting a relative timing between a rising edge and a falling edge of the corresponding one of the signals, the edge-adjustment circuits outputting adjusted signals, and a skew-measurement circuit controlling one of the edge-adjustment circuits corresponding to the clock signal such that an adjusted clock signal output from the one of the edge-adjustment circuits has a HIGH-level period and a LOW-level period equal to each other, and controlling remaining ones of the edge-adjustment circuits in the same manner as the one of the edge-adjustment circuits.

According to another aspect of the present invention, the semiconductor device is such that the second skew-reduction circuit includes delay circuits, each provided for a corresponding one of the signals excluding the clock signal, delaying the adjusted signals to output delayed signals, and inter-signal-skew-measurement circuits, each provided for a corresponding one of the delay circuits, measuring a phase difference between a corresponding one of the delayed signals and the adjusted clock signal and adjusting a delay of a corresponding one of the delay circuits such that the phase difference becomes substantially zero.

According to another aspect of the present invention, the semiconductor device is such that the second skew-reduction circuit further includes a clock-buffer circuit delaying the adjusted clock signal by a predetermined length of delay to output a delayed clock signal, and latch circuits, each provided for a corresponding one of the delay circuits, latching a corresponding one of the delayed signals by using the delayed clock signal as a synchronization signal.

In the semiconductor device described above, the input interface unit of the semiconductor device uses the first skew-reduction circuit to reduce a rise-and-fall skew in each of the signals, and uses the second skew-reduction circuit to reduce inter-signal skews between the signals. With this configuration, the input interface unit can achieve a highly accurate inter-signal skew reduction without being affected by a rise-and-fall skew which is equally present in each of the signals. The semiconductor device is thus able to use signals which have highly accurate timings with reduced skews, and can operate at a high speed using high-frequency signals.

According to another aspect of the present invention, the semiconductor device further includes a third skew-reduction circuit, provided between the first skew-reduction circuit and the second skew-reduction circuit, narrowing a gap between a timing of the adjusted clock signal and a timing distribution of the adjusted signals excluding the adjusted clock signal.

In the semiconductor device described above, the input interface unit is provided with the third skew-reduction circuit between the first skew-reduction circuit and the second skew-reduction circuit in order to bring a timing of the clock signal closer to a timing of other signals, taking into account the fact that the clock signal is likely to have an isolated timing. Since the timing of the clock signal is brought closer to the timing of other signals in advance, it is sufficient for the second skew-reduction circuit to adjust timings within only a limited range of phase adjustment when reducing inter-signal skews between the signals. Namely, a circuit having a relatively small circuit size can achieve a highly accurate inter-signal-skew reduction.

Other objects and further features of the present invention will be apparent from the following detailed description when read in conjunction with the accompanying drawings.

BRIEF DESCRIPTION OF THE DRAWINGS

FIGS. 6A and 6B are timing charts for explaining how edge timings of the signals S8 through S11 relate to edges of a phase-adjusted clock signal and a delayed-clock signal;

FIGS. 7A and 7B are timing charts showing a situation in which a delay is too large if judged by using rising edges of the delayed-clock signal, and is too small if judged based on falling edges of the delayed-clock signal;

FIGS. 25A through 25L are timing charts showing signals S0 through S9 of FIG. 24;

FIG. 23 is applied;

FIG. 56 is a block diagram of a semiconductor device to which the skew-reduction circuit of FIG. 39 is applied;

DESCRIPTION OF THE PREFERRED EMBODIMENTS

In the following, principles and embodiments of the present invention will be described with reference to the accompanying drawings.

Figure 1A:
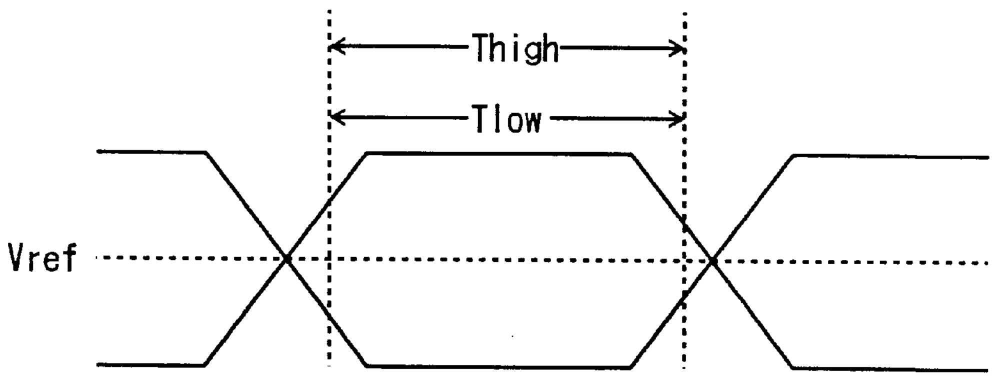
FIGS. 1A and 1B are timing charts for explaining a rise-and-fall skew of a clock signal.
Figure 1B:
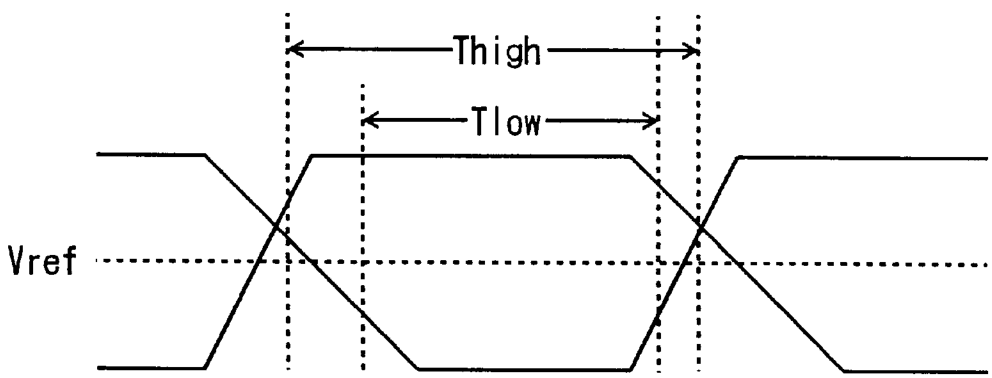
Figure 2:
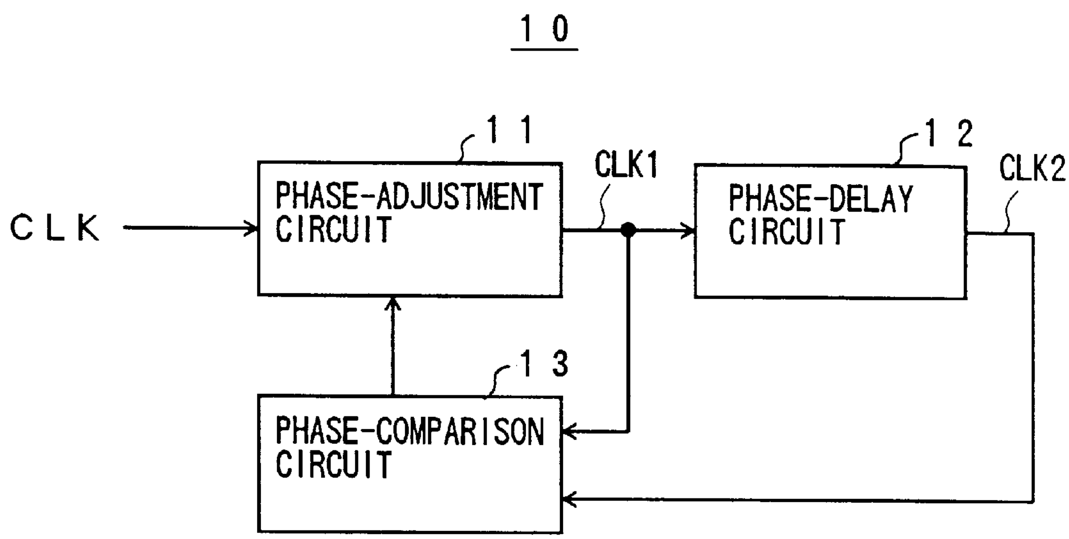
FIG. 2 is a block diagram of a skew-reduction circuit according to a principle of the present invention.

FIG. 2 is a block diagram of a skew-reduction circuit according to a principle of the present invention. A skew-reduction circuit 10 includes a phase-adjustment circuit 11, a phase-delay circuit 12, and a phase-comparison circuit 13. The phase-adjustment circuit 11 receives a clock signal CLK, and adjusts a phase of the clock signal CLK to output a phase-adjusted clock signal CLK1. The phase-adjusted clock signal CLK1 is supplied to a phase-delay circuit 12. The phase-delay circuit 12 delays the phase-adjusted clock signal CLK1 by a predetermined phase amount to generate a delayed-clock signal CLK2. The phase-adjusted clock signal CLK1 and the delayed-clock signal CLK2 are input to the phase-comparison circuit 13. The phase-comparison circuit 13 compares phases of edges between the phase-adjusted clock signal CLK1 and the delayed-clock signal CLK2, and controls the phase-adjustment circuit 11 such that these edges satisfy a predetermined phase relationship. In detail, the phase-adjustment circuit 11 is controlled to output the phase-adjusted clock signal CLK1 having the period Thigh and the period Tlow equal to each other.

The phase-adjustment circuit 11 has a function to adjust a rise timing and a fall timing of the clock signal CLK in different directions, respectively. Namely, an adjustment to reset a rise timing forward or backward with regard to time can be made in a different direction from an adjustment to reset a fall timing forward or backward. For example, the rise timing may be delayed, while the fall timing is advanced. Through such adjustments, the phase-adjusted clock signal CLK1 is controlled to have the period Thigh and the period Tlow equal to each other.

The phase-delay circuit 12 employs a series of delay elements to delay the phase-adjusted clock signal CLK1 by a predetermined phase amount. This predetermined phase amount is 180°, so that the phase-adjusted clock signal CLK1 is delayed by T/2 when the cycle of the phase-adjusted clock signal CLK1 is T.

The phase-comparison circuit 13 compares phases between a rising edge of the phase-adjusted clock signal CLK1 and a falling edge of the delayed-clock signal CLK2, and controls the phase-adjustment circuit 11 such that these edges have the same timing. Alternately, a falling edge of the phase-adjusted clock signal CLK1 and a rising edge of the delayed-clock signal CLK2 may be compared with each other in terms of their phases, and the phase-adjustment circuit 11 is controlled to set these edges at the same timing. Through such adjustments, the phase-adjusted clock signal CLK1 is controlled to have the period Thigh and the period Tlow equal to each other.

Figure 3:
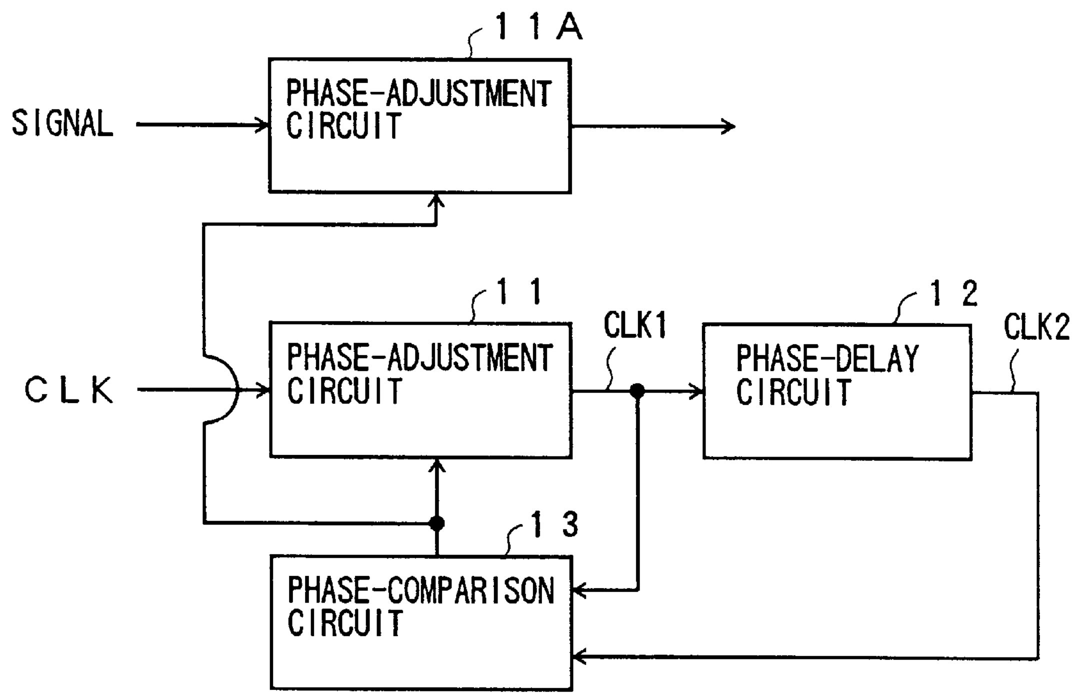
FIG. 3 is a block diagram showing a configuration in which the skew-reduction circuit of FIG. 2 is used for a skew reduction of another signal in addition to a clock signal.

FIG. 3 is a block diagram showing a configuration in which the skew-reduction circuit 10 is used for a skew reduction of another signal in addition to a clock signal. In FIG. 3, the control signal from the phase-comparison circuit 13 is not only supplied to the phase-adjustment circuit 11 receiving the clock signal CLK, but also supplied to a phase-adjustment circuit 11A receiving another signal. The phase-adjustment circuit 11A carries out the same phase adjustment as that of the phase-adjustment circuit 11 with respect to the received signal.

As previously described, factors causing a rise-and-fall skew work identically on each signal. When a phase adjustment for reducing a rise-and-fall skew of the clock signal is also applied to another signal as shown in FIG. 3, therefore, a rise-and-fall skew of this signal can also be reduced. In this manner, rise-and-fall skews of other signals are reduced based on the clock signal CLK.

As described above, the skew-reduction circuit 10 of the present invention includes the phase-adjustment circuit 11 for adjusting a phase of the clock signal CLK and the phase-delay circuit 12 for delaying the phase-adjusted clock signal CLK1 by the predetermined phase amount, and compares phases of edges between the phase-adjusted clock signal CLK1 and the delayed-clock signal CLK2 to control the phase-adjustment circuit 11 such that these edges satisfy a predetermined phase relation. This achieves a proper adjustment of the phase-adjusted clock signal CLK1 so that the phase-adjusted clock signal CLK1 have the period Thigh and the period Tlow the same as each other, thereby reducing the rise-and-fall skew of the clock signal CLK. Further, based on the clock signal CLK, rise-and-fall skews of other signals can also be reduced by drawing on the fact that rise-and-fall skews are identical with respect to each signal.

In the following, embodiments of the above-described principle will be described with reference to the accompanying drawings.

Figure 4:
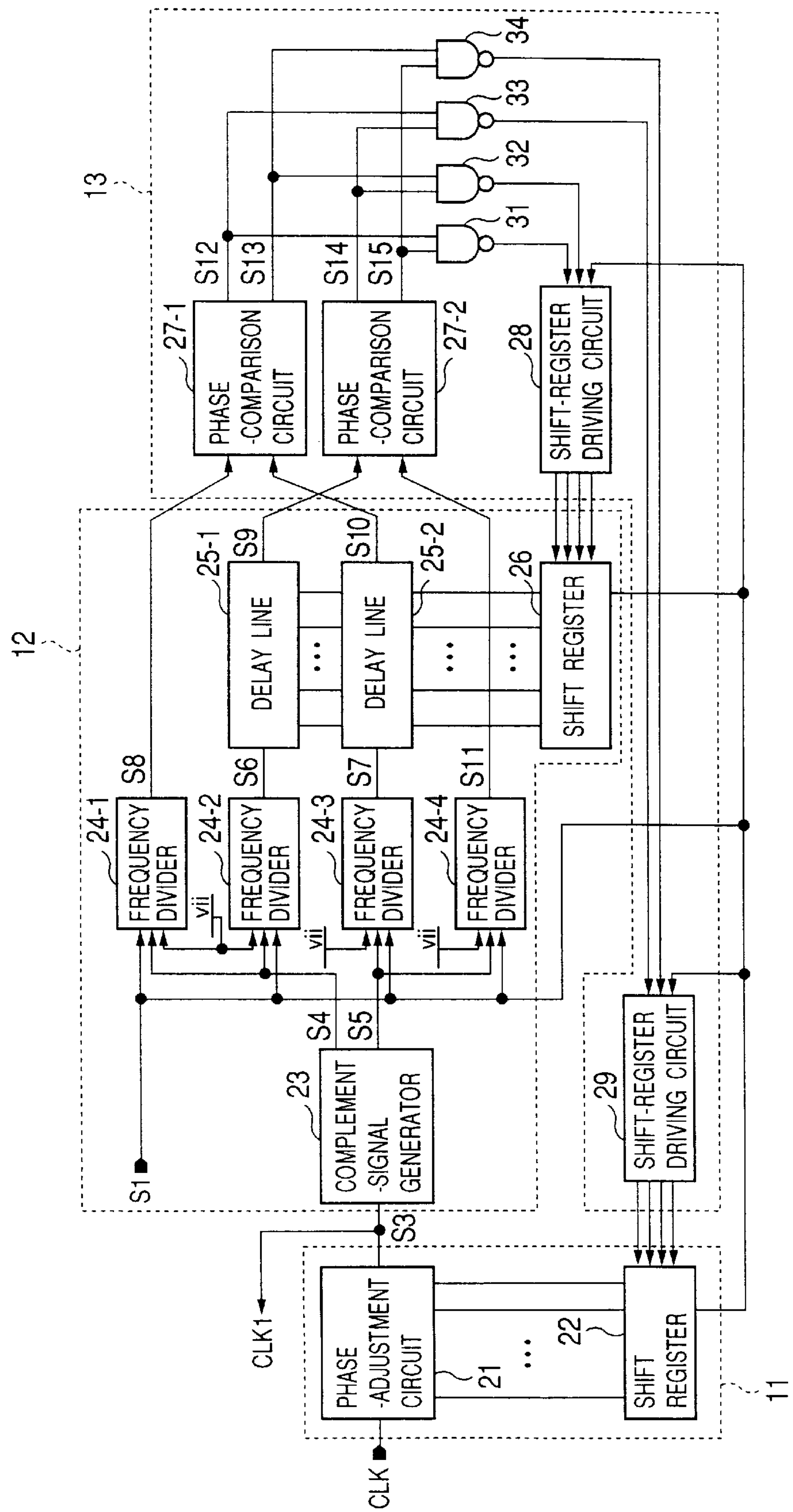
FIG. 4 is a block diagram of a skew-reduction circuit according to an embodiment of the present invention.
Figures 5A, 5B, 5C, 5D, 5E, 5F, 5G, 5H, 5I, 5J, 5K, 5L, 5M, 5N, 5O:
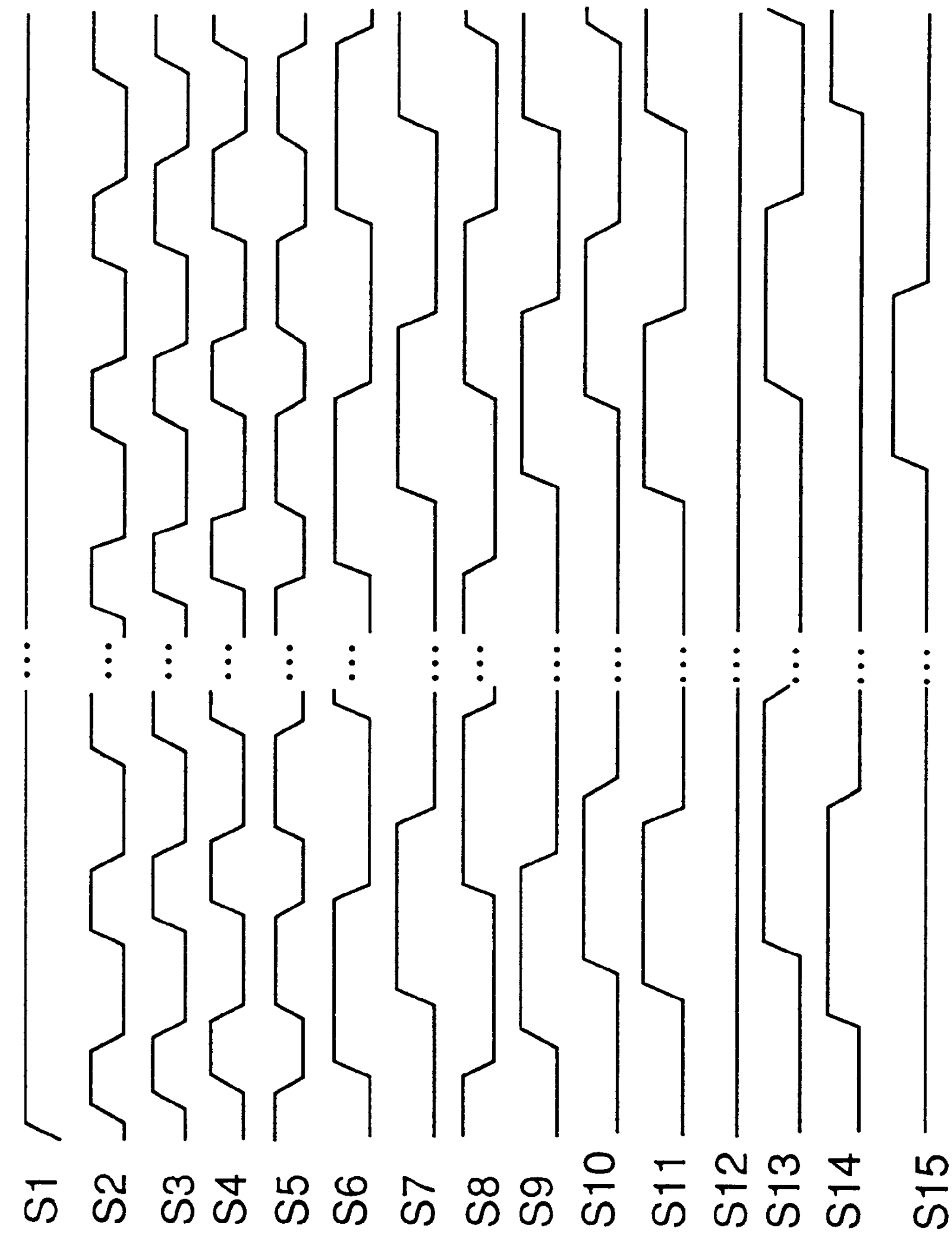
FIGS. 5A through 5O are timing charts showing signals S1 through S15 of FIG. 4.

FIG. 4 is a block diagram of a skew-reduction circuit according to an embodiment of the present invention. FIGS. 5A through 5O are timing charts showing signals S1 through S15 of FIG. 4. In FIGS. 5A through 5O, a left half of the figures exhibit phase relations between the signals prior to a completion of desired phase adjustment, and a right half of the figures illustrate the phase relations after the completion of the desired phase adjustment.

The skew-reduction circuit of FIG. 4 receives the clock signal CLK (signal S2), and outputs the phase-adjusted clock signal CLK1 (signal S3) after reducing a rise-and-fall skew of the clock signal CLK.

The skew-reduction circuit of FIG. 4 includes the phase-adjustment circuit 11, the phase-delay circuit 12, and the phase-comparison circuit 13.

The phase-adjustment circuit 11 includes a phase-adjustment circuit 21 and a shift register 22. The phase-adjustment circuit 21 adjusts a phase of the received signal S2 (CLK), and generates the phase adjusted signal S3 (CLK1). The signal S3 is supplied to the phase-delay circuit 12.

The phase-delay circuit 12 includes a complement-signal generator 23, frequency dividers 24-1 through 24-4, delay lines 25-1 and 25-2, and a shift register 26. Operations of the phase-delay circuit 12 will be later described in detail. In brief, the complement-signal generator 23 generates complement signals S4 and S5 in response to the signal S3 as shown in FIGS. 5D and 5E. The frequency dividers 24-1 and 24-2 divide a frequency of the signal S4 by half to generate complement signals S6 and S8 which toggles at rising edges of the signal S4. The frequency dividers 24-3 and 24-4 divide a frequency of the signal S5 by half to generate signals S7 and S11 which toggles at rising edges of the signal S5. The delay line 25-1 delays the signal S6 to generate a signal S9, and the delay line 25-2 delays a signal S7 to generate a signal S10. The delays introduced by the delay line 25-1 and the delay line 25-2 are the same. The signals S8, S9, S10, and S11 are supplied from the phase-delay circuit 12 to the phase-comparison circuit 13.

The shift register 26 of the phase-delay circuit 12 is used for controlling the delays of the delay lines 25-1 and 25-2. To adjust the delays of the delay lines 25-1 and 25-2 to a predetermined delay amount, the shift register 26 operates under the control of a phase-comparison function of the phase-comparison circuit 13. The phase-comparison function of the phase-comparison circuit 13 relating to the control of the phase-delay circuit 12 may be included in the phase-delay circuit 12. In this case, feedback inputs to the phase-delay circuit 12 are no longer necessary, and a configuration becomes the same as that of FIG. 2. In FIG. 4, the phase-comparison function relating to the phase-delay circuit 12 is performed by utilizing the phase-comparison function of the phase-comparison circuit 13 in order to reduce a size of the circuit.

Among the signals supplied from the phase-delay circuit 12 to the phase-comparison circuit 13, each edge of the signal S8 coincides with rising edges of the phase-adjusted clock signal CLK1 (signal S3), and each edge of the signal S9 corresponds to rising edges of the phase-adjusted clock signal CLK1 (signal S3) with some delay. Further, each edge of the signal S10 corresponds to falling edges of the phase-adjusted clock signal CLK1 (signal S3) with some delay, and each edge of the signal S11 coincides with falling edges of the phase-adjusted clock signal CLK1 (signal S3). FIGS. 6A and 6B are timing charts for explaining how edge timings of the signals S8 through S11 relate to edges of the phase-adjusted clock signal CLK1 and the (imaginary) delayed-clock signal CLK2.

The phase-comparison circuit 13 includes phase-comparison circuits 27-1 and 27-2, shift-register driving circuits 28 and 29, and NAND circuits 31 through 34. The phase-comparison circuit 27-1 compares rising edges between the signal S8 and the signal S10, and turns a signal S12 to HIGH when the rising edge of the signal S8 is ahead of the rising edge of the signal S10. When the rising edge of the signal S10 is ahead of the other, on the other hand, a signal S13 is turned to HIGH. Since the target phase amount is 180°, the signal S12 is HIGH when the delay is too large, and the signal S13 is HIGH when the delay is too small, as can be seen in FIGS. 6A and 6B.

The phase-comparison circuit 27-2 compares rising edges between the signal S9 and the signal S11, and turns a signal S14 to HIGH when the rising edge of the signal S9 is ahead of the rising edge of the signal S11. When the rising edge of the signal S11 is ahead of the other, on the other hand, a signal S15 is turned to HIGH. Since the target phase amount is 180°, the signal S14 is HIGH when the delay is too small, and the signal S15 is HIGH when the delay is too large, as can be seen in FIGS. 6A and 6B.

The check of the delay amount by the phase-comparison circuit 27-1 is concerned with falling edges of the delayed-clock signal CLK2 shown in FIG. 6B. The check of the delay amount by the phase-comparison circuit 27-2 is made with respect to rising edges of the delayed-clock signal CLK2. During a process of adjusting a skew, the period Thigh and the period Tlow of the phase-adjusted clock signal CLK1 are not the same, so that the check of the delay amount by the phase-comparison circuit 27-1 may produce a different result from the check of the delay amount by the phase-comparison circuit 27-2. FIGS. 7A and 7B are timing charts showing a situation in which the delay is too large if judged by using the rising edges of the delayed-clock signal CLK2, and is too small if judged based on the falling edges of the delayed-clock signal CLK2.

The NAND circuit 31 of the phase-comparison circuit 13 controls the shift-register driving circuit 28 to reduce the amount of the delay when both the phase-comparison circuits 27-1 and 27-2 find that the delay is too large. That is, the delay is decreased when both the rising edges and the falling edges of the delayed-clock signal CLK2 show too large a delay. The NAND circuit 32 controls the shift-register driving circuit 28 to increase the amount of the delay when both the phase-comparison circuits 27-1 and 27-2 find that the delay is too small. That is, the delay is increased when both the rising edges and the falling edges of the delayed-clock signal CLK2 exhibit too small a delay. The shift-register driving circuit 28 controls the phase-delay circuit 12 to achieve an appropriate delay.

The NAND circuit 33 of the phase-comparison circuit 13 controls the shift-register driving circuit 29 to make rising edges delayed and falling edges advanced in the phase-adjusted clock signal CLK1 with regard to time when the phase-comparison circuit 27-1 finds too large a delay and the phase-comparison circuit 27-2 detects too small a delay. On the other hand, when the phase-comparison circuit 27-1 detects too small a delay and the phase-comparison circuit 27-2 finds too large a delay (e.g., as shown in FIGS. 7A and 7B), the NAND circuit 34 controls the shift-register driving circuit 29 to make the rising edges advanced and the falling edges delayed in the phase-adjusted clock signal CLK1. The shift-register driving circuit 29 controls the phase-adjustment circuit 11 to adjust the phase-adjusted clock signal CLK1 so that the phase-adjusted clock signal CLK1 has the period Thigh and the period Tlow equal to each other.

On the left half of FIGS. 5A through 5O is shown a case in which both of the phase-comparison circuits 27-1 and 27-2 detect too small a delay. As shown in the left half, the signals S13 and S14 are generated to adjust the delay through the shift-register driving circuit 28. On the right hand of FIGS. 5A through 5O is shown a case in which the delay has been already adjusted to the target delay amount (180°). The signals S13 and S15 are generated to adjust the period Thigh and the period Tlow through the shift-register driving circuit 29.

As described above, the skew-reduction circuit of FIG. 4 includes the phase-comparison circuit 13 to compare phases between the signals equivalent to the phase-adjusted clock signal CLK1 and the signals corresponding to the phase-delay circuit 12. Based on the phase-comparison results, the delay of the phase-delay circuit 12 is adjusted to the predetermined delay amount (180°), and, also, the phase-adjustment circuit 11 is controlled to output the phase-adjusted clock signal CLK1 having the period Thigh and the period Tlow equal to each other.

In what follows, each element of the skew-reduction circuit shown in FIG. 4 will be described.

Figure 8:
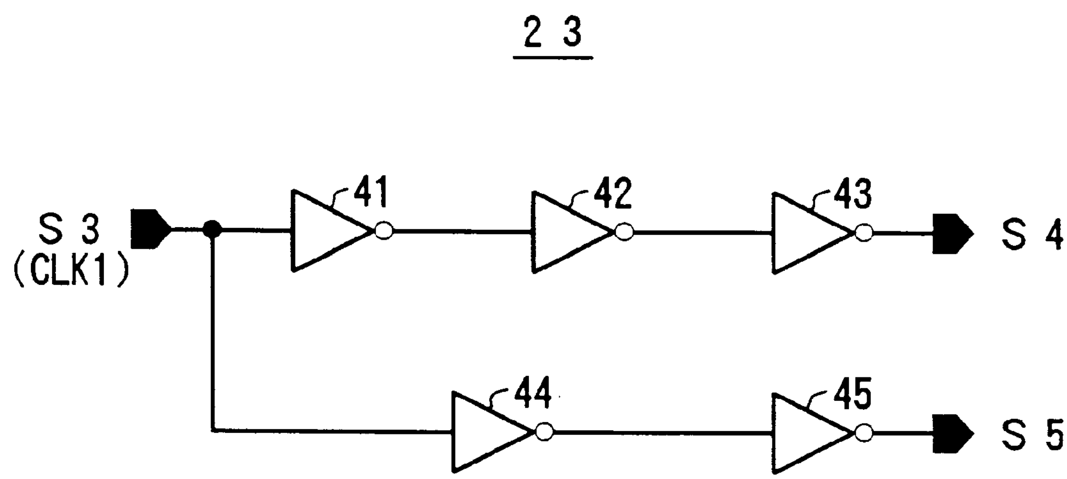
FIG. 8 is a circuit diagram of a complement-signal generator of a phase-delay circuit shown in FIG. 4.

FIG. 8 is a circuit diagram of the complement-signal generator 23 of the phase-delay circuit 12 shown in FIG. 4. The complement-signal generator 23 includes inverters 41 through 45. The signal S3 (phase-adjusted clock signal CLK1) is input, and the signal S4 having the same phase and the signal S5 having the opposite phase are output.

Figure 9:
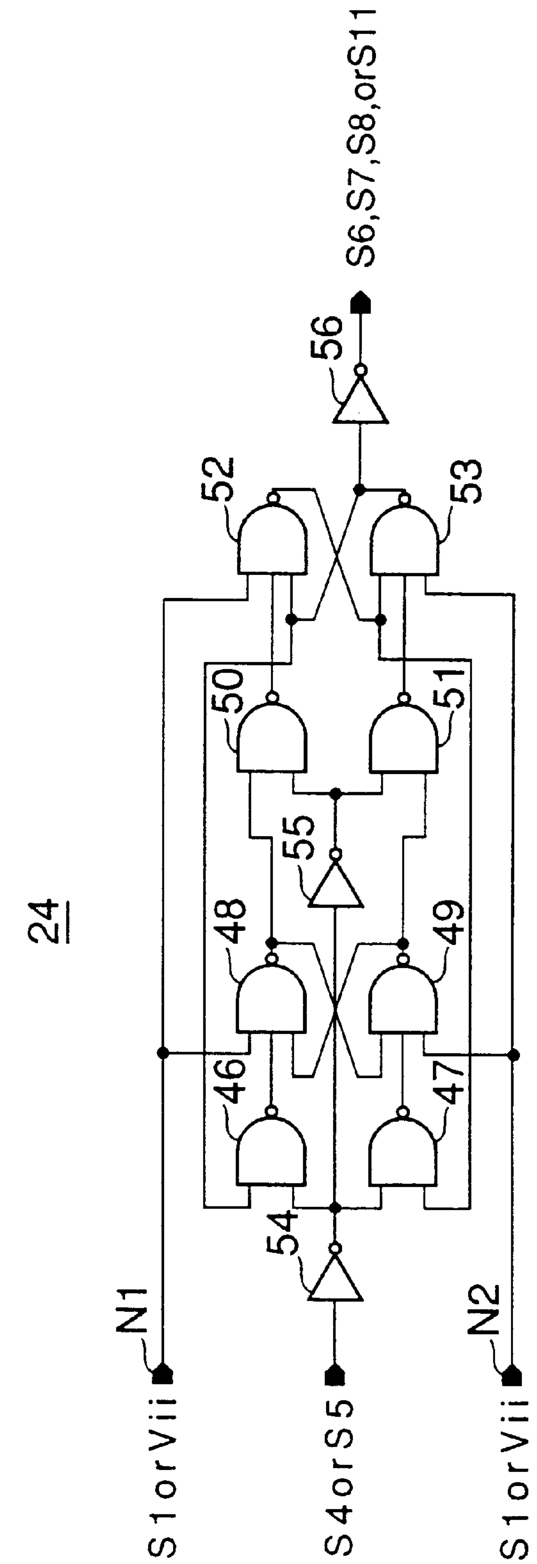
FIG. 9 is a circuit diagram of a frequency divider.

FIG. 9 is a circuit diagram of a frequency divider 24. The frequency divider 24 is uses as any one of the frequency dividers 24-1 through 24-4 in the phase-delay circuit 12 of FIG. 4.

The frequency divider 24 includes NAND circuits 46 through 53 and inverters 54 through 56, and divides a frequency of an input signal by half. The frequency divider 24 receives either the signal S4 or the signal S5 (shown in FIGS. 5D or 5E, respectively) as the input signal, and generates the signal S6, S7, S8, or S11. A reset signal S1 shown in FIG. 5A is supplied to either a node N1 or a node N2 in order to invert the phase of the output signal. A configuration of the frequency divider 24 is well within the scope of ordinary skill in the art, and a description of its operations will be omitted.

Figure 10:
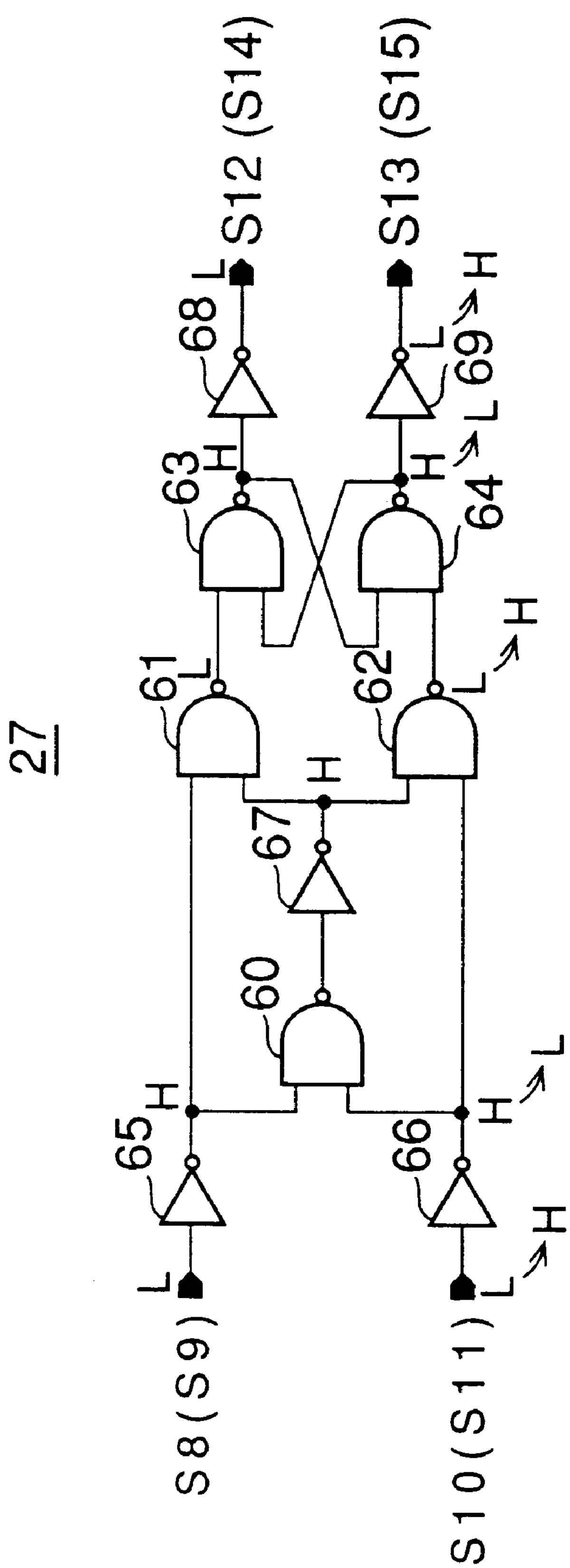
FIG. 10 is a circuit diagram of a phase-comparison circuit.

FIG. 10 is a circuit diagram of a phase-comparison circuit 27. The phase-comparison circuit 27 is used as any one of the phase-comparison circuits 27-1 and 27-2 in the phase-comparison circuit 13 shown in FIG. 4. The phase-comparison circuit 27 receives the signals S8 and S10 (or the signals S9 or S11), and outputs the signals S12 and S13 (or the signals S14 and S15).

The phase-comparison circuit 27 includes NAND circuits 60 through 64 and inverters 65 through 69. The NAND circuits 63 and 64 together form a latch. In this latch, two inputs are LOW at an initial state, and two outputs are HIGH, as shown in FIG. 10. Assume that a rising edge of the signal S10 (or S1) is ahead of a rising edge of the signal S8 (or S9). In this case, an output of the NAND circuit 62 becomes HIGH before an output of the NAND circuit 61 becomes HIGH. The NAND circuit 64 thus turns an output thereof into LOW, while the NAND circuit 63 keeps an output thereof at a HIGH level. This condition is latched, and, thus, does not change even when the output of the NAND circuit 61 is changed to HIGH by the rising edge of the signal S8 (or S9).

In this manner, when the rising edge of the signal S10 (or S11) is ahead of the rising edge of the signal S8 (or S9), the signal S12 (or S14) output from the phase-comparison circuit 27 remains at a LOW level, and the signal S13 (or S15) changes from LOW to HIGH. On the other hand, when the rising edge of the signal S8 (or S9) is ahead of the rising edge of the signal S10 (or S11), the signal S12 (or S14) changes from LOW to HIGH, while the signal S13 (or S15) remains at the LOW level.

In this manner, a check can be made as to which one of the two rising edges input to the phase-comparison circuit 27 is ahead of the other, by finding out which one of the two output signals from the phase-comparison circuit 27 is changed to HIGH.

An output of the inverter 67 is used for resetting the condition of the latch to an initial condition by simultaneously changing the outputs of the NAND circuits 61 and 62 to LOW at an appropriate timing. If such a configuration was not employed, the condition of the latch would be reversed when the signal S10 (or S11) returns to LOW ahead of the signal S8 (or S9) after the outputs of the NAND circuits 61 and 62 become HIGH, thereby changing the signal S12 (or S14) to HIGH. In order to avoid this, the outputs of the NAND circuits 61 and 62 are reset to LOW at the same time.

Figure 11:
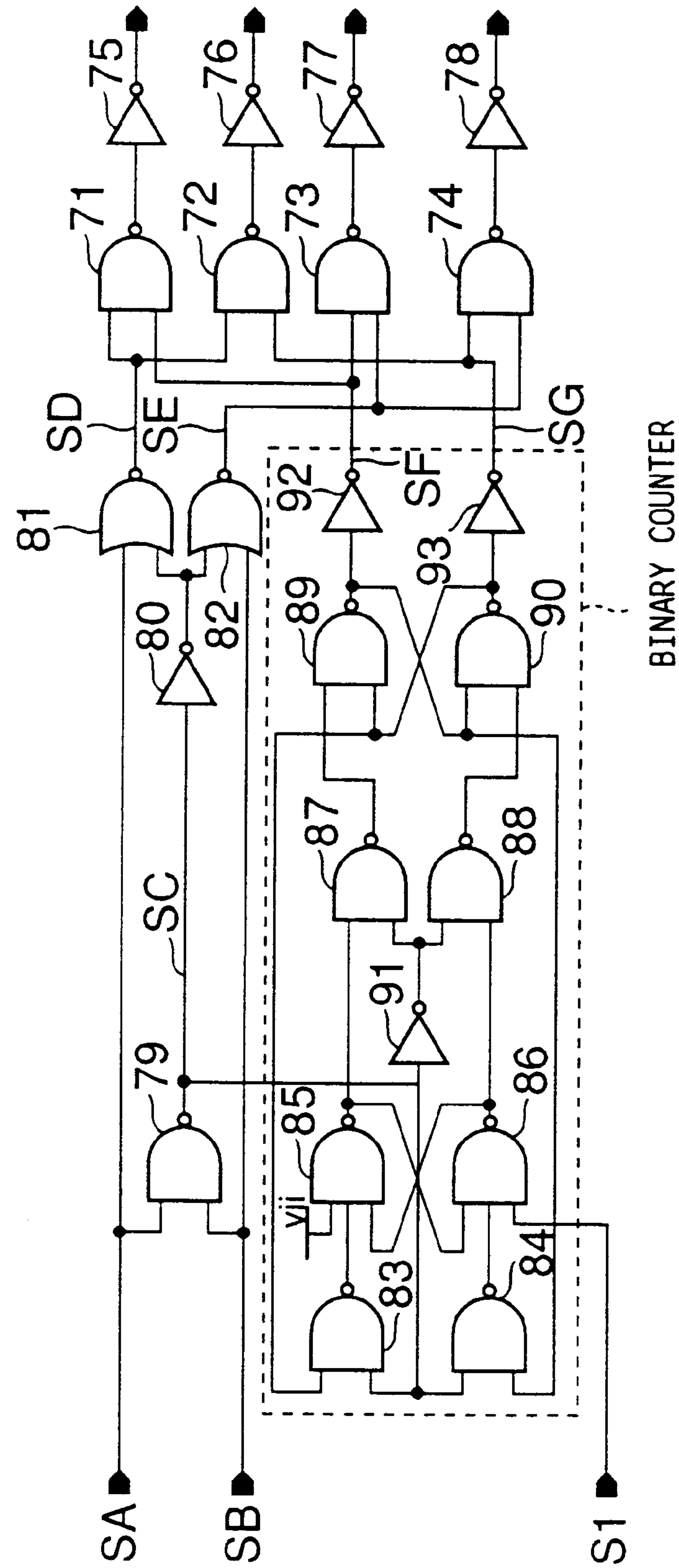
FIG. 11 is a circuit diagram of a shift-register driving circuit.

FIG. 11 is a circuit diagram of the shift-register driving circuit 28 (or 29).

The shift-register driving circuit 28 (29) includes NAND circuits 71 through 74, inverters 75 through 78, a NAND circuit 79, an inverter 80, NOR circuits 81 and 82, NAND circuits 83 through 90, and inverters 91 through 93. The NAND circuits 83 through 90 and the inverters 91 through 93 together form a binary counter.

Here, inputs to the shift-register driving circuit 28 (29) are referred to as signals SA and SB. In the case of the shift-register driving circuit 28, either the signal SA or the signal SB changes between HIGH and LOW at constant intervals, depending on whether the delay is to be increased or decreased. In the case of the shift-register driving circuit 29, either the signal SA or the signal SB changes between HIGH and LOW at constant intervals, depending on whether the period Thigh of the phase-adjusted clock signal CLK1 is to be elongated or shortened.

FIGS. 12A through 12G are timing charts showing signals SA through SG shown in FIG. 11. In an example of FIGS. 12A through 12G, the signal SA switches between HIGH and LOW at constant intervals, and the signal SB remains at HIGH.

A signal SC which is obtained by taking a NAND operation between the signal SA and the signal SB is supplied to the binary counter. Operations of the binary counter is well within the scope of ordinary skill in the art, and a description thereof will be omitted. The binary counter outputs signals SF and SG, which are a signal obtained by dividing a frequency of the signal SC by half and an inverse of this frequency-divided signal, respectively, as shown in FIGS. 12F and 12G.

The signals SA and SB pass through the NOR circuits 81 and 82 to become signals SD and SE, respectively.

The signal SD is supplied to the NAND circuits 71 and 72 from the NOR circuit 81, and the signal SE is provided to the NAND circuits 73 and 74 from the NOR circuit 82. The NAND circuits 71 and 72 also receive the signal SF from the binary counter, while the NAND circuits 73 and 74 receive the signal SG from the binary counter.

Figures 12A, 12B, 12C, 12D, 12E, 12F, 12G:
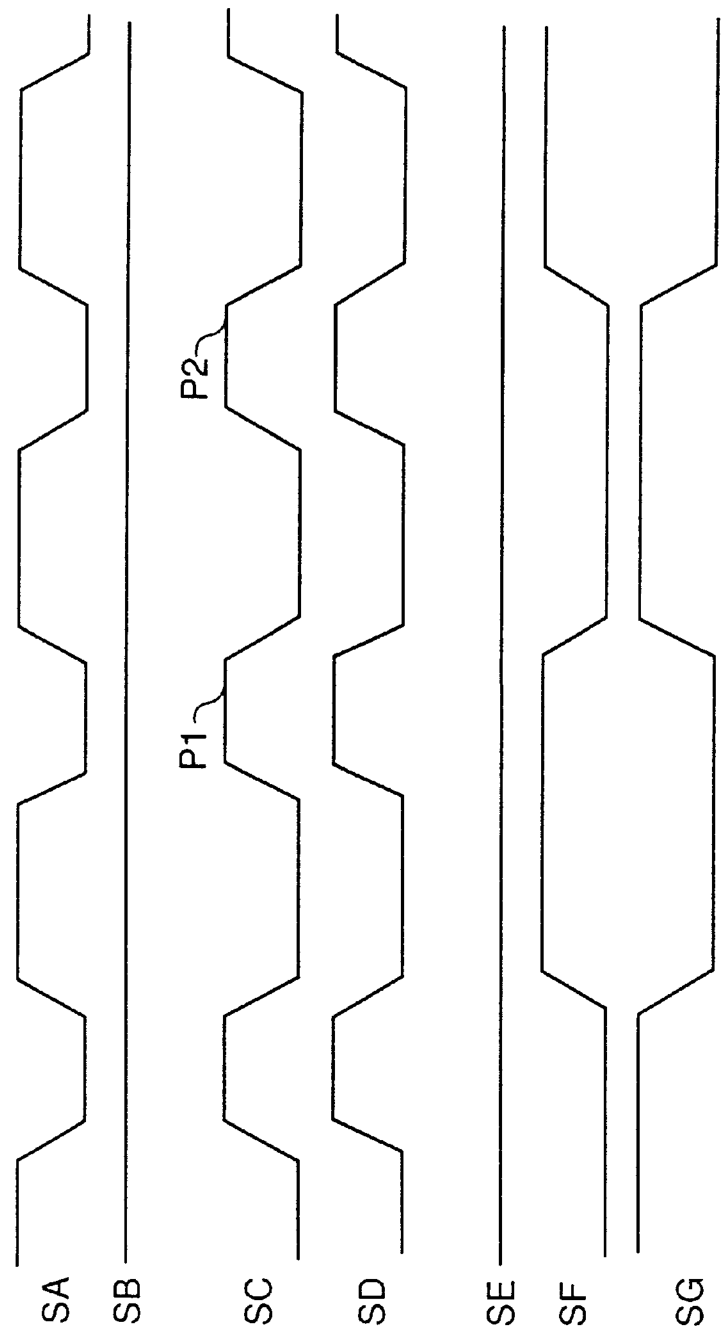
FIGS. 12A through 12G are timing charts showing signals SA through SG shown in FIG. 11.

When the signal SD is comprised of HIGH pulses as shown in FIG. 12D, therefore, the inverters 75 and 76 for inverting the outputs of the NAND circuits 71 and 72, respectively, output these HIGH pulses in turn.

Namely, a pulse P1 shown in FIG. 12D passes through the NAND circuit 71 and the inverter 75 when the NAND circuit 71 is opened by the signal SF, and a pulse P2 passes through the NAND circuit 72 and the inverter 76 when the NAND circuit 72 is opened by the signal SG. The same applies in the case where the signal SE is comprised of HIGH pulses. In this case, these HIGH pulses will be output from the inverters 77 and 78 in turn.

In this manner, the shift-register driving circuit 28 outputs HIGH pulses either from the inverters 75 and 76 or from the inverters 77 and 78, depending on whether the delay needs to be increased or decreased. These pulse signals are supplied to the shift register 26 of the phase-delay circuit 12 shown in FIG. 4.

The shift-register driving circuit 29 outputs HIGH pulses either from the inverters 75 and 76 or from the inverters 77 and 78, depending on whether the period Thigh needs to be extended or shortened. These pulse signals are supplied to the shift register 22 of the phase-adjustment circuit 11 in FIG. 4.

Figure 13:
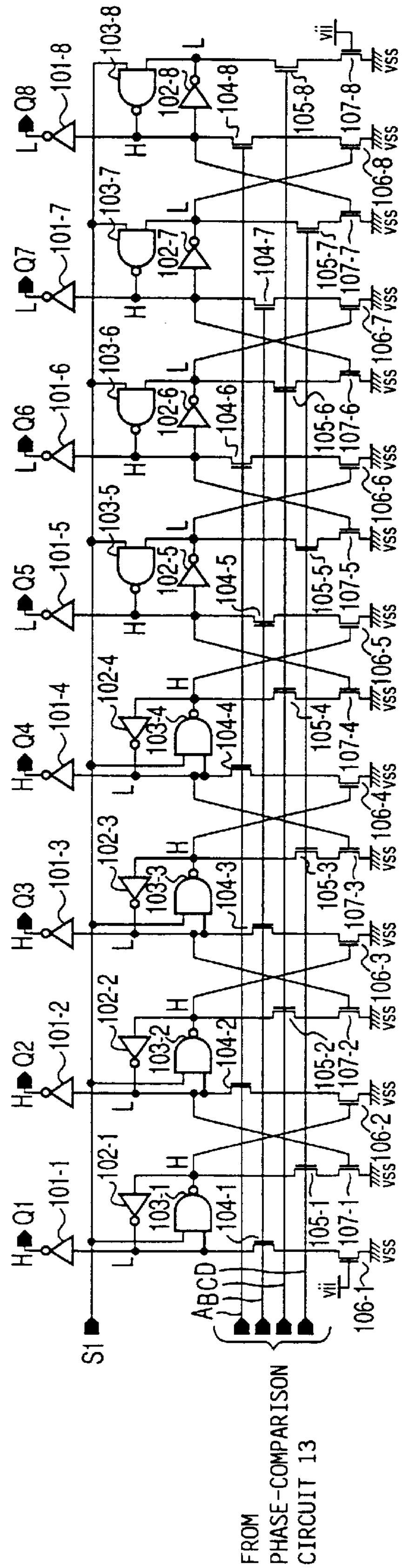
FIG. 13 is a circuit diagram of a shift register of a phase-adjustment circuit.

FIG. 13 is a circuit diagram of the shift register 22 of the phase-adjustment circuit 11. The shift register 22 includes inverters 101-1 through 101-8, inverters 102-1 through 102-8, NAND circuits 103-1 through 103-8, NMOS transistors 104-1 through 104-8, NMOS transistors 105-1 through 105-8, NMOS transistors 106-1 through 106-8, and NMOS transistors 107-1 through 107-8. When the reset signal S1 becomes LOW, the shift register 22 is reset. That is, when the reset signal S1 is changed to LOW, outputs of the NAND circuits 103-1 through 103-8 become HIGH, and outputs of the inverters 102-1 through 102-8 become LOW. Each pair formed by one of the NAND circuits 103-1 through 103-8 and a corresponding one of the inverters 102-1 through 102-8 makes up a latch by each element of the pair providing an output thereof to the other element of the pair. Because of this latch function, an initial state set by the reset signal S1 is kept even after the reset signal S1 returns to HIGH.

In this initial state, as shown in FIG. 13, outputs Q1 through Q4 of the inverters 101-1 through 101-4 are HIGH, and outputs Q5 through Q8 of the inverters 101-5 through 101-8 are LOW.

When the period Thigh of the phase-adjusted clock signal CLK1 needs to be extended, HIGH pulses are supplied to signal lines A and B in turn. When a HIGH pulse is supplied to the signal line B, the NMOS transistor 104-5 is turned on. Since the NMOS transistor 106-5 is on, an output of the NAND circuit 103-5 is connected to the ground, and is forced to change from HIGH to LOW. An output of the inverter 102-5 is thus changed to HIGH, and this condition is held by the latch comprised of the NAND circuit 103-5 and the inverter 102-5. At this time, the output Q5 is changed from LOW to HIGH. Namely, the outputs Q1 through Q5 are HIGH, and the outputs Q6 through Q8 are LOW.

When a HIGH pulse is supplied to the signal line A, the NMOS transistor 104-6 is turned on. Since the NMOS transistor 106-6 is on, an output of the NAND circuit 103-6 is connected to the ground, and is forced to change from HIGH to LOW. An output of the inverter 102-6 is thus changed to HIGH, and this condition is held by the latch comprised of the NAND circuit 103-6 and the inverter 102-6. At this time, the output Q6 is changed from LOW to HIGH. Namely, the outputs Q1 through Q6 are HIGH, and the outputs Q7 and Q8 are LOW.

In this manner, HIGH pulses supplied to the signal lines A and B in turn increase the number of HIGH outputs among the outputs Q1 through Q8. This number increases one by one with every HIGH pulse supplied. The HIGH outputs among the outputs Q1 through Q8 are provided on the left in the figure, and the LOW outputs are provided on the right.

When the period Thigh of the phase-adjusted clock signal CLK1 needs to be shortened, HIGH pulses are supplied to signal lines C and D in turn. When a HIGH pulse is supplied to the signal line C in the initial state shown in FIG. 13, the NMOS transistor 105-4 is turned on. Since the NMOS transistor 107-4 is on, an output of the NAND circuit 103-4 is connected to the ground, and is forced to change from HIGH to LOW. An output of the inverter 102-4 is thus changed to HIGH, and this condition is held by the latch comprised of the NAND circuit 103-4 and the inverter 102-4. At this time, the output Q4 is changed from HIGH to LOW. Namely, the outputs Q1 through Q3 are HIGH, and the outputs Q4 through Q8 are LOW.

When a HIGH pulse is supplied to the signal line D, the NMOS transistor 105-3 is turned on. Since the NMOS transistor 107-3 is on, an output of the NAND circuit 103-3 is connected to the ground, and is forced to change from HIGH to LOW. An output of the inverter 102-3 is thus changed to HIGH, and this condition is held by the latch comprised of the NAND circuit 103-3 and the inverter 102-3. At this time, the output Q3 is changed from HIGH to LOW. Namely, the outputs Q1 and Q2 are HIGH, and the outputs Q3 through Q8 are LOW.

In this manner, HIGH pulses supplied to the signal lines C and D in turn increase the number of LOW outputs among the outputs Q1 through Q8. This number increases one by one with every HIGH pulse supplied. The HIGH outputs among the outputs Q1 through Q8 are provided on the left in the figure, and the LOW outputs are provided on the right.

The output signals Q1 through Q8 are supplied to the phase-adjustment circuit 21 to adjust a phase of the phase-adjusted clock signal CLK1.

Figure 14:
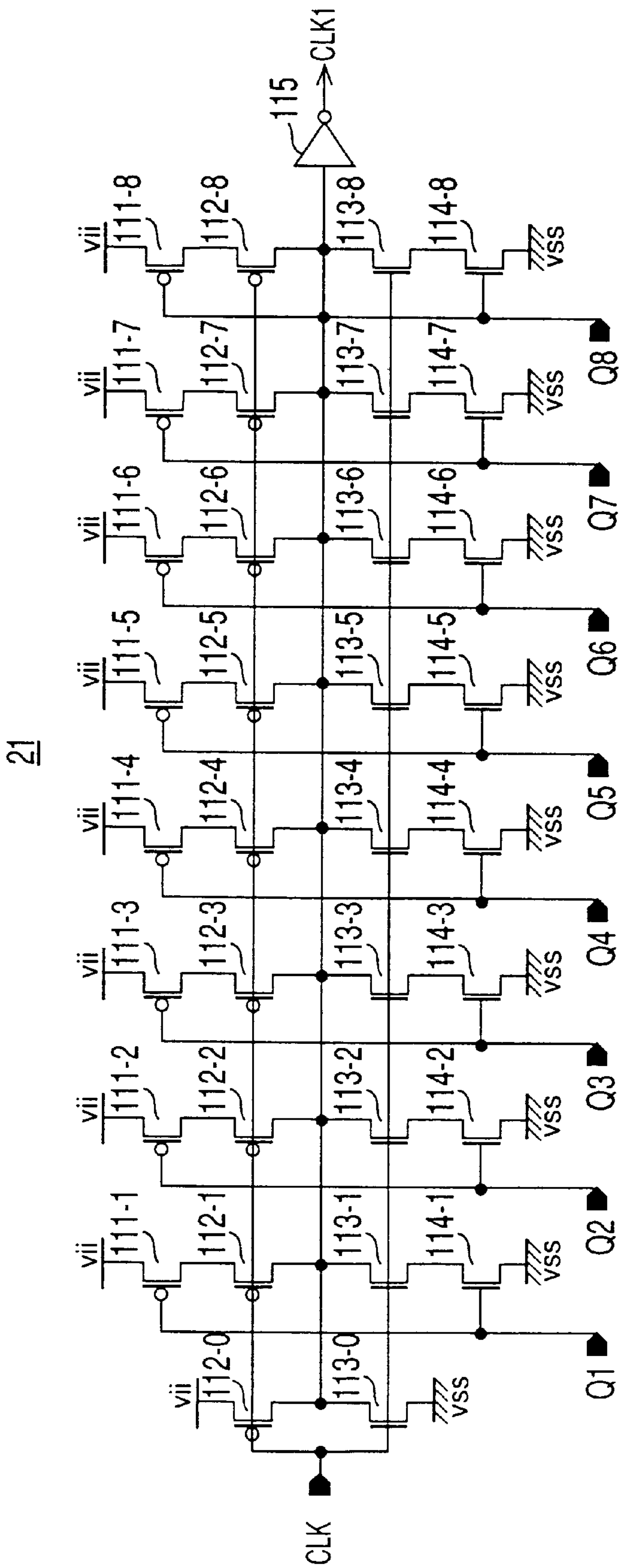
FIG. 14 is a circuit diagram of the phase-adjustment circuit.

FIG. 14 is a circuit diagram of the phase-adjustment circuit 21.

The phase-adjustment circuit 21 includes PMOS transistors 111-1 through 111-8, PMOS transistors 112-0 through 112-8, NMOS transistors 113-0 through 113-8, NMOS transistors 114-1 through 114-8, and an inverter 115.

The signals Q1 through Q8 from the shift register 22 are supplied to gates of the PMOS transistors 111-1 through 111-8 and the NMOS transistors 114-1 through 114-8, respectively. The PMOS transistors 112-0 through 112-8 and the NMOS transistors 113-0 through 113-8 together form an inverter, receiving the clock signal CLK as a gate input. The inverter 115 thus outputs the phase-adjusted clock signal CLK1 having the same phase relation as the input signal.

In the initial state in which the signals Q1 through Q4 are HIGH and the signals Q5 through Q8 are LOW, the PMOS transistors 111-5 through 111-8 are turned on on the power-voltage side, and the NMOS transistors 114-1 through 114-4 are turned on on the ground-voltage side. In this condition, a HIGH pulse of the clock signal CLK prompts the five NMOS transistors 113-0 through 113-4 to be driven. Further, a LOW pulse of the clock signal CLK results in the five PMOS transistors 112-0 and 112-5 through 112-8 being driven. In this manner, a driving force with respect to a rising edge of the clock signal CLK is the same as a driving force for a falling edge of the clock signal CLK.

If the number of HIGH signals among the signals Q1 through Q8 is increased, the number of NMOS transistors driven when the clock signal CLK is HIGH increases. In this case, a driving force for a rising edge of the clock signal CLK is stepped up, and, at the same time, a driving force for a falling edge of the clock signal CLK is suppressed as the number of driven PMOS transistors is decreased. As a result, a transition period of the rising edge of the clock signal CLK is shortened, thereby advancing a rising edge of the phase-adjusted clock signal CLK1. At the same time, a transition period of the falling edge of the clock signal CLK is extended, thereby delaying a falling edge of the phase-adjusted clock signal CLK1.

On the other hand, if the number of HIGH signals among the signals Q1 through Q8 is decreased, the number of NMOS transistors driven when the clock signal CLK is HIGH decreases. In this case, a driving force for a rising edge of the clock signal CLK is reduced, while a driving force for a falling edge of the clock signal CLK is boosted as the number of driven PMOS transistors is increased. As a result, a transition period of the rising edge of the clock signal CLK is extended, thereby delaying a rising edge of the phase-adjusted clock signal CLK1. At the same time, a transition period of the falling edge of the clock signal CLK is shortened, thereby advancing a falling edge of the phase-adjusted clock signal CLK1.

Figure 15:
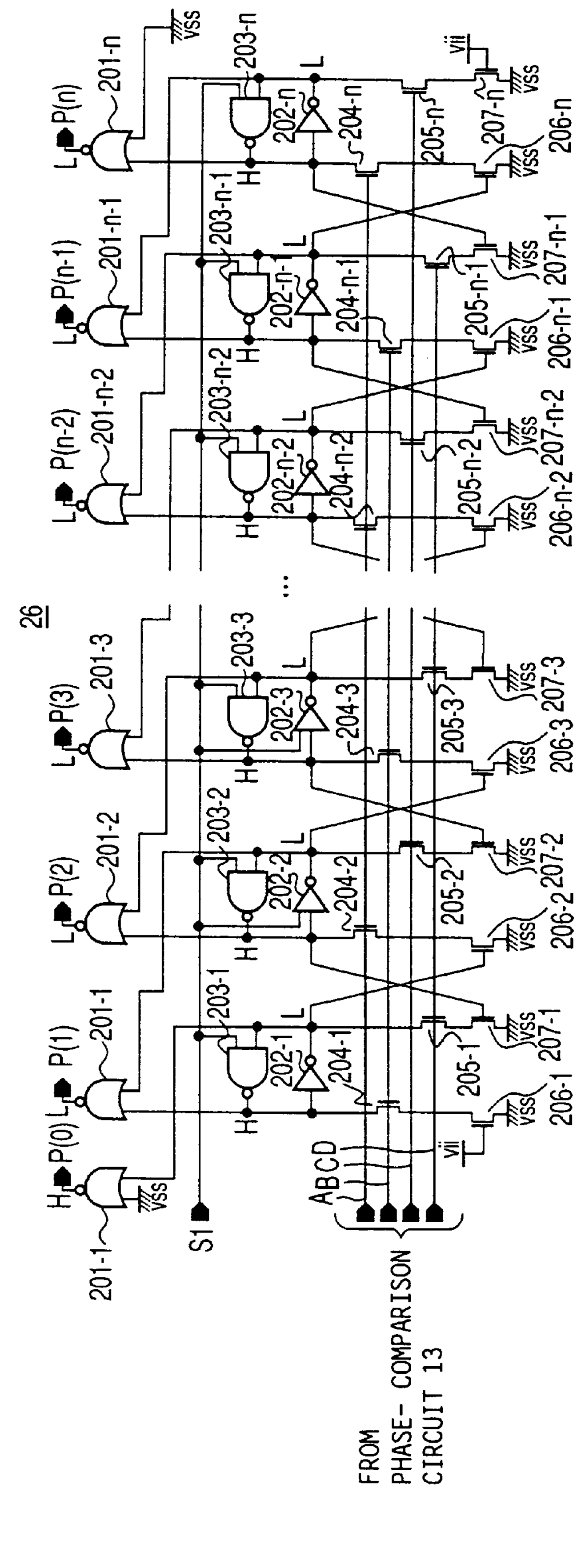
FIG. 15 is a circuit diagram of a shift register of the phase-delay circuit.

FIG. 15 is a circuit diagram of the shift register 26 of the phase-delay circuit 12. The shift register 26 includes NOR circuits 201-0 through 201-n, inverters 202-1 through 202-n, NAND circuits 203-1 through 203-n, NMOS transistors 204-1 through 204-n, NMOS transistors 205-1 through 205-n, NMOS transistors 206-1 through 206-n, and NMOS transistors 207-1 through 207-n. When the reset signal S1 becomes LOW, the shift register 26 is reset. That is, when the reset signal S1 is changed to LOW, outputs of the NAND circuits 203-1 through 203-n become HIGH, and outputs of the inverters 202-1 through 202-n become LOW. Each pair formed by one of the NAND circuits 203-1 through 203-n and a corresponding one of the inverters 202-1 through 202-n makes up a latch by each element of the pair providing an output thereof to the other element of the pair. Because of this latch function, an initial state set by the reset signal S1 is kept even after the reset signal S1 returns to HIGH.

In this initial state, as shown in FIG. 15, an output P(0) of the NOR circuit 201-0 is HIGH, while outputs P(1) through P(n) of the NOR circuits 201-1 through 201-n are LOW. That is, only the output P(0) is HIGH.

When the delay needs to be increased, HIGH pulses are supplied to signal lines A and B in turn. When a HIGH pulse is supplied to the signal line B, the NMOS transistor 204-1 is turned on. Since the NMOS transistor 206-1 is on, an output of the NAND circuit 203-1 is connected to the ground, and is forced to change from HIGH to LOW. An output of the inverter 202-1 is thus changed to HIGH, and this condition is held by the latch comprised of the NAND circuit 203-1 and the inverter 202-1. At this time, the output P(0) is changed from HIGH to LOW, and the output P(1) is turned from LOW to HIGH. Namely, only the output P(1) is HIGH in this case.

When a HIGH pulse is supplied to the signal line A, the NMOS transistor 204-2 is turned on. Since the NMOS transistor 206-2 is on, an output of the NAND circuit 203-2 is connected to the ground, and is forced to change from HIGH to LOW. An output of the inverter 202-2 is thus changed to HIGH, and this condition is held by the latch comprised of the NAND circuit 203-2 and the inverter 202-2. At this time, the output P(1) is changed from HIGH to LOW, and the output P(2) is turned from LOW to HIGH. Namely, only the output P(2) is HIGH in this case.

In this manner, each HIGH pulse supplied to the signal lines A and B in turn can shift only one HIGH output P(x) among the outputs P(0) through P(n) one by one to the left.

When the delay needs to be decreased, HIGH pulses are supplied to the signal lines C and D in turn. Operations of the shift register 26 in this case are a reverse of what has been described in the above, and a description thereof will be omitted.

The output signals P(1) through P(n) are supplied to the delay lines 25-1 and 25-2 to adjust the delay of the signals.

Figure 16:
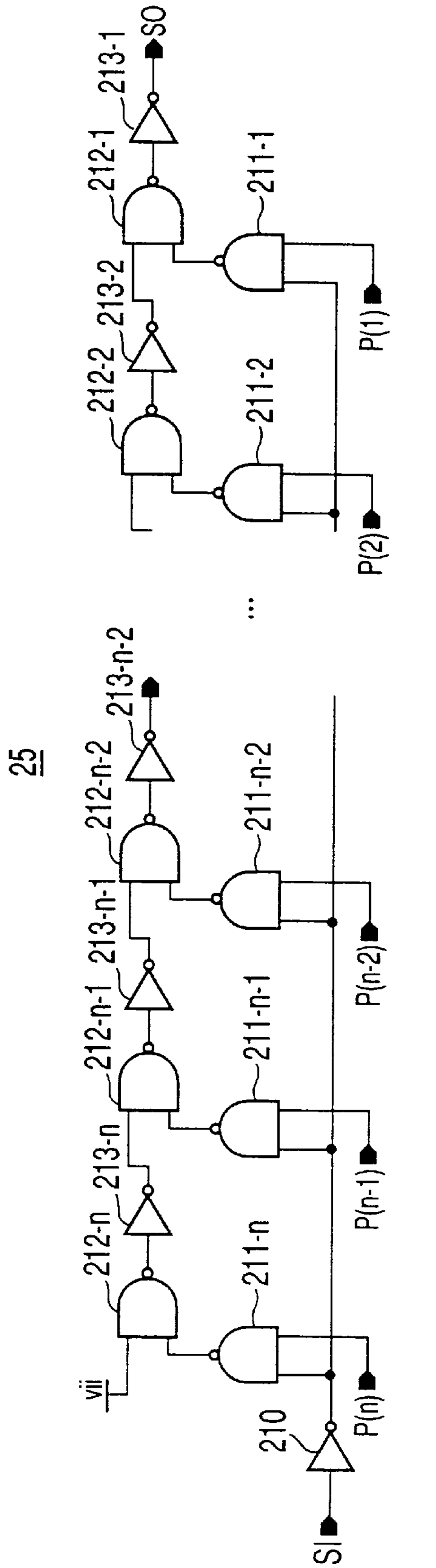
FIG. 16 is a circuit diagram of a delay line.

FIG. 16 is a circuit diagram of a delay line 25. The delay line 25 is used as either one of the delay line 25-1 and the delay line 25-2.

The delay line 25 includes inverter 210, NAND circuits 211-1 through 211-n, NAND circuits 212-1 through 212-n, and inverters 213-1 through 213-n. The NAND circuits 212-1 through 212-n and the inverters 213-1 through 213-n form a series of delay elements.

The NAND circuits 211-1 through 211-n receive at one input thereof an inverse of an input signal SI from the inverter 210, and receive at the other input thereof the signals P(1) through P(n), respectively. The only one HIGH signal among the signals P(1) through P(n) is referred to as P(x).

The NAND circuits 211-1 through 211-n exclusive of the NAND circuit 211-x has a LOW-level signal at one input thereof, and, thus, output a HIGH-level signal. The NAND circuits 212-1 through 212-n other than the NAND circuit 212-x receive this HIGH-level signal at one input thereof, and, thus, serve as an inverter for a signal supplied to the other input thereof.

Accordingly, the series of delay elements comprised of the NAND circuits 212-n through the inverter 213-x+1 allows a HIGH-level signal to propagate therethrough when the fixed HIGH level is supplied to one input of the NAND circuit 212-n. One input of the NAND circuit 212-x is thus HIGH. The other input of the NAND circuit 212-x receives the input signal SI via the inverter 210 and the NAND circuit 211-x. In this case, the series of delay elements comprised of the NAND circuit 212-x through the inverter 213-1 allows the input signal SI to propagate therethrough while incurring some delay. A signal delayed through this propagation is obtained as an output signal SO. The output signal SO is delayed compared to the input signal SI by a delay which is commensurate with the number (x) of delay elements.

As described in connection with the shift register 26 of FIG. 15, the only one HIGH signal P(x) among the signals P(1) through P(n) can shift a position thereof within a range of $1 \leqq x \leqq n$. Use of the delay line 25 of FIG. 16, therefore, makes it possible to achieve a desired adjustment of the signal delay.

Using all the elements described in the above, the skew-reduction circuit of FIG. 4 enables the phase-comparison circuit 13 to compare phases between the signals corresponding to the phase-adjusted clock signal CLK1 and the signals corresponding to the delayed-clock signal CLK2, and sets the delay of the phase-delay circuit 12 to the predetermined phase amount (180°) based on phase-comparison results. Further, the skew-reduction circuit controls the phase-adjustment circuit 11 to generate the phase-adjusted clock signal CLK1 having the period Thigh and the period Tlow equal to each other.

Figure 17:
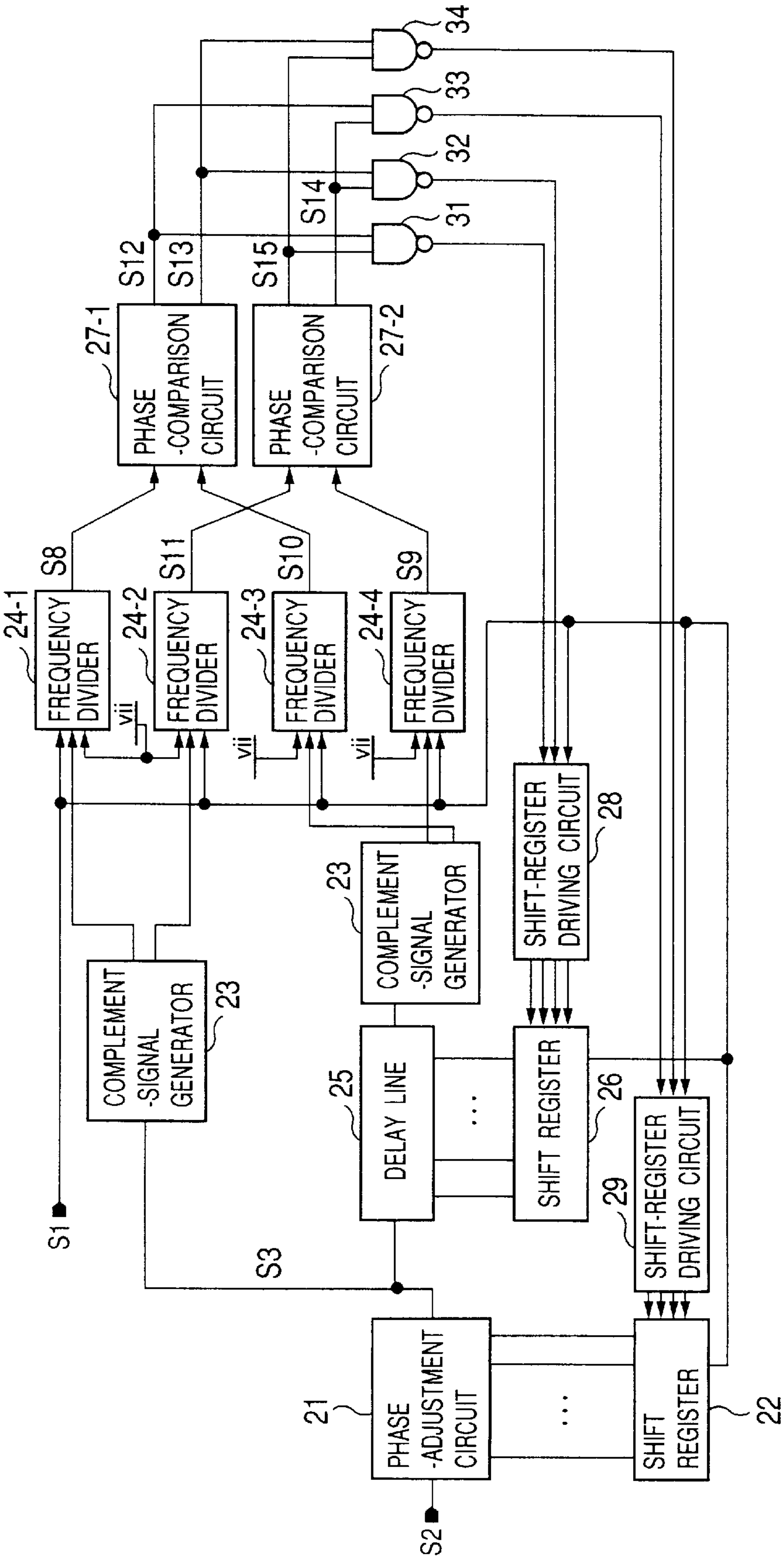
FIG. 17 is a block diagram showing a variation of the skew-reduction circuit of FIG. 4

FIG. 17 is a block diagram showing a variation of the skew-reduction circuit of FIG. 4. In FIG. 17, the same elements as those of FIG. 4 are referred to by the same numerals, and a description thereof will be omitted.

A skew-reduction circuit of FIG. 17 differs from the skew-reduction circuit of FIG. 4 only in that the delay line 25 is arranged at a prior stage of the frequency dividers 24-1 and 24-4 and the complement-signal generator 23. Each element has the same configuration as in the previous embodiment, and operations of the skew-reduction circuit is also the same. A description of the configurations and the operations will thus be omitted.

Figure 18:
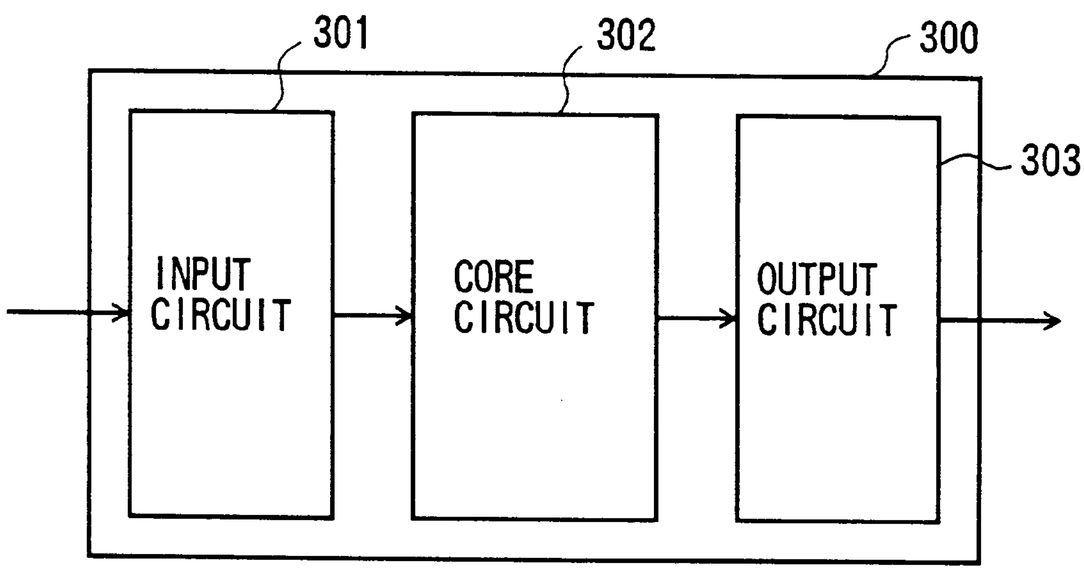
FIG. 18 is a block diagram of a semiconductor device to which the skew-reduction circuit is applied.

FIG. 18 is a block diagram of a semiconductor device to which the skew-reduction circuit of FIG. 2 or FIG. 3 is applied. A semiconductor device 300 of FIG. 18 includes an input circuit 301, a core circuit 302, and an output circuit 303. The input circuit 301 receives input signals from an external source, and supplies the received signals to the core circuit 302. Output signals from the core circuit 302 are sent out from the semiconductor device 300 via the output circuit 303.

The skew-reduction circuit may be used as an input-interface circuit such as the input circuit 301 for receiving input signals, and may be used as an output-interface circuit such as the output circuit 303 for transmitting output signals.

Figure 19:
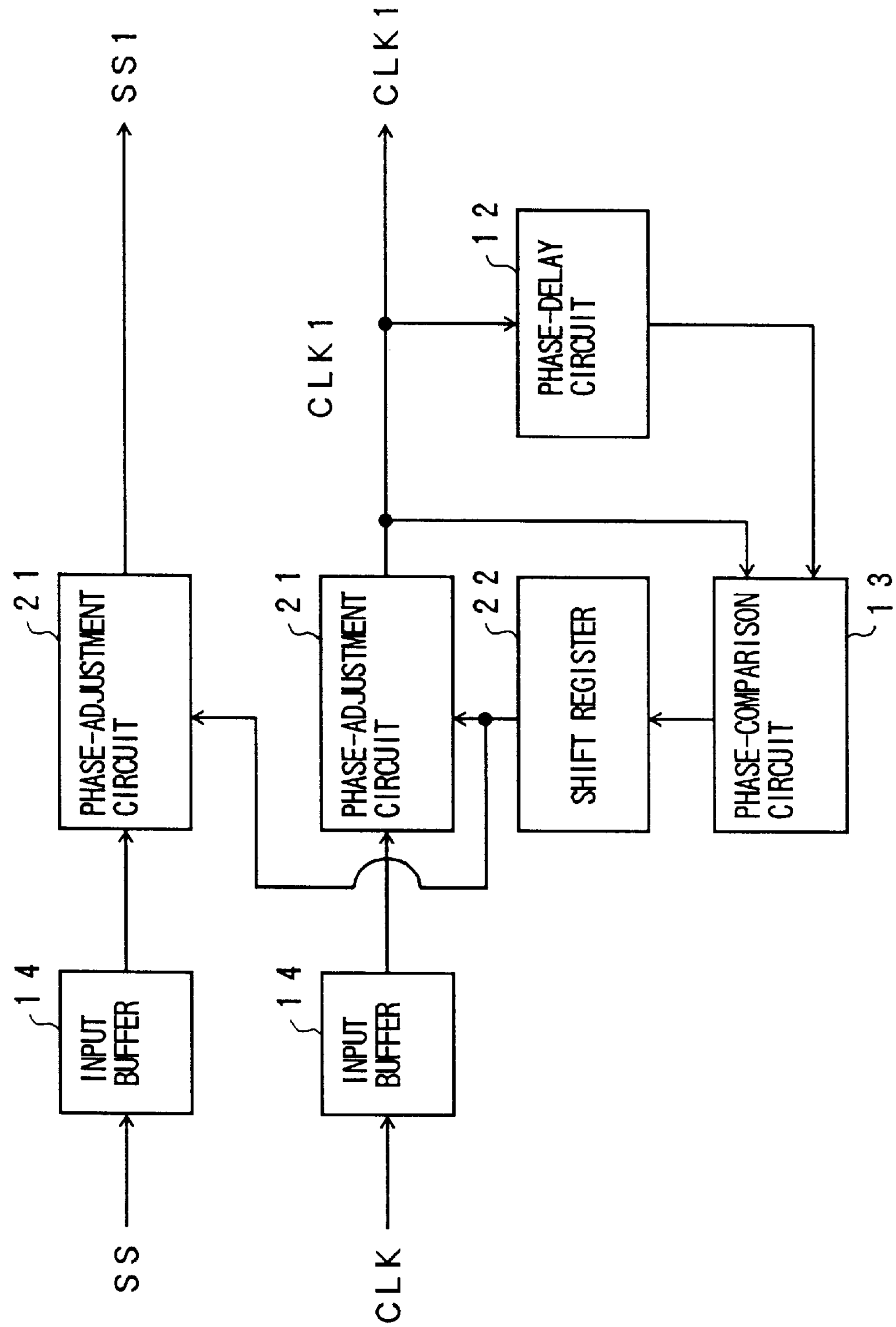
FIG. 19 is a block diagram of an embodiment of an input-interface circuit to which the skew-reduction circuit of FIG. 4 is applied.

FIG. 19 is a block diagram of an embodiment of an input-interface circuit to which the skew-reduction circuit of FIG. 4 is applied. In FIG. 19, the same elements as those of FIG. 4 are referred to by the same numerals, and a description thereof will be omitted.

The clock signal CLK input via an input buffer 14 receives a phase adjustment in the phase-adjustment circuit 21, and supplied as the phase-adjusted clock signal CLK1 to an internal circuit (e.g., the core circuit 302 of FIG. 18). The phase-delay circuit 12, the phase-comparison circuit 13, and the shift register 22 function in an interrelated manner to control the phase-adjustment circuit 21 so that the phase-adjusted clock signal CLK1 has the period Thigh and the period Tlow equal to each other. The same phase adjustment by the phase-adjustment circuit 21 and the shift register 22 is also applied to another input signal SS. As a result, an input signal SS1 is obtained after reducing a rise-and-fall skew of the input signal SS. The input signal SS1 which has no rise-and-fall skew is supplied to the internal circuit (e.g., the core circuit 302 of FIG. 18).

Figure 20:
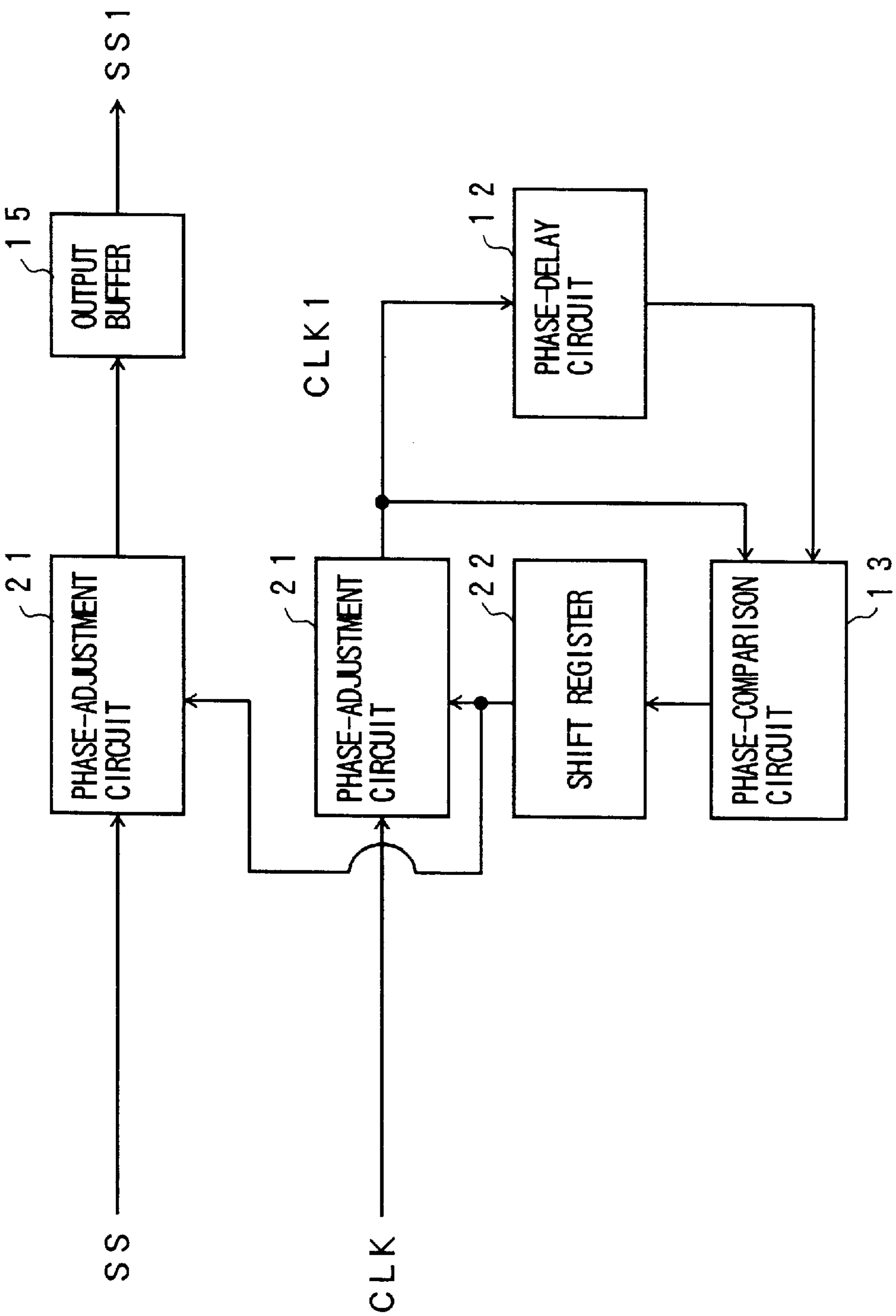
FIG. 20 is a block diagram of an embodiment of an output-interface circuit to which the skew-reduction circuit of FIG. 4 is applied.

FIG. 20 is a block diagram of an embodiment of an output-interface circuit to which the skew-reduction circuit of FIG. 4 is applied. In FIG. 20, the same elements as those of FIG. 19 are referred to by the same numerals, and a description thereof will be omitted.

The output-interface circuit of FIG. 20 receives the clock signal CLK and an internal signal SS from an internal circuit (e.g., the core circuit 302 of FIG. 18). A rise-and-fall skew of the internal signal SS is reduced by using the clock signal CLK. A signal SS1 which has a reduced rise-and-fall skew is output from the phase-adjustment circuit 21 to the outside of the device via the output buffer 15.

Figure 21:
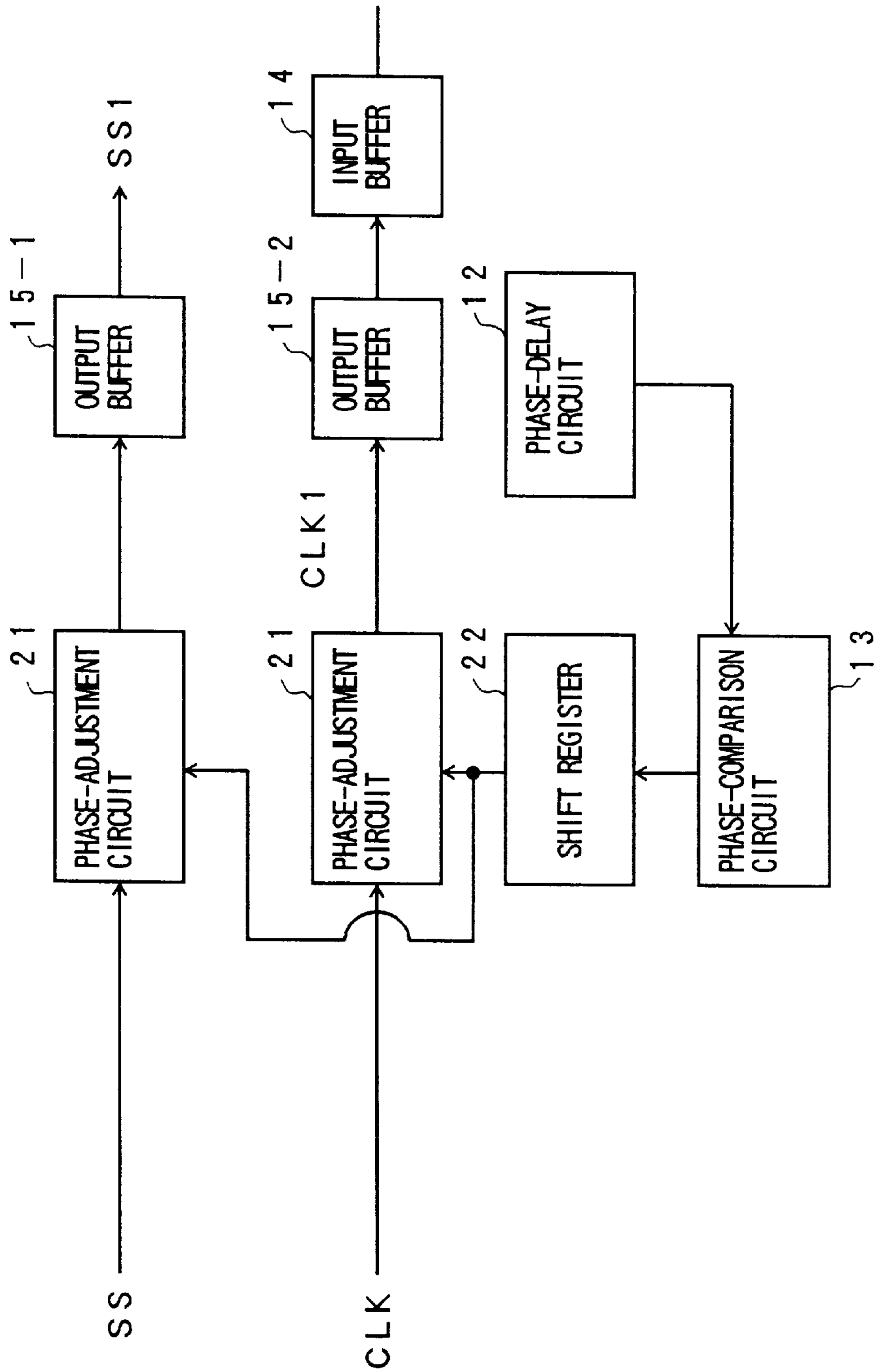
FIG. 21 is a block diagram showing a variation of the embodiment of an output-interface circuit to which the skew-reduction circuit of FIG. 4 is applied.

FIG. 21 is a block diagram showing a variation of the embodiment of an output-interface circuit to which the skew-reduction circuit of FIG. 4 is applied. In FIG. 21, the same elements as those of FIG. 20 are referred to by the same numerals, and a description thereof will be omitted.

The output-interface circuit of FIG. 21 receives the clock signal CLK and the internal signal SS from an internal circuit (e.g., the core circuit 302 of FIG. 18). A rise-and-fall skew of the internal signal SS is reduced by using the clock signal CLK. The signal SS1 which has a reduced rise-and-fall skew is output from the phase-adjustment circuit 21 to the outside of the device via an output buffer 15-1.

An output buffer 15-2 identical to the output buffer 15-1 is provided to receive the phase-adjusted clock signal CLK1. An output of the output buffer 15-2 is supplied to the phase-delay circuit 12 and the phase-comparison circuit 13 via the input buffer 14.

In the configuration of FIG. 21, the output buffer 15-2 identical to the output buffer 15-1 is incorporated into a feedback loop for the phase adjustment in order to prevent a rise-and-fall skew from sneaking into the output signal SS1 in the output buffer 15-1. This configuration ensures that a rise-and-fall-skew reduction is performed with respect to the phase-adjusted clock signal CLK1 after it passes through the output buffer 15-2. In this manner, a rise-and-fall-skew reduction is achieved with respect to the output signal SS1 having passed through the output buffer 15-1. In the configuration of FIG. 21, it is assumed that a rise-and-fall skew created in the input buffer 14 is as small as tolerable.

Figure 22:
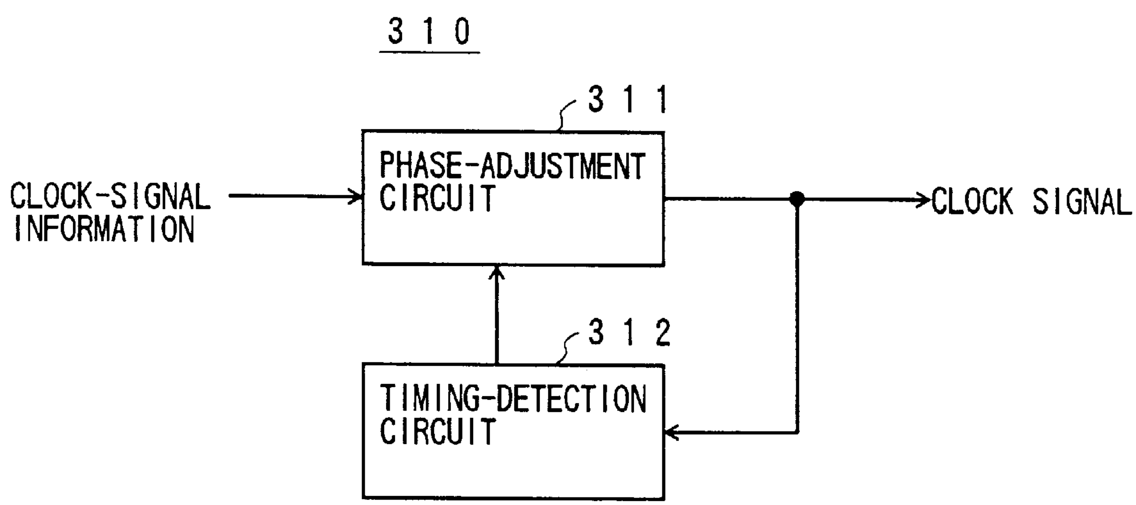
FIG. 22 is a block diagram of a skew-reduction circuit according to another principle of the present invention.

FIG. 22 is a block diagram of a skew-reduction circuit according to another principle of the present invention. A skew-reduction circuit 310 includes a phase-adjustment circuit 311 and a timing-detection circuit 312. The phase-adjustment circuit 11 receives clock-signal information, and adjusts a phase of the clock-signal information to output a phase-adjusted clock signal. The phase-adjusted clock signal is supplied to a timing-detection circuit 312. The timing-detection circuit 312 detects relative timings of a rising edge and a falling edge of the phase-adjusted clock signal, and controls the phase-adjustment circuit 311 such that these edges satisfy a predetermined phase relationship. In detail, the phase-adjustment circuit 311 is controlled to output the phase-adjusted clock signal having the period Thigh and the period Tlow equal to each other.

The phase-adjustment circuit 311 has a function to adjust a rise timing and a fall timing of the clock signal CLK in different directions, respectively. Namely, an adjustment to reset a rise timing forward or backward with regard to time can be made in a different direction from an adjustment to reset a fall timing forward or backward. For example, the rise timing may be delayed, while the fall timing is advanced. Through such adjustments, the phase-adjusted clock signal CLK1 is controlled to have the period Thigh and the period Tlow equal to each other.

The timing-detection circuit 312 detects relative timings of a rising edge and a falling edge of the phase-adjusted clock signal, and controls the phase-adjustment circuit 311 based on the detected relative timings. For example, a check is made as to which one of the period Thigh and the period Tlow is longer than the other based on the relative timings of the rising edge and the falling edge of the phase-adjusted clock signal, and results of this check may be used for controlling the phase-adjustment circuit 311.

Figure 23:
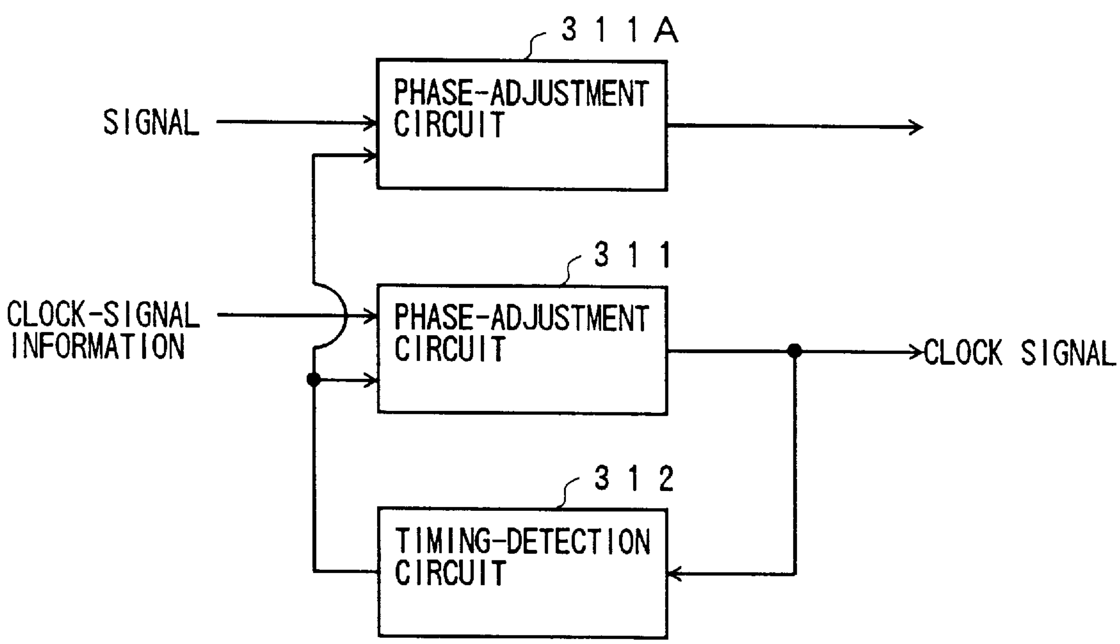
FIG. 23 is a block diagram showing a configuration in which the skew-reduction circuit of FIG. 22 is used for a skew reduction of another signal in addition to a clock signal.

FIG. 23 is a block diagram showing a configuration in which the skew-reduction circuit 310 is used for a skew reduction of another signal in addition to a clock signal. In FIG. 23, the control signal from the timing-detection circuit 312 is not only supplied to the phase-adjustment circuit 11 receiving the clock-signal information, but also supplied to a phase-adjustment circuit 11A receiving another signal. The phase-adjustment circuit 11A carries out the same phase adjustment as that of the phase-adjustment circuit 11 with respect to the received signal.

As previously described, factors causing a rise-and-fall skew work identically on each signal. When a phase adjustment for reducing a rise-and-fall skew of the clock signal is also applied to another signal as shown in FIG. 23, therefore, a rise-and-fall skew of this signal can also be reduced. In this manner, rise-and-fall skews of other signals are reduced based on the clock signal CLK.

As described above, the skew-reduction circuit 310 of the present invention includes the phase-adjustment circuit 311 for adjusting a phase of the clock-signal information, and the timing-detection circuit 312 for controlling the phase-adjustment circuit 311 based on relative timings of a rising edge and a falling edge of the phase-adjusted clock signal, so that the phase-adjusted clock signal have the period Thigh and the period Tlow the same as each other, thereby reducing a rise-and-fall skew of the clock signal. Further, based on the clock-signal information, rise-and-fall skews of other signals can also be reduced by drawing on the fact that rise-and-fall skews are identical with respect to each signal.

In the following, embodiments of the above-described principle will be described with reference to the accompanying drawings.

Figure 24:
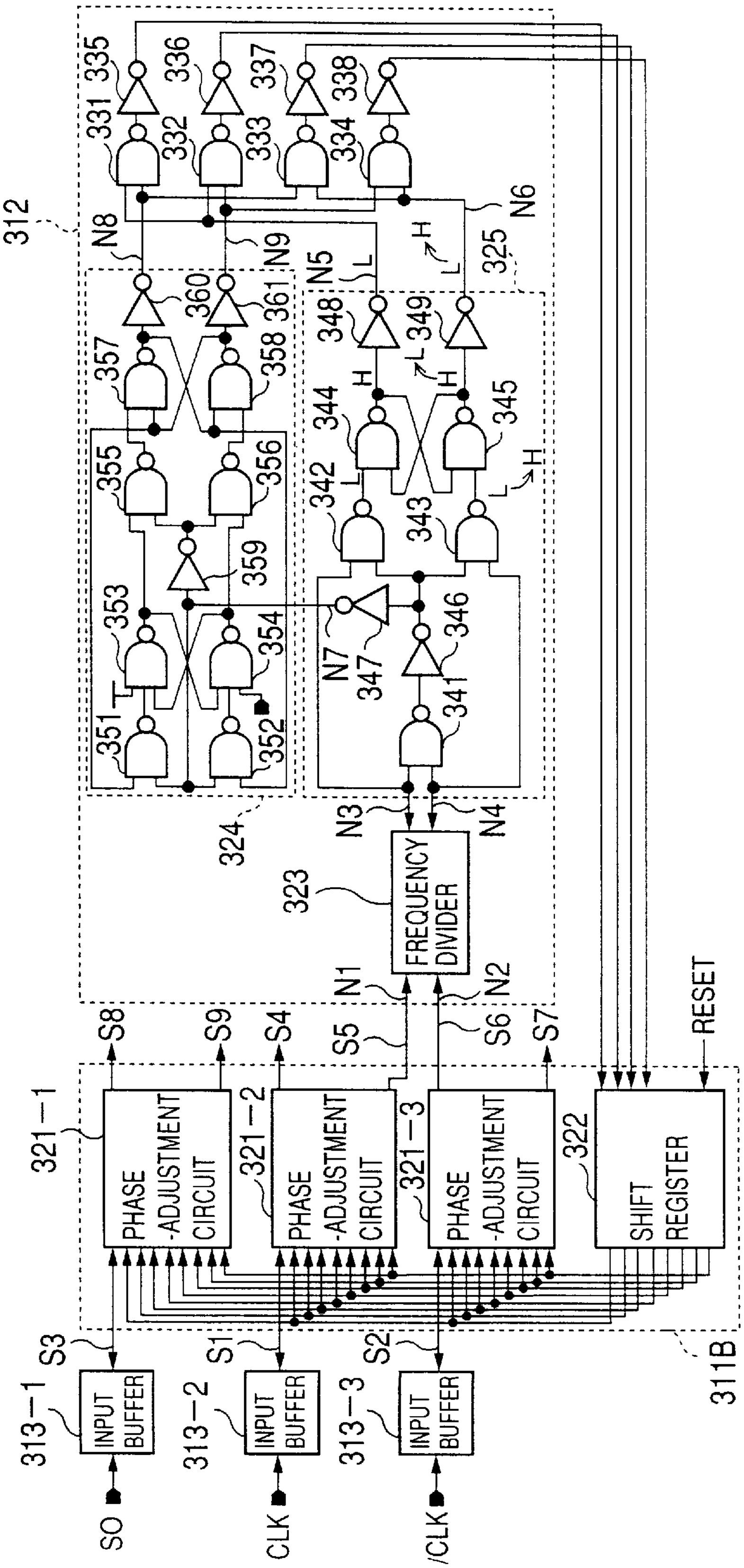
FIG. 24 is a block diagram of a skew-reduction circuit according to an embodiment of the present invention.

FIG. 24 is a block diagram of a skew-reduction circuit according to an embodiment of the present invention. FIGS. 25A through 25L are timing charts showing signals S0 through S9 of FIG. 24. In FIGS. 25A through 25L, a left half of the figures exhibit phase relations between the signals prior to a completion of desired phase adjustment, and a right half of the figures illustrate the phase relations after the completion of the desired phase adjustment.

The skew-reduction circuit of FIG. 24 receives three inputs, i.e., a clock signal CLK, an inverse clock signal /CLK (a complementary signal of the clock signal CLK), and an input signal S0. The skew-reduction circuit outputs a signal S9 obtained by reducing a rise-and-fall skew of the input signal S0, and, also, outputs a signal S5 derived from the clock signal CLK after reducing a rise-and-fall skew of the clock signal CLK.

The skew-reduction circuit of FIG. 24 includes a phase-adjustment circuit 311B, the phase-delay circuit 12, and input buffers 313-1 through 313-3. The phase-adjustment circuit 311B combines the phase-adjustment circuit 311 and the phase-adjustment circuit 311A of FIG. 23. The input buffers 313-1 through 313-3 are provided for the input signal S0, the clock signal CLK, and the inverse clock signal /CLK, respectively, and outputs a signal S3, a signal S1, and a signal S2, respectively. As shown in FIGS. 25A through 25L, the clock signal CLK, the inverse clock signal /CLK, and the input signal S0 have a transition period of a rising edge different from a transition period of a falling edge, so that the signals S1 through S3 output from the input buffers have the period Thigh different from the period Tlow. The signals S1 through S3 are supplied to the phase-adjustment circuit 311B.

The phase-adjustment circuit 311B includes phase-adjustment circuits 321-1 through 321-3 and a shift register 322 which is used for controlling the phase-adjustment circuits 321-1 through 321-3. The phase-adjustment circuits 321-1 through 321-3 adjust phases of the signals S3, S1 and S2, respectively, and outputs phase-adjusted signals S9, S5 and S7. Namely, the signal S9 is a product of a phase adjustment of the input signal S0, and the signal S5 is a product of a phase adjustment of the clock signal CLK. Also, the signal S7 is obtained from the inverse clock signal /CLK through a phase adjustment. Each of the phase-adjustment circuits 321-1 through 321-3 is designed to output complementary signals which are an inverse of each other, so that a signal S8 inverse of the signal S9, a signal S4 inverse of signal S5, and a signal S6 inverse of signal S7 are obtained.

The signal S5, which is a product of a phase adjustment of the clock signal CLK, and the signal S6, which is a product of a phase adjustment of the inverse clock signal /CLK, are supplied to the timing-detection circuit 312.

The timing-detection circuit 312 includes a frequency divider 323, a binary counter 324, a phase-comparison circuit 325, NAND circuits 331 through 334, and inverters 335 through 338. Operations of the timing-detection circuit 312 will be later described in detail. In brief, the timing-detection circuit 312 detects timing relations of rising edges between the signal S5 and S6, as shown in FIGS. 25H and 25I, and checks whether a rising edge of the signal S5 is ahead of a rising edge of the signal S6. Outputs from the timing-detection circuit 312 show results of the check, and are supplied to the shift register 322 of the phase-adjustment circuit 311B.

When a rising edge of the signal S5 is ahead of a rising edge of the signal S6, the shift register 322 controls the phase-adjustment circuits 321-1 through 321-3 to delay the rising edge of the signal S5 and advance the falling edge of the signal S5 with regard to time. On the other hand, when a rising edge of the signal S5 is behind a rising edge of the signal S6 as shown in FIGS. 25H and 25I, the shift register 322 controls the phase-adjustment circuits 321-1 through 321-3 to advance the rising edge of the signal S5 and delay the falling edge of the signal S5 with regard to time.

Figures 26A, 26B:
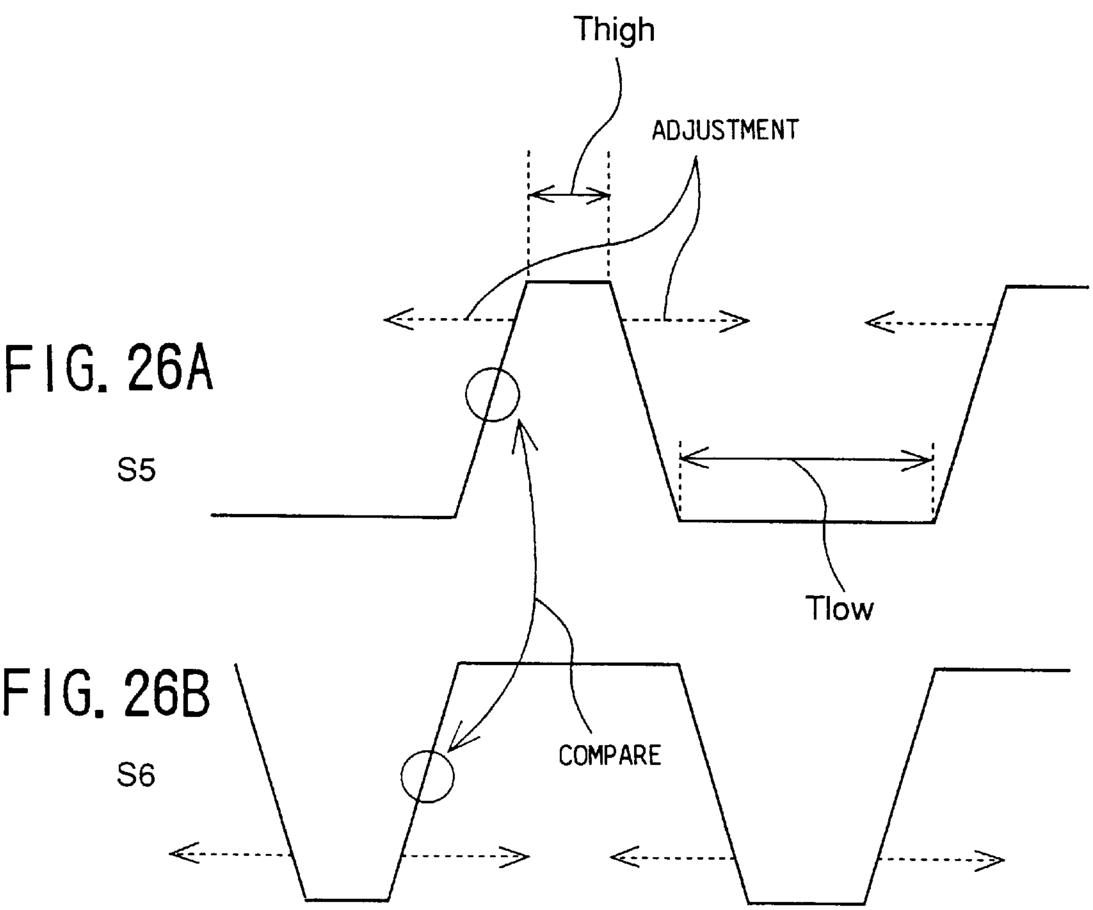
FIGS. 26A and 26B are timing charts for explaining a phase adjustment.

FIGS. 26A and 26B are timing charts for explaining this phase adjustment. Concurring with FIGS. 25H and 25I, FIGS. 26A and 26B show a case in which a rising edge of the signal S5 is behind a rising edge of the signal S6. The signal S5 is derived from the clock signal CLK, and the signal S6 is an inverse of the signal S7 which is derived from the inverse clock signal /CLK. Because of this, the signals S5 and S6 should be the same when there is no rise-and-fall skew in the clock signal CLK. When a rising edge of the signal S5 is behind a rising edge of the signal S6 as shown in FIGS. 26A and 26B, it means that the period Thigh of the signal S5 is shorter than a correct length (½ cycle), and that the period Tlow is longer than a correct extension (½ cycle). In this case, therefore, the signal S5 should be adjusted such that the rising edge thereof is advanced and the falling edge thereof is delayed with regard to time. When this adjustment is carried out, all the signals S5, S7, and S9, which are not inverted signals among the signals S4 through S9, are adjusted in the same fashion, and the inverted signals S4, S6, and S8 are adjusted in a reversed fashion to have rising edges thereof delayed and falling edges thereof advanced. When this adjustment achieves an alignment of the rising edges between the signals S5 and S6, the period Thigh and the period Tlow have a correct length.

Through this adjustment, rising edges of the signal S5 and rising edges of the signal S6 are in line with each other, as shown in the right half portion of FIGS. 25H and 25I. When this happens, the period Thigh and the period Tlow of the signals S4 through S9 become equal to each other.

In what follows, each element of the skew-reduction circuit shown in FIG. 24 will be described.

Figure 27:
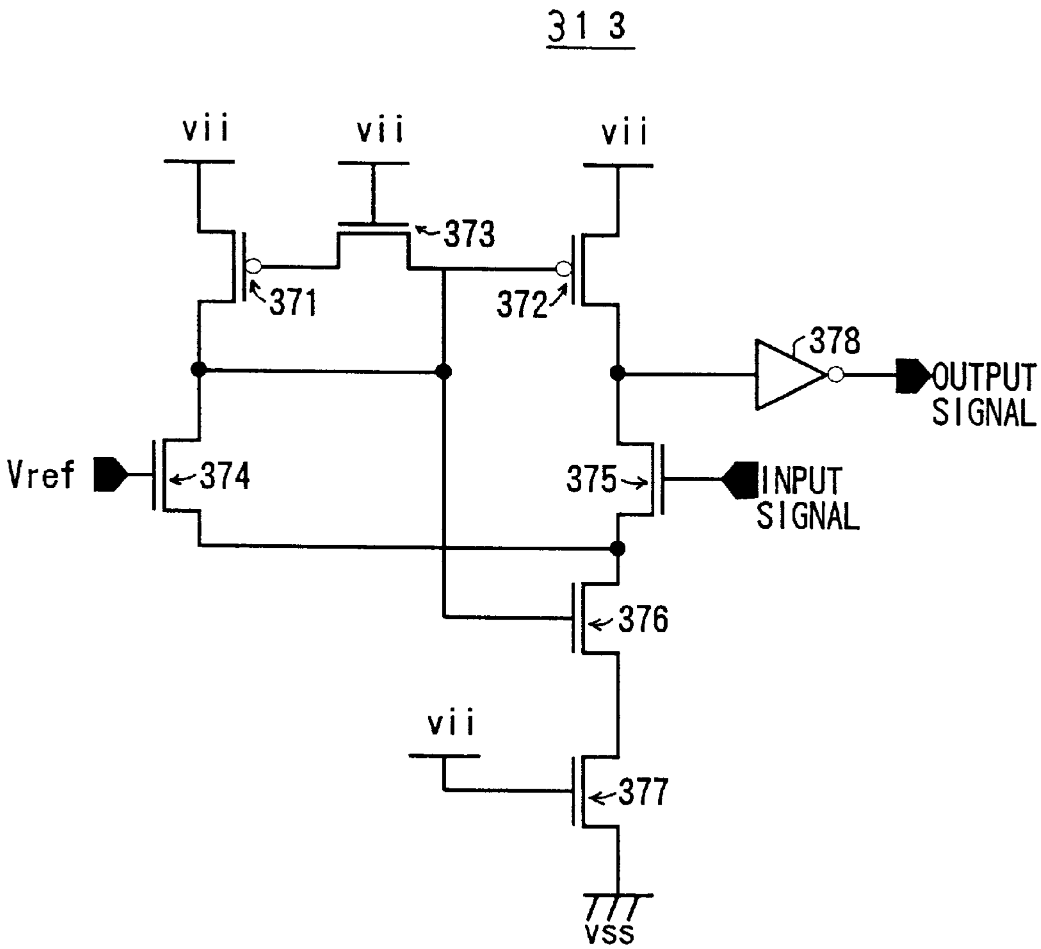
FIG. 27 is a circuit diagram of an input buffer.

FIG. 27 is a circuit diagram of an input buffer 313 corresponding to the input buffers 313-1 through 313-3. The input buffer 313 of FIG. 27 is used as any one of the input buffers 313-1 through 313-3.

The input buffer 313 includes PMOS transistors 371 and 372, NMOS transistors 373 through 377, and an inverter 378. The input buffer 313 compares a voltage level of an input signal with a reference voltage Vref, and produces a HIGH output signal when the voltage of the input signal is higher. When the voltage of the input signal is lower than the reference voltage Vref, the output signal is LOW. The input buffer 313 is a current-mirror buffer widely known in the art, and a detailed description thereof will be omitted.

Figure 28:
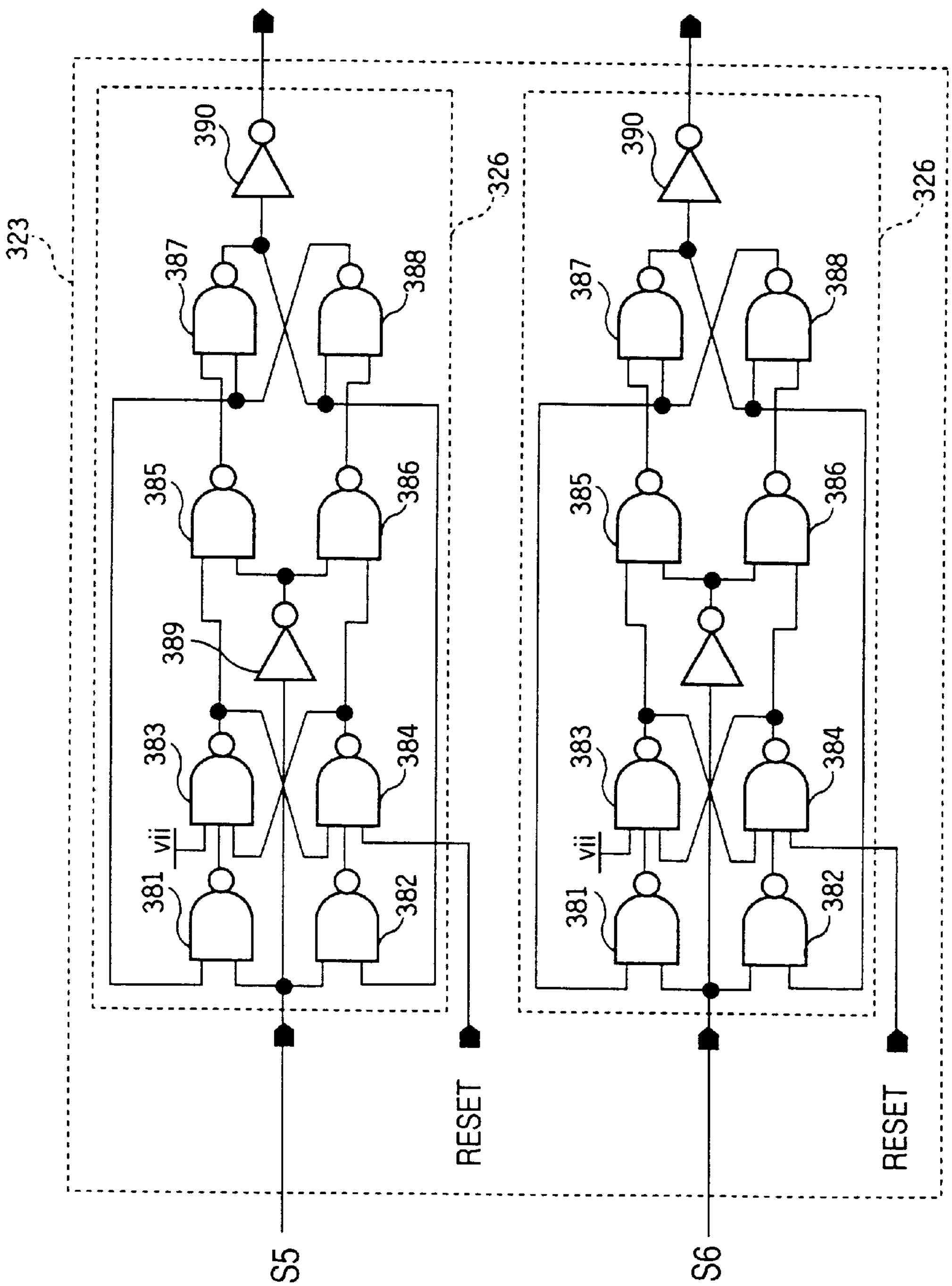
FIG. 28 is a circuit diagram of a frequency divider included in a timing-detection circuit of FIG. 24.

FIG. 28 is a circuit diagram of the frequency divider 323 included in the timing-detection circuit 312 of FIG. 24. The frequency divider 323 includes two frequency dividers 326 which are identical to each other. The frequency divider 326 divides an input frequency by half, and includes NAND circuits 381 through 388 and inverters 389 and 390. One of the two frequency dividers 326 receives the signal S5, and outputs a signal having a frequency half of that of the signal S5. The other frequency divider 326 receives the signal S6, and generates a signal having half a frequency of the signal S6. The frequency dividers 326 are used for making it easier to compare rising-edge timings between the signals S5 and S6 by lowering the frequencies of these signals. That is, a frequency division makes signal cycles longer, so that a correspondence of edges between the signals S5 and S6 is not taken between wrong edges, and a timing comparison is made reliably between correctly corresponding edges. A configuration of the frequency divider 326 is well within the scope of ordinary skill in the art, and a description thereof will be omitted.

With reference to FIG. 24 again, operations of the timing-detection circuit 312 will be described in the following. FIGS. 29A through 29I are timing charts showing signal changes at nodes N1 through N9 of the timing-detection circuit 312 shown in FIG. 24.

Figure 29:
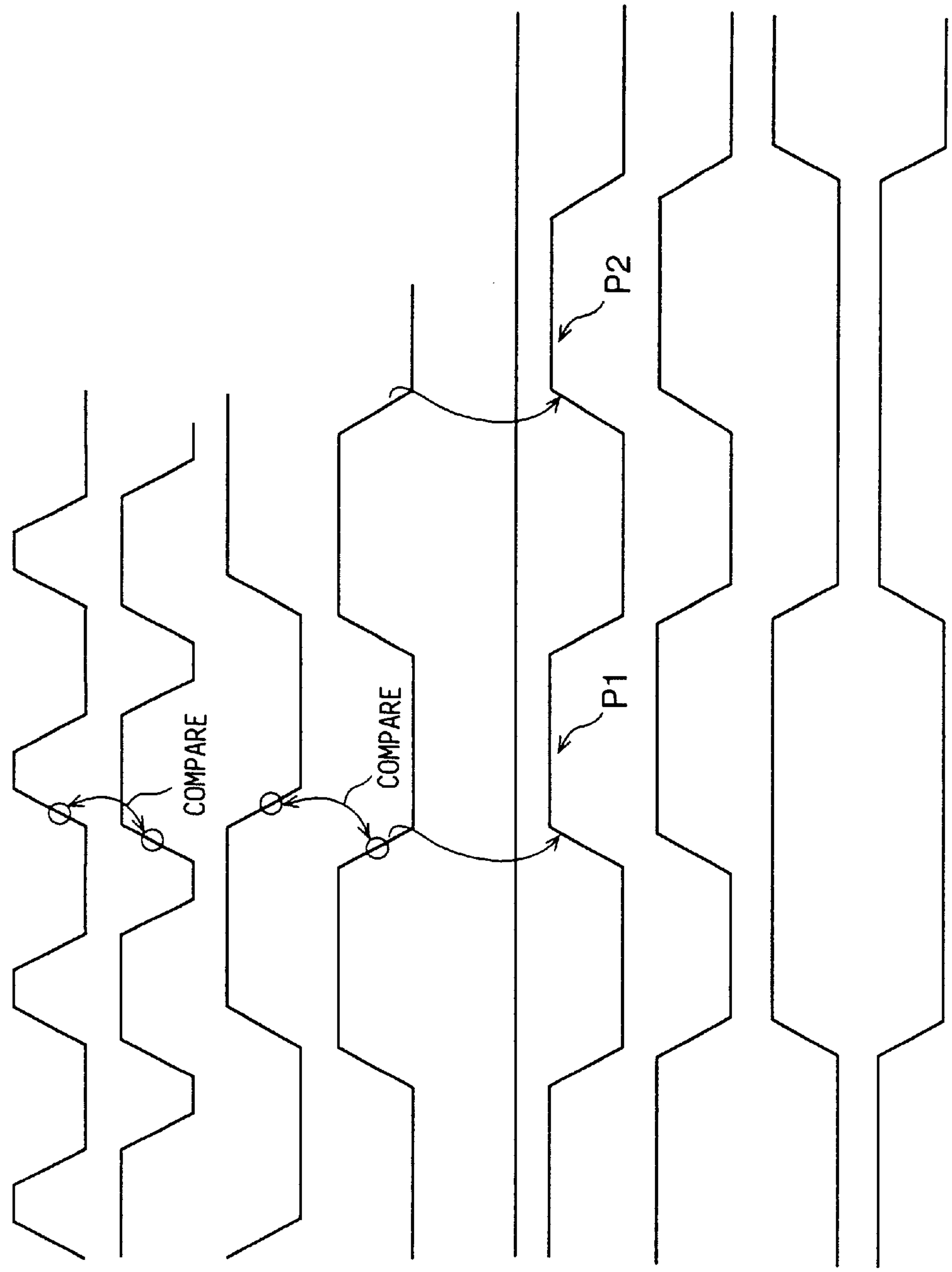
FIGS. 29A through 29I are timing charts showing signal changes at nodes N1 through N9 of the timing-detection circuit shown in FIG. 24.

The signals S5 and S6 (N1 and N2 in FIGS. 29A and 29B), which are input to the timing-detection circuit 312, are subjected to frequency division by the frequency divider 323, and are transformed into signals shown as N3 and N4 in FIGS. 29C and 29D, respectively. As shown in the figures, edges compared between the two outputs of the frequency divider 323 are falling edges. The signals at the nodes N3 and N4 are supplied to the phase-comparison circuit 325.

The phase-comparison circuit 325 includes NAND circuits 341 through 345 and inverters 346 through 349. The NAND circuits 344 and 345 together form a latch. In this latch, two inputs are LOW at an initial state, and two outputs are HIGH, as shown in FIG. 24. As shown in FIGS. 29C and 29D, a rising edge of the signal N4 is ahead of a rising edge of the signal N3. In this case, an output of the NAND circuit 343 becomes HIGH before an output of the NAND circuit 342 becomes HIGH. The NAND circuit 345 thus turns an output thereof into LOW, while the NAND circuit 344 keeps an output thereof at a HIGH level. This condition is latched, and, thus, does not change even when the output of the NAND circuit 342 is changed to HIGH by the falling edge of the signal N3. As shown in FIG. 24, an output signal N5 of the phase-comparison circuit 325 is kept LOW while an output signal N6 is changed from LOW to HIGH. Conversely, if falling edges used for comparison include a falling edge of the signal N3 coming before that of the signal N4, the signal N5 is changed to HIGH while the signal N6 remains at a LOW level.

In this manner, a check can be made as to which one of the signal S5 and the signal S6 has a rising edge coming ahead of the other by looking into which one of the signal N5 and the signal N6 is changed to HIGH. When the signal N5 is changed to HIGH, this is an indication that a rising edge of the signal S5 comes ahead of the other. When the signal N6 is turned to HIGH, on the other hand, a rising edge of the signal S6 should be ahead of the other. In other words, there is a need to delay rising edges of the signal S5 when the signal N5 is HIGH, and there is a need to advance rising edges of the signal S5 when the signal N6 is HIGH.

An output of the inverter 346 is used for resetting the condition of the latch to an initial condition by simultaneously changing the outputs of the NAND circuits 342 and 343 to LOW at an appropriate timing. If such a configuration was not employed, the condition of the latch would be reversed when the signal N4 returns to HIGH ahead of the signal N3 after the outputs of the NAND circuits 342 and 343 become HIGH, thereby changing the signal N5 to HIGH. In order to avoid this, the outputs of the NAND circuits 342 and 343 are reset to LOW at the same time.

A signal at the node N7 (hereinafter referred to as a signal N7) is a product of a NAND operation between the signal N3 and the signal N4 (delay ignored in the figure). The signal N7 is supplied to the binary counter 324. Signals N8 and N9 (at the nodes N8 and N9) are outputs from the binary counter 324. One of the signals N8 and N9 is a product of ½-frequency division of the signal N7, and the other is the inverse of the former.

The binary counter 324 includes NAND circuits 351 through 358 and inverters 359 through 361. Operations of the binary counter 324 are well within the scope of ordinary skill in the art, and a description thereof will be omitted. The outputs of the binary counter 324 are shown in FIGS. 29H and 29I.

The signal N5 is supplied to one input of the NAND circuits 331 and 332, and the signal N6 is provided to one input of the NAND circuits 333 and 334. The other input of the NAND circuits 331 and 333 receives the signal N8 from the binary counter 324, and the other input of the NAND circuits 332 and 334 receives the signal N9 from the binary counter 324.

Accordingly, when the signal N6 periodically becomes HIGH as shown in FIG. 29F, the inverters 337 and 338 inverting outputs of the NAND circuits 333 and 334, respectively, end up outputting HIGH pulses in turn. That is, a pulse P1 shown in FIG. 29F is output from the timing-detection circuit 312 after passing through the NAND circuit 333 and the inverter 337 which are opened by the signal N8, and a pulse P2 is output by passing through the NAND circuit 334 and the inverter 338 which are opened by the signal N9. The same applies in the case in which the signal N5 periodically becomes HIGH. In this case, HIGH pulses are output from the inverters 335 and 336 in turn.

Namely, when there is a need to delay the rising edges of the signal S5, HIGH pulses are output from the inverters 335 and 336 in turn. On the other hand, when the rising edges of the signal S5 need to be advanced, HIGH pulses are output from the inverters 337 and 338 in turn. These HIGH pulse are supplied to the shift register 322 of FIG. 24.

Figure 30:
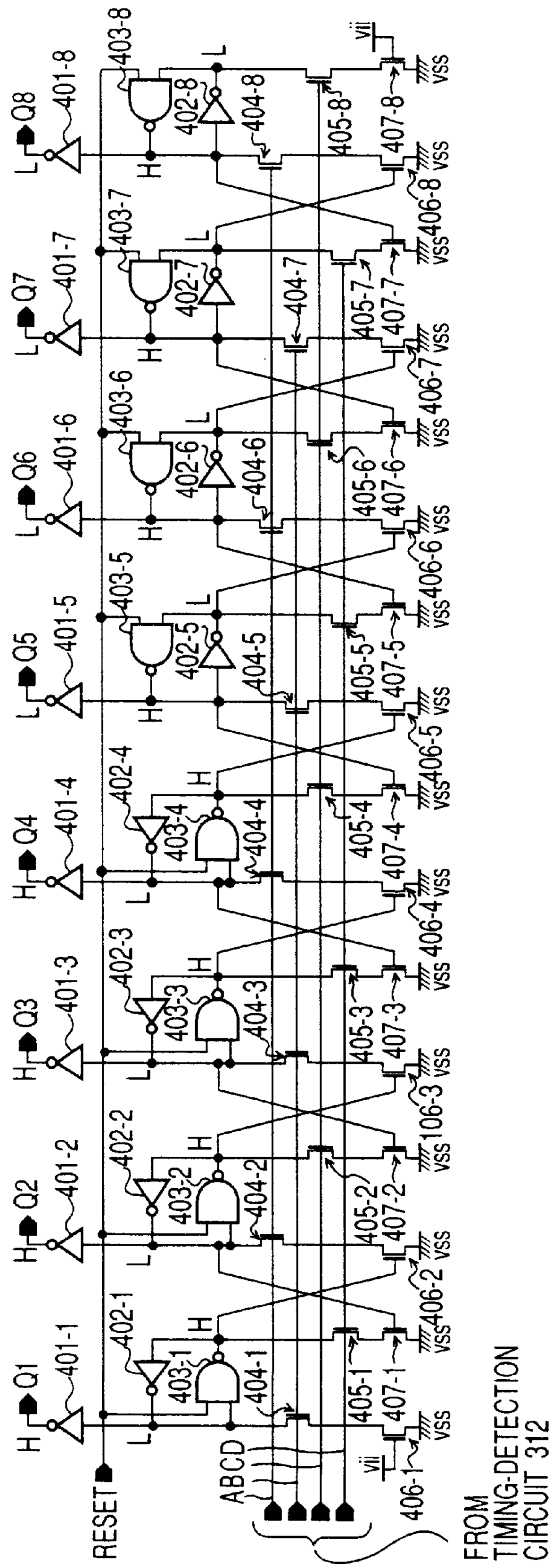
FIG. 30 is a circuit diagram of a shift register.

FIG. 30 is a circuit diagram of the shift register 322. The shift register 322 includes inverters 401-1 through 401-8, inverters 402-1 through 402-8, NAND circuits 403-1 through 403-8, NMOS transistors 404-1 through 404-8, NMOS transistors 405-1 through 405-8, NMOS transistors 406-1 through 406-8, and NMOS transistors 407-1 through 407-8. When the reset signal RESET becomes LOW, the shift register 322 is reset. That is, when the reset signal RESET is changed to LOW, outputs of the NAND circuits 403-1 through 403-8 become HIGH, and outputs of the inverters 402-1 through 402-8 become LOW. Each pair formed by one of the NAND circuits 403-1 through 403-8 and a corresponding one of the inverters 402-1 through 402-8 makes up a latch by each element of the pair providing an output thereof to the other element of the pair. Because of this latch function, an initial state set by the reset signal RESET is kept even after the reset signal RESET returns to HIGH.

In this initial state, as shown in FIG. 30, outputs Q1 through Q4 of the inverters 401-1 through 401-4 are HIGH, and outputs Q5 through Q8 of the inverters 401-5 through 401-8 are LOW.

When rising edges of the signal S5 need to delayed, HIGH pulses are supplied to signal lines A and B in turn. When a HIGH pulse is supplied to the signal line B, the NMOS transistor 404-5 is turned on. Since the NMOS transistor 406-5 is on, an output of the NAND circuit 403-5 is connected to the ground, and is forced to change from HIGH to LOW. An output of the inverter 402-5 is thus changed to HIGH, and this condition is held by the latch comprised of the NAND circuit 403-5 and the inverter 402-5. At this time, the output Q5 is changed from LOW to HIGH. Namely, the outputs Q1 through Q5 are HIGH, and the outputs Q6 through Q8 are LOW.

When a HIGH pulse is supplied to the signal line A, the NMOS transistor 404-6 is turned on. Since the NMOS transistor 406-6 is on, an output of the NAND circuit 403-6 is connected to the ground, and is forced to change from HIGH to LOW. An output of the inverter 402-6 is thus changed to HIGH, and this condition is held by the latch comprised of the NAND circuit 403-6 and the inverter 402-6. At this time, the output Q6 is changed from LOW to HIGH. Namely, the outputs Q1 through Q6 are HIGH, and the outputs Q7 and Q8 are LOW.

In this manner, HIGH pulses supplied to the signal lines A and B in turn increase the number of HIGH outputs among the outputs Q1 through Q8. This number increases one by one with every HIGH pulse supplied. The HIGH outputs among the outputs Q1 through Q8 are provided on the left in the figure, and the LOW outputs are provided on the right.

When rising edges of the signal S5 need to be advanced, HIGH pulses are supplied to signal lines C and D in turn. When a HIGH pulse is supplied to the signal line C in the initial state shown in FIG. 30, the NMOS transistor 405-4 is turned on. Since the NMOS transistor 407-4 is on, an output of the NAND circuit 403-4 is connected to the ground, and is forced to change from HIGH to LOW. An output of the inverter 402-4 is thus changed to HIGH, and this condition is held by the latch comprised of the NAND circuit 403-4 and the inverter 402-4. At this time, the output Q4 is changed from HIGH to LOW. Namely, the outputs Q1 through Q3 are HIGH, and the outputs Q4 through Q8 are LOW.

When a HIGH pulse is supplied to the signal line D, the NMOS transistor 405-3 is turned on. Since the NMOS transistor 407-3 is on, an output of the NAND circuit 403-3 is connected to the ground, and is forced to change from HIGH to LOW. An output of the inverter 402-3 is thus changed to HIGH, and this condition is held by the latch comprised of the NAND circuit 403-3 and the inverter 402-3. At this time, the output Q3 is changed from HIGH to LOW. Namely, the outputs Q1 and Q2 are HIGH, and the outputs Q3 through Q8 are LOW.

In this manner, HIGH pulses supplied to the signal lines C and D in turn increase the number of LOW outputs among the outputs Q1 through Q8. This number increases one by one with every HIGH pulse supplied. The HIGH outputs among the outputs Q1 through Q8 are provided on the left in the figure, and the LOW outputs are provided on the right.

The output signals Q1 through Q8 are supplied to the phase-adjustment circuits 321-1 through 321-3 to adjust signal phases.

Figure 31:
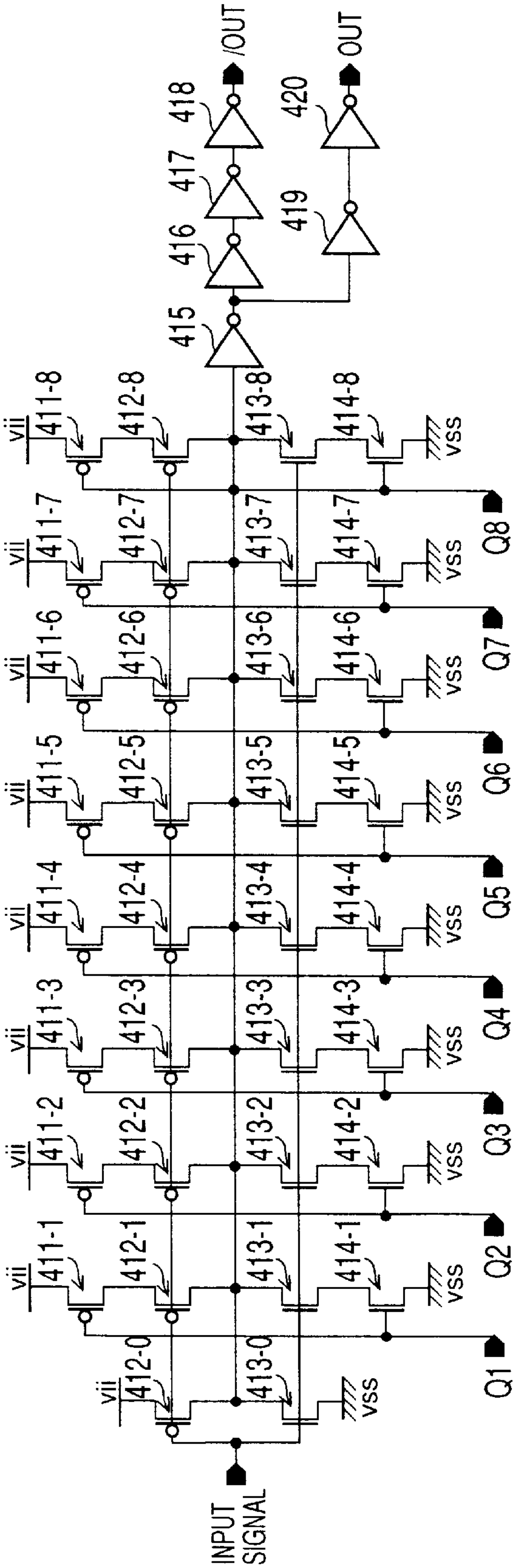
FIG. 31 is a circuit diagram of a phase-adjustment circuit.

FIG. 31 is a circuit diagram of a phase-adjustment circuit 321 which corresponds to the phase-adjustment circuits 321-1 through 321-3. That is, the phase-adjustment circuit 321 is used as any one of the phase-adjustment circuits 321-1 through 321-3.

The phase-adjustment circuit 321 includes PMOS transistors 411-1 through 411-8, PMOS transistors 412-0 through 412-8, NMOS transistors 413-0 through 413-8, NMOS transistors 414-1 through 414-8, and inverters 415 through 420.

The signals Q1 through Q8 from the shift register 322 are supplied to gates of the PMOS transistors 411-1 through 411-8 and the NMOS transistors 414-1 through 414-8, respectively. The PMOS transistors 412-0 through 412-8 and the NMOS transistors 413-0 through 413-8 together form an inverter, receiving the clock signal CLK as a gate input. An output signal /OUT thus has a phase which is an inverse of the phase of an input signal, and an output signal OUT has the same phase as the input signal.

In the initial state in which the signals Q1 through Q4 are HIGH and the signals Q5 through Q8 are LOW, the PMOS transistors 411-5 through 411-8 are turned on on the power-voltage side, and the NMOS transistors 414-1 through 414-4 are turned on on the ground-voltage side. When the input signal is HIGH, thus, five NMOS transistors 413-0 through 413-4 are driven. When the input signal is LOW on the other hand, five PMOS transistors 412-0 and 412-5 through 412-8 are driven. In this manner, a driving force with respect to a rising edge of the input signal is the same as a driving force for a falling edge of the input signal.

If the number of HIGH signals among the signals Q1 through Q8 is increased, the number of NMOS transistors driven when the clock signal CLK is HIGH increases. In this case, a driving force for a rising edge of the input signal is stepped up, and, at the same time, a driving force for a falling edge of the input signal is suppressed as the number of driven PMOS transistors is decreased. As a result, a transition period of the rising edge of the input signal is shortened, thereby bringing the rising edge forward with regard to time. At the same time, a transition period of the falling edge of the input signal is extended, thereby delaying the falling edge.

On the other hand, if the number of HIGH signals among the signals Q1 through Q8 is decreased, the number of NMOS transistors driven when the clock signal CLK is HIGH decreases. In this case, a driving force for a rising edge of the input signal is reduced, while a driving force for a falling edge of the input signal is boosted as the number of driven PMOS transistors is increased. As a result, a transition period of the rising edge of the input signal is extended, thereby delaying the rising edge. At the same time, a transition period of the falling edge of the input signal is shortened, thereby bringing the falling edge forward.

In this manner, the timing-detection circuit 312 makes a check as to which one of the signal S5 and signal S6 has a rising edge coming ahead of the other, and, then, the number of HIGH signals among the output signals Q1 through Q8 of the shift register 322 is adjusted based on the check results. In accordance with the number of the HIGH signals among the signals Q1 through Q8, the phase-adjustment circuits 321-1 through 321-3 controls a driving force for rising edges and a driving force for falling edges. This control makes it possible to adjust a rising-edge timing and a falling-edge timing of each signal such that the period Thigh and the period Tlow of the clock signal CLK become the same.

Figure 32:
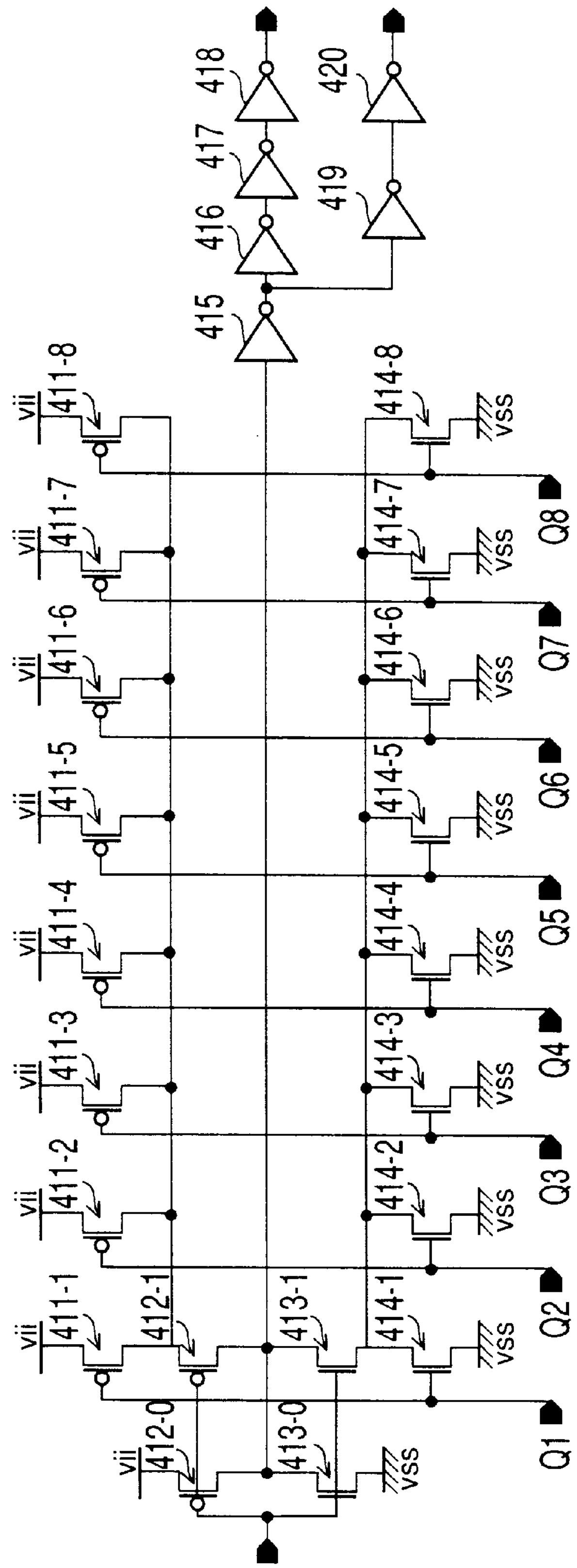
FIG. 32 is a circuit diagram of a variation of the phase-adjustment circuit.

FIG. 32 is a circuit diagram of a variation of the phase-adjustment circuit 321. In FIG. 32, the same elements as those of FIG. 31 are referred to by the same numerals, and a description thereof will be omitted. In a phase-adjustment circuit 321A of FIG. 32, the PMOS transistors 412-0 and 412-1 and the NMOS transistors 413-0 and 413-1 together make up an inverter.

As the number of HIGH signals among the signals Q1 through Q8 increases, the number of driven transistors among the PMOS transistors 411-1 through 411-8 decreases. When this happens, a resistance provided on the power-voltage side of the inverter increases, thereby making falling edges of the input signal less steep. At the same time, the number of driven transistors among the NMOS transistors 414-1 through 414-8 increases, so that a resistance provided on the ground-voltage side of the inverter decreases, making rising edges of the input signal steeper. As a result, rising edges are advanced with regard to time, and falling edges are delayed.

Conversely, when the number of HIGH signals among the signals Q1 through Q8 decreases, rising edges are delayed, and falling edges are advanced with regard to time.

Figure 33:
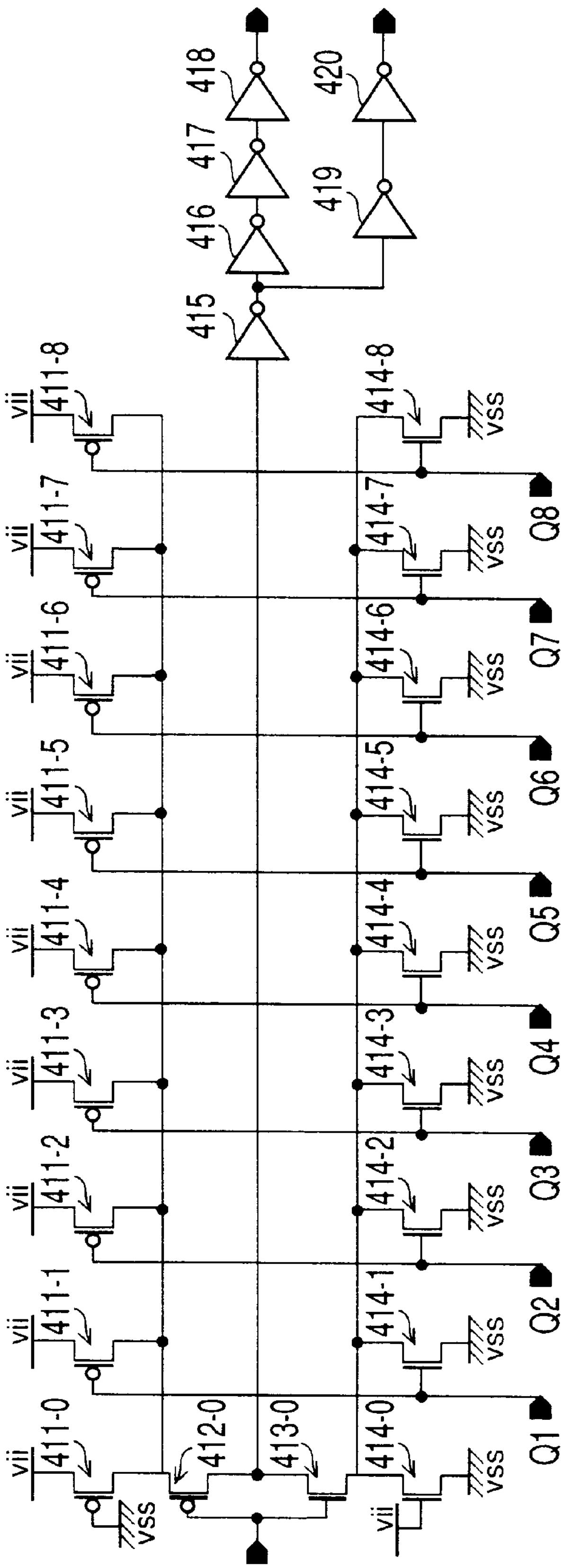
FIG. 33 is a circuit diagram of another variation of the phase-adjustment circuit.

FIG. 33 is a circuit diagram of another variation of the phase-adjustment circuit 321. In FIG. 33, the same elements as those of FIGS. 31 and 32 are referred to by the same numerals, and a description thereof will be omitted. In a phase-adjustment circuit 321B of FIG. 33, the PMOS transistors 412-0 and the NMOS transistors 413-0 together make up an inverter.

As the number of HIGH signals among the signals Q1 through Q8 increases, the number of driven transistors among the PMOS transistors 411-1 through 411-8 decreases. When this happens, a resistance provided on the power-voltage side of the inverter increases, thereby making falling edges of the input signal less steep. At the same time, the number of driven transistors among the NMOS transistors 414-1 through 414-8 increases, so that a resistance provided on the ground-voltage side of the inverter decreases, making rising edges of the input signal steeper. As a result, rising edges are advanced with regard to time, and falling edges are delayed.

Conversely, when the number of HIGH signals among the signals Q1 through Q8 decreases, rising edges are delayed, and falling edges are advanced with regard to time.

In FIG. 33, the PMOS transistor 411-0 and the NMOS transistor 414-0 are turned on at all the time. Because of this, the inverter comprised of the PMOS transistor 412-0 and the NMOS transistor 413-0 does not stop operating even when all the signals Q1 through Q8 become HIGH or all the signals Q1 through Q8 become LOW.

The above-described embodiments regarding the skew-reduction circuit 310 have been given with regard to an example in which the skew-reduction circuit is used as an input interface for signal input. The skew-reduction circuit, however, may be used as an output interface for outputting signals.

Figure 34:
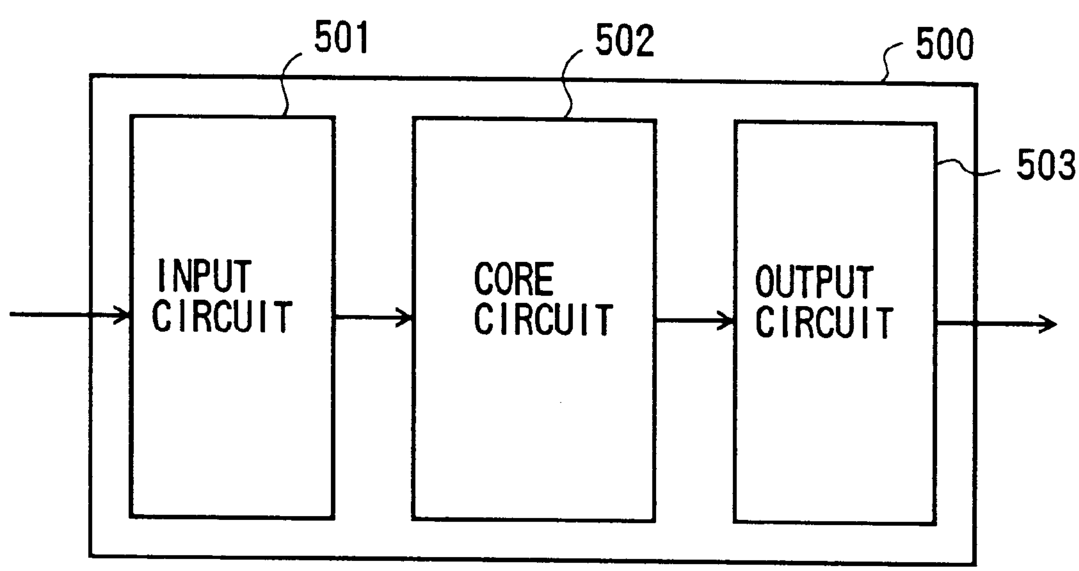
FIG. 34 is a block diagram of a semiconductor device to which the skew-reduction circuit of FIG. 22

FIG. 34 is a block diagram of a semiconductor device to which the skew-reduction circuit of FIG. 22 or FIG. 23 is applied. A semiconductor device 500 of FIG. 34 includes an input circuit 501, a core circuit 502, and an output circuit 503. The input circuit 501 receives input signals from an external source, and supplies the received signals to the core circuit 502. Output signals from the core circuit 502 are sent out from the semiconductor device 500 via the output circuit 503. The previously described embodiments concern a configuration in which the skew-reduction circuit of the present invention is used in the input circuit 501 of FIG. 34. The skew-reduction circuit, however, may be used in the output circuit 503 of FIG. 34 as an output interface for outputting signals.

Figure 35:
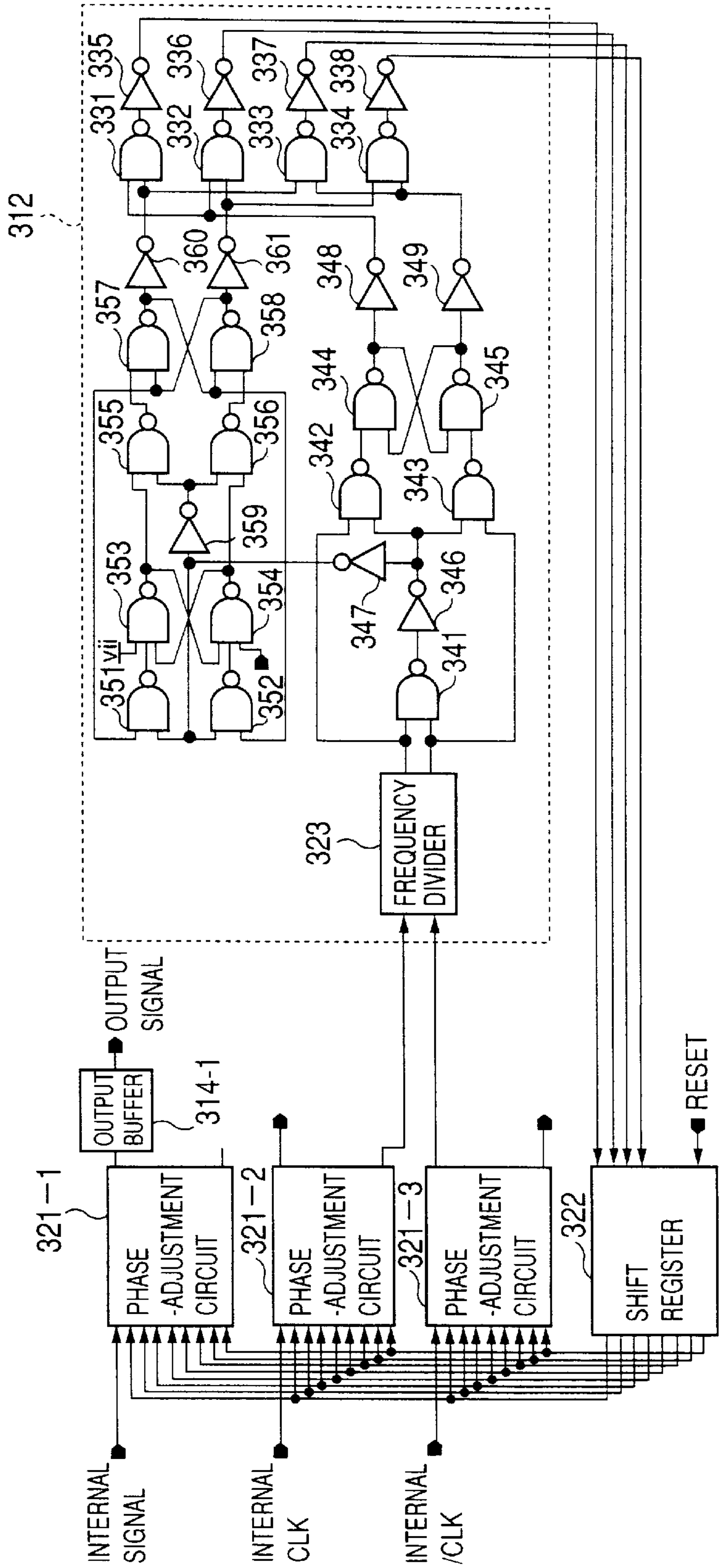
FIG. 35 is a block diagram of an embodiment of an output interface in which the skew-reduction circuit of FIG. 24 is employed.

FIG. 35 is a block diagram of an embodiment of an output interface in which the skew-reduction circuit of FIG. 24 is employed. In FIG. 35, the same elements as those of FIG. 24 are referred to by the same numerals, and a description thereof will be omitted.

The skew-reduction circuit of FIG. 35 is provided with the clock signal CLK, the clock signal /CLK, and internal signals used inside a device which includes the output interface of FIG. 35. As in the previous embodiments, rise-and-fall skews are reduced in the clock signal CLK, the clock signal /CLK, and the internal signals by using information contained in the clock signal CLK and the clock signal /CLK. The internal signals having a rise-and-fall skew thereof reduced are output from the phase-adjustment circuit 321-1, and are sent out from the device via an output buffer 314-1.

Figure 36:
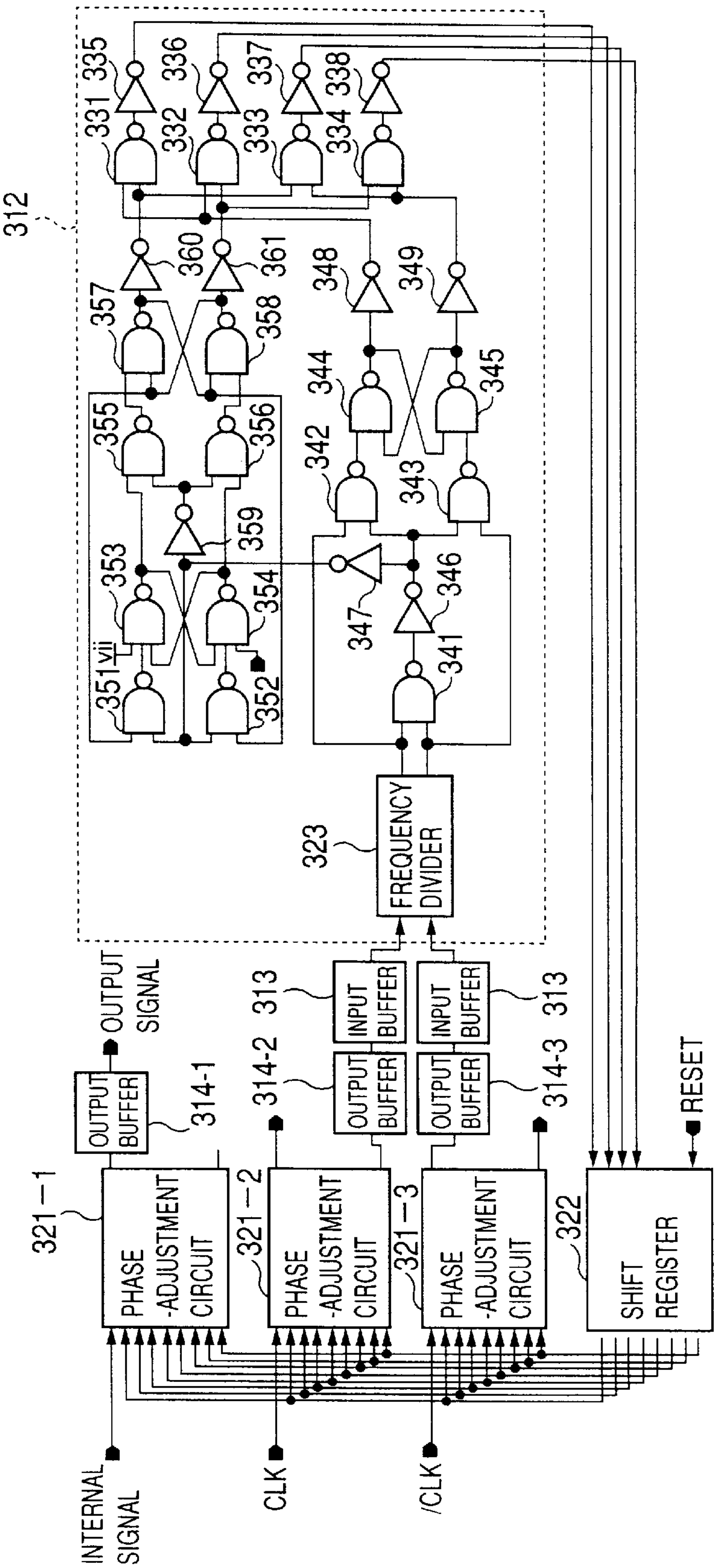
FIG. 36 is a block diagram of another embodiment of an output interface in which the skew-reduction circuit of FIG. 24 is employed.

FIG. 36 is a block diagram of another embodiment of an output interface in which the skew-reduction circuit of FIG. 24 is employed. In FIG. 36, the same elements as those of FIG. 35 are referred to by the same numerals, and a description thereof will be omitted.

The skew-reduction circuit of FIG. 36 is provided with the clock signal CLK, the clock signal /CLK, and internal signals used inside a device which includes the output interface of FIG. 36. As in the embodiment of FIG. 35, rise-and-fall skews are reduced in the clock signal CLK, the clock signal /CLK, and the internal signals by using information contained in the clock signal CLK and the clock signal /CLK. The internal signals having a rise-and-fall skew thereof reduced are output from the phase-adjustment circuit 321-1, and are sent out from the device via an output buffer 314-1. Output buffers 314-2 and 314-3 identical to the output buffer 314-1 are connected to the phase-adjustment circuit 321-2 for adjusting a phase of the clock signal CLK and to the phase-adjustment circuit 321-3 for adjusting a phase of the clock signal /CLK, respectively. Outputs of the output buffers 314-2 and 314-3 are supplied to the frequency divider 323 of the timing-detection circuit 312 via input buffers 313.

In the configuration of FIG. 36, the output buffers 314-2 and 314-3 identical to the output buffer 314-1 are incorporated into a feedback loop for phase adjustment, so that the output buffer 314-1 does not cause a rise-and-fall skew to be included in the output signal. Namely, the configuration of FIG. 36 reduces rise-and-fall skews in the clock signal CLK and the clock signal /CLK after these clock signals pass through the output buffers 314-2 and 314-3. This ensures that the output signal from the output buffer 314-1 has a reduced rise-and-fall skew. Here, in the configuration of FIG. 36, a rise-and-fall skew generated by the input buffer 313 is assumed to be insignificant.

Figure 37:
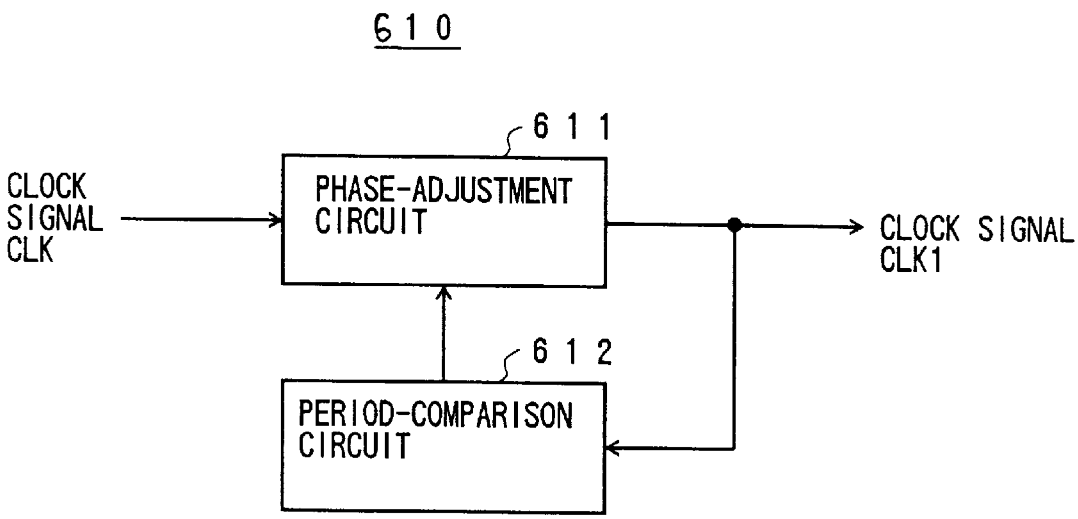
FIG. 37 is a block diagram of a skew-reduction circuit according to yet another principle of the present invention.

FIG. 37 is a block diagram of a skew-reduction circuit according to yet another principle of the present invention.

A skew-reduction circuit 610 includes a phase-adjustment circuit 611 and a period-comparison circuit 612. The phase-adjustment circuit 611 receives a clock signal CLK, and adjusts a phase of the clock signal CLK to output a phase-adjusted clock signal CLK1. The phase-adjusted clock signal CLK1 is supplied to a period-comparison circuit 612. The period-comparison circuit 612 compares a period Thigh with a period Tlow, where the phase-adjusted clock signal CLK1 is HIGH during the period Thigh and LOW during the period Tlow, and controls the phase-adjustment circuit 611 to have the period Thigh and the period Tlow equal to each other.

The phase-adjustment circuit 611 has a function to adjust a rise timing and a fall timing of the clock signal CLK in different directions, respectively. Namely, an adjustment to reset a rise timing forward or backward with regard to time can be made in a different direction from an adjustment to reset a fall timing forward or backward. For example, the rise timing may be delayed, while the fall timing is advanced. Through such adjustments, the phase-adjusted clock signal CLK1 is controlled to have the period Thigh and the period Tlow equal to each other.

The period-comparison circuit 612 detects relative timings of a rising edge and a falling edge of the phase-adjusted clock signal CLK1, and controls the phase-adjustment circuit 611 based on the detected relative timings. In detail, the period-comparison circuit 612 compares the period Thigh extending from a rising edge to a falling edge with the period Tlow spanning from a falling edge to a rising edge, and finds which one of these two periods is the longest. Based on this, the period-comparison circuit 612 controls the phase-adjustment circuit 611.

Figure 38:
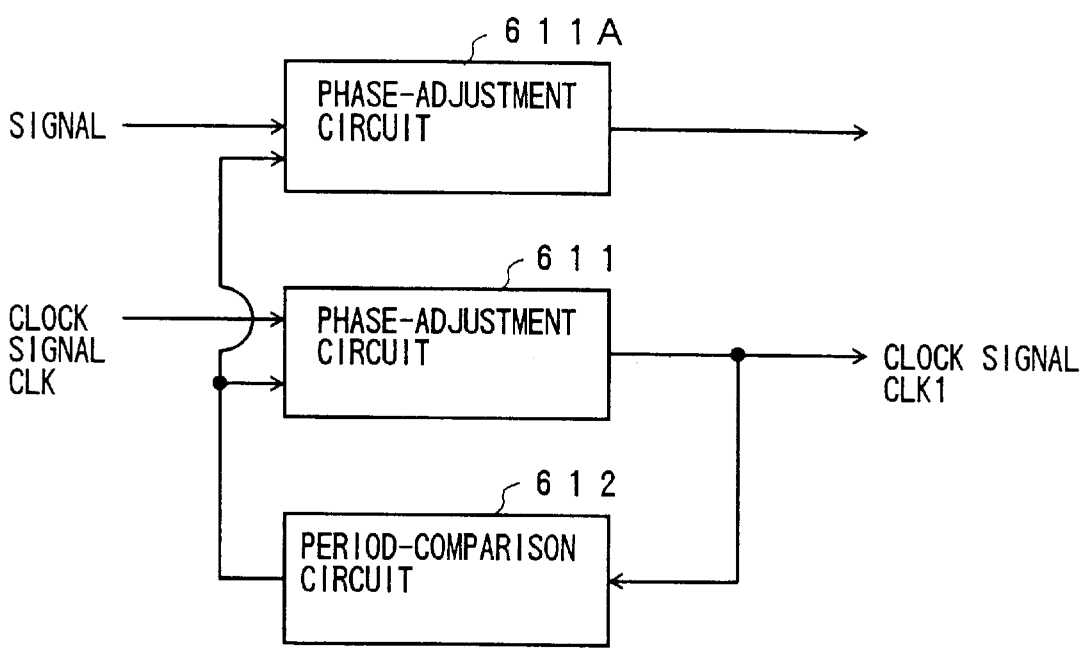
FIG. 38 is a block diagram showing a configuration in which the skew-reduction circuit of FIG. 37 is used for a skew reduction of another signal in addition to a clock signal.

FIG. 38 is a block diagram showing a configuration in which the skew-reduction circuit 610 is used for a skew reduction of another signal in addition to a clock signal.

In FIG. 38, the control signal from the period-comparison circuit 612 is not only supplied to the phase-adjustment circuit 611 receiving the clock signal CLK, but also supplied to a phase-adjustment circuit 611A receiving another signal. The phase-adjustment circuit 611A carries out the same phase adjustment as that of the phase-adjustment circuit 611 with respect to the received signal.

As previously described, factors causing a rise-and-fall skew work identically on each signal. When a phase adjustment for reducing a rise-and-fall skew of the clock signal is also applied to another signal as shown in FIG. 38, therefore, a rise-and-fall skew of this signal can also be reduced. In this manner, rise-and-fall skews of other signals are reduced based on the clock signal CLK.

As described above, the skew-reduction circuit 610 of the present invention includes the phase-adjustment circuit 611 for adjusting a phase of the clock signal CLK and the period-comparison circuit 612 for controlling the phase-adjustment circuit 611 based on a comparison of the period Thigh extending from a rising edge to a falling edge with the period Tlow spanning from a falling edge to a rising edge. With this configuration, the skew-reduction circuit 610 can adjust the clock signal CLK such that the phase-adjusted clock signal CLK1 has the period Thigh thereof and the period Tlow thereof equal to each other, thereby reducing the rise-and-fall skew of the clock signal CLK. Further, based on the clock signal CLK, rise-and-fall skews of other signals can also be reduced by drawing on the fact that rise-and-fall skews are identical with respect to each signal.

In the following, embodiments of the above-described principle will be described with reference to the accompanying drawings.

Figure 39:
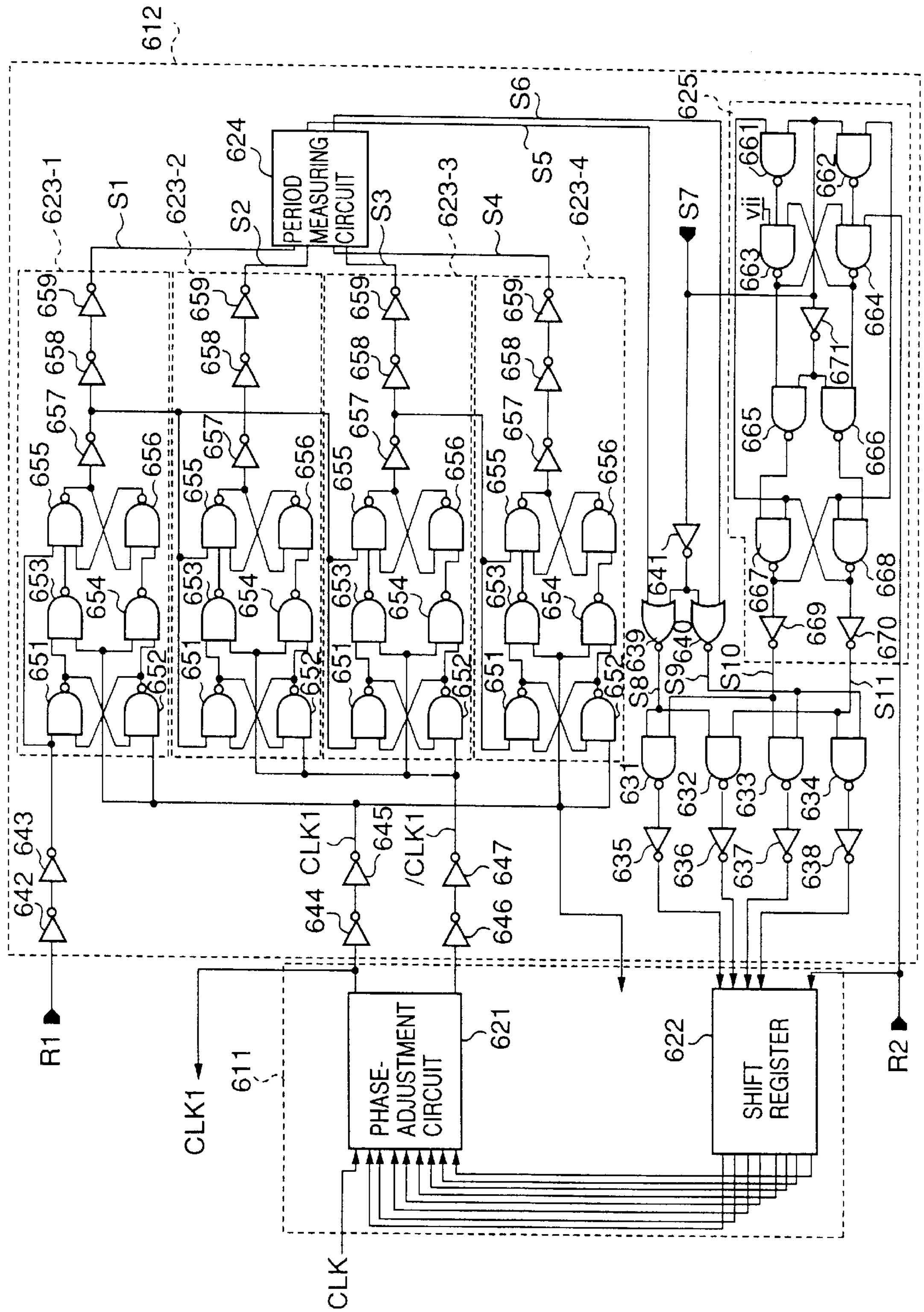
FIG. 39 is a block diagram of a skew-reduction circuit according to an embodiment of the present invention.

FIG. 39 is a block diagram of a skew-reduction circuit according to an embodiment of the present invention. FIGS. 40A through 40L are timing charts showing signals R1, R2, CLK, CLK1, /CLK1, and S0 through S7 of FIG. 39. The skew-reduction circuit of FIG. 39 receives the clock signal CLK, and outputs the phase-adjusted clock signal CLK1.

The skew-reduction circuit of FIG. 39 includes the phase-adjustment circuit 611 and the period-comparison circuit 612 of FIG. 37. The clock signal CLK input to the skew-reduction circuit is supplied to the phase-adjustment circuit 611.

The phase-adjustment circuit 611 includes a phase-adjustment circuit 621 and a shift register 622. The phase-adjustment circuit 621 adjust a phase of the clock signal CLK, and outputs the phase-adjusted clock signal CLK1 as well as an inverse clock signal /CLK1 which is an inverse of the phase-adjusted clock signal CLK1. The phase-adjusted clock signal CLK1 and the inverse clock signal /CLK1 output from the phase-adjustment circuit 611 are supplied to the period-comparison circuit 612.

The period-comparison circuit 612 includes edge-detection circuits 623-1 through 623-4, a period measuring circuit 624, a binary counter 625, NAND circuits 631 through 634, inverters 635 through 639, NOR circuits 639 through 640, and inverters 641 through 647. Operations of the period-comparison circuit 612 will be described later in detail. In brief, the edge-detection circuits 623-1 through 623-4 of the period-comparison circuit 612 generates a signal S1 changing to HIGH at a first rising edge of the phase-adjusted clock signal CLK1, signals S2 and S3 turning to HIGH at a first rising edge of the inverse clock signal /CLK1, and a signal S4 changing to HIGH at a second rising edge of the phase-adjusted clock signal CLK1, respectively, as shown in FIGS. 40F through 40I. The period measuring circuit 624 of the period-comparison circuit 612 measures the period Thigh by measuring a period between the rising edge of the signal S1 and the rising edge of the signal S2. Further, the period measuring circuit 624 measures the period Tlow by gauging a period between the rising edge of the signal S3 and the rising edge of the signal S4. Based on a check as to which one of these two periods is the longest, the period measuring circuit 624 changes one of the signals S5 and S6 to HIGH. Information regarding which one of the signals S5 and S6 is HIGH is supplied to the shift register 622 of the phase-adjustment circuit 611 at a time when the timing signal S7 is HIGH.

When the period Thigh is longer than the period Tlow, the shift register 622 controls the phase-adjustment circuit 621 to adjusts the phase-adjusted clock signal CLK1 such that rising edges thereof are delayed and the falling edges thereof are advanced. When the period Thigh is shorter than the period Tlow, on the other hand, the phase-adjustment circuit 621 is controlled such that the rising edges of the phase-adjusted clock signal CLK1 are advanced, and the falling edges thereof are delayed. Through these adjustments, the phase-adjusted clock signal CLK1 ends up having the period Thigh and the period Tlow equal to each other.

In what follows, each element of the skew-reduction circuit of FIG. 39 will be described.

Each of the edge-detection circuits 623-1 through 623-4 which are identical to each other includes NAND circuits 651 through 656 and inverters 657 through 659.

In the edge-detection circuit 623-1, the phase-adjusted clock signal CLK1 is LOW immediately after the reset signal R1 is changed to HIGH. Receiving the phase-adjusted clock signal CLK1 and the reset signal R1 as input signals, a latch comprised of the NAND circuits 651 and 652 holds a state in which outputs of the NAND circuits 651 and 652 are LOW and HIGH, respectively. This state does not change even when the phase-adjusted clock signal CLK1 is changed. As the phase-adjusted clock signal CLK1 becomes HIGH, the outputs of the NAND circuits 651 and 652 are supplied to a latch comprised of the NAND circuits 655 and 656 via the NAND circuits 653 and 654. The NAND circuits 655 and 656 thus have outputs thereof fixed at LOW and HIGH, respectively. This condition does not change even when the phase-adjusted clock signal CLK1 is changed. Because of this, the output of the edge-detection circuit 623-1 becomes HIGH at a first rising edge of the phase-adjusted clock signal CLK1 after the reset signal R1 is turned to HIGH, and remains at a HIGH level until the edge-detection circuit 623-1 is reset.

In the edge-detection circuits 623-2 and 623-3, a signal having the same waveform as the signal S1 is supplied in the same manner as the reset signal R1 is supplied to the edge-detection circuit 623-1, and the inverse clock signal /CLK1 is supplied in the same manner as the phase-adjusted clock signal CLK1 is supplied to the edge-detection circuit 623-1. An output of the edge-detection circuits 623-2 and 623-3, therefore, changes to HIGH at a first rising edge of the inverse clock signal /CLKl after the signal S1 is turned to HIGH. After changing to HIGH, the output of the edge-detection circuits 623-2 and 623-3 maintains a HIGH level thereof until these circuits are reset.

In the edge-detection circuit 623-4, a signal having the same waveform as the signal S3 is supplied in place of the reset signal R1 when compared with the edge-detection circuit 623-1. The output of the edge-detection circuit 623-4 thus changes to HIGH at a first rising edge of the phase-adjusted clock signal CLK1 after the signal S3 is turned to HIGH, and, then, maintains a HIGH level thereof until the edge-detection circuit 623-4 is reset.

In this manner, the edge-detection circuits 623-1 through 623-4 generates signals S1 through S4, respectively, as shown in FIGS. 40F through 40I.

Figure 41:
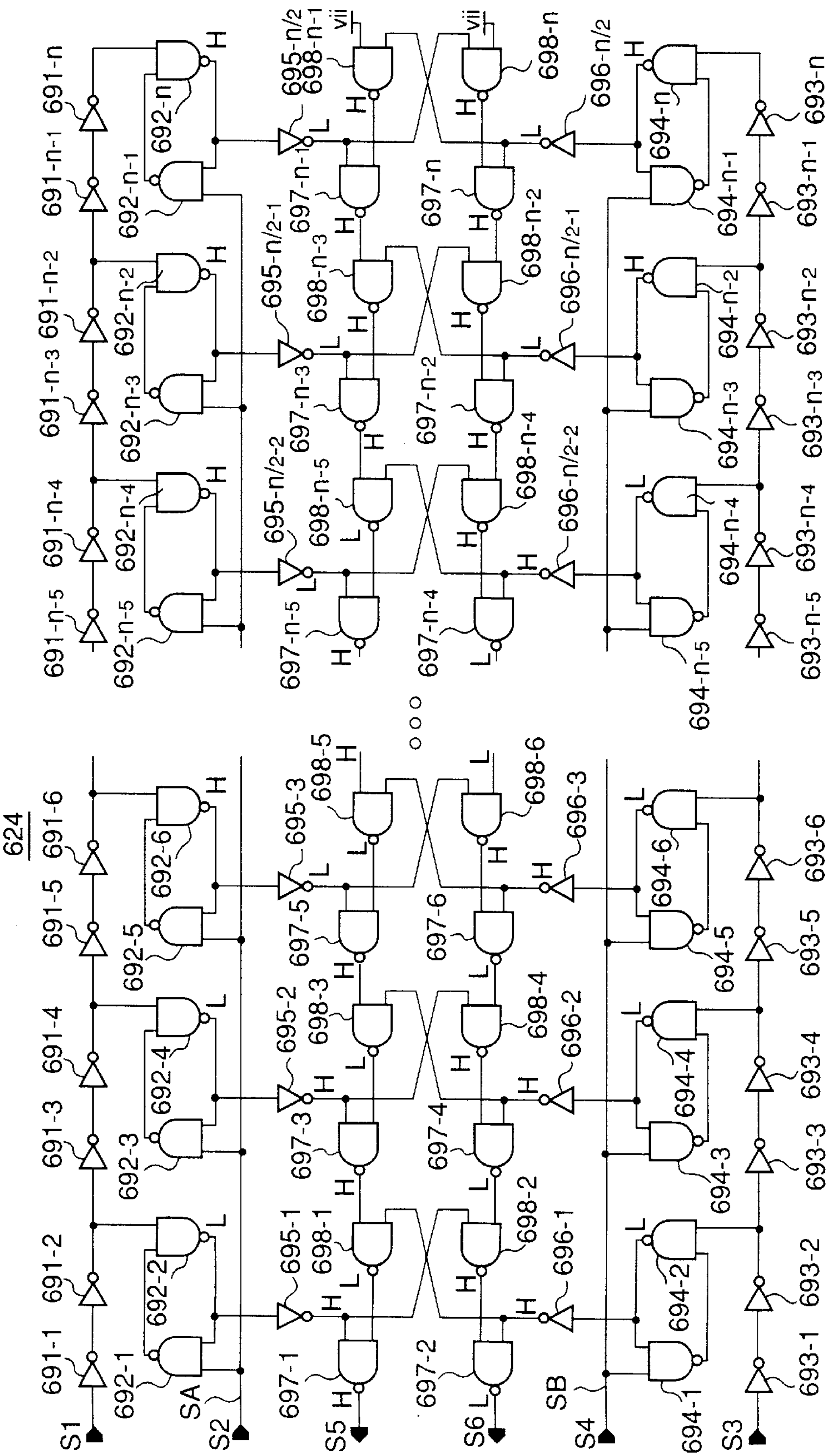
FIG. 41 is a circuit diagram of a first embodiment of a period measuring circuit.

FIG. 41 is a circuit diagram of a first embodiment of the period measuring circuit 624.

The period measuring circuit 624 of FIG. 41 includes inverters 691-1 through 691-n (n: even number) connected in series, NAND circuit 692-1 through 692-n with every pair thereof forming a latch, inverters 693-1 through 693-n connected in series, NAND circuit 694-1 through 694-n with every pair thereof forming a latch, inverters 695-1 through 695-n/2 inverting outputs of the latches formed by the NAND circuits 692-1 through 692-n, inverters 696-1 through 696-n/2 inverting outputs of the latches formed by the NAND circuits 694-1 through 694-n, NAND circuits 697-1 through 697-n, and NAND circuits 698-1 through 698-n.

A series of the inverters 691-1 through 691-n of FIG. 41 forms a series of delay elements, and the input signal S1 propagates therethrough while incurring delays. The signal S2 propagates along a signal line SA which is laid out in parallel to the series of delay elements comprising the inverters 691-1 through 691-n. In this configuration, the signal S1 propagating through the series of delay elements with some delay competes with the signal S2 propagating through the signal line SA without any delay.

Figures 40A, 40B, 40C, 40D, 40E, 40F, 40G, 40H, 40I, 40J, 40K, 40L:
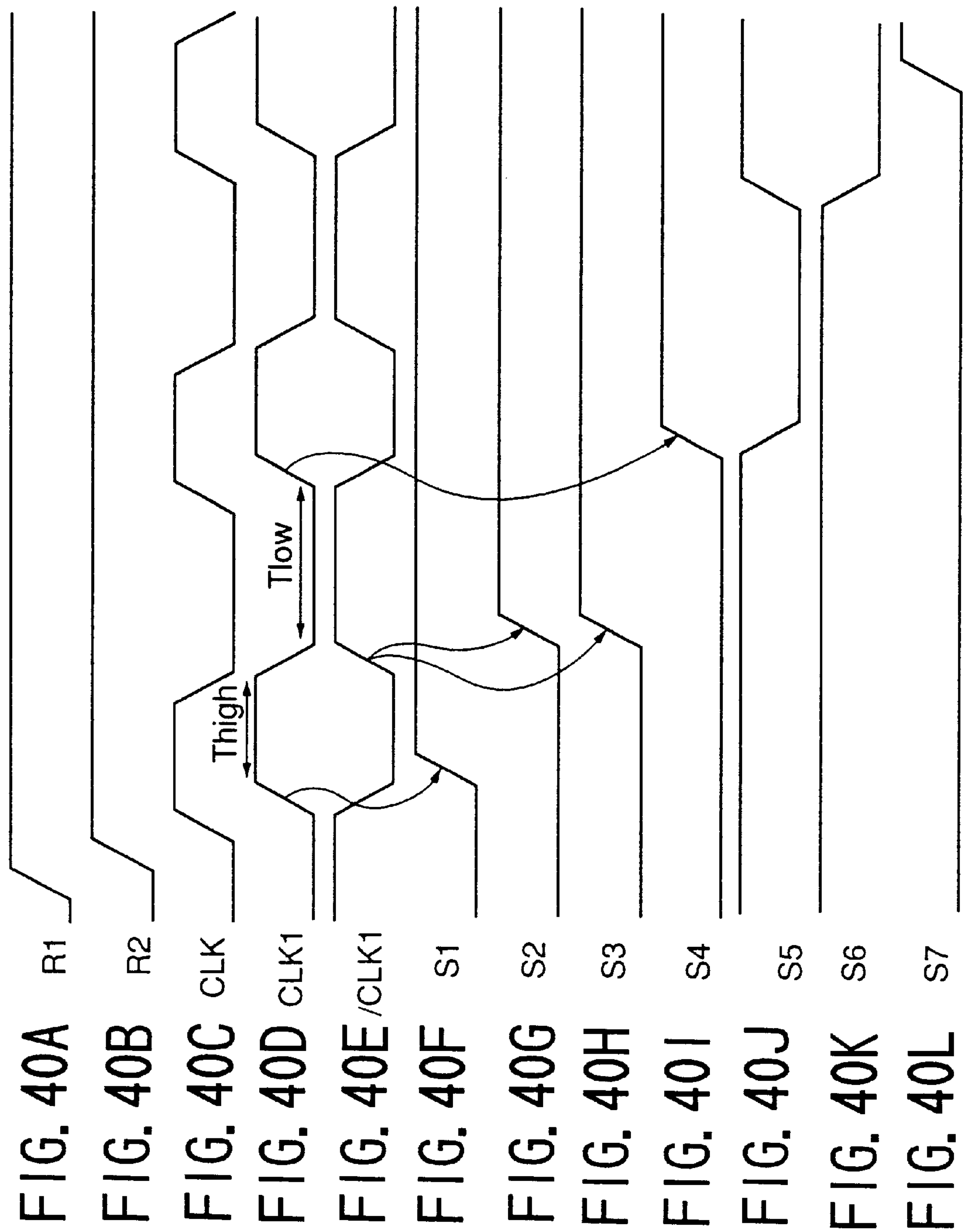
FIGS. 40A through 40L are timing charts showing signals R1, R2, CLK, CLK1, /CLK1, and S0 through S7 of FIG. 39.

The latches formed by the NAND circuits 692-1 through 692-n latch a LOW output thereof when the signal S1 becomes HIGH ahead of the signal S2, and latch a HIGH output thereof when the signal S2 is the first to become HIGH. As shown in FIGS. 40F and 40G, the signal S1 is the first to become HIGH at a time when the signals S1 and S2 are input to the circuit. Because of this, latches provided on the left-hand side of FIG. 41, which are close to the input nodes, latch a LOW output thereof. Since the signal S1 incurs an increased delay as it propagates further to the right in the figure, latches provided on the right-hand side of FIG. 41, which are far away from the input node, latch a HIGH output thereof. A position of a boundary between the latches latching LOW and the latches latching HIGH indicates a time difference between the edge of the signal S1 and the edge of the signal S2. The smaller the time difference, the closer the position of the boundary to the input nodes.

By the same token, the latches formed by the NAND circuit 694-1 through 694-n latch a LOW output thereof when the signal S3 becomes HIGH ahead of the signal S4, and latch a HIGH output thereof when the signal S4 is the first to become HIGH. As shown in FIGS. 40H and 40I, the signal S3 is the first to become HIGH at a time when the signals S3 and S4 are input to the circuit. Because of this, latches provided on the left-hand side of FIG. 41, which are close to the input nodes, latch a LOW output thereof. Since the signal S3 incurs an increased delay as it propagates further to the right in the figure, latches provided on the right-hand side of FIG. 41, which are far away from the input node, latch a HIGH output thereof. A position of a boundary between the latches latching LOW and the latches latching HIGH indicates a time difference between the edge of the signal S3 and the edge of the signal S4. The smaller the time difference, the closer the position of the boundary to the input nodes.

In an example of FIG. 41, a difference in edge timings between the signal S1 and the signal S2 is relatively small, and the latch comprised of the NAND circuits 692-5 and 692-6 latches a HIGH output. This HIGH output corresponds to a boundary indicating the time difference. This boundary is referred to as a first boundary. A difference in edge timings between the signal S3 and the signal S4 is relatively large, and the latch comprised of the NAND circuits 694-n-3 and 694-n-2 latches a HIGH output which corresponds to a boundary indicating the time difference. This boundary is referred to as a second boundary. In this case, the NAND circuits 697-2x-1 and 697-2x forming a pair produce HIGH outputs on the right-hand side of the second boundary. On the left-hand side of the second boundary, however, the NAND circuits 697-2x-1 and 697-2x output HIGH and LOW, respectively. The same pattern of outputs are observed even on the left-hand side of the first boundary. Final outputs, which are the signals S5 and S6, are thus HIGH and LOW, respectively.

If the timing difference of edges between the signals S1 and S2 is longer than the timing difference of edges between the signals S3 and S4, which is the opposite case to the example of FIG. 41, the NAND circuits 697-2x-1 and 697-2x outputs LOW and HIGH, respectively, on the left-hand side of a boundary which is first from the rightmost point (this boundary indicates the time difference between the signal S1 and the signal S2). These outputs are conveyed up to the final outputs, and the signals S5 and S6, which are outputs of the NAND circuits 697-1 and 697-2, respectively, thus become LOW and HIGH, respectively.

In this manner, the period measuring circuit 624 measures the time difference (Thigh) between the signals S1 and S2 and the time difference (Tlow) between the signals S3 and S4, and compares these two time differences to change one of the signals S5 and S6 to HIGH accordingly. In the configuration of FIG. 41, the signal S5 becomes HIGH if the period Thigh is shorter than the period Tlow, and the signal S6 becomes HIGH if the period Thigh is longer than the period Tlow.

With reference to FIG. 39 again, the signals S5 and S6 from the period measuring circuit 624 are supplied to the shift register 622 via a set of gate circuits including NOR circuits 639 and 640, NAND circuits 631 through 634, and inverters 635 through 638.

The NOR circuits 639 and 640 allows the passage of the signals S5 and S6 only when the timing signal S7 is HIGH. The timing signal S7 becomes HIGH when the period measuring circuit 624 outputs effective data of the signals S5 and S6. In accordance with periodic outputs of effective data by the period measuring circuit 624 comparing the period Thigh and the period Tlow of the periodic phase-adjusted clock signal CLK1, the timing signal S7 changes between HIGH and LOW back and forth.

FIGS. 42A through 42E are timing charts showing the timing signal S7, signals S8 and S9 output from the NOR circuits 639 and 640, respectively, and signals S10 and S11 output from the binary counter 625 which receives the timing signal S7 as an input thereof.

Figures 42A, 42B, 42C, 42D, 42E:
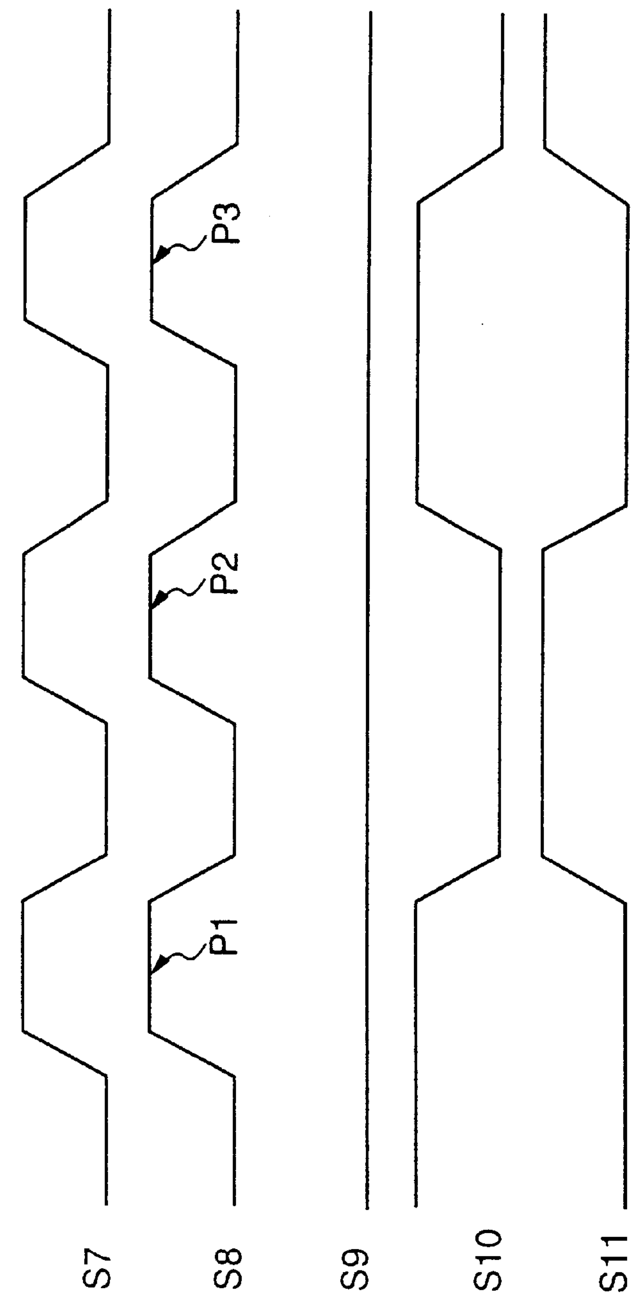
FIGS. 42A through 42E are timing charts showing signals S7, S8, S9, S10, S11 of FIG. 39.

The signals S8 and S9 correspond to an inverse logic of the signals S5 and S6, respectively, which are output from the period measuring circuit 624. When the signal S6 is selected, the signals S8 becomes HIGH as shown in FIG. 42B. That is, when the period Thigh is longer than the period Tlow, the signal S8 becomes HIGH. When the period Thigh is shorter than the period Tlow, on the other hand, the signal S9 becomes HIGH.

The timing signal S7 exhibits periodic changes between HIGH and LOW as shown in FIG. 42A. The timing signal S7 is supplied to the binary counter 625. The binary counter 625 includes NAND circuits 661 through 668 and inverters 669 through 671. Operations of the binary counter 625 are well within the scope of ordinary skill in the art, and a description thereof will be omitted. The signals S10 and S11 output from the binary counter 625 are a signal obtained from the timing signal S7 by diving a frequency thereof by half and an inverse of this obtained signal, respectively, as shown in FIGS. 42D and 42E.

The signal S8 is supplied from the NOR circuit 639 to the NAND circuits 631 and 632, and the signal S9 is supplied from the NOR circuit 640 to the NAND circuits 633 and 634. The NAND circuits 631 and 633 also receive the signal S10 from the binary counter 625, while the NAND circuits 632 and 634 receive the signal S11 from the binary counter 625.

When the signal S8 is comprised of HIGH pulses as shown in FIG. 42B, therefore, the inverters 635 and 636 inverting the outputs of the NAND circuits 631 and 632, respectively, output these HIGH pulses in turn.

Namely, pulses P1 and P3 shown in FIG. 42A pass through the NAND circuit 631 and the inverter 635 when the NAND circuit 631 is opened by the signal S10, and a pulse P2 passes through the NAND circuit 632 and the inverter 636 when the NAND circuit 632 is opened by the signal S11. The same applies in the case where the signal S9 is comprised of HIGH pulses. In this case, these HIGH pulses will be output from the inverters 637 and 638 in turn.

Accordingly, when the period Thigh is longer than the period Tlow, HIGH pulses are output from the inverters 635 and 636 in turn. On the other hand, when the period Thigh is shorter than the period Tlow, HIGH pulses are output from the inverters 637 and 638 in turn. These pulses are supplied to the shift register 622 shown in FIG. 39.

Figure 43:
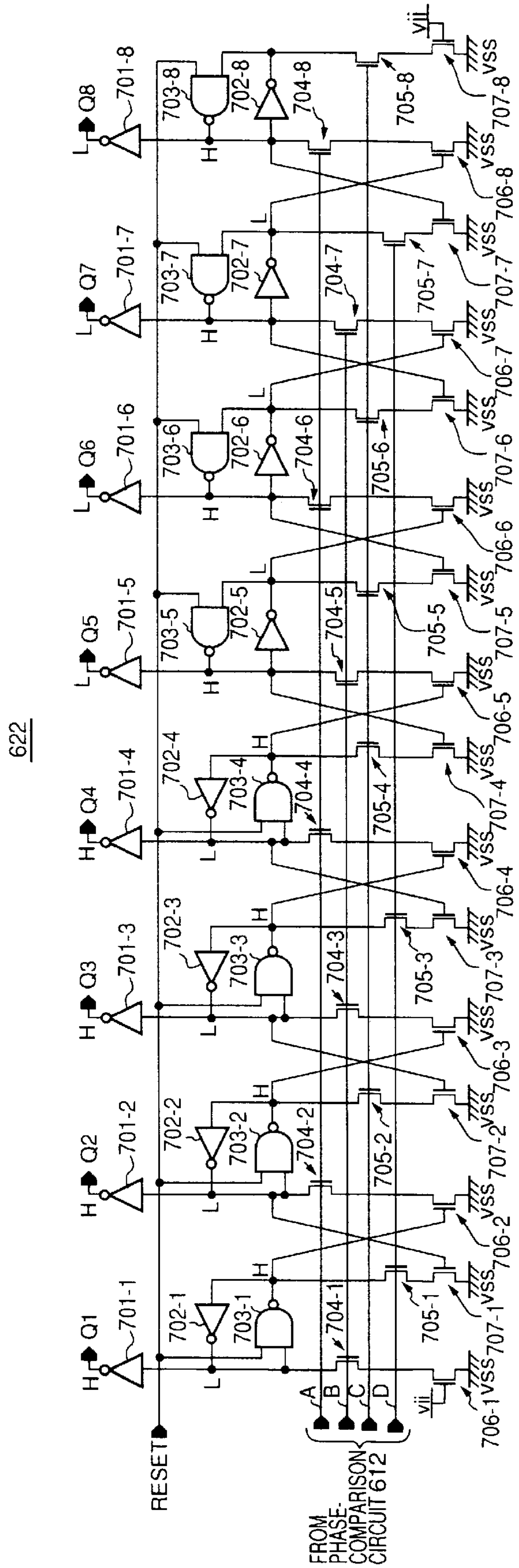
FIG. 43 is a circuit diagram of a shift register of a phase-adjustment circuit.

FIG. 43 is a circuit diagram of the shift register 622 of the phase-adjustment circuit 611.

The shift register 622 includes inverters 701-1 through 701-8, inverters 702-1 through 702-8, NAND circuits 703-1 through 703-8, NMOS transistors 704-1 through 704-8, NMOS transistors 705-1 through 705-8, NMOS transistors 706-1 through 706-8, and NMOS transistors 707-1 through 707-8. When the reset signal RESET becomes LOW, the shift register 622 is reset. That is, when the reset signal RESET is changed to LOW, outputs of the NAND circuits 703-1 through 703-8 become HIGH, and outputs of the inverters 702-1 through 702-8 become LOW. Each pair formed by one of the NAND circuits 703-1 through 703-8 and a corresponding one of the inverters 702-1 through 702-8 makes up a latch by each element of the pair providing an output thereof to the other element of the pair. Because of this latch function, an initial state set by the reset signal RESET is kept even after the reset signal RESET returns to HIGH.

In this initial state, as shown in FIG. 43, outputs Q1 through Q4 of the inverters 701-1 through 701-4 are HIGH, and outputs Q5 through Q8 of the inverters 701-5 through 701-8 are LOW.

When rising edges of the phase-adjusted clock signal CLK1 needs to be advanced, HIGH pulses are supplied to signal lines A and B in turn. When a HIGH pulse is supplied to the signal line B, the NMOS transistor 704-5 is turned on. Since the NMOS transistor 706-5 is on, an output of the NAND circuit 703-5 is connected to the ground, and is forced to change from HIGH to LOW. An output of the inverter 702-5 is thus changed to HIGH, and this condition is held by the latch comprised of the NAND circuit 703-5 and the inverter 702-5. At this time, the output Q5 is changed from LOW to HIGH. Namely, the outputs Q1 through Q5 are HIGH, and the outputs Q6 through Q8 are LOW.

When a HIGH pulse is supplied to the signal line A, the NMOS transistor 704-6 is turned on. Since the NMOS transistor 706-6 is on, an output of the NAND circuit 703-6 is connected to the ground, and is forced to change from HIGH to LOW. An output of the inverter 702-6 is thus changed to HIGH, and this condition is held by the latch comprised of the NAND circuit 703-6 and the inverter 702-6. At this time, the output Q6 is changed from LOW to HIGH. Namely, the outputs Q1 through Q6 are HIGH, and the outputs Q7 and Q8 are LOW.

In this manner, HIGH pulses supplied to the signal lines A and B in turn increase the number of HIGH outputs among the outputs Q1 through Q8. This number increases one by one with every HIGH pulse supplied. The HIGH outputs among the outputs Q1 through Q8 are provided on the left in the figure, and the LOW outputs are provided on the right.

When rising edges of the phase-adjusted clock signal CLK1 needs to be delayed, HIGH pulses are supplied to signal lines C and D in turn. When a HIGH pulse is supplied to the signal line C in the initial state shown in FIG. 43, the NMOS transistor 705-4 is turned on. Since the NMOS transistor 707-4 is on, an output of the NAND circuit 703-4 is connected to the ground, and is forced to change from HIGH to LOW. An output of the inverter 702-4 is thus changed to HIGH, and this condition is held by the latch comprised of the NAND circuit 703-4 and the inverter 702-4. At this time, the output Q4 is changed from HIGH to LOW. Namely, the outputs Q1 through Q3 are HIGH, and the outputs Q4 through Q8 are LOW.

When a HIGH pulse is supplied to the signal line D, the NMOS transistor 705-3 is turned on. Since the NMOS transistor 707-3 is on, an output of the NAND circuit 703-3 is connected to the ground, and is forced to change from HIGH to LOW. An output of the inverter 702-3 is thus changed to HIGH, and this condition is held by the latch comprised of the NAND circuit 703-3 and the inverter 702-3. At this time, the output Q3 is changed from HIGH to LOW. Namely, the outputs Q1 and Q2 are HIGH, and the outputs Q3 through Q8 are LOW.

In this manner, HIGH pulses supplied to the signal lines C and D in turn increase the number of LOW outputs among the outputs Q1 through Q8. This number increases one by one with every HIGH pulse supplied. The HIGH outputs among the outputs Q1 through Q8 are provided on the left in the figure, and the LOW outputs are provided on the right.

The output signals Q1 through Q8 are supplied to the phase-adjustment circuit 621 (FIG. 39) to adjust a phase of the phase-adjusted clock signal CLK1.

Figure 44:
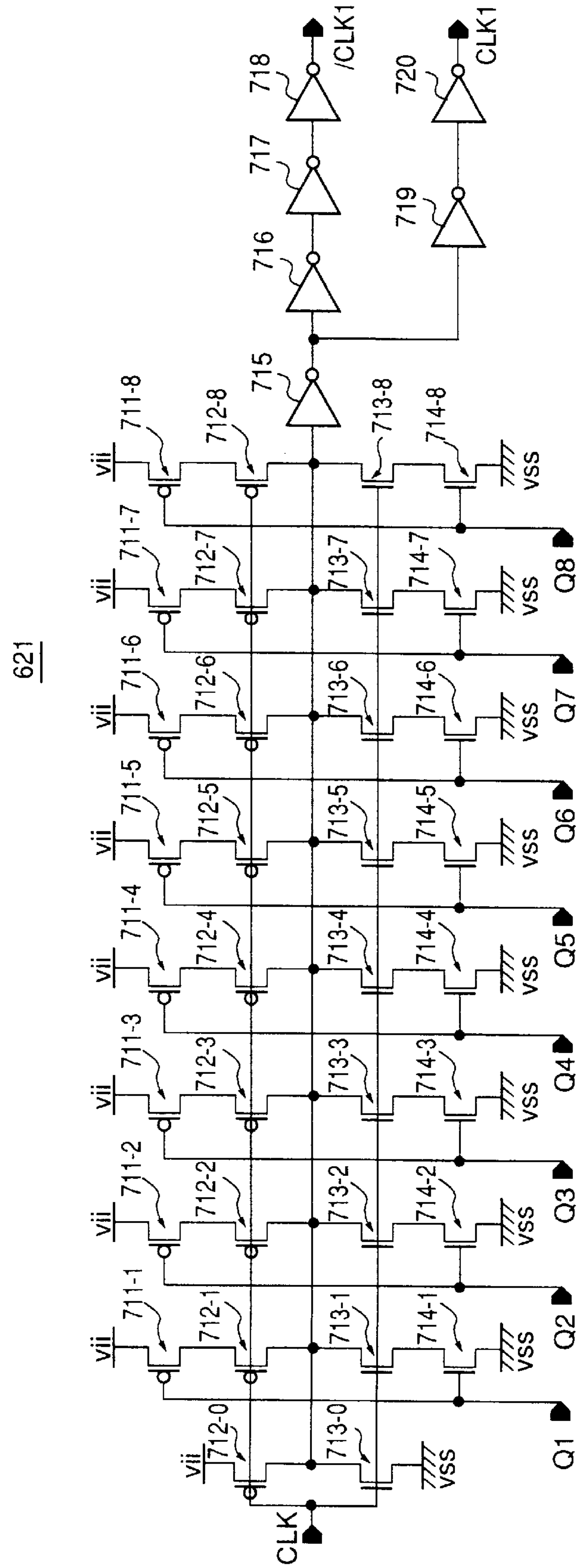
FIG. 44 is a circuit diagram of a phase-adjustment circuit.

FIG. 44 is a circuit diagram of a phase-adjustment circuit 621.

The phase-adjustment circuit 321 includes PMOS transistors 711-1 through 711-8, PMOS transistors 712-0 through 712-8, NMOS transistors 713-0 through 713-8, NMOS transistors 714-1 through 714-8, and inverters 715 through 720.

The signals Q1 through Q8 from the shift register 622 are supplied to gates of the PMOS transistors 711-1 through 711-8 and the NMOS transistors 714-1 through 714-8, respectively. The PMOS transistors 712-0 through 712-8 and the NMOS transistors 713-0 through 713-8 together form an inverter, receiving the clock signal CLK as a gate input. The inverse clock signal /CLK1 thus has a phase which is an inverse of the phase of the input signal, and the phase-adjusted clock signal CLK1 has the same phase as the input signal.

In the initial state in which the signals Q1 through Q4 are HIGH and the signals Q5 through Q8 are LOW, the PMOS transistors 711-5 through 711-8 are turned on on the power-voltage side, and the NMOS transistors 714-1 through 714-4 are turned on on the ground-voltage side. When the clock signal CLK is HIGH, thus, five NMOS transistors 713-0 through 713-4 are driven. When the clock signal CLK is LOW on the other hand, five PMOS transistors 712-0 and 712-5 through 712-8 are driven. In this manner, a driving force with respect to a rising edge of the clock signal CLK is the same as a driving force for a falling edge of the clock signal CLK.

If the number of HIGH signals among the signals Q1 through Q8 is increased, the number of NMOS transistors driven when the clock signal CLK is HIGH increases. In this case, a driving force for a rising edge of the clock signal CLK is stepped up, and, at the same time, a driving force for a falling edge of the clock signal CLK is suppressed as the number of driven PMOS transistors is decreased. As a result, a transition period of the rising edge of the phase-adjusted clock signal CLK1 is shortened, thereby bringing the rising edge forward with regard to time. At the same time, a transition period of the falling edge of the phase-adjusted clock signal CLK1 is extended, thereby delaying the falling edge.

On the other hand, if the number of HIGH signals among the signals Q1 through Q8 is decreased, the number of NMOS transistors driven when the clock signal CLK is HIGH decreases. In this case, a driving force for a rising edge of the clock signal CLK is reduced, while a driving force for a falling edge of the clock signal CLK is boosted as the number of driven PMOS transistors is increased. As a result, a transition period of the rising edge of the phase-adjusted clock signal CLK1 is extended, thereby delaying the rising edge. At the same time, a transition period of the falling edge of the phase-adjusted clock signal CLK1 is shortened, thereby bringing the falling edge forward.

In this manner, the period-comparison circuit 612 makes a check as to which one of the period Thigh and the period Tlow of the phase-adjusted clock signal CLK1 is the longest, and, then, the number of HIGH signals among the output signals Q1 through Q8 of the shift register 622 is adjusted based on the check results. In accordance with the number of the HIGH signals among the signals Q1 through Q8, the phase-adjustment circuit 621 controls a driving force for rising edges of the clock signal CLK and a driving force for falling edges of the clock signal CLK. This control makes it possible to adjust a rising-edge timing and a falling-edge timing of the phase-adjusted clock signal CLK1 such that the period Thigh and the period Tlow of the phase-adjusted clock signal CLK1 become the same.

Figure 45:
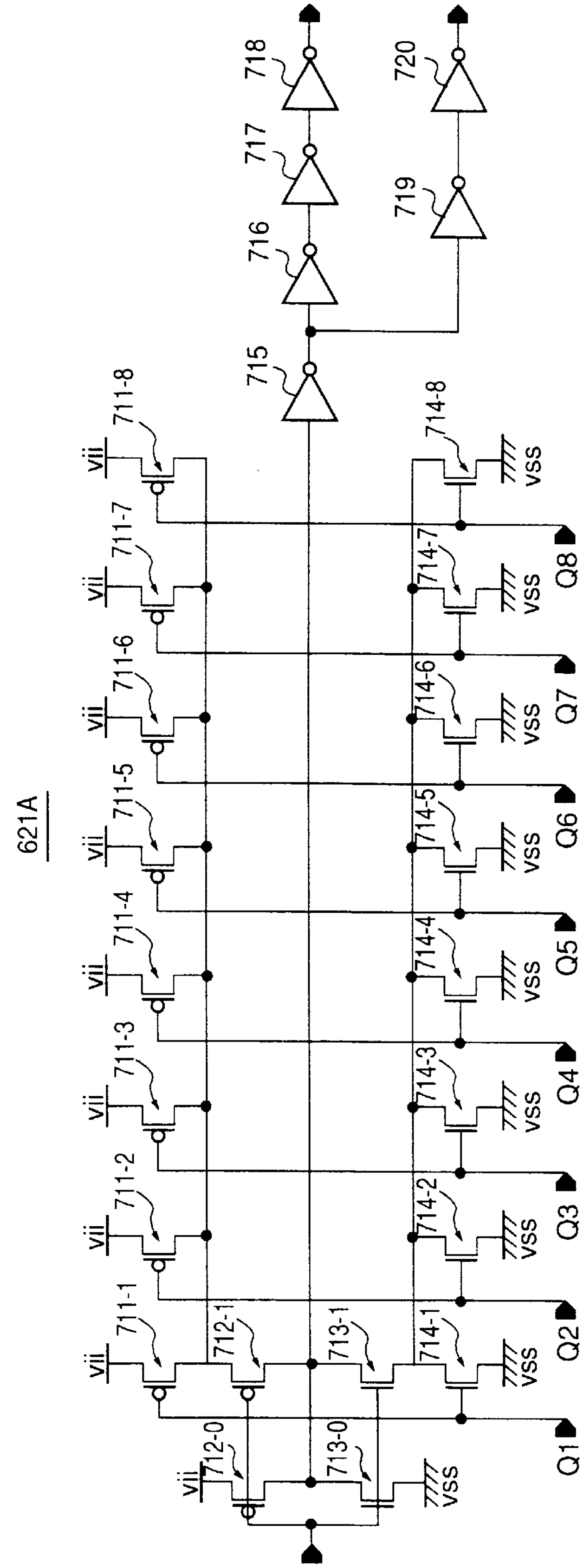
FIG. 45 is a circuit diagram of a variation of the phase-adjustment circuit.

FIG. 45 is a circuit diagram of a variation of the phase-adjustment circuit 621. In FIG. 45, the same elements as those of FIG. 44 are referred to by the same numerals, and a description thereof will be omitted. In a phase-adjustment circuit 621A of FIG. 45, the PMOS transistors 712-0 and 712-1 and the NMOS transistors 713-0 and 713-1 together make up an inverter.

As the number of HIGH signals among the signals Q1 through Q8 increases, the number of driven transistors among the PMOS transistors 711-1 through 711-8 decreases. When this happens, a resistance provided on the power-voltage side of the inverter increases, thereby making falling edges of the input signal less steep. At the same time, the number of driven transistors among the NMOS transistors 714-1 through 714-8 increases, so that a resistance provided on the ground-voltage side of the inverter decreases, making rising edges of the input signal steeper. As a result, rising edges are advanced with regard to time, and falling edges are delayed.

Conversely, when the number of HIGH signals among the signals Q1 through Q8 decreases, rising edges are delayed, and falling edges are advanced with regard to time.

Figure 46:
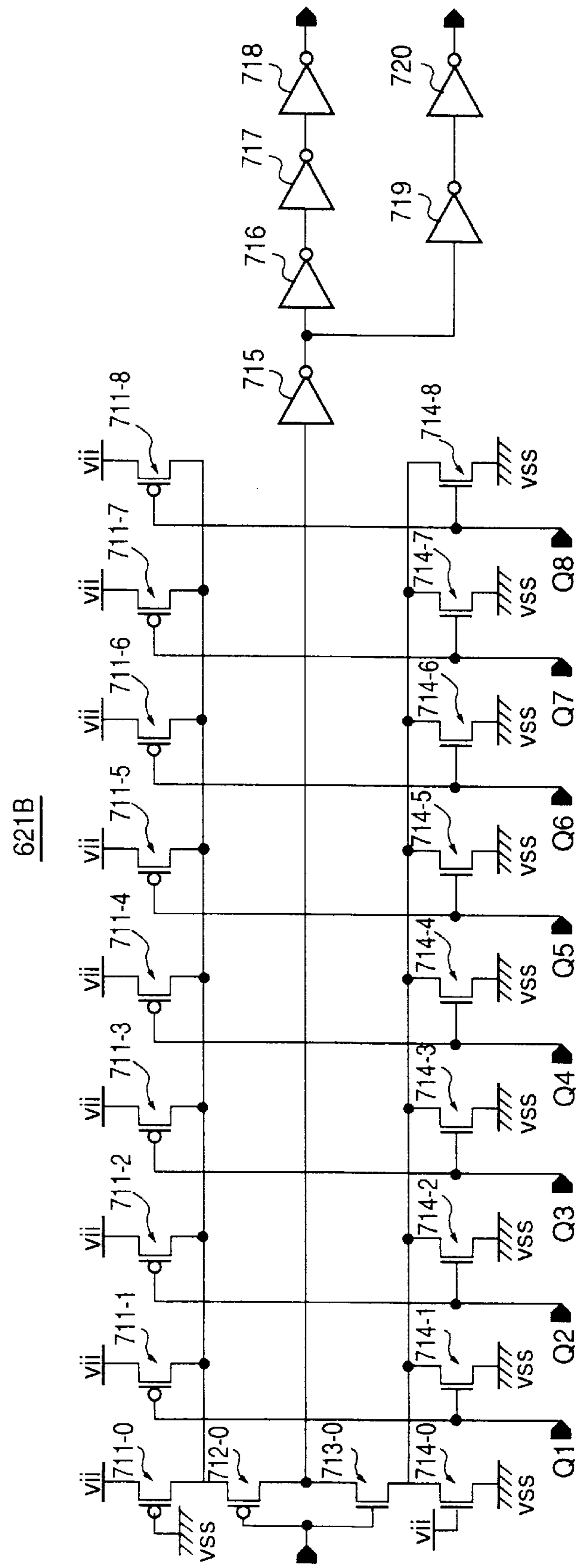
FIG. 46 is a circuit diagram of another variation of the phase-adjustment circuit.

FIG. 46 is a circuit diagram of another variation of the phase-adjustment circuit 621. In FIG. 46, the same elements as those of FIGS. 44 and 45 are referred to by the same numerals, and a description thereof will be omitted. In a phase-adjustment circuit 621B of FIG. 46, the PMOS transistors 712-0 and the NMOS transistors 713-0 together make up an inverter.

As the number of HIGH signals among the signals Q1 through Q8 increases, the number of driven transistors among the PMOS transistors 711-0 through 711-8 decreases. When this happens, a resistance provided on the power-voltage side of the inverter increases, thereby making falling edges of the input signal less steep. At the same time, the number of driven transistors among the NMOS transistors 714-0 through 714-8 increases, so that a resistance provided on the ground-voltage side of the inverter decreases, making rising edges of the input signal steeper. As a result, rising edges are advanced with regard to time, and falling edges are delayed.

Conversely, when the number of HIGH signals among the signals Q1 through Q8 decreases, rising edges are delayed, and falling edges are advanced with regard to time.

In FIG. 46, the PMOS transistor 711-0 and the NMOS transistor 714-0 are turned on at all the time. Because of this, the inverter comprised of the PMOS transistor 712-0 and the NMOS transistor 713-0 does not stop operating even when all the signals Q1 through Q8 become HIGH or all the signals Q1 through Q8 become LOW.

Figure 47:
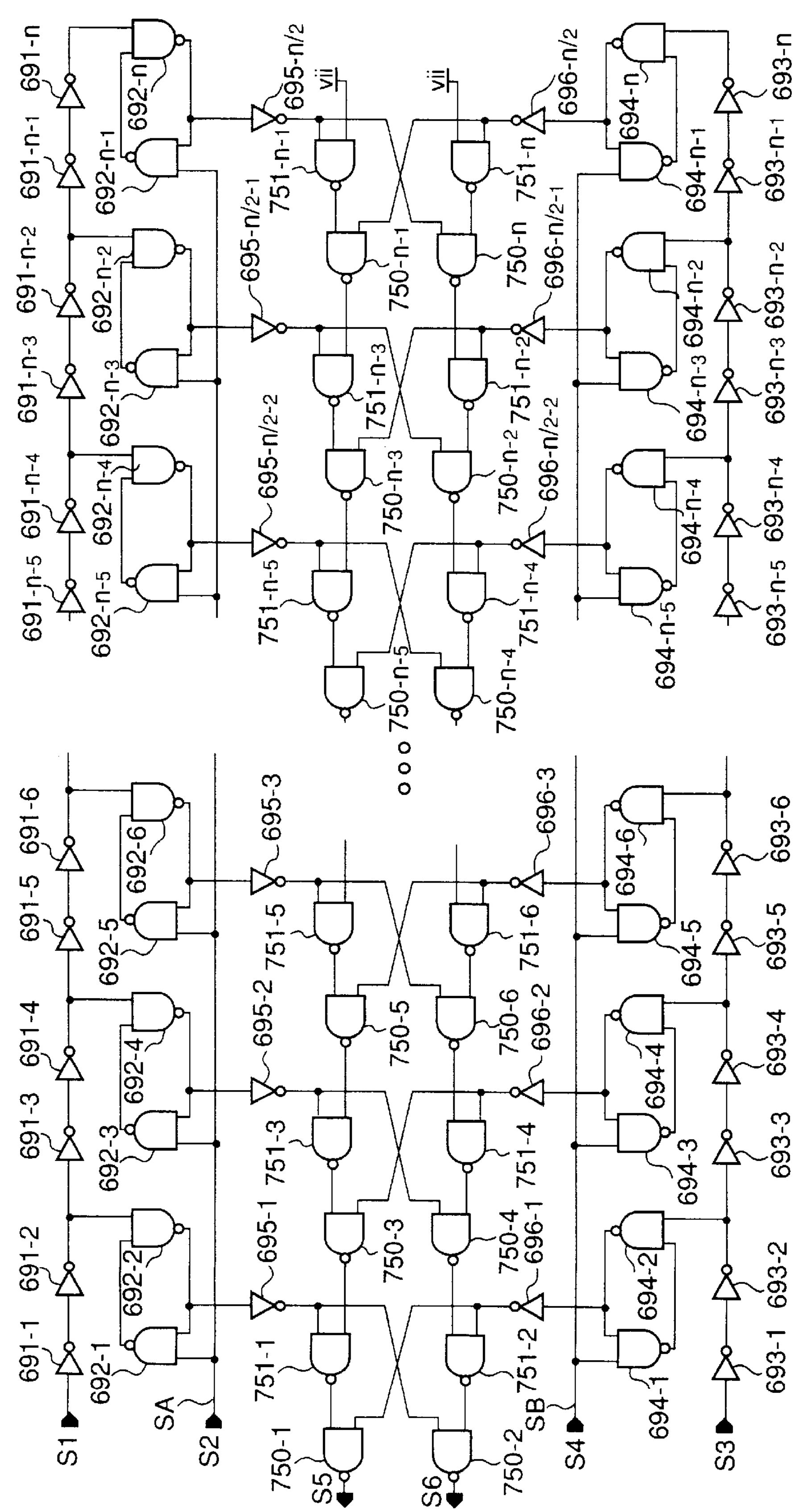
FIG. 47 is a circuit diagram of a second embodiment of the period measuring circuit.

FIG. 47 is a circuit diagram of a second embodiment of the period measuring circuit 624. In FIG. 47, the same elements as those of FIG. 41 are referred to by the same numerals, and a description thereof will be omitted.

A period measuring circuit 624A of FIG. 47 includes NAND circuits 750-1 through 750-n and NAND circuits 751-1 through 751-n in place of the NAND circuits 697-1 through 697-n and the NAND circuits 698-1 through 698-n of FIG. 41. Operations of the period measuring circuit 624A are almost the same as those of the period measuring circuit 624 of FIG. 41, and a description thereof will be omitted.

Figure 48:
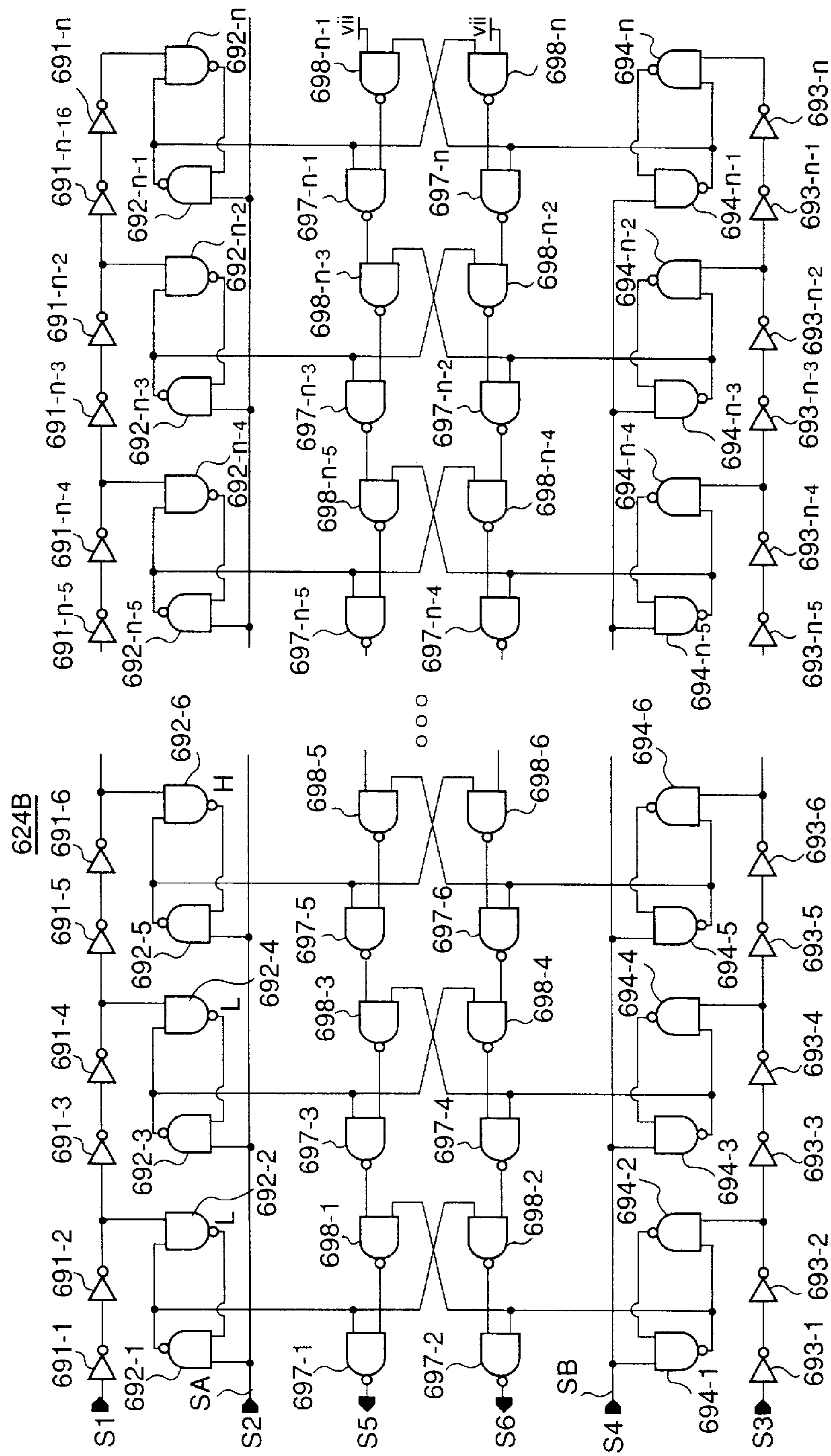
FIG. 48 is a circuit diagram of a third embodiment of the period measuring circuit.

FIG. 48 is a circuit diagram of a third embodiment of the period measuring circuit 624. In FIG. 48, the same elements as those of FIG. 41 are referred to by the same numerals, and a description thereof will be omitted.

In a period measuring circuit 624B of FIG. 48, the inverters 695-1 through 695-n/2 of FIG. 41 are removed. With this removal, among outputs of the latches comprised of the NAND circuit 692-1 through 692-n, the outputs which are provided on a side opposite to the side used in FIG. 41 are used. Further, the inverters 696-1 through 696-n/2 of FIG. 41 are removed. Then, among outputs of the latches comprised of the NAND circuit 694-1 through 694-n, the outputs which are provided on a side opposite to the side used in FIG. 41 are used. Operations of the period measuring circuit 624B are almost the same as those of the period measuring circuit 624 of FIG. 41, and a description thereof will be omitted.

Figure 49:
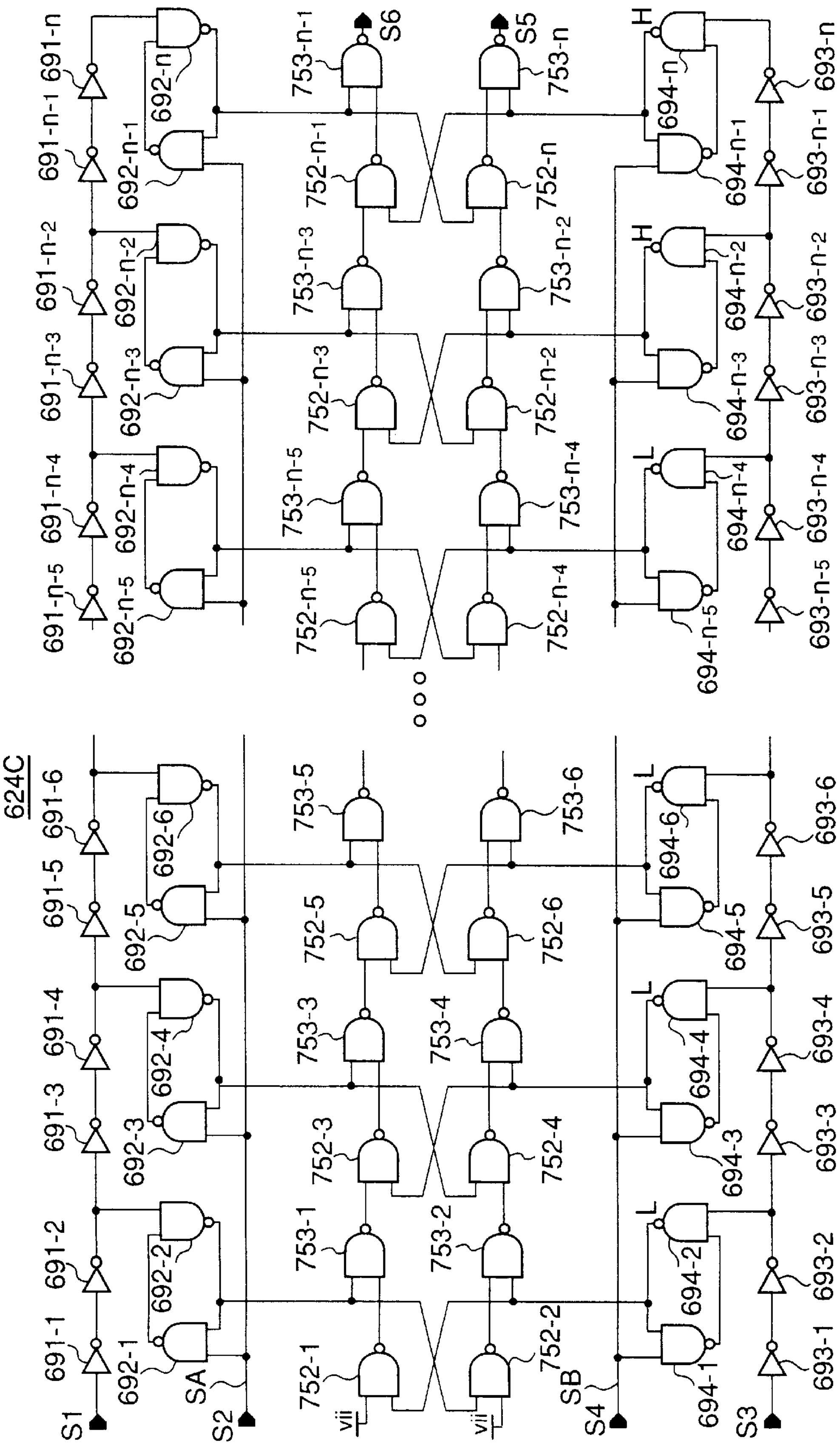
FIG. 49 is a circuit diagram of a fourth embodiment of the period measuring circuit.

FIG. 49 is a circuit diagram of a fourth embodiment of the period measuring circuit 624. In FIG. 49, the same elements as those of FIG. 41 are referred to by the same numerals, and a description thereof will be omitted.

In a period measuring circuit 624C of FIG. 49, the inverters 695-1 through 695-n/2 and the inverters 696-1 through 696-n/2 of FIG. 41 are removed. Further, NAND circuits 752-1 through 752-n and NAND circuits 753-1 through 753-n are used for implementing a circuit which has an identical circuit structure with the circuit comprised of the NAND circuits 697-1 through 697-n and the NAND circuits 698-1 through 698-n of FIG. 41. This circuit is arranged in FIG. 49 in a placement opposite to the placement of the circuit of FIG. 41. Operations of the period measuring circuit 624C are almost the same as those of the period measuring circuit 624 of FIG. 41, and a description thereof will be omitted.

Figure 50:
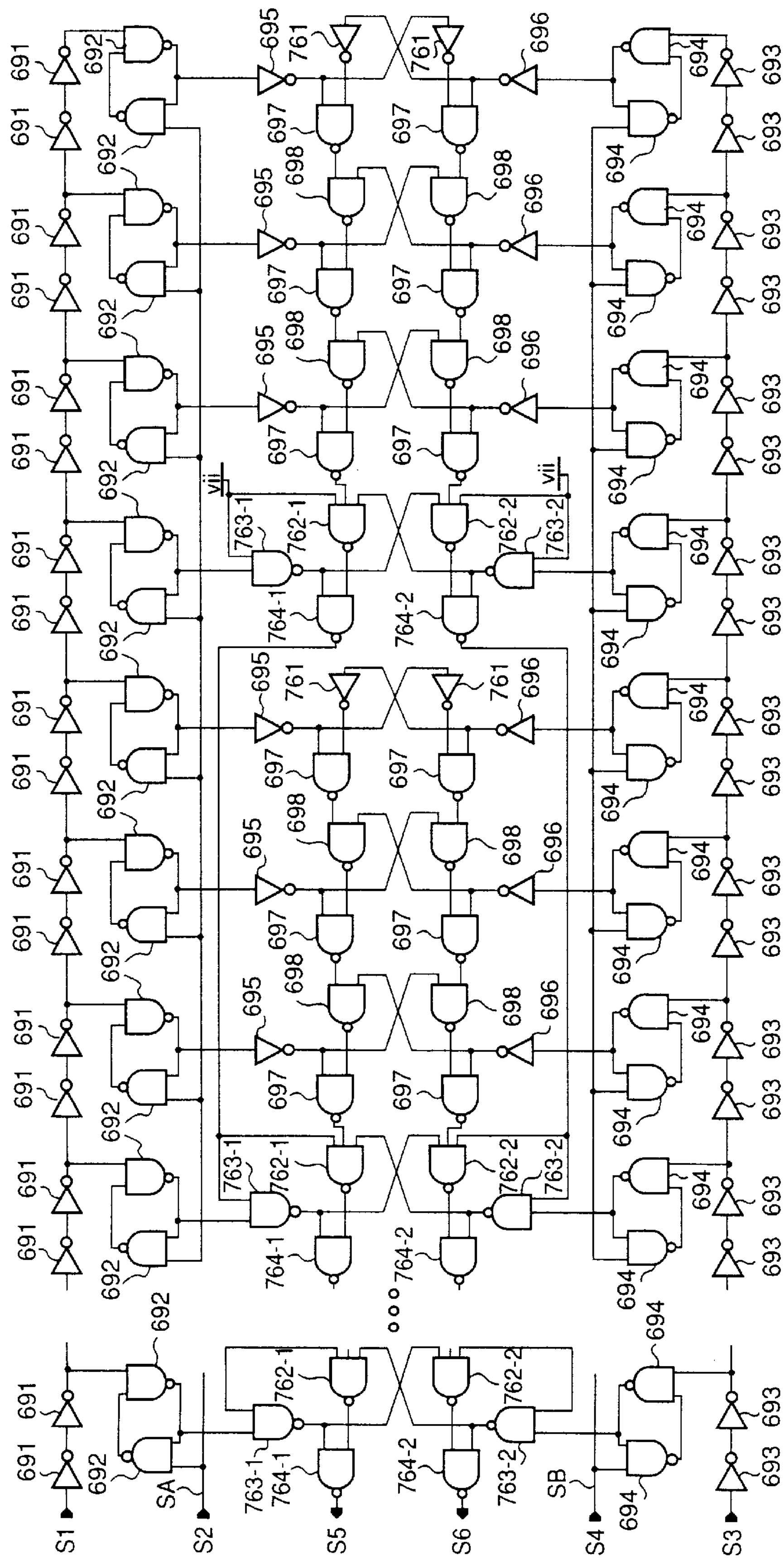
FIG. 50 is a circuit diagram of a fifth embodiment of the period measuring circuit.

FIG. 50 is a circuit diagram of a fifth embodiment of the period measuring circuit 624. In FIG. 50, the same elements as those of FIG. 41 are referred to by the same numerals, and a description thereof will be omitted. Here, the same elements as those of FIG. 41 will be referred to by numerals with suffixes thereof omitted for the sake of clarity of the drawing and a description.

In a period measuring circuit 624 of FIG. 41, signals propagates from the right-hand side of the figure to the left-hand side until they are output as the signals S5 and S6, and this propagation takes place through the gates comprised of the NAND circuits 697 and 698. In order to reduce the time required for the signal propagation, a period measuring circuit 624D of FIG. 50 includes three-input NAND circuits 762-1 and 762-2, two-input NAND circuits 763-1 and 763-2, and two-input NAND circuits 764-1 and 764-2.

Outputs of the NAND circuits 764-1 and 764-2 skip a plurality of gates, and are directly supplied to the NAND circuits 762-1 and 763-1 and the NAND circuits 762-2 and 763-2, respectively, provided at a next stage. When both outputs of the NAND circuits 764-1 and 764-2 are HIGH, outputs of the NAND circuits 762-1 and 763-1 and the NAND circuits 762-2 and 763-2 at the next stage are not affected.

When the output of the NAND circuit 764-1 is LOW, for example, the NAND circuits 762-1 and 763-1 at the next stage produce HIGH outputs. The NAND circuit 764-1 receiving these HIGH outputs produce a LOW output. In this manner, outputs of the NAND circuits 764-1 and 764-2 propagate until they are output as the signals S5 and S6 at the leftmost point of FIG. 50 by skipping a plurality of gates at every turn. Operations other than those described here are the same as those of the period measuring circuit 624 of FIG. 41, and a description thereof will be omitted.

In this manner, the period measuring circuit 624D of FIG. 50 can output the signals S5 and S6 in a shorter time than can the period measuring circuit 624 of FIG. 41.

Figure 51:
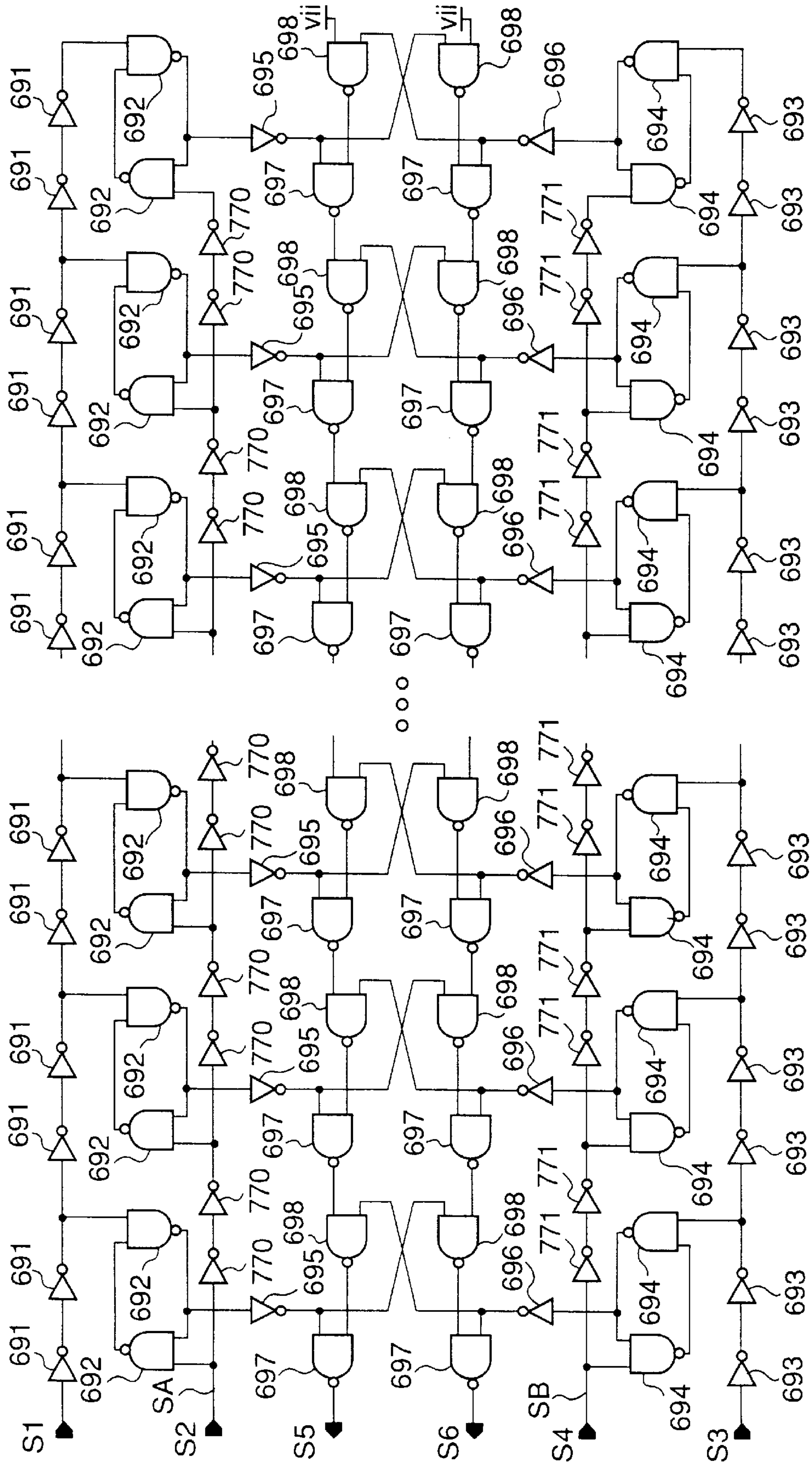
FIG. 51 is a circuit diagram of a sixth embodiment of the period measuring circuit.

FIG. 51 is a circuit diagram of a sixth embodiment of the period measuring circuit 624. In FIG. 51, the same elements as those of FIG. 41 are referred to by the same numerals, and a description thereof will be omitted. Here, the same elements as those of FIG. 41 will be referred to by numerals with suffixes thereof omitted for the sake of clarity of the drawing and a description.

In a period measuring circuit 624E of FIG. 51, a plurality of inverters 770 and 771 are inserted into the signal lines SA and SB, respectively, along the extension thereof. The inverters 770 and 771 have a delay which is smaller than the delay of the inverters 691 and 693. Namely, a signal propagating through the inverters 770 and 771 travels faster than a signal going through the inverters 691 and 693. Because of this, when the signal S1 propagating through the inverters 691 and the signal S2 propagating through the inverters 770 are compared, a difference in edge timings between the signal S1 and the signal S2 can be measured at a higher accuracy than when the period measuring circuit 624 of FIG. 41 is used.

Operations of the period measuring circuit 624E other than those described in the above are the same as those of the period measuring circuit 624 of FIG. 41, and a description thereof will be omitted.

Figure 52:
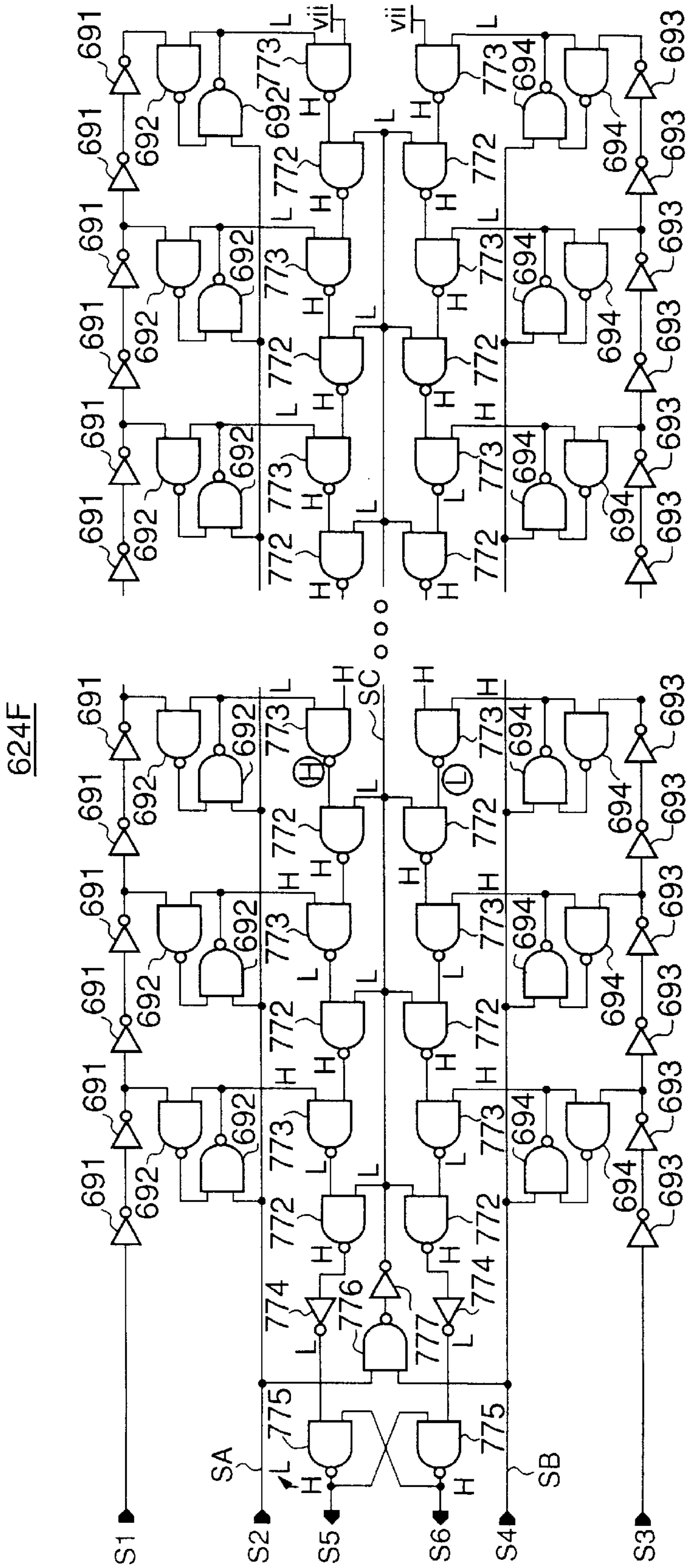
FIG. 52 is a circuit diagram of a seventh embodiment of the period measuring circuit.

FIG. 52 is a circuit diagram of a seventh embodiment of the period measuring circuit 624. In FIG. 52, the same elements as those of FIG. 41 are referred to by the same numerals, and a description thereof will be omitted. Here, the same elements as those of FIG. 41 will be referred to by numerals with suffixes thereof omitted for the sake of clarity of the drawing and a description.

In a period measuring circuit 624F of FIG. 52, a circuit which conveys signals from the right-hand side of the figure to the left-hand side of the figure up to the signals S5 and S6 differs from that of period measuring circuit 624 shown in FIG. 41. This circuit of FIG. 52 includes a plurality of NAND circuits 772, a plurality of NAND circuits 773, two inverters 774, two NAND circuits 775 forming a latch, a NAND circuit 776, and an inverter 777. Input/output signal levels of these gates shown in FIG. 52 exhibit a condition in which the signals S1 through S4 has already reached the right-most point of the figure but a signal line SC still remains at a LOW level. As the signal line SC is changed to a HIGH level, outputs of the NAND circuits 173 shown by a circled letter H and a circled letter L passe through a plurality of NAND circuits 172 and 173, each of which serves as an inverter, and are supplied via the inverters 174 to the latch comprised of the NAND circuits 175. In the example of FIG. 52, therefore, the signal S7 becomes HIGH and the signal S5 becomes LOW. In the same manner as in FIG. 41, which one of the period Thigh and the period Tlow is the longest will determine which one of the signals S5 and S6 is changed to HIGH.

As can be seen from a comparison of period measuring circuit 624F of FIG. 52 with the period measuring circuit 624 of FIG. 41, the period measuring circuit 624F of FIG. 52 is implemented by using a simpler circuit structure.

Figure 53:
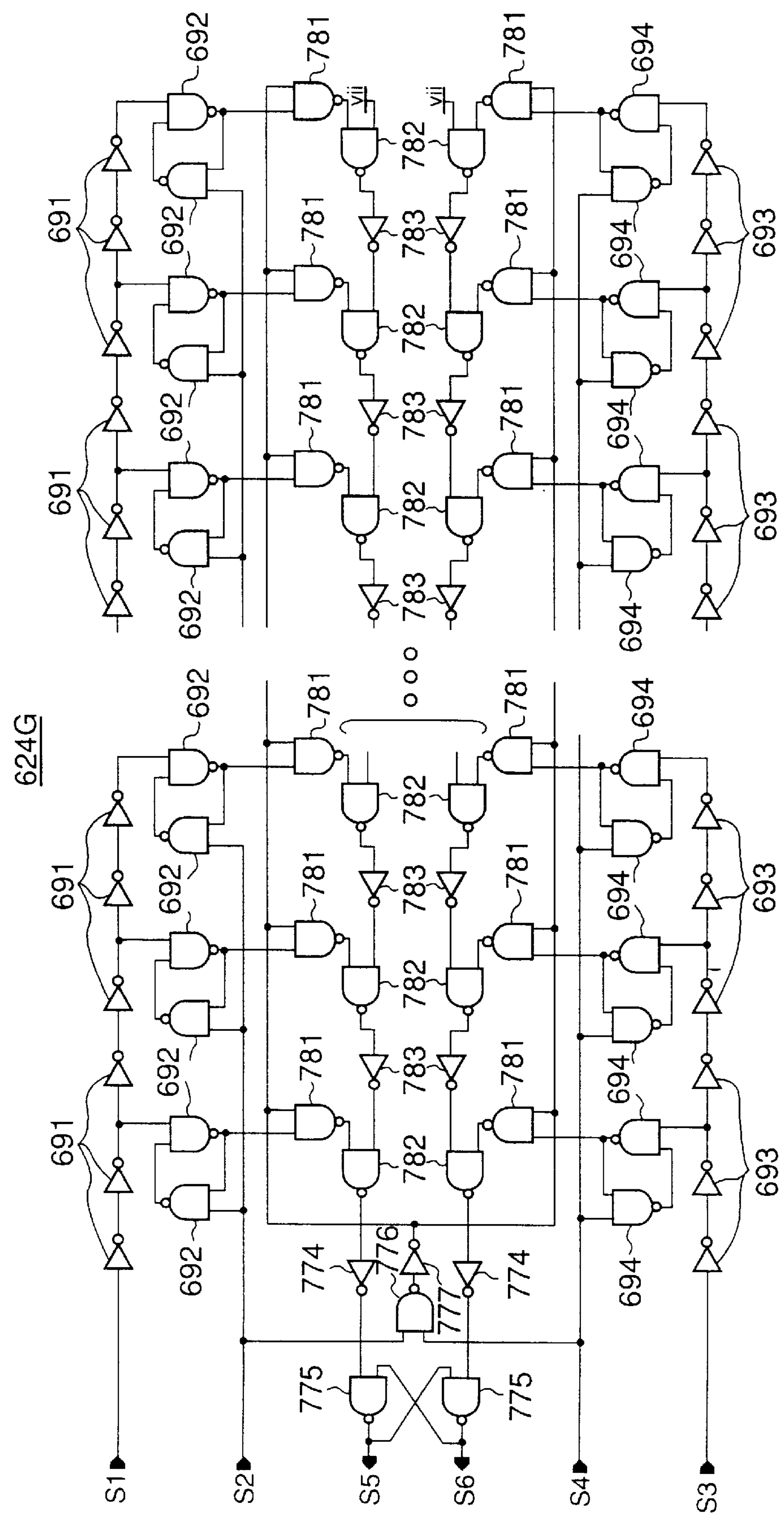
FIG. 53 is a circuit diagram of an eighth embodiment of the period measuring circuit.

FIG. 53 is a circuit diagram of an eighth embodiment of the period measuring circuit 624. In FIG. 53, the same elements as those of FIG. 52 are referred to by the same numerals, and a description thereof will be omitted.

A period measuring circuit 624G of FIG. 53 includes NAND circuits 781 and 782 and inverters 783 in place of the NAND circuits 772 and 773 of the period measuring circuit 624F of FIG. 52. In principle, operations of the period measuring circuit 624G are the same as those of the period measuring circuit 624F, and a description thereof will be omitted.

Figure 54:
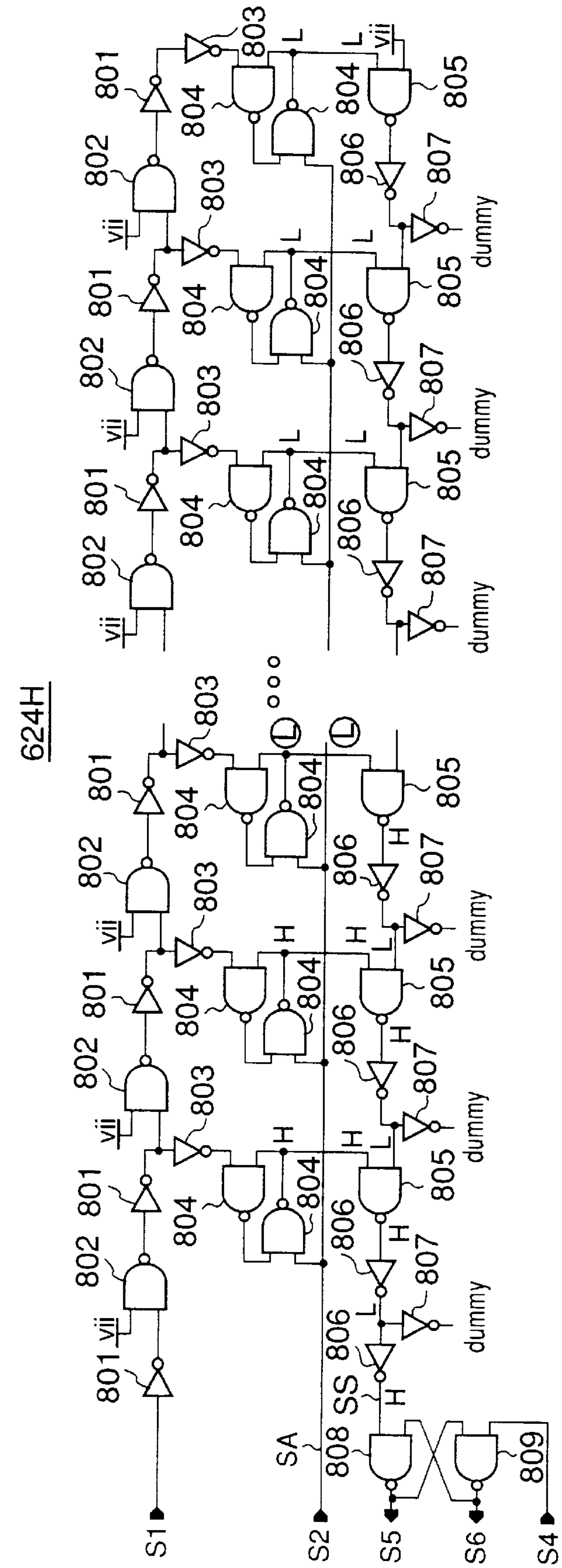
FIG. 54 is a circuit diagram of a ninth embodiment of the period measuring circuit.

FIG. 54 is a circuit diagram of a ninth embodiment of the period measuring circuit 624.

A period measuring circuit 624H of FIG. 54 includes a plurality of inverters 801, a plurality NAND circuits 802, a plurality of inverters 803, a plurality NAND circuits 804 with each pair thereof forming a latch, a plurality NAND circuits 805, a plurality of inverters 806, a plurality of inverters 807, and NAND circuits 808 and 809 forming a latch.

In FIG. 54, the plurality of inverters 801 and the plurality of NAND circuits 802 together form a series of delay elements, and the signal S1 propagates therethrough. The signal S2 propagates through a signal line SA laid out in parallel to the series of delay elements. In this configuration, the signal S1 propagating through the series of delay elements by incurring delays competes with the signal S2 propagating through the signal line SA by incurring no delay.

The latches formed by the NAND circuits 804 latch a HIGH output thereof when the signal S1 becomes HIGH ahead of the signal S2, and latch a LOW output thereof when the signal S2 is the first to become HIGH. As shown in FIGS. 40R and 40G, the signal S1 is the first to become HIGH at a time when the signals S1 and S2 are input to the circuit. Because of this, latches provided on the left-hand side of FIG. 54, which are close to the input nodes, latch a HIGH output thereof. Since the signal S1 incurs an increased delay as it propagates further to the right in the figure, latches provided on the right-hand side of FIG. 54, which are far away from the input node, latch a LOW output thereof. A position of a boundary between the latches latching LOW and the latches latching HIGH indicates a time difference between the edge of the signal S1 and the edge of the signal S2. The smaller the time difference, the closer the position of the boundary to the input nodes.

An output of the latch, which is positioned leftmost among the latches holding a LOW output, is shown by a circled letter L. This LOW output propagates through a series of delay elements comprised of the plurality of NAND circuits 805 and the plurality of inverters 806, and is supplied to the latch comprised of the NAND circuits 808 and 809. The series of delay elements comprised of the plurality of NAND circuits 805 and the plurality of inverters 806 is equivalent to the series of delay elements comprised of the plurality of NAND circuits 802 and the plurality of inverters 801. That is, the signals propagate through these series of delay elements at the same speed.

Figures 55A, 55B, 55C, 55D, 55E:
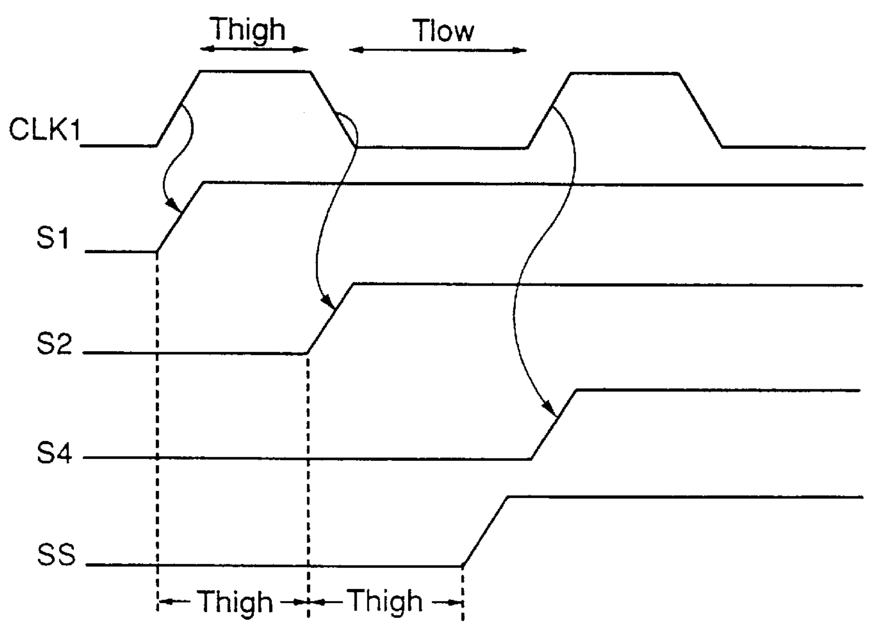
FIGS. 55A through 55E are timing charts showing signals S1, S2, S4, and SS of FIG. 54.

FIGS. 55A through 55E are timing charts showing the signals S1, S2, and S4 input to the period measuring circuit 624H of FIG. 54 and a signal SS input to the NAND circuit 808 of the latch provided at an output of the period measuring circuit 624H. As can be seen from the description provided in the above, the signal S1 propagates through the first series of delay elements for the period Thigh until the signal S2 becomes HIGH, and, then, is latched by a latch comprised of the NAND circuits 804. The latched signal propagates the same distance through the second series of delay elements having identical characteristics, and, then, is supplied as the signal SS to the NAND circuit 808. As shown in FIG. 55E, the signal SS has a rise thereof delayed by the period Thigh behind the rise of the signal S2.

The latch comprised of the NAND circuits 808 and 809 latches a rise in one of the signal S4 and the signal SS, whichever comes first. In the example of FIGS. 55D and 55E, the signals S5 and S6 of FIG. 54 are LOW and HIGH, respectively. In such a case, as shown in FIG. 55A, the period Thigh of the phase-adjusted clock signal CLK1 is shorter than the period Tlow. When the period Thigh is longer than the period Tlow, on the other hand, the positions of the signals S5 and S6 are reversed.

The period measuring circuit 624H of FIG. 54 can be implemented by using a circuit structure simpler than any other circuit structures of the previous embodiments, and, thus, has an advantage of a small circuit size. It should be noted that even when the roles of the period Thigh and the period Tlow is exchanged, a similar circuit based on the same principle can be used for comparing these two periods.

FIG. 56 is a block diagram of a semiconductor device to which the skew-reduction circuit of FIG. 39 is applied.

A semiconductor device 900 of FIG. 56 includes an input circuit 901, a core circuit 902, and an output circuit 903. The input circuit 901 receives input signals from an external source, and supplies the received signals to the core circuit 902. Output signals from the core circuit 902 are sent out from the semiconductor device 900 via the output circuit 903.

The skew-reduction circuit may be used as an input-interface circuit such as the input circuit 901 for receiving input signals, and may be used as an output-interface circuit such as the output circuit 903 for transmitting output signals.

Figure 57:
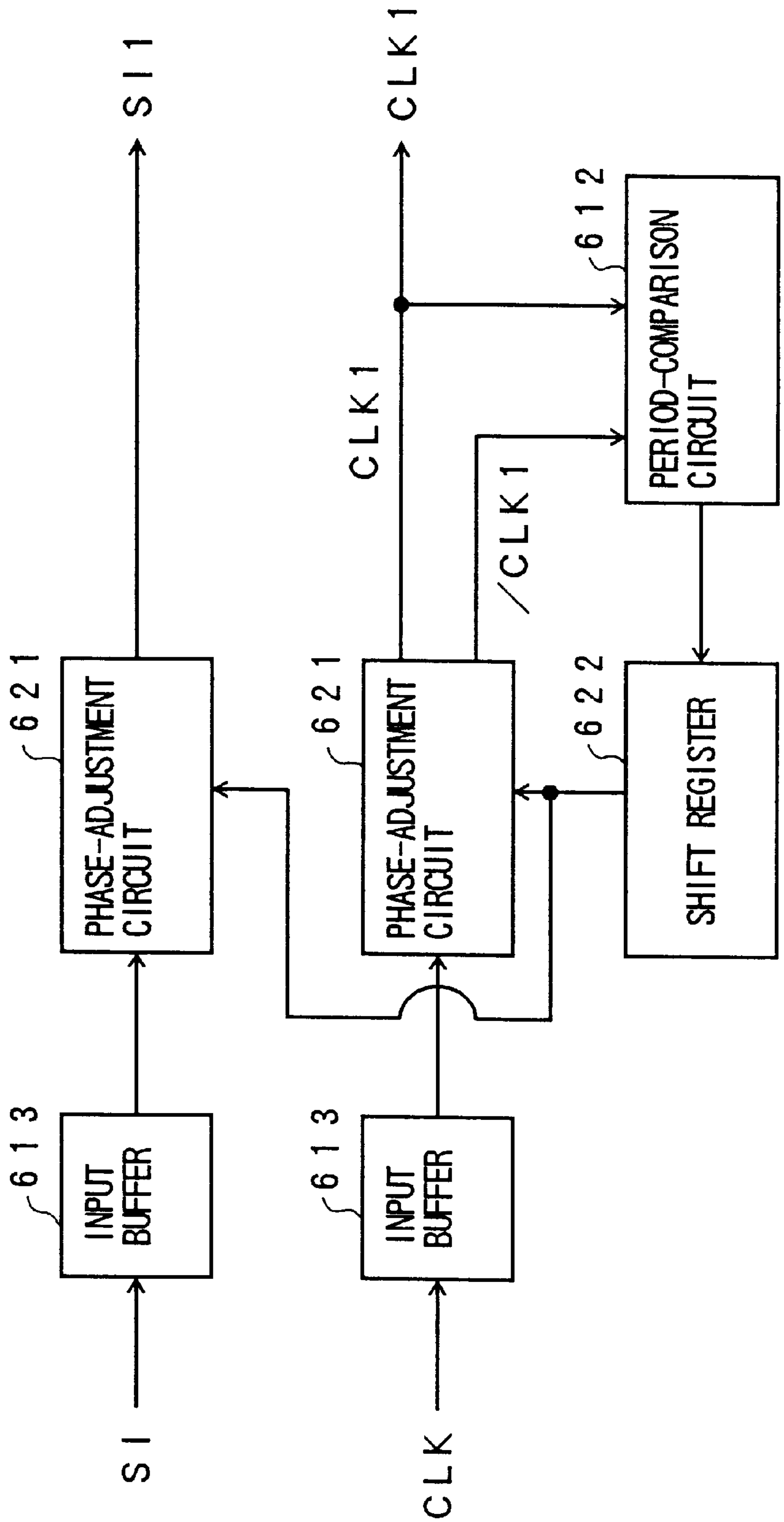
FIG. 57 is a block diagram of an embodiment of an input-interface circuit to which the skew-reduction circuit of FIG. 39 is applied.

FIG. 57 is a block diagram of an embodiment of an input-interface circuit to which the skew-reduction circuit of FIG. 39 is applied. In FIG. 57, the same elements as those of FIG. 39 are referred to by the same numerals, and a description thereof will be omitted.

The clock signal CLK input via an input buffer 613 is subjected to a phase adjustment in the phase-adjustment circuit 621, and is supplied as the phase-adjusted clock signal CLK1 to an internal circuit (e.g., the core circuit 902 of FIG. 56). The period-comparison circuit 612 and the shift register 622 controls the phase-adjustment circuit 621 such that the period Thigh and the period Tlow of the phase-adjusted clock signal CLK1 become equal to each other. The same phase adjustment by the shift register 622 and the phase-adjustment circuit 621 is also applied to another input signal SI. As a result, an input signal SI1 having a rise-and-fall skew thereof reduced is obtained. The input signal SI1 which has no rise-and-fall skew is supplied to the internal circuit (e.g., the core circuit 902 of FIG. 56).

Figure 58:
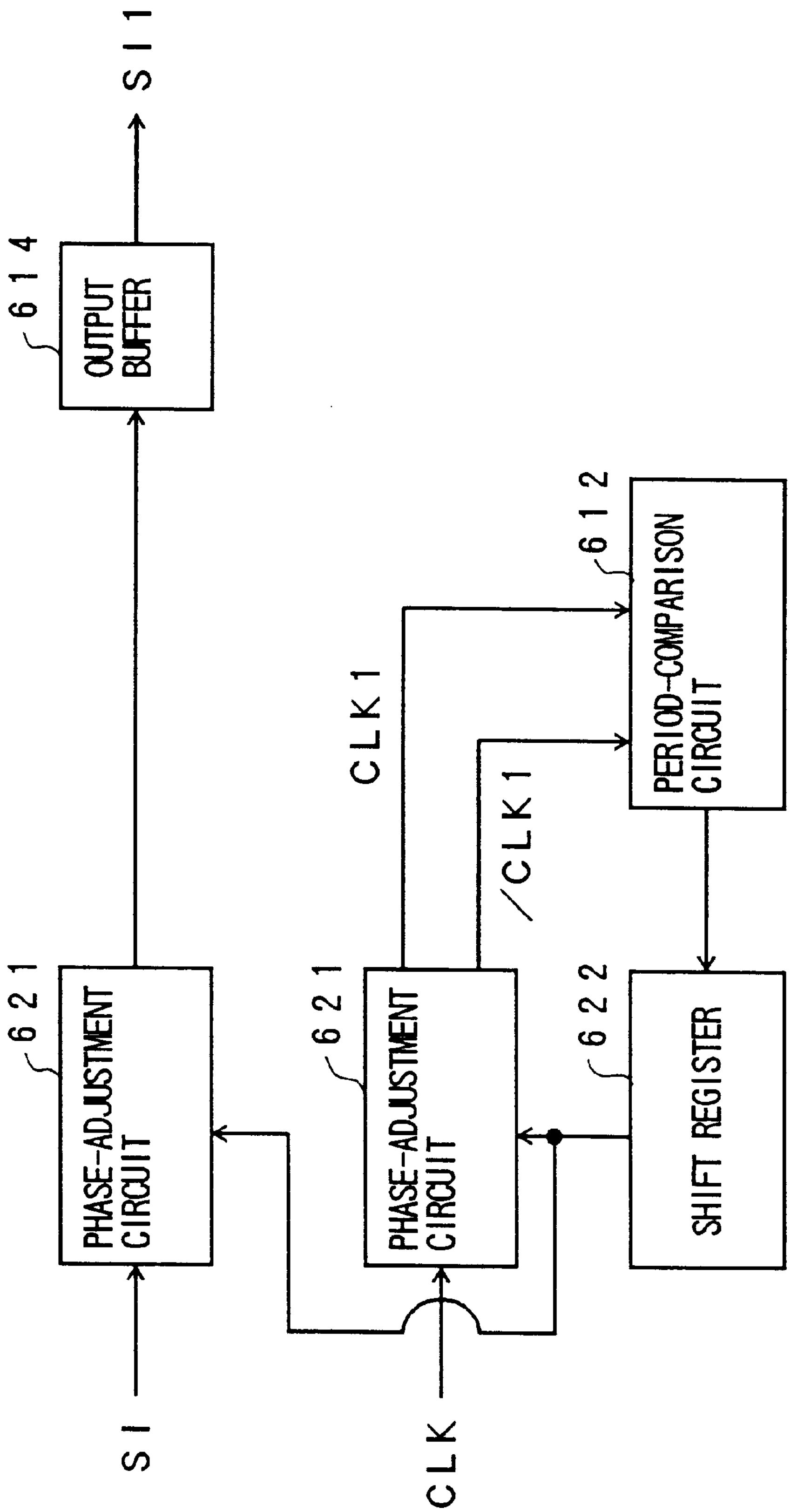
FIG. 58 is a block diagram of an embodiment of an output-interface circuit to which the skew-reduction circuit of FIG. 39 is applied.

FIG. 58 is a block diagram of an embodiment of an output-interface circuit to which the skew-reduction circuit of FIG. 39 is applied. In FIG. 58, the same elements as those of FIG. 39 are referred to by the same numerals, and a description thereof will be omitted.

The output-interface circuit of FIG. 58 receives the clock signal CLK and an internal signal SI from an internal circuit (e.g., the core circuit 902 of FIG. 56). Rise-and-fall skews of the clock signal CLK and the internal signal SI are reduced by using the clock signal CLK. A signal SI1 which has a reduced rise-and-fall skew is output from the phase-adjustment circuit 621 to the outside of the device via the output buffer 614.

Figure 59:
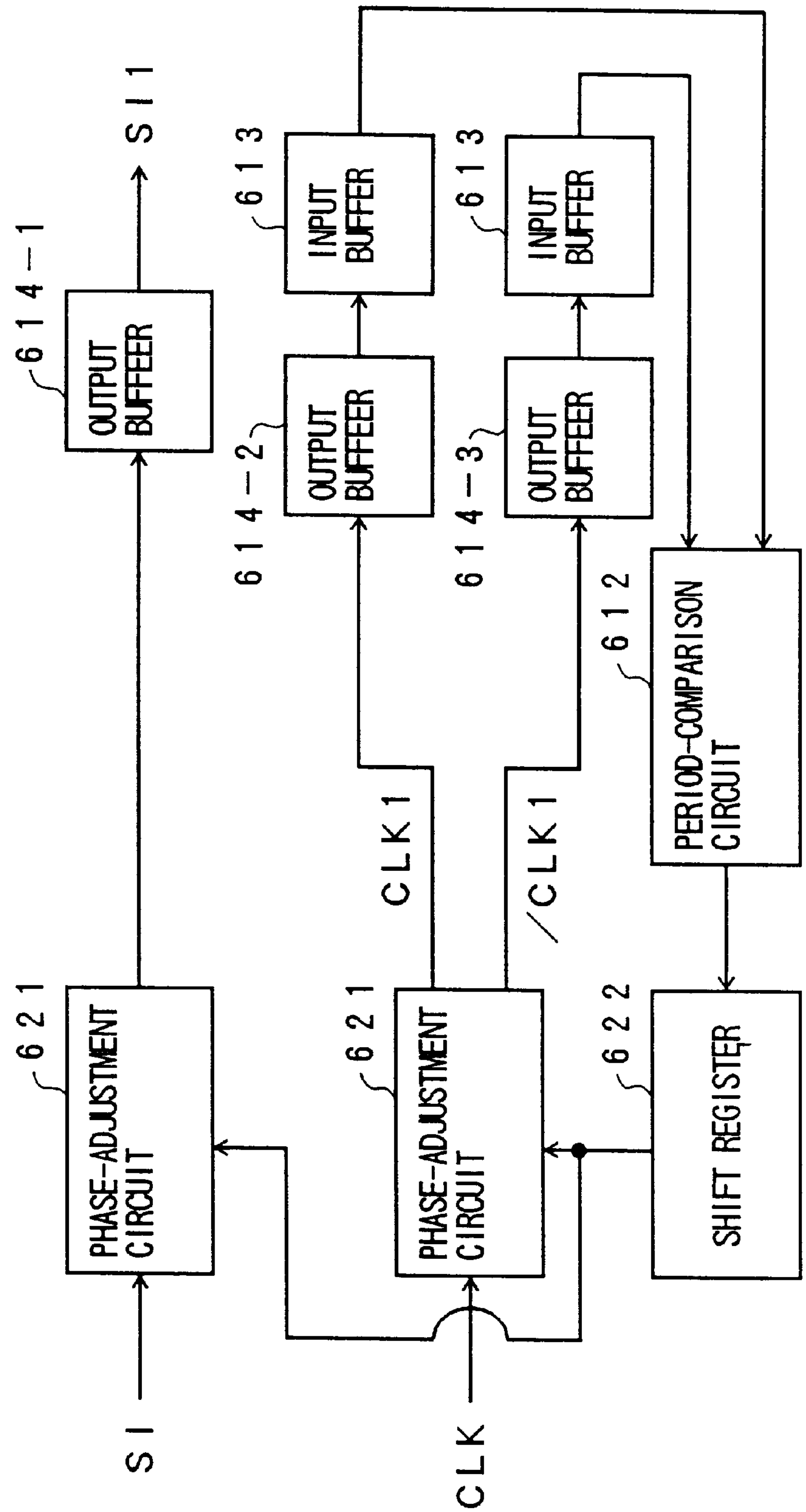
FIG. 59 is a block diagram showing a variation of the embodiment of the output-interface circuit to which the skew-reduction circuit of FIG. 39 is applied.

FIG. 59 is a block diagram showing a variation of the embodiment of an output-interface circuit to which the skew-reduction circuit of FIG. 39 is applied. In FIG. 59, the same elements as those of FIG. 58 are referred to by the same numerals, and a description thereof will be omitted.

The output-interface circuit of FIG. 59 receives the clock signal CLK and the internal signal SI from an internal circuit (e.g., the core circuit 902 of FIG. 56). Rise-and-fall skews of the clock signal CLK and the internal signal SI are reduced by using the clock signal CLK. A signal SI1 which has a reduced rise-and-fall skew is output from the phase-adjustment circuit 621 to the outside of the device via the output buffer 614-1.

Output buffers 614-2 and 614-3 identical to the output buffer 614-1 are provided to receive the phase-adjusted clock signal CLK1 and the inverse clock signal /CLK1, respectively. Outputs of the output buffers 614-2 and 614-3 are supplied to the period-comparison circuit 612 via input buffers 613.

In the configuration of FIG. 59, the output buffers 614-2 and 614-3 identical to the output buffer 614-1 are incorporated into a feedback loop for the phase adjustment in order to prevent a rise-and-fall skew from sneaking into the output signal SI1 in the output buffer 614-1. This configuration ensures that a rise-and-fall-skew reduction is performed with respect to the phase-adjusted clock signal CLK1 and the inverse clock signal /CLK1 after they pass through the output buffers 614-2 and 614-3, respectively. In this manner, a rise-and-fall-skew reduction is achieved with respect to the output signal SII having passed through the output buffer 614-1. In the configuration of FIG. 59, it is assumed that the a rise-and-fall skew created in the input buffers 613 is as small as tolerable.

In the following, a description will be given with regard to reduction of inter-signal skews.

Figure 60:
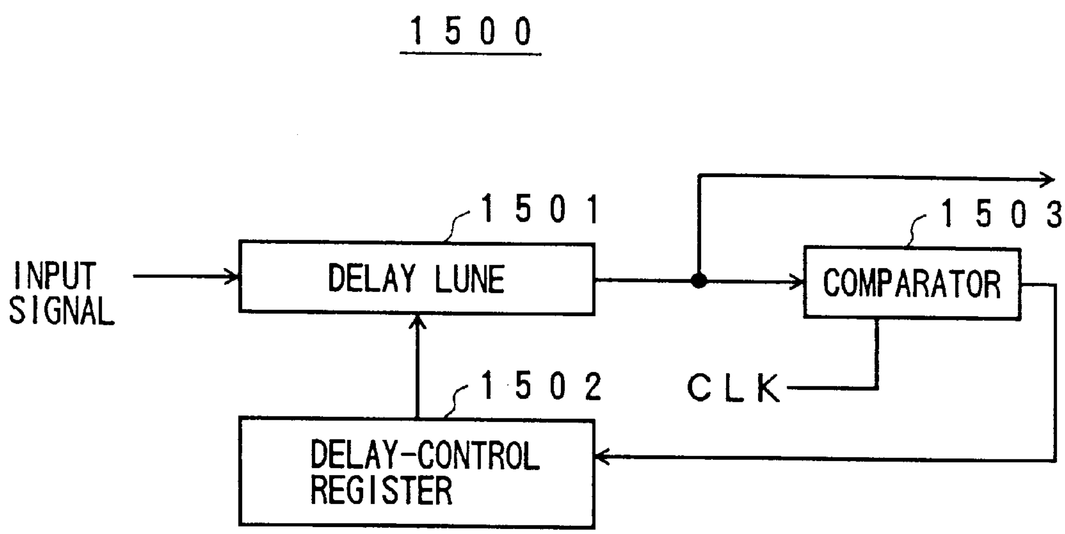
FIG. 60 is a block diagram of a related-art circuit for reducing an inter-signal skew.

FIG. 60 is a block diagram of a related-art circuit for reducing an inter-signal skew.

A skew-reduction circuit 1500 of FIG. 60 includes a delay line 1501, a delay-control register 1502, and a comparator 1503. The delay line 1501 includes a series of digital delay elements, and controls a length of delay which is applied to an input signal thereof. This control is achieved by changing the number of operating delay elements based on a control signal supplied from the delay-control register 1502. The comparator 1503 receives a delayed input signal from the delay line 1501 and a clock signal CLK, and compares phases between these two signals. A phase-comparison result is supplied to the delay-control register 1502. The delay-control register 1502 adjusts the amount of delay of the delay line 1501 such that the delayed input signal and the clock signal CLK have the same phase. When the delay-control register 1502 keeps this condition of a zero phase difference, the delayed input signal from the delay line 1501 is in a synchronized phase relation with the clock signal CLK. Namely, a skew between the input signal and the clock signal CLK is reduced. By providing the skew-reduction circuit 1500 for each signal input, an intersignal skew can be reduced between the clock signal CLK and each input signal.

Use of a skew-reduction circuit such as shown in FIG. 60 makes it possible to reduce an inter-signal skew. The problem is that skews are not only present between signals but also present in each signal, i.e., each signal suffers a rise-and-fall skew.

Figure 61:
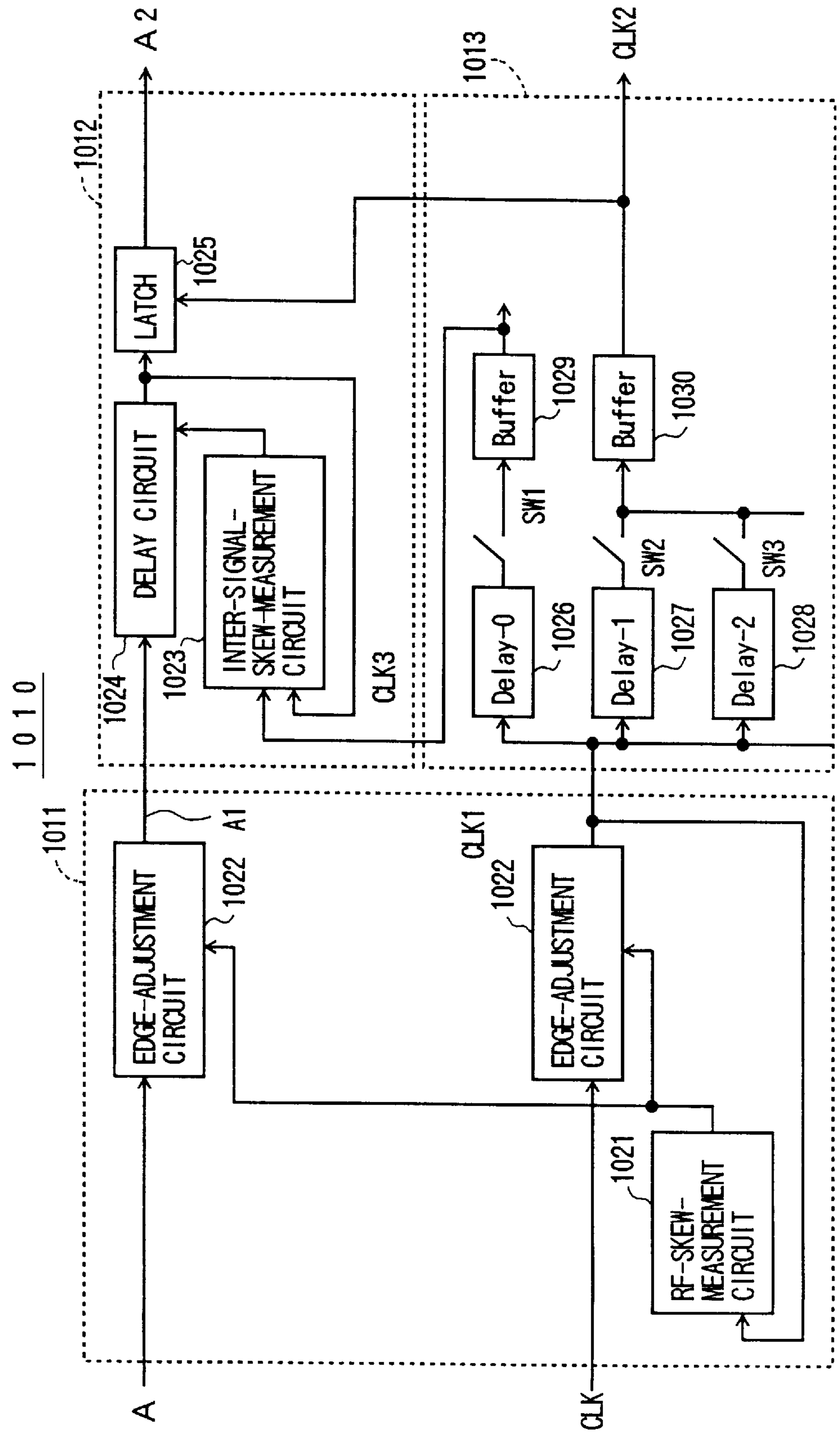
FIG. 61 is a block diagram of an embodiment of a skew-reduction circuit for reducing an inter-signal skew according to the present invention.

FIG. 61 is a block diagram of an embodiment of a skew-reduction circuit for reducing an inter-signal skew according to the present invention.

A skew-reduction circuit 1010 of FIG. 61 includes a RF(rise and fall)-skew-reduction circuit 1011, an inter-signal-skew-reduction circuit 1012, and a clock-buffer circuit 1013. The skew-reduction circuit 1010 of the present invention is mainly used in an input interface of a semiconductor device.

The RF-skew-reduction circuit 1011 reduces a rise-and-fall skew in a clock signal CLK and a rise-and-fall skew in a signal A based on the clock signal CLK, and outputs a signal A1 and a clock signal CLK1. The signal A1 is the signal A with a reduced rise-and-fall skew, and the clock signal CLK1 is the clock signal CLK with a reduced rise-and-fall skew. The inter-signal-skew-reduction circuit 1012 receives a clock signal CLK3 generated by delaying the clock signal CLK1 in the clock-buffer circuit 1013, and reduces a skew between the clock signal CLK3 and the signal A1. The clock-buffer circuit 1013 applies an appropriate amount of delay to the clock signal CLK1, and outputs a clock signal CLK2 in a normal operation mode and the clock signal CLK3 in a calibration mode.

FIG. 61 shows only one signal (signal A) other than the clock signal CLK. It is apparent, however, that a plurality of signals can be aligned to the clock signal CLK in the same manner as the signal A is aligned to the clock signal CLK. That is, skews between a plurality of signals can be reduced by effecting an alignment between the plurality of signals.

The RF-skew-reduction circuit 1011 includes a RF-skew-measurement circuit 1021 and a plurality (two in the figure) of edge-adjustment circuits 1022. The RF-skew-measurement circuit 1021 receives a clock signal CLK1 obtained by adjusting edge positions of a clock signal CLK in an edge-adjustment circuit 1022, and measures a rise-and-fall skew of the clock signal CLK1. Based on the measurement of the rise-and-fall skew, the RF-skew-measurement circuit 1021 controls the edge-adjustment circuit 1022 such that a period Thigh and a period Tlow of the clock signal CLK1 become equal to each other. Here, the clock signal CLK1 is HIGH during the period Thigh, and is LOW during the period Tlow. In this manner, the rise-and-fall skew of the clock signal CLK1 is reduced. Further, the RF-skew-measurement circuit 1021 applies the same control to another edge-adjustment circuit 1022 which receives the signal A. Through this control, a rise-and-fall skew of the signal A is reduced, and the signal A1 with a reduced skew is output.

The clock-buffer circuit 1013 includes a first delay circuit 1026, a second delay circuit 1027, a third delay circuit 1028, a first buffer 1029, a second buffer 1030, a first switch SW1, a second switch SW2, and a third switch SW3. The clock-buffer circuit 1013 receives the clock signal CLK1 having a rise-and-fall skew thereof reduced. In the calibration mode, the first switch SW1 is closed (turned on). In the normal operation mode, either the second switch SW2 or the third switch SW3 is closed (turned on). The clock signal CLK3 delayed by the first delay circuit 1026 is thus supplied to the inter-signal-skew-reduction circuit 1012 in the calibration mode, and the clock signal CLK2 delayed by either the second delay circuit 1027 or the third delay circuit 1028 is supplied to the inter-signal-skew-reduction circuit 1012 in the normal operation mode. In the normal operation mode, further, the clock signal CLK2 is supplied to an internal circuit of the device which has the skew-reduction circuit 1010 as an input interface.

The inter-signal-skew-reduction circuit 1012 includes an inter-signal-skew-measurement circuit 1023, a delay circuit 1024, and a latch 1025. During the calibration mode, the inter-signal-skew-measurement circuit 1023 measures a phase difference between the clock signal CLK3 and the signal A1 delayed by the delay circuit 1024, and adjust a delay of the delay circuit 1024 to eliminate the phase difference. Through this adjustment, a skew is reduced between the signal A1 and the clock signal CLK3, so that the signals are aligned to each other.

In the normal operation mode, the latch 1025 latches the signal A1 by using the clock signal CLK2 as a synchronization signal, where the signal A1 is already aligned. The clock signal CLK2 is obtained by the clock-buffer circuit 1013, and is further delayed behind the clock signal CLK3 by a proper delay amount. When this delay amount is set equal to a set-up time of the latch 1025, a proper data-latch operation is achieved in the latch 1025. The signal latched by the latch 1025 is output as a signal A2.

In this manner, the skew-reduction circuit 1010 has the RF-skew-reduction circuit 1011 which reduces the rise-and-fall skews of the clock signal CLK and the signal A based on skew information of the clock signal CLK. Further, the inter-signal-skew-reduction circuit 1012 aligns the signal A to the clock signal CLK to reduce an inter-signal skew. Namely, rise-and-fall skews which are common skews equally present in different signals are reduced at a first stage, and an inter-signal skew is suppressed at a second stage following the first stage, thereby making it possible to reduce inter-signal skews without being affected by common skews.

Figure 62:
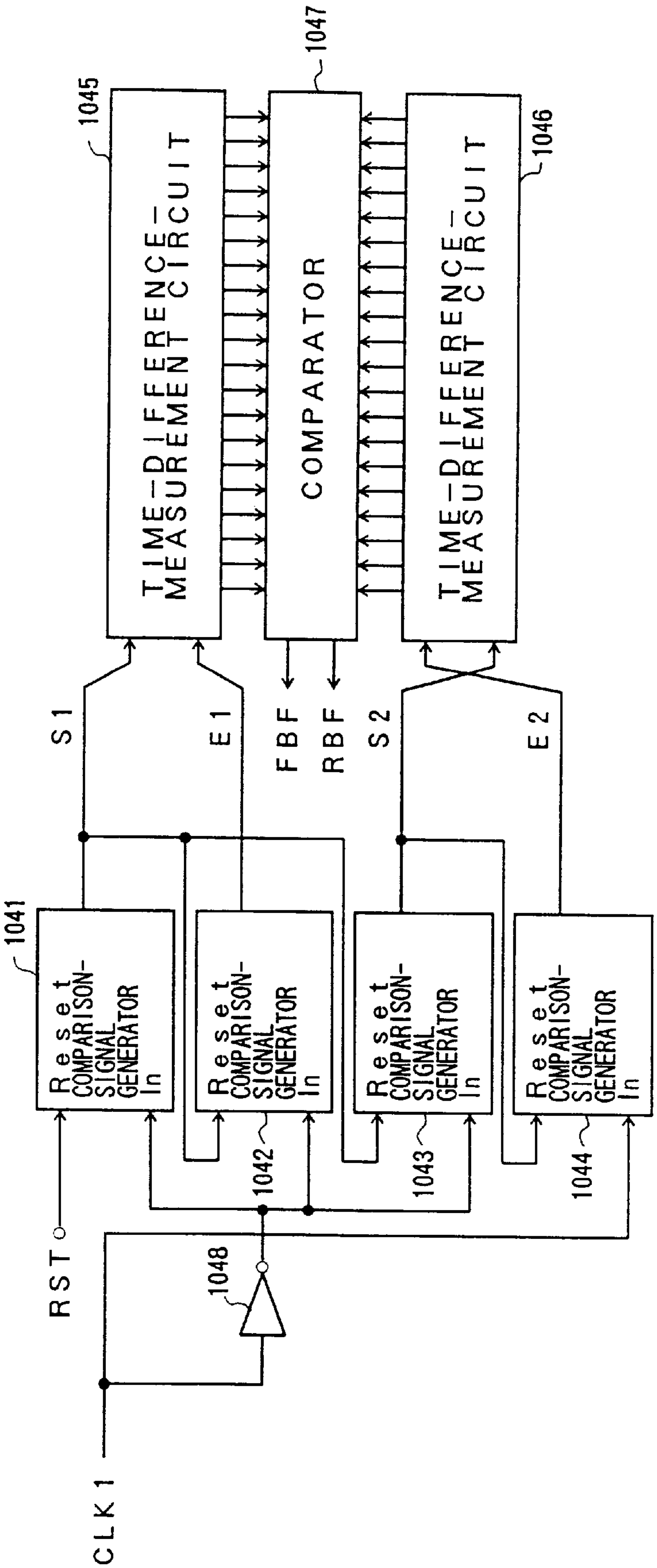
FIG. 62 is a block diagram of a RF-skew-measurement circuit shown in FIG. 61.

FIG. 62 is a block diagram of the RF-skew-measurement circuit 1021 shown in FIG. 61.

The RF-skew-measurement circuit 1021 includes comparison-signal generators 1041 through 1044, time-difference-measurement circuits 1045 and 1046, and an inverter 1048.

FIGS. 63A through 63G are timing charts for explaining operations of the RF-skew-measurement circuit 1021 of FIG. 62. The operations of the RF-skew-measurement circuit 1021 will be described with reference to FIG. 62 and FIGS. 63A through 63G.

The comparison-signal generators 1041 through 1044 have an identical circuit structure, and changes an output thereof to HIGH when a signal supplied to a signal input In exhibits a first rising edge thereof after a reset input Reset is changed to HIGH. The signal input In of the comparison-signal generators 1041 and 1044 receives the clock signal CLK1, and the signal input In of the comparison-signal generators 1042 and 1043 receives an inverse of the clock signal CLK1 from the inverter 1048.

The reset input Reset of the comparison-signal generator 1041 is provided with a reset signal RST. An output S1 of the comparison-signal generator 1041 thus changes to HIGH at a first rising edge of the clock signal CLK1 after the reset signal RST is changed to HIGH.

The reset input Reset of the comparison-signal generator 1042 is provided with the signal S1 output from the comparison-signal generator 1041. An output E1 of the comparison-signal generator 1042 thus changes to HIGH at a first rising edge of the inverted clock signal /CLK1 after the signal S1 is changed to HIGH. The same applies to an output S2 of the comparison-signal generators 1043.

The reset input Reset of the comparison-signal generator 1044 is provided with the signal S2 output from the comparison-signal generator 1043. An output E2 of the comparison-signal generator 1044 thus changes to HIGH at a first rising edge of the clock signal CLK1 after the signal S2 is changed to HIGH.

As shown in FIGS. 63D through 63G, rising edges of the signals S1 and E1 indicate a start and an end of the period Thigh during which the clock signal CLK1 maintains a HIGH level, and rising edges of the signals S2 and E2 indicate a start and an end of the period Tlow during which the clock signal CLK1 is LOW.

The time-difference-measurement circuit 1045 measures a difference in edge timings between the signal S1 and the signal E1, and outputs the measured timing difference, i.e., a duration of the period Thigh, in a digital representation. By the same token, the time-difference-measurement circuit 1046 measures a difference in edge timings between the signal S2 and the signal E2, and outputs the measured timing difference, i.e., a duration of the period Tlow, in a digital representation.

The outputs of the time-difference-measurement circuits 1045 and 1046 are compared with each other by the comparator 1047. The comparator 1047 changes a signal FBF to HIGH when the period Thigh is longer than the period Tlow, where the signal FBF indicates a need to advance (bring forward) a falling edge with regard to time. On the other hand, when the period Tlow is longer than the period Thigh, a signal RBF which indicates a need to advance a rising edge with regard to time is changed to HIGH. These signal FBF and RBF are used for controlling the edge-adjustment circuits 1022 of FIG. 61.

Figure 64:
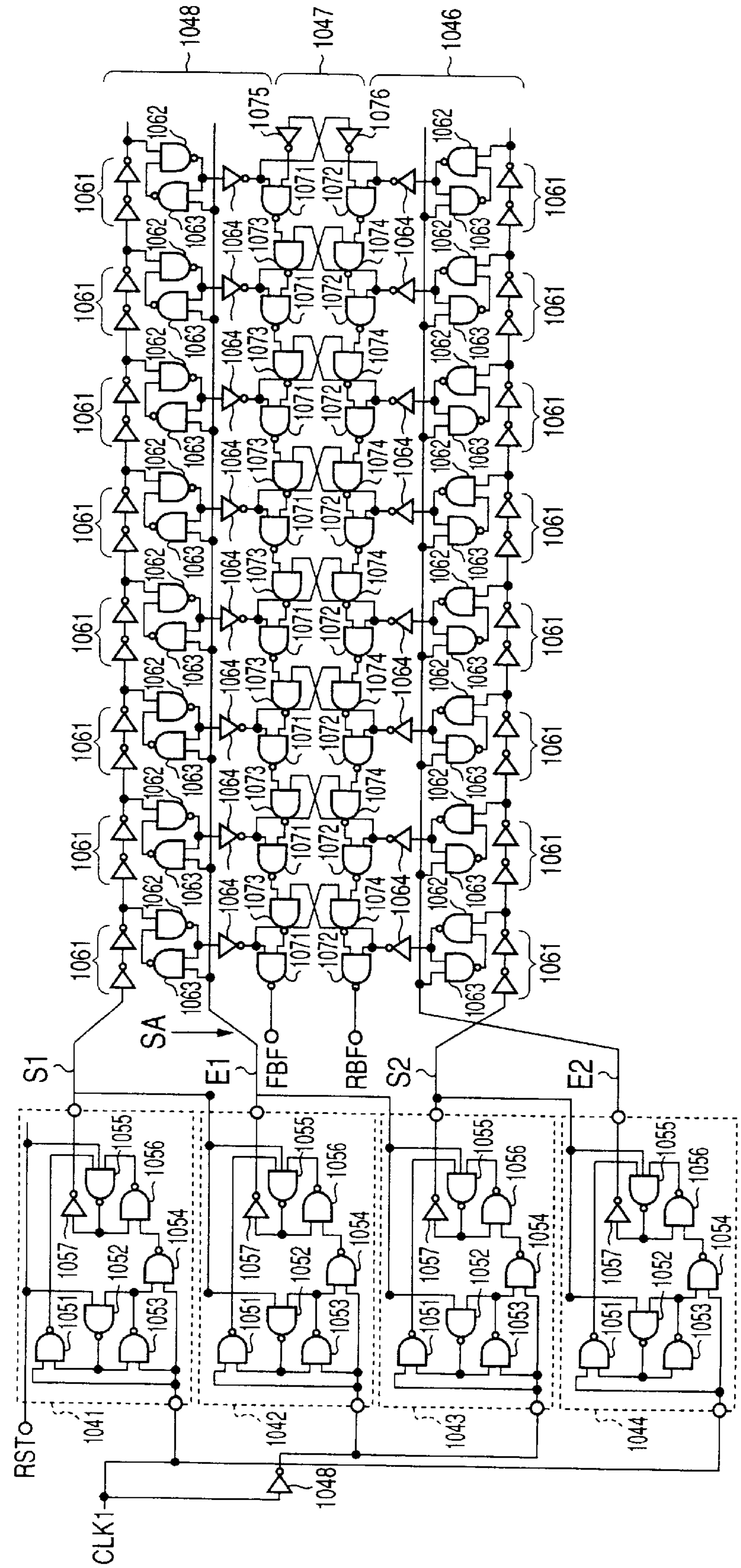
FIG. 64 is a circuit diagram of the RF-skew-measurement circuit.

FIG. 64 is a circuit diagram of the RF-skew-measurement circuit 1021. Each of the comparison-signal generators 1041 through 1044 includes NAND circuits 1051 through 1056 and an inverter 1057.

A description of operations will be given by taking the comparison-signal generator 1041 as an example. When the signal RST is LOW, an output of the NAND circuit 1055 remains at a HIGH level, so that the signal S1 output from the inverter 1057 is LOW. When the signal RST is changed to HIGH, a latch comprised of the NAND circuits 1052 and 1053 latches a signal state in which the outputs of the NAND circuits 1052 and 1053 are LOW and HIGH, respectively. As long as the clock signal CLK1 maintains a LOW level thereof, the output of the NAND circuit 1054 is HIGH, and a latch comprised of the NAND circuits 1055 and 1056 latches a signal state in which the outputs of the NAND circuits 1055 and 1056 are HIGH and LOW, respectively.

In these signal states, an output of the NAND circuit 1051 is HIGH. When the clock signal CLK1 is changed to HIGH, an output of the NAND circuit 1054 is changed to LOW. When this happens, the latch comprised of the NAND circuits 1055 and 1056 inverts a signal state thereof, so that the outputs of the NAND circuits 1055 and 1056 become LOW and HIGH, respectively. The signal S1 output from the inverter 1057 is thus changed to HIGH. Even though the clock signal CLK1 changes between HIGH and LOW, the latch comprised of the NAND circuits 1055 and 1056 does not change a signal state thereof, so that the signal S1 remains at the HIGH level as long as the reset signal RST is HIGH. When the signal RST is changed to LOW after a predetermined time period, the output of the NAND circuit 1055 is changed to HIGH, so that the signal S1 output from the inverter 1057 returns to LOW.

In this manner, the comparison-signal generator 1041 can detect a first rising edge of the clock signal CLK1 after the signal RST is changed to HIGH. Operations of the comparison-signal generators 1042 through 1044 are basically identical to the operation of the comparison-signal generator 1041, and generate signals shown in FIGS. 63E through 63G, respectively.

Each of the time-difference-measurement circuits 1045 and 1046 includes a plurality of inverters 1061 connected in series, NAND circuits 1062 and 1063 each pair of which forms a latch, and a plurality of inverters 1064 which invert outputs of the latches formed by the NAND circuits 1062 and 1063.

A description of operations will be given by taking the time-difference-measurement circuit 1045 as an example. The plurality of inverters 1061 make up a series of delay elements, and an input signal S1 propagates through the series of delay elements by incurring some delay. The signal E1 propagates along a signal line SA which is laid out in parallel to the series of delay elements comprising the inverters 1061. In this configuration, the signal S1 propagating through the series of delay elements with some delay competes with the signal E1 propagating through the signal line SA without any delay.

Figures 63A, 63B, 63C, 63D, 63E, 63F, 63G:
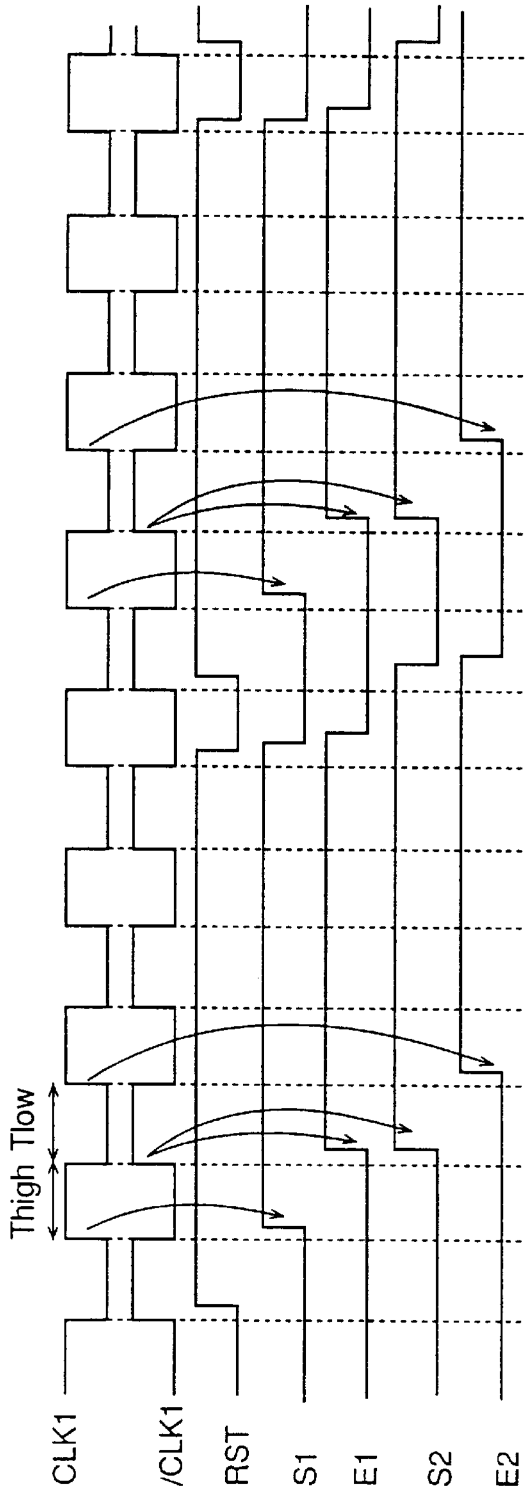
FIGS. 63A through 63G are timing charts for explaining operations of the RF-skew-measurement circuit.

The latches formed by the NAND circuits 1062 and 1063 latch a LOW output thereof when the signal S1 becomes HIGH ahead of the signal E1, and latch a HIGH output thereof when the signal E1 is the first to become HIGH. As shown in FIGS. 63D and 63E, the signal S1 is the first to become HIGH at a time when the signals S1 and E1 are input to the circuit. Because of this, latches provided on the left-hand side of FIG. 64, which are close to input nodes, latch a LOW output thereof. Since the signal S1 incurs an increased delay as it propagates further to the right in the figure, latches provided on the right-hand side of FIG. 64, which are far away from the input node, latch a HIGH output thereof. A position of a boundary between the latches latching LOW and the latches latching HIGH indicates a time difference between the edge of the signal S1 and the edge of the signal E1. The smaller the time difference, the closer the position of the boundary to the input nodes.

In this manner, the time-difference-measurement circuit 1045 measures a difference in rising-edge timings between the signal S1 and the signal E1, i.e., measures the length of the period Thigh of the clock signal CLK1. The time-difference-measurement circuit 1046 operates in the same manner, and measures a difference in rising-edge timings between the signal S2 and the signal E2, i.e., measures the length of the period Tlow of the clock signal CLK1.

The comparator 1047 includes a plurality of NAND circuit 1071, a plurality of NAND circuit 1072, a plurality of NAND circuit 1073, a plurality of NAND circuit 1074, and inverters 1075 and 1076.

The outputs of the inverters 1064, which are the outputs of the time-difference-measurement circuits 1045 and 1046, are HIGH on a left-hand side of the figure and LOW on a right-hand side of the figure. For example, if the NAND circuits 1071 and 1072 and the NAND circuits 1073 and 1074 which are first from the left in the figure receive HIGH signals at one input thereof from the inverters 64 which are first from the left and provided on an upper side and on a lower side, these NAND circuits serve as inverters for the other input thereof. Namely, the NAND circuits 1071 and 1072 and the NAND circuits 1073 and 1074 merely pass signals therethrough when these signals have propagated from the right-hand side of the figure.

When the NAND circuits 1071 and 1072 which are first from the right in the figure receive LOW signals at one input thereof from the inverters 1064 which are first from the right, these NAND circuits output a HIGH signal regardless of a signal level supplied to the other input thereof.

Namely, when the inverters 1064 forming a pair between the upper side and the lower side output HIGH signals, the comparator 1047 allow signals to pass therethrough from the right-hand side of the figure to the left-hand side. When the inverters 1064 output LOW signals, the NAND circuits 1071 and 1072 output HIGH signals.

When the period Thigh and the period Tlow have different lengths, the inverters 64 forming a pair between the upper side and the lower side output different signals somewhere in the comparator 1047. Assume that an upper-side inverter 1064 of a given pair generates a HIGH output and a lower-side inverter 1064 generates a LOW output. In this case, corresponding NAND circuits 1071 and 1072 output LOW and HIGH, respectively. These LOW output and HIGH output propagate to the leftmost portion of the comparator 1047, thereby allowing a check to be made as to which one of the period Thigh and the period Tlow is longer than the other.

In detail, the signal FBF is HIGH when the period Thigh is longer, and the signal RBF is HIGH when the period Tlow is longer. The signals FBF and RBF are used for controlling the edge-adjustment circuits 1022 of FIG. 61.

Figure 65:
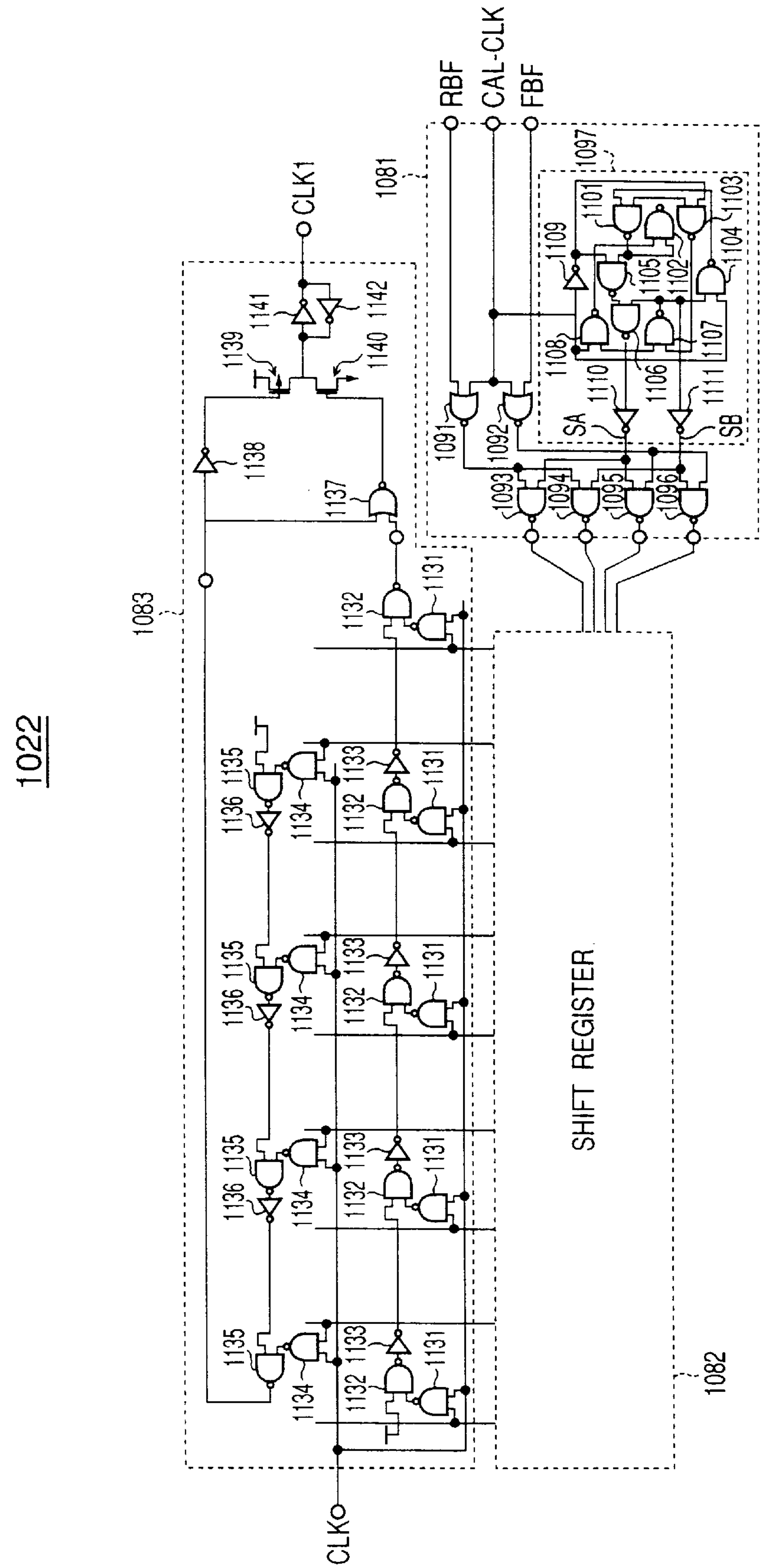
FIG. 65 is a circuit diagram of an edge-adjustment circuit of FIG. 61.

FIG. 65 is a circuit diagram of the edge-adjustment circuit 1022 of FIG. 61.

The edge-adjustment circuit 1022 includes a shift-register driving circuit 1081, a shift register 1082, and an edge-shift circuit 1083.

The shift-register driving circuit 1081 receives the signals RBF and FBF and a calibration clock CAL-CLK which is used as a synchronization signal in the calibration mode. The calibration clock CAL-CLK is an ordinary clock signal having a proper clock cycle, and the shift-register driving circuit 1081 changes outputs thereof in synchronism with the calibration clock CAL-CLK.

The shift-register driving circuit 1081 includes NOR circuits 1091 and 1092, NAND circuits 1093 through 1096, and a binary counter 1097. The binary counter 1097 includes NAND circuits 1101 through 1108 and inverters 1109 through 1111. Operations of the binary counter 1097 are well within the scope of ordinary skill in the art, and a description thereof will be omitted. Signals SA and SB output from the binary counter 1097 are a signal obtained by dividing a frequency of the calibration clock CAL-CLK by half and a signal obtained by inverting this signal.

The NOR circuits 1091 and 1092 serve as gates which allows the passage of the signals RBF and FBF only when the calibration clock CAL-CLK is HIGH.

The signal RBF (an inverse thereof to be exact) is supplied from the NOR circuit 1091 to one input of the NAND circuits 1093 and 1094, and the signal FBF (an inverse thereof to be exact) is supplied from the NOR circuit 1092 to one input of the NAND circuits 1095 and 1096. The other input of the NAND circuits 1093 and 1095 receives the signal SA from the binary counter 1097, and the other input of the NAND circuits 1094 and 1096 receives the signal SB from the binary counter 1097.

Namely, when the signal RBF is HIGH, the NAND circuits 1093 and 1094 output HIGH pulses in turn. When the signal FBF is HIGH, on the other hand, the NAND circuits 1095 and 1096 output HIGH pulses in turn. These HIGH pulses are used for driving the shift register 1082.

Figure 66:
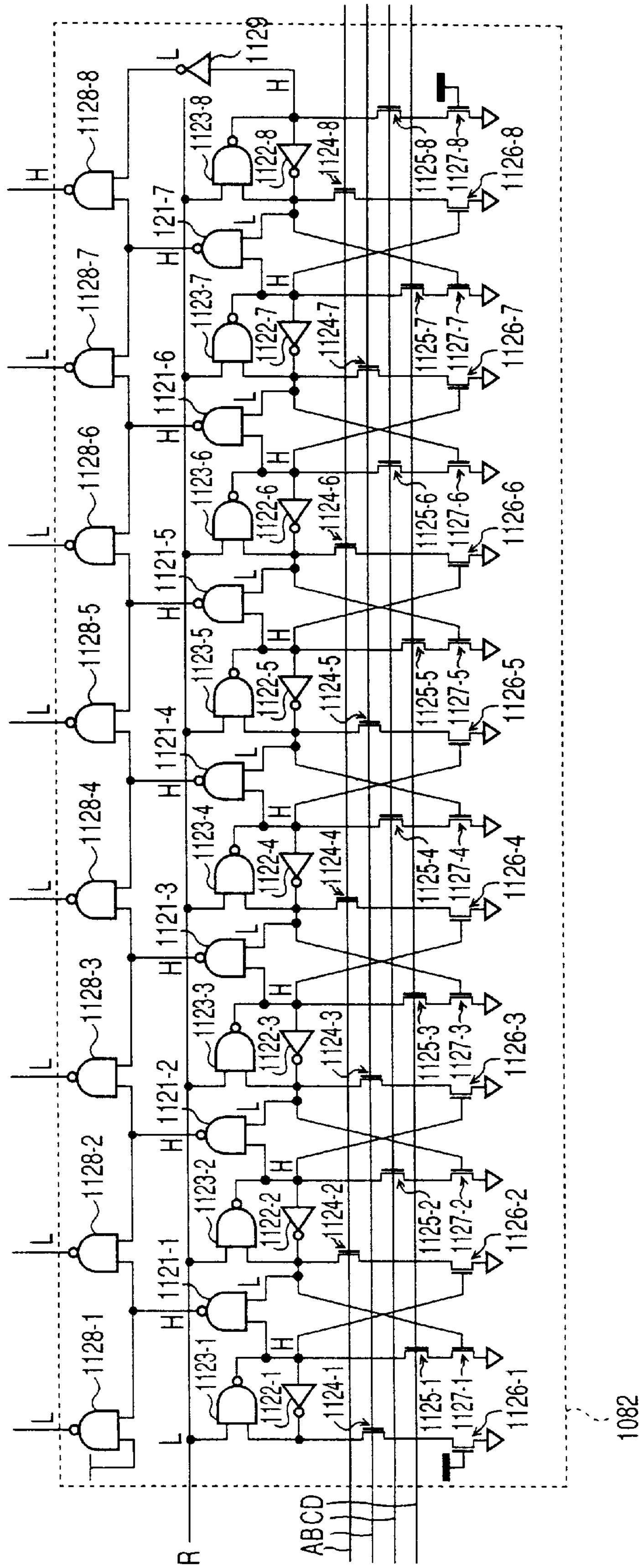
FIG. 66 is a circuit diagram of a shift register.

FIG. 66 is a circuit diagram of the shift register 1082.

The shift register 1082 includes NAND circuits 1121-1 through 1121-7, inverters 1122-1 through 1122-8, NAND circuits 1123-1 through 1123-8, NMOS transistors 1124-1 through 1124-8, NMOS transistors 1125-1 through 1125-8, NMOS transistors 1126-1 through 1126-8, NMOS transistors 1127-1 through 1127-8, NAND circuits 1128-1 through 1128-8, and an inverter 1129. When the reset signal R becomes LOW, the shift register 1082 is reset. That is, when the reset signal R is changed to LOW, outputs of the NAND circuits 1123-1 through 1123-8 become HIGH, and outputs of the inverters 1122-1 through 1122-8 become LOW. Each pair formed by one of the NAND circuits 1123-1 through 1123-8 and a corresponding one of the inverters 1122-1 through 1122-8 makes up a latch by each element of the pair providing an output thereof to the other element of the pair. Because of this latch function, an initial state set by the reset signal R is kept even after the reset signal R returns to HIGH.

In this initial state, as shown in FIG. 66, outputs of the NAND circuits 1128-1 through 1128-7 are LOW, while an output of the NAND circuit 1128-8 is HIGH.

When the falling edges of the clock signal CLK1 need to be advanced with regard to time, HIGH pulses are supplied to signal lines C and D in turn. When a HIGH pulse is supplied to the signal line C, the NMOS transistor 1125-8 is turned on. Since the NMOS transistor 1127-8 is on, an output of the NAND circuit 1123-8 is connected to the ground, and is forced to change from HIGH to LOW. An output of the inverter 1122-8 is thus changed to HIGH, and this condition is held by the latch comprised of the NAND circuit 1123-8 and the inverter 1122-8. As a result, an output of the inverter 1129 is changed from LOW to HIGH, and the output of the NAND circuit 1121-7 is changed from HIGH to LOW. In this case, therefore, the outputs of the NAND circuits 1128-7 and 1128-8 are HIGH, and the remaining outputs are LOW.

When a HIGH pulse is supplied to the signal line D, the NMOS transistor 1125-7 is turned on. Since the NMOS transistor 1127-7 is on, an output of the NAND circuit 1123-7 is connected to the ground, and is forced to change from HIGH to LOW. An output of the inverter 1122-7 is thus changed to HIGH, and this condition is held by the latch comprised of the NAND circuit 1123-7 and the inverter 1122-7. At this time, the output of the NAND circuit 1121-7 is changed from LOW to HIGH, and the output of the NAND circuit 1121-6 is changed from HIGH to LOW. Namely, the outputs of the NAND circuits 1128-6 and 1128-7 are HIGH, and the remaining outputs are LOW.

In this manner, HIGH pulses supplied to the signal lines C and D in turn successively shift positions of the only two HIGH outputs among the outputs of the NAND circuits 1128-1 through 1128-8 to the left.

When there is a need to advance the rising edges of the clock signal CLK1 with regard to time, HIGH pulses are supplied to the signal lines A and B. Through this operation, positions of only two HIGH outputs among the outputs of the NAND circuits 1128-1 through 1128-8 are successively shifted to the right. Operations in this case are basically the same as those described in the above, and a description thereof will be omitted.

As described above, the plurality of outputs from the shift register 1082 are LOW, except for two adjacent outputs which are HIGH. Depending on whether there is a need to advance the rising edges or a need to advance the falling edges, positions of the two HIGH outputs are shifted to the right or to the left. The plurality of outputs from the shift register 1082 are used for controlling the edge-shift circuits 1083 of FIG. 65.

The edge-shift circuit 1083 of FIG. 65 includes a plurality of NAND circuits 1131, a plurality of NAND circuits 1132, a plurality of inverters 1133, a plurality of NAND circuits 1134, a plurality of NAND circuits 1135, a plurality of inverters 136, a NOR circuit 1137, an inverter 1138, a PMOS transistor 1139, an NMOS transistor 1140, and inverters 1139 and 1140. The plurality of the NAND circuits 1132 and the plurality of inverters 1133 together form a first series of delay elements, and the plurality of the NAND circuits 1135 and the plurality of inverters 1136 together form a second series of delay elements.

The plurality of NAND circuits 1131 receive the outputs of the shift register 1082 at one input thereof, and receive the clock signal CLK at the other input thereof. The clock signal CLK thus enters the first series of delay elements at a position where the outputs from the shift register 1082 are HIGH. The clock signal CLK propagates through the first series of delay elements, and is supplied to the NOR circuit 1137.

The plurality of NAND circuits 1134 receive the outputs of the shift register 1082 at one input thereof, and receive the clock signal CLK at the other input thereof. The clock signal CLK thus enters the second series of delay elements at a position where the outputs from the shift register 1082 are HIGH. The clock signal CLK propagates through the second series of delay elements, and is supplied to the NOR circuit 1137 and the inverter 1138.

The two HIGH outputs among the outputs from the shift register 1082 are positioned next to each other. When the two HIGH outputs are shifted to the right, a delay which the clock signal CLK incurs by propagating through the first series of delay elements is decreased, while a delay which the clock signal CLK incurs by propagating through the second series of delay elements is increased. When the two HIGH outputs are shifted to the left, on the other hand, a delay which the clock signal CLK incurs by propagating through the first series of delay elements is increased, while a delay which the clock signal CLK incurs by propagating through the second series of delay elements is decreased.

A latch comprised of the inverters 1141 and 1142 latches a HIGH level at a rising edge of the clock signal CLK having propagated through the second series of delay elements. Further, this latch latches a LOW level when both the clock signal CLK having propagated through the first series of delay elements and the clock signal CLK having propagated through the second series of delay elements become LOW.

Accordingly, the clock signal CLK1 output from the edge-shift circuit 1083 has the period Thigh and the period Tlow adjusted depending on positions of the two HIGH outputs among the plurality of outputs from the shift register 1082.

In this manner, the edge-adjustment circuit 1022 receives the clock signal CLK as an input, and adjusts the period Thigh and the period Tlow of the output clock signal CLK1 based on the control signals supplied from the RF-skew-measurement circuit 1021. As a result of this adjustment, the period Thigh and the period Tlow of the clock signal CLK1 are made equal to each other, thereby reducing a rise-and-fall skew of the clock signal CLK.

As described in connection with FIG. 61, the edge-adjustment circuits 1022 apply the same edge adjustment to the signal A as does to the clock signal CLK, thereby reducing a rise-and-fall skew of the signal A.

Figure 67:
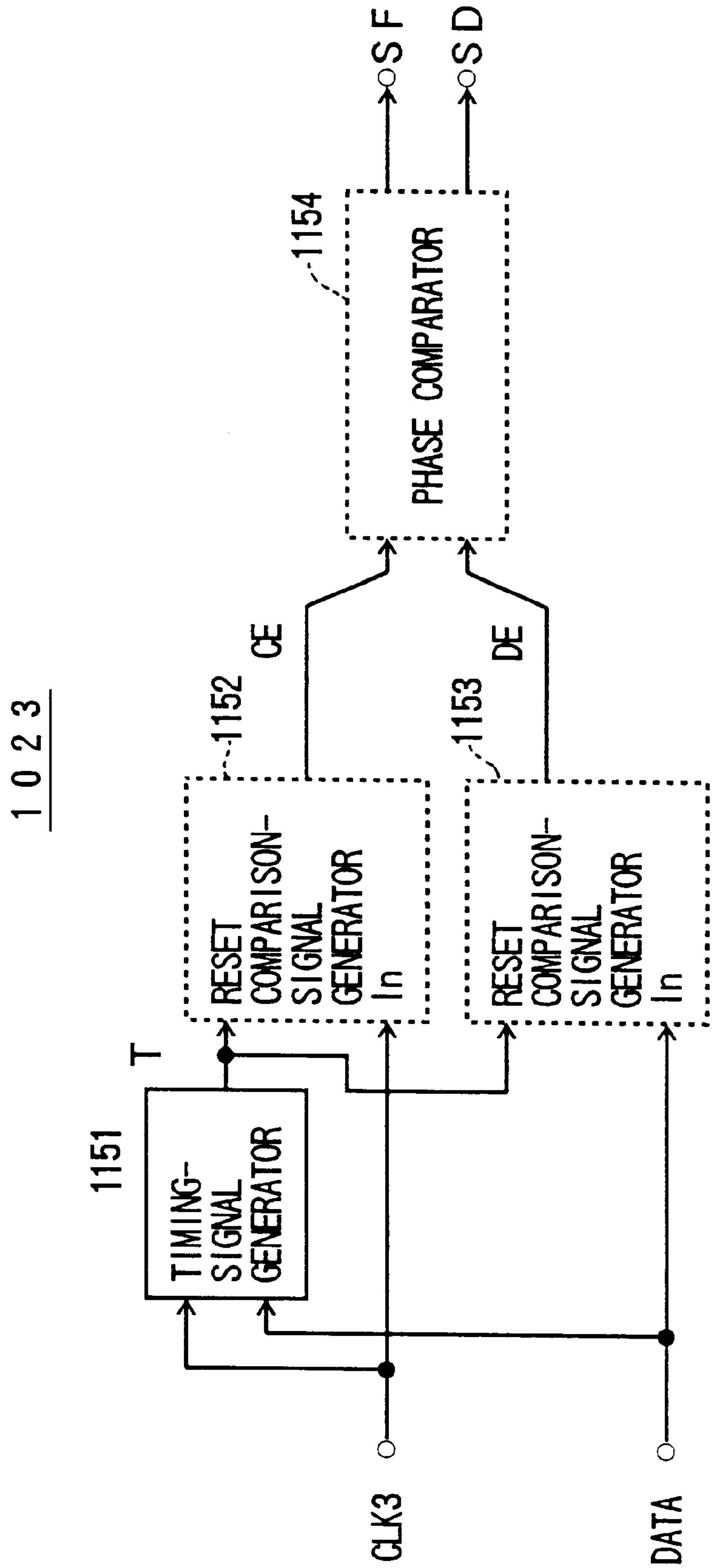
FIG. 67 is a block diagram of an inter-signal-skew-measurement circuit shown in FIG. 61.
Figures 68A, 68B, 68C, 68D, 68E:
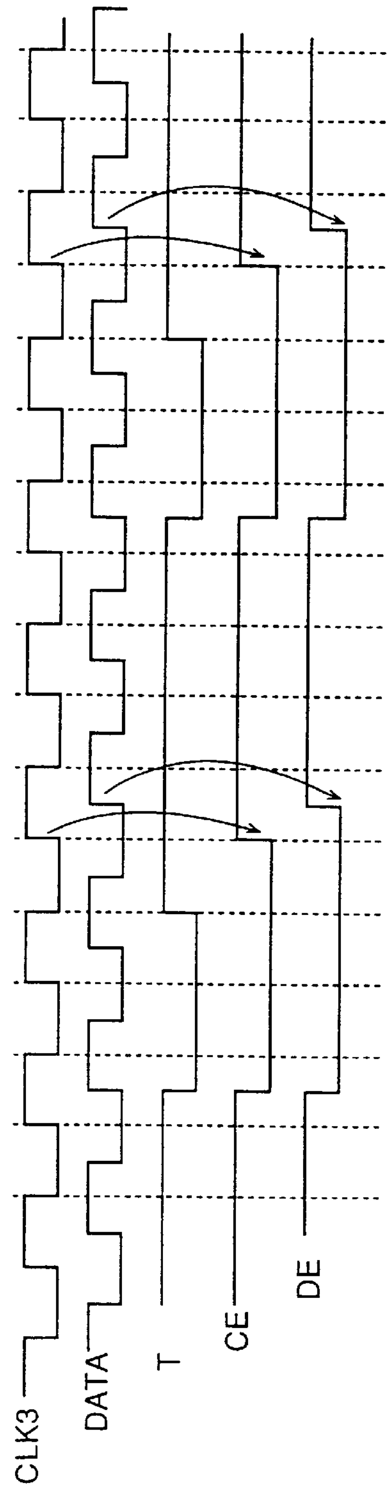
FIGS. 68A through 68E are timing charts showing signals of FIG. 67.

FIG. 67 is a block diagram of the inter-signal-skew-measurement circuit 1023 shown in FIG. 61.

The inter-signal-skew-measurement circuit 1023 includes a timing-signal generator 1151, comparison-signal generators 1152 and 1153, and a phase comparator 1154.

The timing-signal generator 1151 receives the clock signal CLK3 and a signal DATA which is the signal A delayed by the delay circuit 1024, and generates a timing signal T based on these received signals. The timing signal T is supplied to the comparison-signal generators 1152 and 1153. The comparison-signal generator 1152 changes an output signal CE to HIGH at a first rising edge of the clock signal CLK3 after the timing signal T is changed to HIGH. The comparison-signal generator 1153 turns an output signal DE to HIGH at a first rising edge of the signal DATA after the timing signal T is changed to HIGH.

FIGS. 68A through 68E are timing charts showing signals of FIG. 67. A comparison of rising edges between the signal CE and the signal DE shown in FIGS. 68D and 68E makes it possible to check a relative phase relation between the clock signal CLK3 and the signal DATA.

With reference to FIG. 67 again, the phase comparator 1154 receives the signals CE and DE, and checks which one of these signals has a rising edge at an earlier timing. When the signal DATA needs to be advanced in order to align phases between the clock signal CLK3 and the signal DATA, the phase comparator 1154 changes an output signal SF to HIGH. When the signal DATA needs to be delayed in order to achieve a phase alignment, the phase comparator 1154 changed an output signal SD to HIGH.

Figure 69:
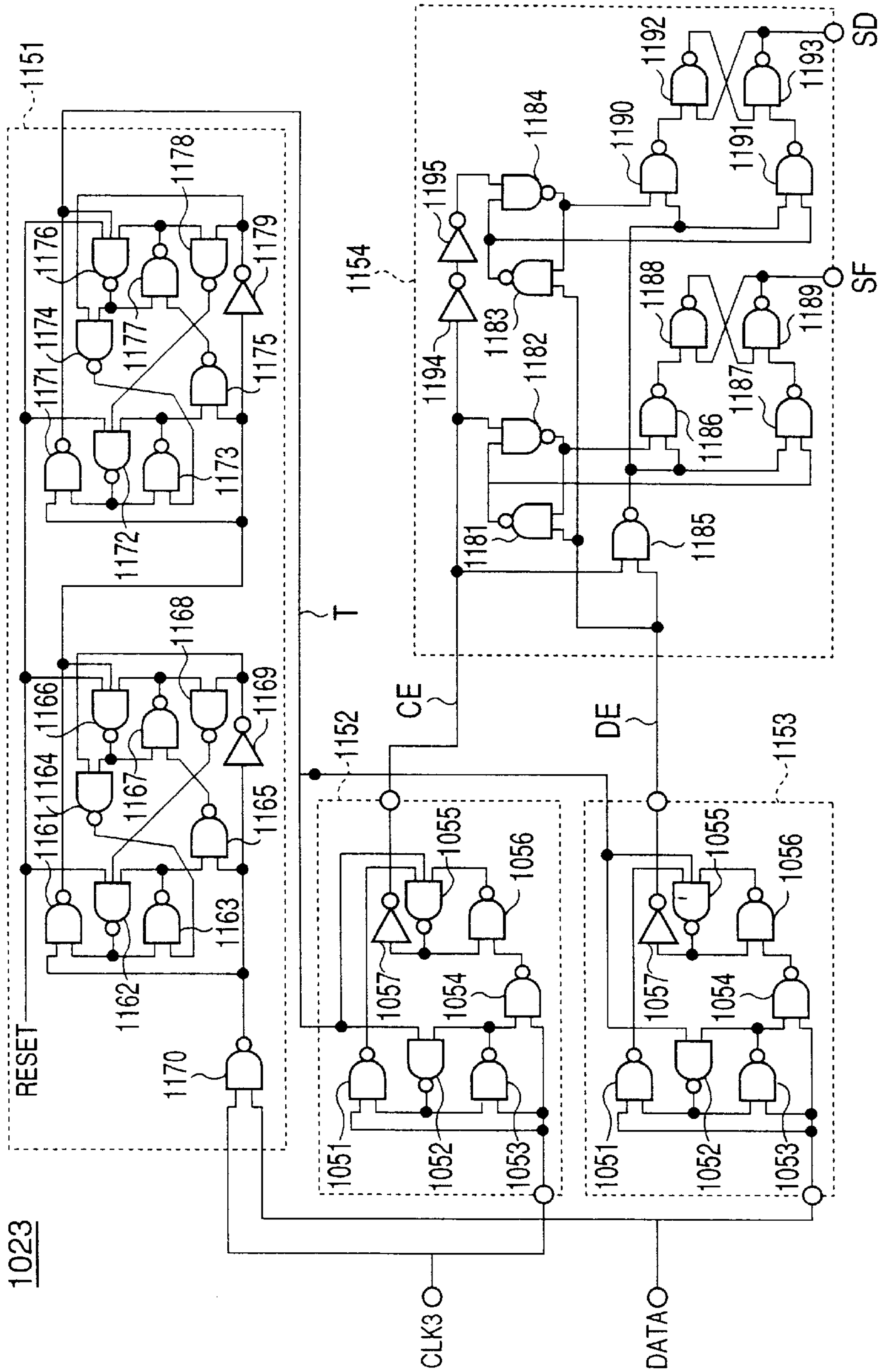
FIG. 69 is a circuit diagram of the inter-signal-skew-measurement circuit.

FIG. 69 is a circuit diagram of the intersignal-skew-measurement circuit 1023.

The timing-signal generator 1151 includes NAND circuits 1161 through 1168, an inverter 1169, a NAND circuit 1170, NAND circuits 1171 through 1178, and an inverter 1179. In the timing-signal generator 1151, the NAND circuit 1170 takes a NAND operation between the clock signal CLK3 and the signal DATA, and the timing signal T is generated based on a timing of an output signal of the NAND circuit 1170.

The comparison-signal generators 1152 and 1153 have a configuration identical to the comparison-signal generators 1041 through 1044 shown in FIG. 64, and a description thereof will be omitted.

The phase comparator 1154 includes NAND circuits 1181 through 1193 and inverters 1194 and 1195. The NAND circuits 1181 and 1182 together form a first latch, and NAND circuits 1183 and 1184 make up a second latch. The first latch latches a rising edge of the signal CE or a rising edge of the signal DE whichever comes first. The second latch latches a rising edge of the signal DE or a rising edge of the signal CE delayed by the inverters 1194 and 1195 whichever comes first. A signal level of the output signal SF is determined depending upon a status of the first latch, and a signal level of the output signal SD is determined depending on a status of the second latch.

The signal SF becomes HIGH when the signal DATA needs to be advanced in order to achieve a phase alignment, and the signal SD becomes HIGH when the signal DATA needs to be delayed in order to align phases.

The signals SF and SD are used for controlling the delay circuit 1024 of FIG. 61.

Figure 70:
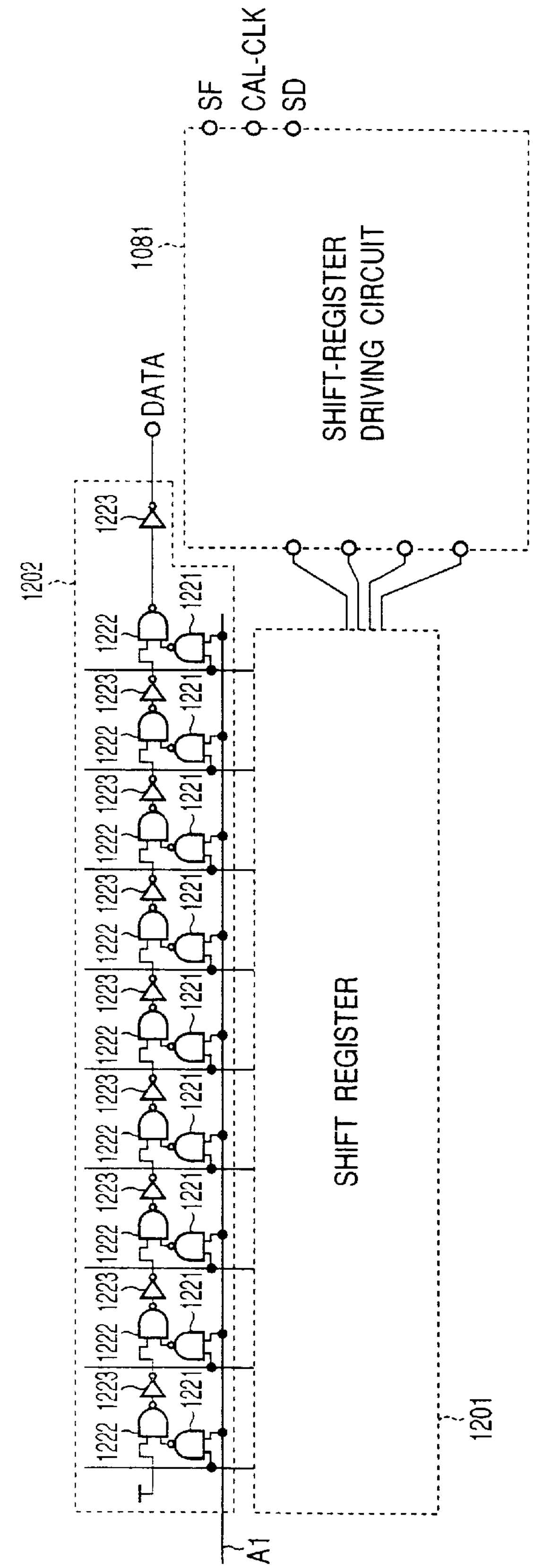
FIG. 70 is a circuit diagram of a delay circuit.

FIG. 70 is a circuit diagram of the delay circuit 1024.

The delay circuit 1024 includes a shift-register driving circuit 1081, a shift register 1201, and a delay line 1202. In FIG. 70, the same elements as those of FIG. 65 are referred to by the same numerals.

The shift-register driving circuit 1081 receives the signals SF and SD and the calibration clock CAL-CLK which is used as a synchronization signal during the calibration mode. The shift-register driving circuit 1081 of FIG. 70 has a configuration identical to that of the shift-register driving circuit 1081 of FIG. 65, and a description thereof will be omitted.

Figure 71:
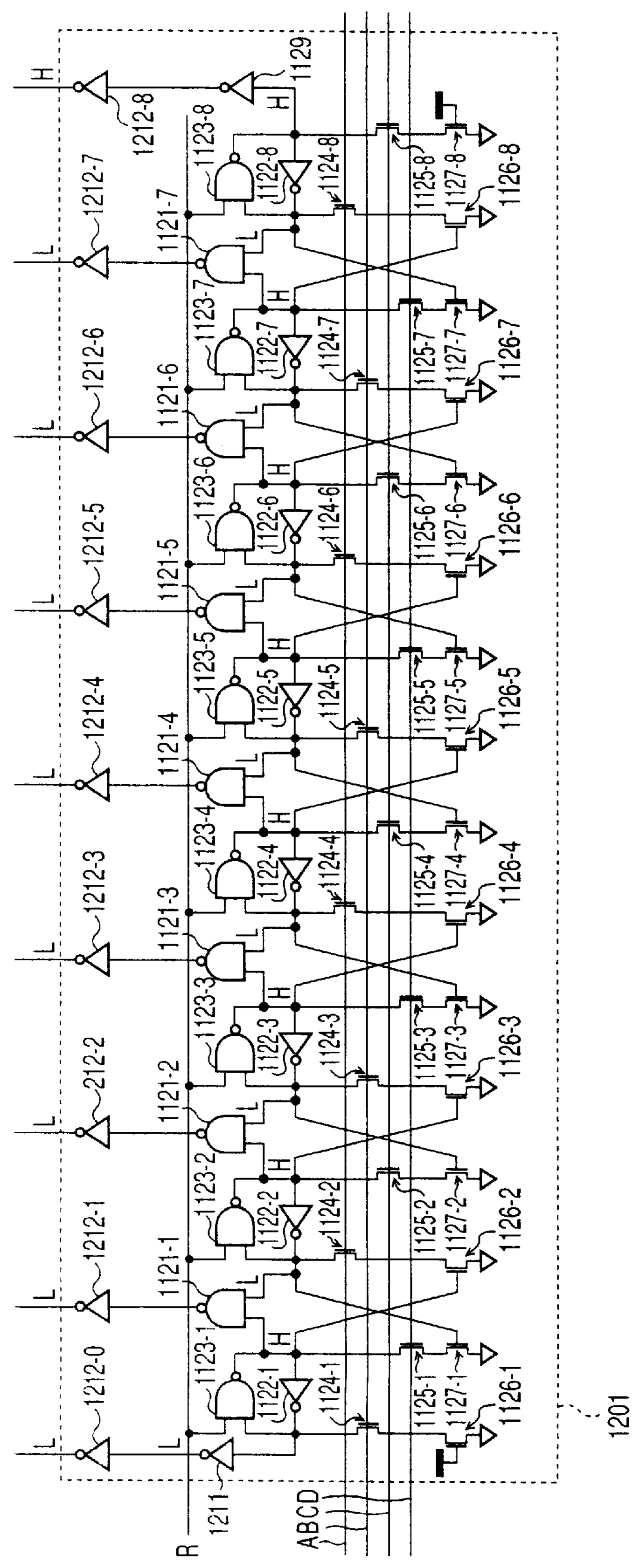
FIG. 71 is a circuit diagram of a shift register.
Figures 72A, 72B, 72C, 72D, 72E:
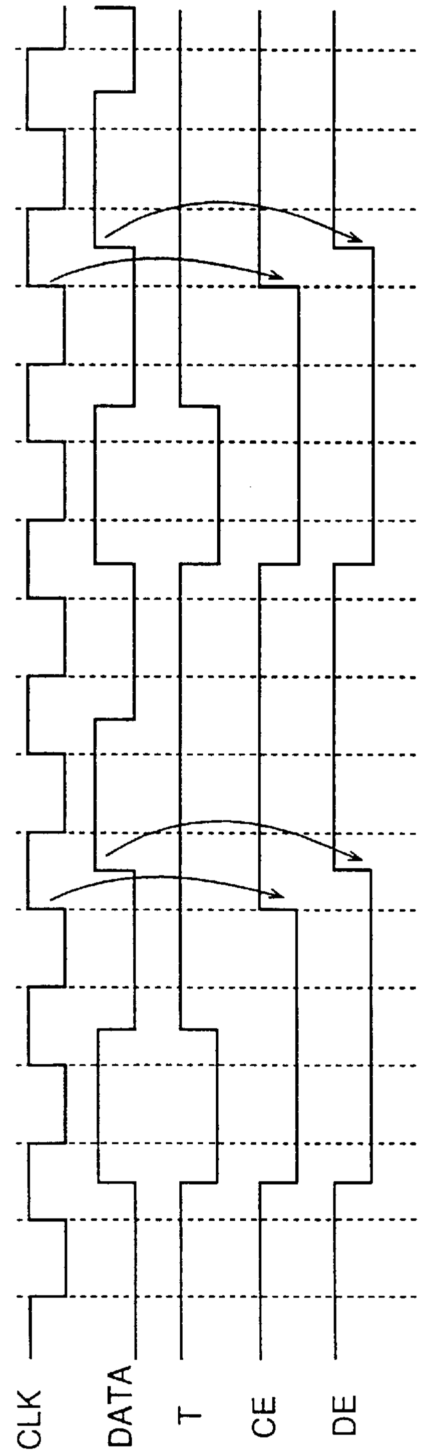
FIGS. 72A through 72E are timing charts corresponding to FIGS. 68A through 68E and show signals when a calibration signal different from that of FIGS. 68A through 68E is used in a calibration mode for reducing inter-signal skews.
Figures 73A, 73B, 73C, 73D, 73E, 73F:
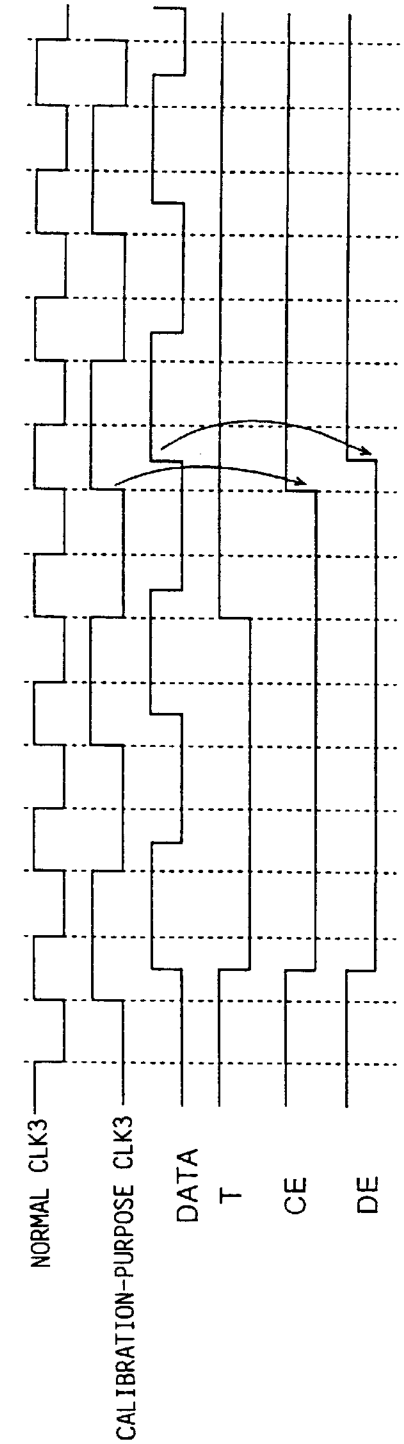
FIGS. 73A through 73F are timing charts showing signals when a different calibration clock signal is used in the calibration mode for reducing inter-signal skews.

FIG. 71 is a circuit diagram of the shift register 1201. In FIG. 71, the same elements as those of FIG. 66 are referred to by the same numerals.

The shift register 1201 includes the NAND circuits 1121-1 through 1121-7, the inverters 1122-1 through 1122-8, the NAND circuits 1123-1 through 1123-8, the NMOS transistors 1124-1 through 1124-8, the NMOS transistors 1125-1 through 1125-8, the NMOS transistors 1126-1 through 1126-8, the NMOS transistors 1127-1 through 1127-8, the inverter 1129, an inverter 1211, and inverters 1212-0 through 1212-8. When the reset signal R becomes LOW, the shift register 1201 is reset. That is, when the reset signal R is changed to LOW, outputs of the NAND circuits 1123-1 through 1123-8 become HIGH, and outputs of the inverters 1122-1 through 1122-8 become LOW. Each pair formed by one of the NAND circuits 1123-1 through 1123-8 and a corresponding one of the inverters 1122-1 through 1122-8 makes up a latch by each element of the pair providing an output thereof to the other element of the pair. Because of this latch function, an initial state set by the reset signal R is kept even after the reset signal R returns to HIGH.

In this initial state, as shown in FIG. 71, outputs of the inverters 1212-0 through 1212-7 are LOW, while an output of the inverter 1212-8 is HIGH.

When the delay of the delay circuit 1024 needs to be increased, HIGH pulses are supplied to signal lines C and D in turn. When a HIGH pulse is supplied to the signal line C at the initial state shown in FIG. 71, the NMOS transistor 1125-8 is turned on. Since the NMOS transistor 1127-8 is on, an output of the NAND circuit 1123-8 is connected to the ground, and is forced to change from HIGH to LOW. An output of the inverter 1122-8 is thus changed to HIGH, and this condition is held by the latch comprised of the NAND circuit 1123-8 and the inverter 1122-8. As a result, an output of the inverter 1129 is changed from LOW to HIGH, and the output of the NAND circuit 1121-7 is changed from HIGH to LOW. In this case, therefore, only the output of the inverter 1212-7 is HIGH, and the remaining outputs are LOW.

When a HIGH pulse is supplied to the signal line D, the NMOS transistor 1125-7 is turned on. Since the NMOS transistor 1127-7 is on, an output of the NAND circuit 1123-7 is connected to the ground, and is forced to change from HIGH to LOW. An output of the inverter 1122-7 is thus changed to HIGH, and this condition is held by the latch comprised of the NAND circuit 1123-7 and the inverter 1122-7. At this time, the output of the NAND circuit 1121-7 is changed from LOW to HIGH, and the output of the NAND circuit 1121-6 is changed from HIGH to LOW. In this case, therefore, only the output of the inverter 1212-6 is HIGH, and the remaining outputs are LOW.

In this manner, HIGH pulses supplied to the signal lines C and D in turn successively shift a position of the only one HIGH output among the outputs of the inverters 1212-0 through 1212-8 to the left.

When there is a need to decrease the delay of the delay circuit 1024, HIGH pulses are supplied to the signal lines A and B. Through this operation, a position of the only one HIGH output among the outputs of the inverters 1212-0 through 1212-8 is successively shifted to the right. Operations in this case are basically the same as those described in the above, and a description thereof will be omitted.

The plurality of outputs from the shift register 1201 are used for controlling the delay line 1202 of FIG. 70.

The delay line 1202 of FIG. 70 includes a plurality of NAND circuits 1221, a plurality of NAND circuits 1222, and a plurality of inverters 1223. The plurality of NAND circuits 1222 and the plurality of inverters 1223 together form a series of delay elements.

The plurality of NAND circuits 1221 receive the outputs of the shift register 1201 at one input thereof, and receive the signal A1 from the RF-skew-reduction circuit 1011 at the other input thereof. The signal Al thus enters the series of delay elements at a position where the only one HIGH output among the outputs of the shift register 1201 is located. The signal A1 propagates through the series of delay elements, and is output as the data signal DATA.

When the only one HIGH output among the outputs of the shift register 1201 is shifted to the right, a delay which the signal A1 incurs by propagating through the series of delay elements is decreased. When the only one HIGH output is shifted to the left, on the other hand, a delay which the signal A1 incurs by propagating through the series of delay elements is increased.

Accordingly, the signal DATA output from the delay line 1202 has a delay thereof adjusted depending on the position of the only one HIGH output among the plurality of outputs of the shift register 1201.

In this manner, the delay circuit 1024 receives the signal A1 as an input, and adjusts the delay of the output signal DATA based on the control signals from the inter-signal-skew-measurement circuit 1023. As a result of this adjustment, the signal DATA and the clock signal CLK3 are aligned in terms of their phases, thereby reducing an inter-signal skew between the signal DATA and the clock signal CLK3.

As described in connection with FIG. 61, the delay circuit 1024 may apply the same inter-signal alignment (phase alignment) to other signals in addition to the signal A, thereby reducing inter-signal skews between these signals.

FIGS. 72A through 72E are timing charts corresponding to FIGS. 68A through 68E and show signals when a calibration signal DATA different from that of FIGS. 68A through 68E is used in the calibration mode for reducing inter-signal skews. As shown in FIGS. 72A through 72E, a signal which has double the cycle of the clock signal CLK3 may be used as the calibration signal DATA.

FIGS. 73A through 73F are timing charts showing signals when a different calibration clock signal CLK3 is used in the calibration mode for reducing inter-signal skews. As shown in FIGS. 73A through 73F, a signal which has double the cycle of the normal clock signal CLK3 may be used as the calibration signal DATA, and, at the same time, a calibration-purpose clock signal CLK3 having double the clock cycle of the normal clock signal may be used.

As shown in FIGS. 72A through 72E and FIGS. 73A through 73F, calibration for inter-signal-skew reduction can be carried out under various calibration conditions, so that a flexible inter-signal-skew reduction is attainable in order to cope with various signal conditions.

Figure 74:
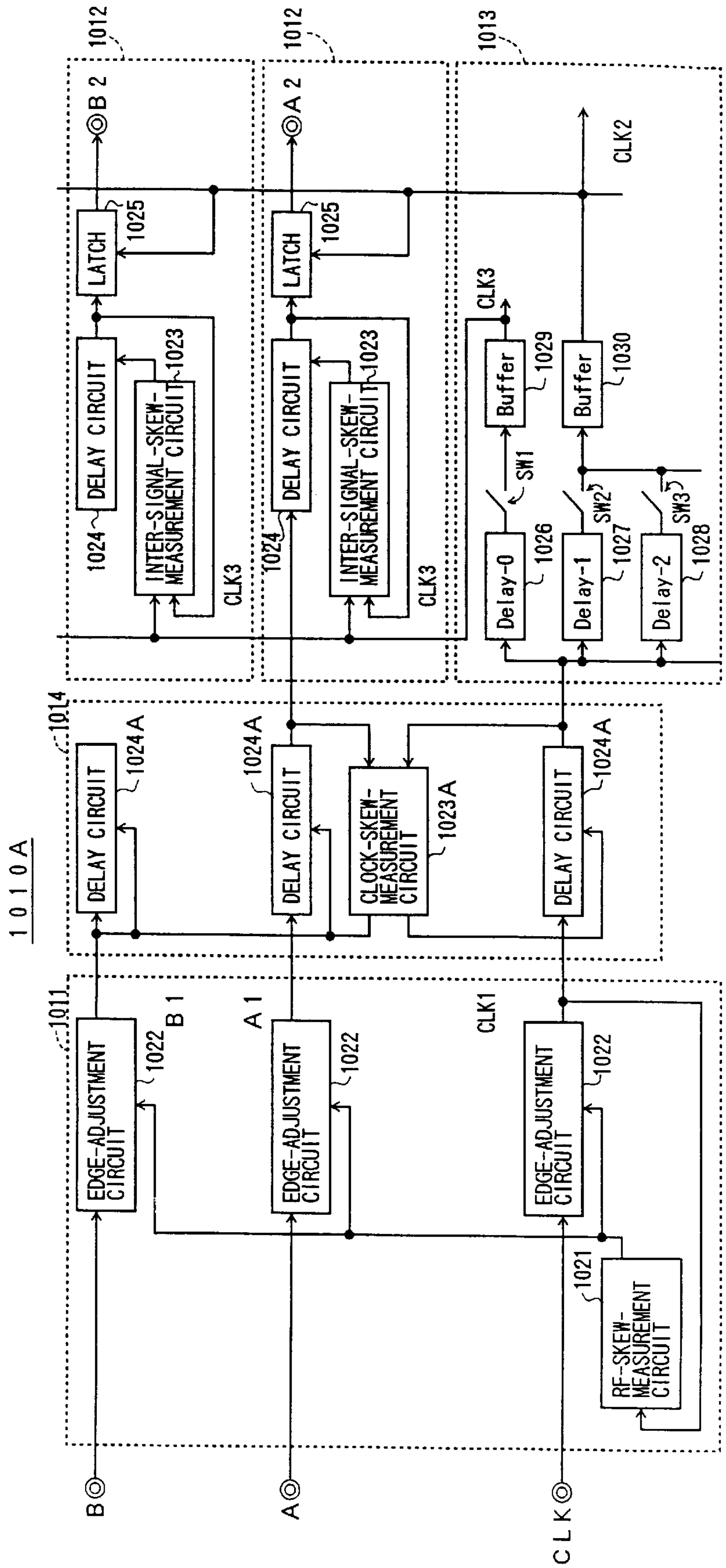
FIG. 74 is a block diagram of a second embodiment of a skew-reduction circuit for reducing an inter-signal skew according to the present invention.

FIG. 74 is a block diagram of a second embodiment of a skew-reduction circuit for reducing an inter-signal skew according to the present invention. In FIG. 74, the same elements as those of FIG. 61 are referred to by the same numerals, and a description thereof will be omitted.

The skew-reduction circuit 1010A of FIG. 74 includes the RF-skew-reduction circuit 1011, the intersignal-skew-reduction circuits 1012, the clock-buffer circuit 1013, and a clock-skew-reduction circuit 1014.

In memory systems, for example, when wiring lines are provided between a memory controller and a memory device, a wiring line for conveying a clock signal tends to be laid out along a route which is different from a route used for data-signal wiring lines and address-signal wiring lines. This is because since the clock signal needs to be supplied to other devices also, it is easier to lay out wiring lines if a different path is used for conveying the clock signal. In such a case, however, the clock signal received at the receiver device ends up having a timing considerably different from timings of other received signals. In consideration of this, the skew-reduction circuit 1010A of FIG. 74 first attends to alignment between the clock signal and the signal A. Of course, when there are a plurality of signals in addition to the clock signal, each of these signals should be aligned to the clock signal. An inter-signal skew between each signal and the clock signal, however, is considerably larger than inter-signal skews which are existent between signals other than the clock signal.

It is preferable, therefore, to bring a timing of the clock signal closer to a timing distribution of the plurality of other signals by reducing a large inter-signal skew between the clock signal and the other signals, and, then, to reduce a small inter-signal skew between the clock signal and each of the other signals. When a circuit for reducing the large skew of the clock signal is provided separately from a circuit for reducing the small skew between the clock signal and the other signals, an accurate inter-signal-skew reduction is achieved while maintaining a small circuit size.

The clock-skew-reduction circuit 1014 of FIG. 74 reduces the large inter-signal skew between the clock signal and the plurality of other signals. This large inter-signal skew is hereinafter called a clock skew. After the clock-skew-reduction circuit 1014 reduces the clock skew, the inter-signal-skew-reduction circuits 1012 align each signal to the clock signal so as to reduce the small inter-signal skews.

The clock-skew-reduction circuit 1014 includes a clock-skew-measurement circuit 1023A and a plurality of delay circuits 1024A. The delay circuits 1024A receive the signal A1, a signal B1, and the clock signal CLK1 which have rise-and-fall skews thereof reduced in the RF-skew-reduction circuit 1011. The delay circuits 1024A delay these signals. The clock-skew-measurement circuit 1023A receives the signal A1 and the clock signal CLK1 after these two signals are delayed by the delay circuits 1024A, and detects a phase difference between the two signals. The clock-skew-measurement circuit 1023A adjusts the delays of the delay circuits 1024 such that the signal A1 delayed by the delay circuit 1024A and the clock signal CLK1 delayed by the delay circuit 1024A have an identical phase.

The clock-skew-measurement circuit 1023A may have a configuration identical to the configuration of the inter-signal-skew-measurement circuit 1023 shown in FIG. 69. The delay circuits 1024A may have the same configuration as that of the delay circuit 1024 shown in FIG. 70. It should be noted, however, that the positions of the control signals SF and SD should be exchanged to ensure that the delay of the delay circuit 1024A receiving the signal A1 is increased and the delay of the delay circuit 1024A receiving the clock signal CLK1 is decreased when the signal A1 after delay is ahead of the clock signal CLK1 after delay. When the signal A1 after delay is behind the clock signal CLK1 after delay, on the other hand, the delay of the delay circuit 1024A receiving the signal A1 needs to be decreased and the delay of the delay circuit 1024A receiving the clock signal CLK1 needs to be increased. Further, the delay circuit 1024A receiving the signal B1 is controlled to have a delay which is equal to the delay applied to the signal A1.

In the configuration of FIG. 74, the clock-skew-reduction circuit 1014 reduces a large intersignal skew between the clock signal CLK1 and the plurality of signals A and B so as to bring a timing of the clock signal CLK1 close to a timing distribution of the plurality of signals A and B, and, then, the intersignal-skew-reduction circuits 1012 reduce small inter-signal skews between the clock signal CLK1 and the signal A as well as between the clock signal CLK1 and the signal B. The clock-skew-reduction circuit 1014 for reducing the large clock skew of the clock signal may be provided with a delay adjustment function to coarsely adjust a delay within a wide range, while the inter-signal-skew-reduction circuits 1012 for reducing the small inter-signal skews may be provided with a delay adjustment function to achieve fine adjustment within a narrow range. In this manner, a highly accurate inter-signal-skew reduction can be achieved while maintaining a relatively small circuit size.

Figure 75:
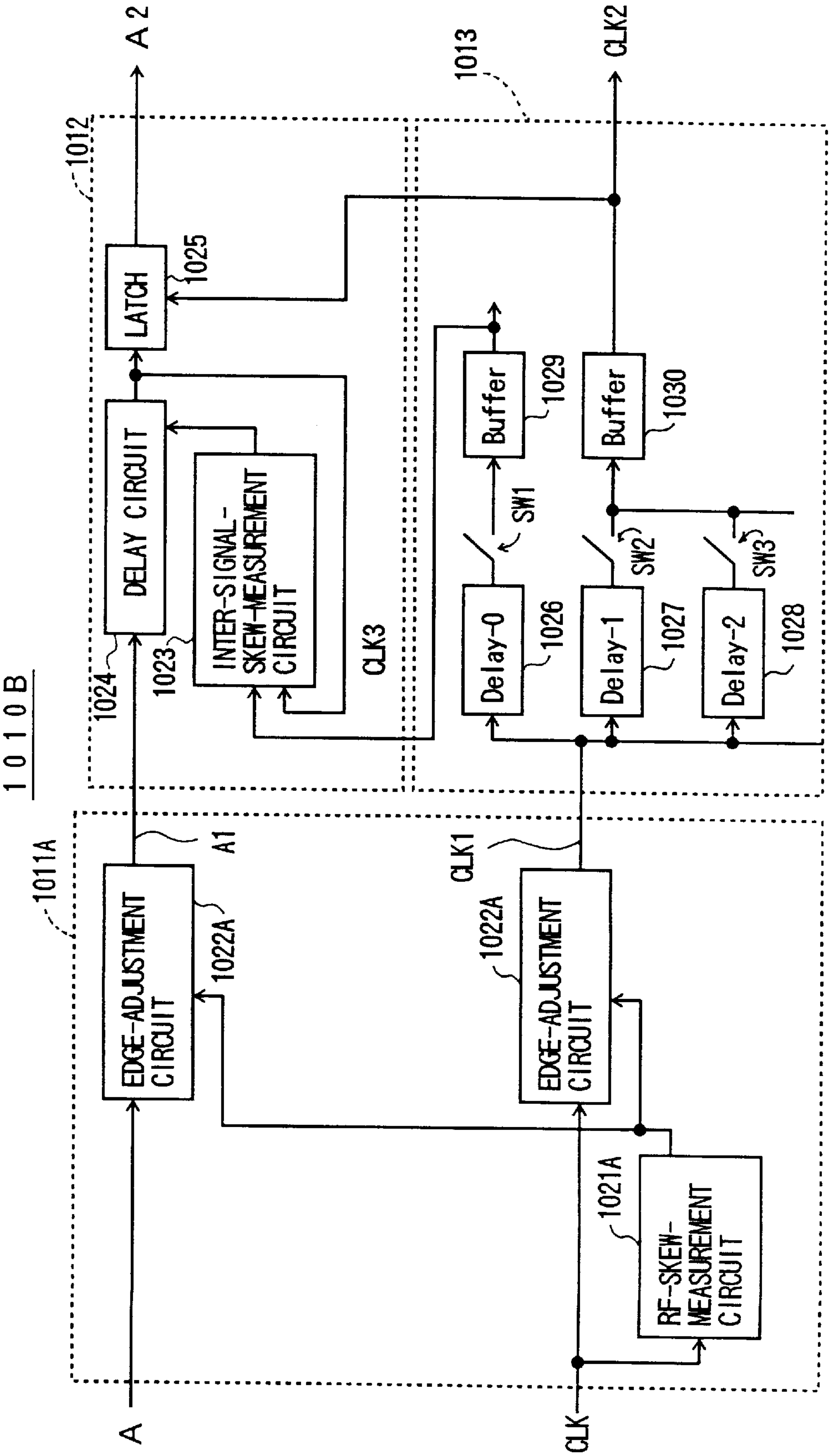
FIG. 75 is a block diagram of a third embodiment of a skew-reduction circuit for reducing an inter-signal skew according to the present invention.

FIG. 75 is a block diagram of a third embodiment of a skew-reduction circuit for reducing an inter-signal skew according to the present invention. In FIG. 75, the same elements as those of FIG. 61 are referred to by the same numerals, and a description thereof will be omitted.

The skew-reduction circuit 1010B of FIG. 75 includes a RF-skew-reduction circuit 1011A, the intersignal-skew-reduction circuit 1012, and the clock-buffer circuit 1013. Only the RF-skew-reduction circuit 1011A is different from the skew-reduction circuit 1010 of FIG. 61. The RF-skew-reduction circuit 1011A includes a RF-skew-measurement circuit 1021A and a plurality of edge-adjustment circuits 1022A. In the skew-reduction circuit 1010 of FIG. 61, the RF-skew-measurement circuit 1021 measures a rise-and-fall skew by using the clock signal CLKl output from the edge-adjustment circuit 1022, and controls the edge-adjustment circuits 1022 based on a feedback-control scheme. In the skew-reduction circuit 1010B of FIG. 75, on the other hand, the RF-skew-measurement circuit 1021A measures a rise-and-fall skew directly from the clock signal CLK input to the skew-reduction circuit 1010B, and sets the amount of edge adjustment in the edge-adjustment circuits 1022A based on the measured skew amount.

Figure 76:
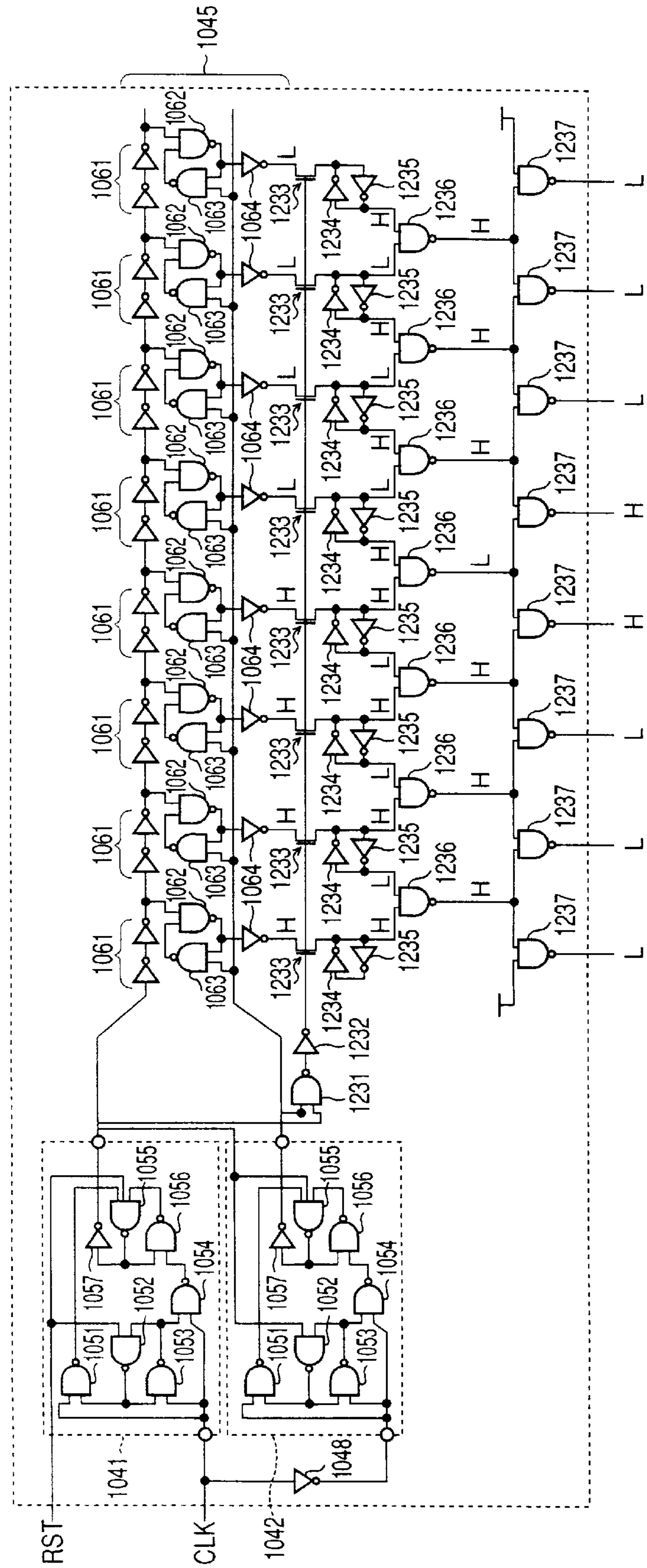
FIG. 76 is a circuit diagram of a RF-skew-measurement circuit of FIG. 75.

FIG. 76 is a circuit diagram of the RF-skew-measurement circuit 1021A. In FIG. 76, the same elements as those of FIG. 64 are referred to by the same numerals, and a description thereof will be omitted.

The RF-skew-measurement circuit 1021A of FIG. 76 includes the comparison-signal generators 1041 and 1042 and the time-difference-measurement circuit 1045 shown in FIG. 64. The RF-skew-measurement circuit 1021A further includes a NAND circuit 1231, an inverter 1232, a plurality of NMOS transistors 1233, a plurality of inverters 1234 and 1235, a plurality of NAND circuits 1236, and a plurality of NAND circuits 1237.

As described in connection with FIG. 64, the outputs of the inverters 1064, which are outputs of the time-difference-measurement circuit 1045, are HIGH on a left-hand side of the figure closer to input nodes, and are LOW on a right-hand side of the figure farther away from the input nodes. A position of a boundary between the HIGH outputs and the LOW outputs indicates a time difference between a rising edge and a falling edge of the clock signal CLK. The larger the time difference, the further right the position of the boundary.

The NAND circuit 1231 and the inverter 1232 turn of the NMOS transistors 1233 when both the comparison-signal generators 1041 and 1042 generate a HIGH output. When this happens, the output of the inverters 1064 are latched by a plurality of latches comprised of the inverters 1234 and 1235. Outputs of two adjacent latches are supplied to a corresponding one of the NAND circuits 1236, as shown in FIG. 76. Only one of the NAND circuits 1236 thus produces a LOW output, and a position of this LOW output corresponds to the position of the boundary between the HIGH outputs and the LOW outputs of the inverters 1064.

Outputs of two adjacent NAND circuits 1236 are supplied to a corresponding one of the NAND circuits 1237. As a result, two adjacent NAND circuits 1237 which are situated in a position corresponding to the boundary between the HIGH outputs and the LOW outputs of the inverters 1064 generate HIGH outputs.

A position of the two adjacent HIGH outputs among the outputs of the NAND circuits 1237 serves as an indicator to a duration of the period Thigh, i.e., a duration of the period from a rising edge to a falling edge of the clock signal CLK. That is, the outputs of the RF-skew-measurement circuit 1021A shown in FIG. 76 represents the duration of the period Thigh of the clock signal CLK.

The outputs of the RF-skew-measurement circuit 1021A have the same format as the outputs of the shift register 1082 shown in FIG. 65, and, thus, can be supplied to a circuit basically identical to the edge-shift circuit 1083 of FIG. 65. Namely, the edge-adjustment circuits 1022A of FIG. 75 may have a configuration basically identical to the configuration of the edge-shift circuit 1083 of FIG. 75. With this configuration, positions of rising edges and falling edges of the clock signal CLK can be shifted depending on a measured duration of the period Thigh of the clock signal CLK.

As described above, the third embodiment of the skew-reduction circuit shown in FIG. 75 measures a rise-and-fall skew of the clock signal CLK by using the RF-skew-measurement circuit 1021A, and sets the amount of edge adjustment in the edge-adjustment circuits 1022A based on the measured skew. In this manner, the RF-skew-reduction circuit 1011A reduces the rise-and-fall skew of the clock signal CLK and the signal A.

Figure 77:
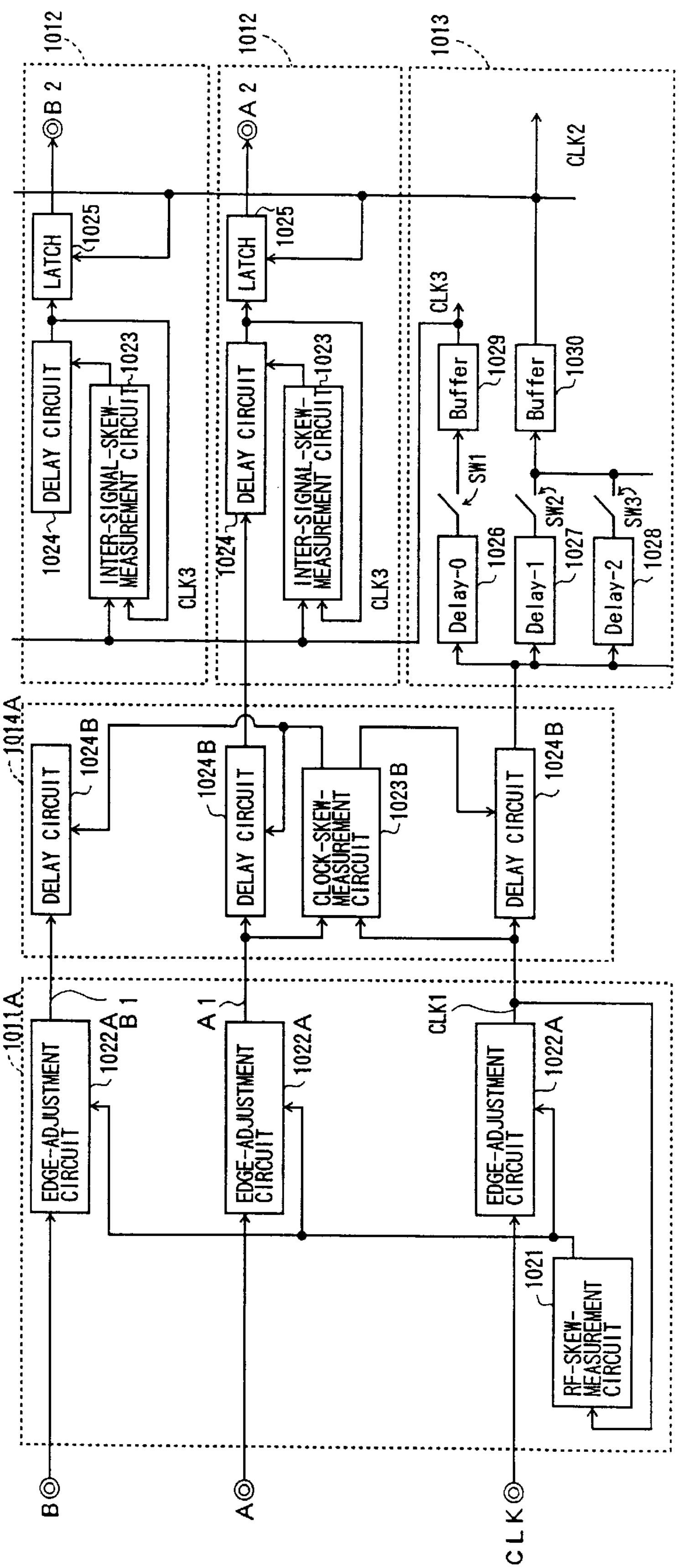
FIG. 77 is a block diagram of a fourth embodiment of a skew-reduction circuit for reducing an inter-signal skew according to the present invention.

FIG. 77 is a block diagram of a fourth embodiment of a skew-reduction circuit for reducing an inter-signal skew according to the present invention. In FIG. 77, the same elements as those of FIG. 74 and FIG. 75 are referred to by the same numerals, and a description thereof will be omitted.

The skew-reduction circuit 1010C of FIG. 77 includes the RF-skew-reduction circuit 1011A, the inter-signal-skew-reduction circuit 1012, the clock-buffer circuit 1013, and a clock-skew-reduction circuit 1014A. The skew-reduction circuit 1010C of FIG. 77 differs from the skew-reduction circuit 1010A of FIG. 74 in that the RF-skew-reduction circuit 1011 of FIG. 74 is replaced by the RF-skew-reduction circuit 1011A of FIG. 75, and that the clock-skew-reduction circuit 1014 of FIG. 74 is substituted for by the clock-skew-reduction circuit 1014A.

The clock-skew-reduction circuit 1014A includes a clock-skew-measurement circuit 1023B and a plurality of delay circuits 1024B. The clock-skew-measurement circuit 1023B receives the clock signal CLK1 and the signal A1, and measures a phase difference between these two signals. Based on a measured phase difference, the delay circuits 1024B delay the clock signal CLK1, the signal A1, and the signal B1. The clock-skew-reduction circuit 1014A differs from the clock-skew-reduction circuit 1014 in that the setting of delay is made based on the measurement of a phase difference between the clock signal CLK1 and the signal A1 rather than based on a feedback control.

Figure 78:
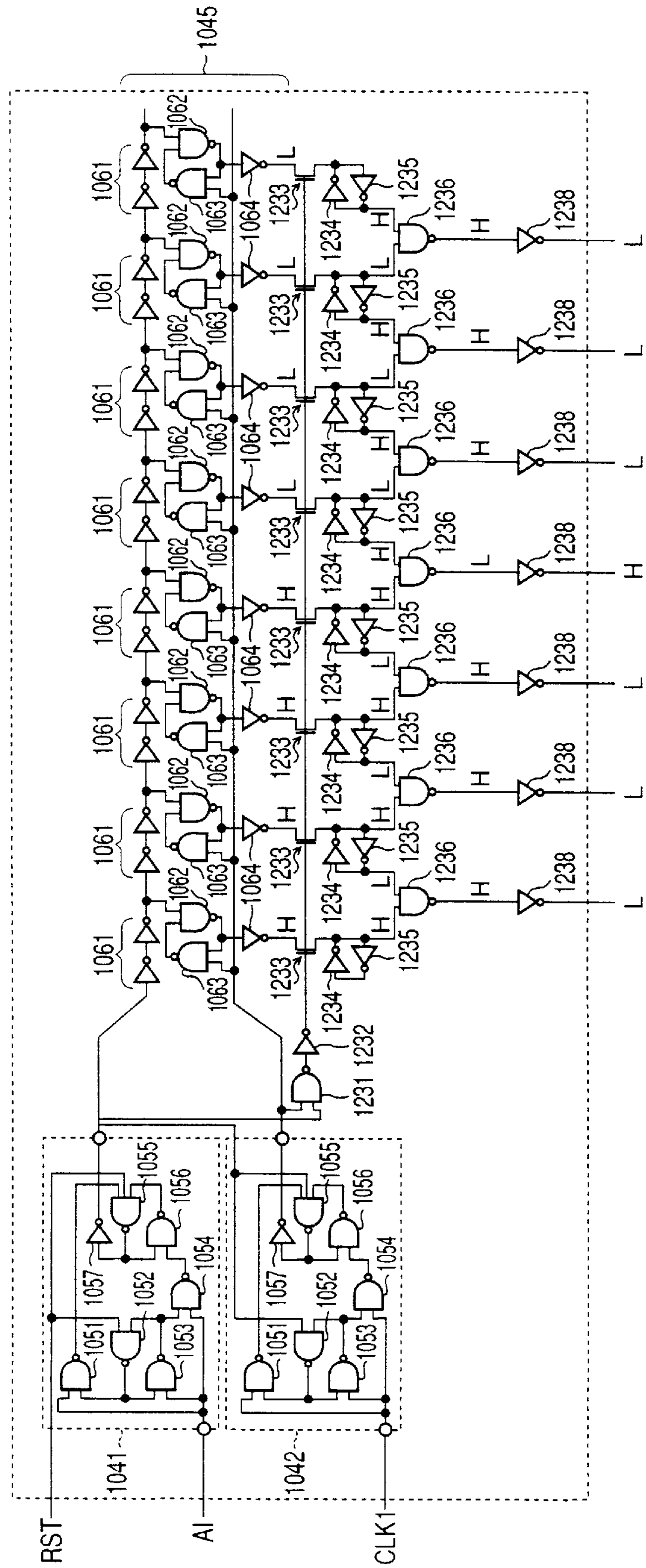
FIG. 78 is a circuit diagram of a clock-skew-measurement circuit of FIG. 77.

FIG. 78 is a circuit diagram of the clock-skew-measurement circuit 1023B. In FIG. 78, the same elements as those of FIG. 76 are referred to by the same numerals, and a description thereof will be omitted.

The clock-skew-measurement circuit 1023B of FIG. 78 includes a plurality of inverters 1238 in place of the plurality of NAND circuits 1237 of the RF-skew-measurement circuit 1021A shown in FIG. 76. As is clear from the description provided in connection with FIG. 76, only one inverter among the plurality of inverters 1238 produces a HIGH output when this inverter corresponds to a position of the boundary between the HIGH outputs and the LOW outputs of the plurality of inverters 1064, and the remaining ones of inverters 1238 produce a LOW output.

A position of the only one inverter which produces a HIGH output serves as an indicator to a phase difference between the signal A1 and the clock signal CLK1. Since the outputs of the clock-skew-measurement circuit 1023B have the same format as the outputs of the shift register 1201 shown in FIG. 70, and, thus, can be supplied to a circuit basically identical to the delay line 1202 of FIG. 70. Namely, the delay circuits 1024B of FIG. 77 may have a configuration basically identical to the configuration of the delay line 1202 of FIG. 70. With this configuration, a proper length of delay can be introduced to the clock signal CLK1, the signal A1, and the signal B1 in accordance with the phase difference between the signal A1 and the clock signal CLK1.

As described above, the fourth embodiment of the skew-reduction circuit shown in FIG. 77 measures a phase difference between the clock signal CLK1 and the signal Al by using the clock-skew-measurement circuit 1023B, and sets delays in the delay circuits 1024B based on the measured phase difference. In this manner, the clock-skew-reduction circuit 1014A brings a timing of the clock signal CLK1 close to a timing distribution of the signals A1 and B1.

Further, the present invention is not limited to these embodiments, but various variations and modifications may be made without departing from the scope of the present invention.

What is claimed is:

1. A circuit comprising:

a first skew-reduction circuit, receiving input signals and an input clock signal, for reducing a difference between a logic high period and a logic low period in the input clock signal by a control signal, and for adjusting a relative timing between a rising edge and a falling edge in each of said input signals by the control signal, thereby generating adjusted signals inclusive of an adjusted clock signal; and a second skew-reduction circuit reducing edge-timing differences between said adjusted signals output from said first skew-reduction circuit.

2. The circuit as claimed in claim 1, wherein said first skew-reduction circuit comprises:

edge-adjustment circuits, each provided for a corresponding one of said input clock signal and input signals, adjusting a relative timing between a rising edge and a falling edge of said corresponding one of said input clock signal and input signals, said edge-adjustment circuits outputting said adjusted signals; and a skew-measurement circuit controlling one of said edge-adjustment circuits corresponding to said input clock signal such that the adjusted clock signal output from said one of said edge-adjustment circuits has a logic high period and a logic low period equal to each other, and controlling remaining ones of said edge-adjustment circuits in the same manner as said one of said edge-adjustment circuits.

3. The circuit as claimed in claim 2, wherein said skew-measurement circuit receives said adjusted clock signal to compare said logic high period and said logic low period of said adjusted clock signal, and controls said one of said edge-adjustment circuits corresponding to said input clock signal such that said logic-high period and said logic low period become equal to each other, said skew-measurement circuit controlling said remaining ones of said edge-adjustment circuits in the same manner as said one of said edge-adjustment circuits.

4. The circuit as claimed in claim 3, wherein said skew-measurement circuit comprises:

a first time-difference-measurement circuit measuring a first duration of a first period ranging from a rising edge to a falling edge of said adjusted clock signal;

a second time-difference-measurement circuit measuring a second duration of a second period ranging from a falling edge to a rising edge of said adjusted clock signal; and a comparison circuit comparing said first duration measured by said first time-difference measurement circuit with said second duration measured by said second time-difference-measurement circuit.

5. The circuit as claimed in claim 4, wherein said first circuit comprises a series of first delay elements, and measures said first duration of said first period based on a number of said first delay elements through which a signal passes in said first period, and wherein said second circuit comprises a series of second delay elements, and measures said second duration of said second period based on a number of said second delay elements through which a signal passes in said second period.

6. The circuit as claimed in claim 2, wherein said skew-measurement circuit receives said input clock signal to measure said logic high period and said logic low period of said input clock signal, and controls said one of said edge-adjustment circuits corresponding to said input clock signal based on the measurement of said logic high period and said logic low period such that said logic high period and said logic low period of said adjusted clock signal become equal to each other, said skew-measurement circuit controlling said remaining ones of said edge-adjustment circuits in the same manner as said one of said edge-adjustment circuits.

7. The circuit as claimed in claim 2, wherein said second skew-reduction circuit comprises:

first delay circuits, each provided for a corresponding one of said adjusted signals excluding said adjusted clock signal, delaying said adjusted signals to output delayed signals; and inter-signal-skew-measurement circuits, each provided for a corresponding one of said first delay circuits, measuring a phase difference between a corresponding one of said delayed signals and said adjusted clock signal and adjusting a delay of a corresponding one of said first delay circuits such that said phase difference becomes substantially zero.

8. The circuit as claimed in claim 7, wherein said second skew-reduction circuit further comprises:

a clock-buffer circuit delaying said adjusted clock signal by a predetermined length of delay to output a delayed clock signal; and latch circuits, each provided for a corresponding one of said first delay circuits, latching a corresponding one of said delayed signals by using said delayed clock signal as a synchronization signal.

9. The circuit as claimed in claim 2, further comprising a third skew-reduction circuit, provided between said first skew-reduction circuit and said second skew-reduction circuit, narrowing a gap between a timing of said adjusted clock signal and a timing distribution of said adjusted signals excluding said adjusted clock signal.

10. The circuit as claimed in claim 9, wherein said third skew-reduction circuit comprises:

second delay circuits, each provided for a corresponding one of said adjusted signals excluding said adjusted clock signal, delaying said adjusted signals to output delayed signals;

a third delay circuit delaying said adjusted clock signal to output a delayed clock signal; and a clock-skew-measurement circuit adjusting a delay of one of said second delay circuits and a delay of said third delay circuit such that one of said delayed signals corresponding to said one of said second delay circuits has a phase substantially equal to a phase of said delayed clock signal, and setting the same delay in remaining ones of said second delay circuits as a delay set in said one of said second delay circuits.

11. The circuit as claimed in claim 2, wherein each of said edge-adjustment circuits comprises:

a first series of delay elements delaying said corresponding one of said input clock signal and input signals by a first delay to generate a first delayed signal;

a second series of delay elements delaying said corresponding one of said input clock signal and input signals by a second delay to generate a second delayed signal; and a circuit combining said first delayed signal and said second delayed signal to generate a corresponding one of said adjusted signals.

12. The circuit as claimed in claim 1, wherein said first skew-reduction circuit receives calibration-purpose signal patterns as said input signals when there is a need to reduce edge-timing differences between said input signals, said calibration-purpose signal patterns having edge timings coinciding with at least some edges of said clock signal.

13. The circuit as claimed in claim 12, wherein said calibration-purpose signal patterns include a plurality of signal patterns.

14. A semiconductor device receiving input signals and an input clock signal, said semiconductor device comprising an input interface unit, wherein said input interface unit includes:

a first skew-reduction circuit reducing a difference between a logic high period and a logic low period in the input clock signal by a control signal, and adjusting a relative timing between a rising edge and a falling edge in each of said input signals by the control signal, thereby generating adjusted signals inclusive of an adjusted clock signal; and a second skew-reduction circuit reducing edge-timing differences between said adjusted signals output from said first skew-reduction circuit.

15. The semiconductor device as claimed in claim 14, wherein said first skew-reduction circuit comprises:

edge-adjustment circuits, each provided for a corresponding one of said input clock signal and input signals, adjusting a relative timing between a rising edge and a falling edge of said corresponding one of said input clock signal and input signals, said edge-adjustment circuits outputting said adjusted signals; and a skew-measurement circuit controlling one of said edge-adjustment circuits corresponding to said input clock signal such that the adjusted clock signal output from said one of said edge-adjustment circuits has a logic high period and a logic low period equal to each other, and controlling remaining ones of said edge-adjustment circuits in the same manner as said one of said edge-adjustment circuits.

16. The semiconductor device as claimed in claim 15, wherein said second skew-reduction circuit comprises:

delay circuits, each provided for a corresponding one of said adjusted signals excluding said adjusted clock signal, delaying said adjusted signals to output delayed signals; and inter-signal-skew-measurement circuits, each provided for a corresponding one of said delay circuits, measuring a phase difference between a corresponding one of said delayed signals and said adjusted clock signal and adjusting a delay of a corresponding one of said delay circuits such that said phase difference becomes substantially zero.

17. The semiconductor device as claimed in claim 16, wherein said second skew-reduction circuit further comprises:

a clock-buffer circuit delaying said adjusted clock signal by a predetermined length of delay to output a delayed clock signal; and latch circuits, each provided for a corresponding one of said delay circuits, latching a corresponding one of said delayed signals by using said delayed clock signal as a synchronization signal.

18. The semiconductor device as claimed in claim 15, further comprising a third skew-reduction circuit, provided between said first skew-reduction circuit and said second skew-reduction circuit, narrowing a gap between a timing of said adjusted clock signal and a timing distribution of said adjusted signals excluding said adjusted clock signal.

* * * * *

UNITED STATES PATENT AND TRADEMARK OFFICE

CERTIFICATE OF CORRECTION

PATENT NO. : 6,114,890
DATED : September 5, 2000
INVENTOR(S) : Okajima et al.

It is certified that error appears in the above-identified patent and that said Letters Patent is hereby corrected as shown below:

Title page,
Item [75], please delete -- TSUYOSHI HIGUCHI --.

Signed and Sealed this

Second Day of October, 2001

*Attest:*

*Nicholas P. Godici*

NICHOLAS P. GODICI

*Attesting Officer*

*Acting Director of the United States Patent and Trademark Office*